US010749027B2

(12) United States Patent
Yedinak et al.

(10) Patent No.: US 10,749,027 B2
(45) **Date of Patent: *Aug. 18, 2020**

(54) METHODS AND APPARATUS RELATED TO TERMINATION REGIONS OF A SEMICONDUCTOR DEVICE

(71) Applicant: FAIRCHILD SEMICONDUCTOR CORPORATION, Phoenix, AZ (US)

(72) Inventors: Joseph A. Yedinak, Mountain Top, PA (US); Richard Stokes, Shavertown, PA (US); Jason Higgs, Mountain Top, PA (US); Fred Session, Sandy, UT (US)

(73) Assignee: Fairchild Semiconductor Corporation, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/234,844

(22) Filed: Dec. 28, 2018

(65) Prior Publication Data

US 2019/0245078 A1 Aug. 8, 2019

Related U.S. Application Data

(63) Continuation of application No. 15/274,926, filed on Sep. 23, 2016, now abandoned, which is a
(Continued)

(51) Int. Cl.
*H01L 29/78* (2006.01)
*H01L 29/06* (2006.01)
(Continued)

(52) U.S. Cl.
CPC .... *H01L 29/7813* (2013.01); *H01L 21/02104* (2013.01); *H01L 29/06* (2013.01);
(Continued)

(58) Field of Classification Search
CPC ............ H01L 29/7813; H01L 29/7395; H01L 29/7387; H01L 29/7827; H01L 29/7825;
(Continued)

(56) References Cited

U.S. PATENT DOCUMENTS 6,750,508 B2 6/2004 Omura et al.
6,987,305 B2 1/2006 He et al.
(Continued)

FOREIGN PATENT DOCUMENTS

CN 102246306 A 11/2011
DE 102006030225 A1 1/2008
(Continued)

OTHER PUBLICATIONS

EP14000929.1 , "Extended European Search Report Received", dated Dec. 16, 2014, 11 Pages.

*Primary Examiner* — Michael M Trinh
(74) *Attorney, Agent, or Firm* — Brake Hughes Bellermann LLP

(57) ABSTRACT

In one general aspect, an apparatus can include a semiconductor region, and a trench defined within the semiconductor region. The trench can have a depth aligned along a vertical axis and have a length aligned along a longitudinal axis orthogonal to the vertical axis. The trench can have a first portion of the length included in a termination region of the semiconductor region and can have a second portion of the length included in an active region of the semiconductor region.

17 Claims, 75 Drawing Sheets

Related U.S. Application Data continuation of application No. 14/204,765, filed on Mar. 11, 2014, now Pat. No. 9,496,391.

(60) Provisional application No. 61/801,253, filed on Mar. 15, 2013, provisional application No. 61/801,272, filed on Mar. 15, 2013.

(51) Int. Cl.

| | |
|---|---|
| ***H01L 29/40*** | (2006.01) |
| ***H01L 29/423*** | (2006.01) |
| ***H01L 21/02*** | (2006.01) |
| ***H01L 29/739*** | (2006.01) |

(52) U.S. Cl.

CPC ...... *H01L 29/0649* (2013.01); *H01L 29/0661* (2013.01); *H01L 29/404* (2013.01); *H01L 29/407* (2013.01); *H01L 29/4238* (2013.01); *H01L 29/7395* (2013.01); *H01L 29/7811* (2013.01); *H01L 29/7827* (2013.01); *H01L 29/0638* (2013.01); *H01L 29/42364* (2013.01)

(58) Field of Classification Search

CPC ............. H01L 29/7811; H01L 29/7823; H01L 29/42368; H01L 29/42364; H01L 29/407; H01L 29/404; H01L 29/402; H01L 29/06; H01L 29/0661; H01L 29/0638; H01L 29/66734; H01L 29/66704; H01L 29/4238; H01L 29/0649

See application file for complete search history.

(56) References Cited

U.S. PATENT DOCUMENTS

| | | | | |
|---|---|---|---|---|
| 7,211,860 | B2 | 5/2007 | Zundel et al. | |
| 7,397,083 | B2 * | 7/2008 | Amali | H01L 29/407 257/331 |
| 7,786,533 | B2 | 8/2010 | Disney et al. | |
| 8,148,749 | B2 | 4/2012 | Grebs et al. | |
| 8,304,829 | B2 * | 11/2012 | Yedinak | H01L 29/7397 257/334 |
| 8,367,501 | B2 * | 2/2013 | Lui | H01L 29/0638 438/270 |
| 9,496,391 | B2 * | 11/2016 | Yedinak | H01L 21/02104 |
| 2003/0222297 | A1 | 12/2003 | Krumrey et al. | |
| 2005/0017293 | A1 * | 1/2005 | Zundel | H01L 29/42368 257/329 |
| 2009/0026535 | A1 | 1/2009 | Matsuura et al. | |
| 2009/0085074 | A1 * | 4/2009 | Su | H01L 29/7813 257/288 |
| 2009/0189181 | A1 | 7/2009 | Koyama et al. | |
| 2011/0121386 | A1 * | 5/2011 | Hsieh | H01L 27/11519 257/334 |
| 2011/0163409 | A1 | 7/2011 | Mizushima et al. | |
| 2013/0069109 | A1 | 3/2013 | Matsuda et al. | |
| 2013/0207227 | A1 * | 8/2013 | Azam | H01L 29/407 257/508 |
| 2014/0264569 | A1 | 9/2014 | Yedinak et al. | |

FOREIGN PATENT DOCUMENTS

| | | | |
|---|---|---|---|
| EP | 2339636 | A1 | 6/2011 |
| JP | 2005322949 | A | 11/2005 |
| JP | 2006032420 | A | 2/2006 |

* cited by examiner

METHODS AND APPARATUS RELATED TO TERMINATION REGIONS OF A SEMICONDUCTOR DEVICE

RELATED APPLICATIONS

This application is a continuation of U.S. patent application Ser. No. 15/274,926, entitled, "Methods and Apparatus Related to Termination Regions of a Semiconductor Device," filed Sep. 23, 2016, which is a continuation of U.S. patent application Ser. No. 14/204,765, entitled, "Methods and Apparatus Related to Termination Regions of a Semiconductor Device," filed Mar. 11, 2014, which claims priority to and the benefit of U.S. Provisional Application No. 61/801,272, entitled, "Methods and Apparatus Related to Termination Regions of a Semiconductor Device," filed Mar. 15, 2013, and which claims priority to and the benefit of U.S. Provisional Application No. 61/801,253, entitled, "Methods and Apparatus Related to Termination Regions of a Semiconductor Device," filed Mar. 15, 2013. All of these applications are incorporated herein by reference in their entireties.

TECHNICAL FIELD

This description relates to termination regions of a semiconductor device.

BACKGROUND

Implementations of trench-gate type devices (e.g., planar-gate metal-oxide-semiconductor field effect transistor (MOSFET) transistors, vertical gate MOSFET transistors, insulated-gate bipolar transistors (IGBTs), rectifiers, and synchronous rectifiers) can include an array of trenches (e.g., parallel trenches) formed in the top surface of the semiconductor die, with each trench filled with a dielectric, a shield electrode and/or a gate electrode, depending upon the type of power device. The trenches can define a corresponding array of mesas (or mesa regions), where each mesa being disposed between adjacent trenches. Depending upon the device implemented on the die, various electrodes and/or doped regions are disposed at the top of the mesa. One or more of the mesas and adjacent trenches can implement a small instance of the device, and the small instances can be coupled together in parallel to provide the whole power semiconductor device. The device can have an ON state where a desired current flows through the device, an OFF state where current flow is substantially blocked in the device, and a breakdown state where an undesired current flows due to an excess off-state voltage being applied between the current conducting electrodes of the device. The voltage at which breakdown is initiated is called the breakdown voltage. Each mesa and adjacent trenches are configured to provide a desired set of ON-state characteristics and breakdown voltage. The configuration of the mesa and trenches can result in a variety of trade-offs between achieving desirable ON-state characteristics, relatively high breakdown voltage, and desirable switching characteristics.

A power semiconductor die can have an active area where the array of mesas and trenches that implement the device are located, a field termination area around the active area, and an inactive area where interconnects and channel stops may be provided. The field termination area can be used to minimize the electric fields around the active area, and may not be configured to conduct current. The breakdown voltage of the device can be determined by the breakdown processes associated with the active area. However, various breakdown processes in the field termination area and inactive area at significantly lower voltages can occur in an undesirable fashion. These breakdown processes may be referred to as passive breakdown processes or as parasitic breakdown processes.

Known field termination areas that have higher breakdown voltages than the active area have been configured, however such known configurations often compromise total die area, processing costs, performance characteristics, and/or so forth. Thus, a need exists for systems, methods, and apparatus to address the shortfalls of present technology and to provide other new and innovative features.

SUMMARY

In one general aspect, an apparatus can include a semiconductor region having an active region, and an end trench defined within a termination region of the semiconductor region where the end trench has a curved shape.

The details of one or more implementations are set forth in the accompanying drawings and the description below. Other features will be apparent from the description and drawings, and from the claims.

DETAILED DESCRIPTION

Figure 1A:
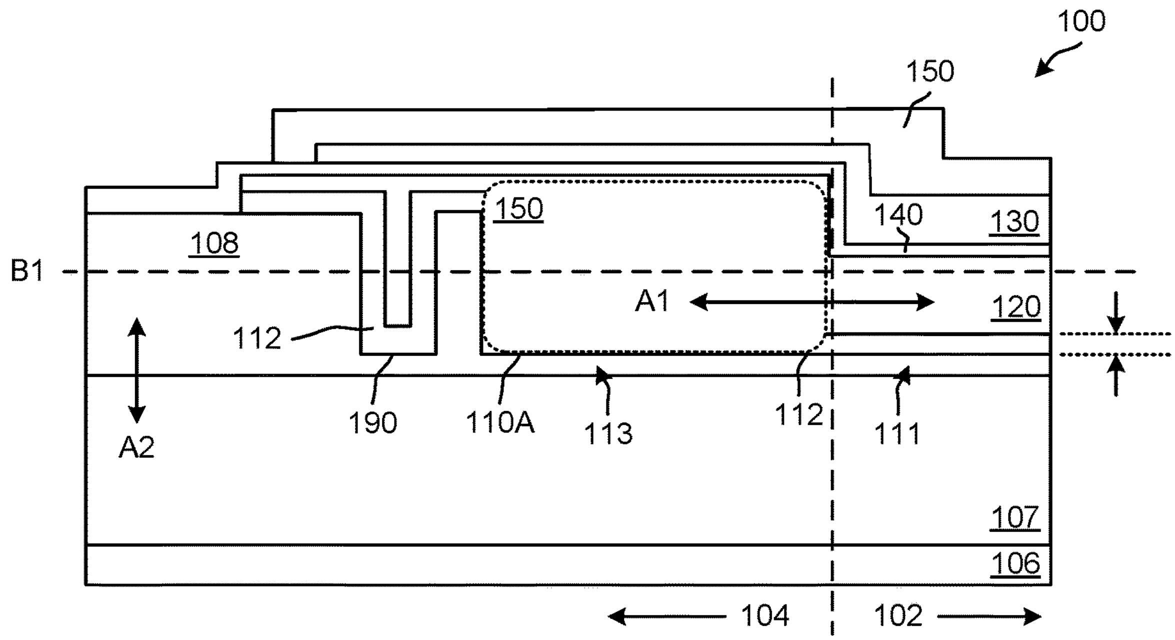
FIG. 1A is a diagram that illustrates a side cross-sectional view of an active region and a termination region associated with a portion of a semiconductor device.
Figure 1B:
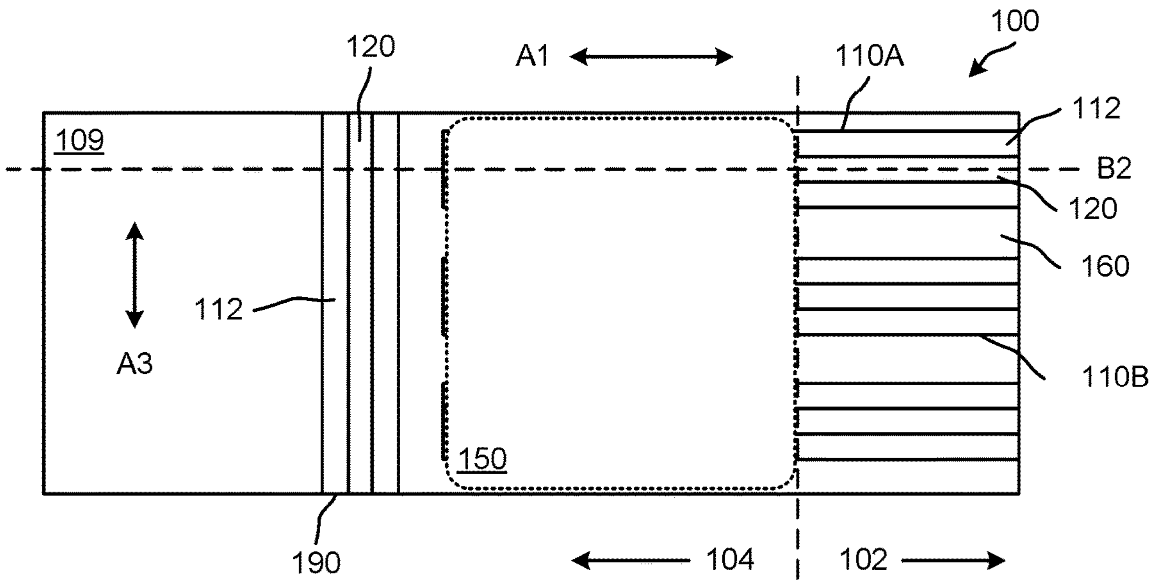
FIG. 1B is a top view of the semiconductor device cut along a line shown in FIG. 1A.

FIG. 1A is a diagram that illustrates a side cross-sectional view of an active region 102 and a termination region 104 associated with a portion of a semiconductor device 100. FIG. 1B is a top view of the semiconductor device 100 cut along line B1 shown in FIG. 1A. The side cross-sectional view of the portion of the semiconductor device 100 is cut along line B2 of the top view of the semiconductor device 100 shown in FIG. 1B.

As shown in FIG. 1A, a trench 110A included in the semiconductor device 100 has a portion 113 in the termination region 104 and has a portion 111 in the active region 102. A dielectric 112 (e.g., an oxide) is disposed in the trench 110A. Also, a shield electrode 120 (e.g., a shield polysilicon electrode) and a gate electrode 130 (e.g., a gate polysilicon electrode) insulated from the shield electrode 120 by an inter-electrode dielectric (IED) 140 are disposed in the trench 110A. A perimeter trench 190 is also included in the semiconductor device 100. At least a portion of the dielectric 112 and at least a portion of the shield electrode 120 are also disposed in the perimeter trench 190. The dielectric 112 can be the combination of more than one dielectric that can be formed using one or more dielectric formation processes (e.g., deposition processes, growth processes).

As shown in FIG. 1A, the trench 110A has a length aligned along a longitudinal axis A1 (also can be referred to as a horizontal direction). The shield electrode 120, the inter-electrode dielectric 140, and the gate electrode 130 are vertically stacked within the trench 110A along a vertical axis A2 (also can be referred to as a vertical direction), which is substantially orthogonal to the longitudinal axis A1. In this implementation, the perimeter trench 190 is aligned along a longitudinal axis A3 (shown in FIG. 1B) so that the longitudinal axis A3 is substantially orthogonal to the longitudinal axis A1 and the vertical axis A2.

The trench 110A is aligned parallel to additional trenches including, for example, trench 110B shown in FIG. 1B. A mesa region 160 is disposed between the trench 110A and the trench 110B. In other words, the mesa region 160 is defined, at least in part by, a sidewall of the trench 110A and a sidewall of the trench 110B.

Although not shown in FIG. 1, the active region of the semiconductor device 100 can include, or can define, one or more vertical metal-oxide-semiconductor field effect transistor (MOSFET) devices. The vertical MOSFET device(s) can be activated via, for example, the gate electrode 130. Many of the elements of the semiconductor device 100 are formed within an epitaxial layer 108, which can be formed within or on a substrate 107 (e.g., an n-type substrate, a p-type substrate). As shown in FIG. 1A, the semiconductor device 100 has a drain contact 106 (e.g., a back-side drain contact).

The elements within the termination region 104, and specifically, within a portion 150 of the termination region 104 associated with, for example, the trench 110A can be configured to avoid undesirable events such as voltage breakdown at the edges of, for example, the active region 102 of the semiconductor device 100. Also, the termination region 104 can be configured so that the dimensions of the semiconductor device 100 can be optimized to achieve desirable performance characteristics of the semiconductor device 100 such as a relatively low on-resistance, a relatively high off-resistance, a breakdown voltage or reverse blocking voltage, a desirable electric field profile, faster switching speeds, and/or so forth. Specifically, the termination region 104 can have features that are configured so that other dimensions of the semiconductor device 100 in the active region 102 can be configured for desirable performance characteristics. For example, the termination region 104 can be configured so that trench depths, pitches between trenches, doping levels, and/or so forth within the active region 102 can be optimized for processing efficiency, low cost, relatively small die area, and/or so forth.

As a specific example, when a potential (e.g., a potential of around zero volts) on a gate electrode is defined so that a semiconductor device is in an off-state, a substantial current can flow during a breakdown condition where a drain potential is high relative to a source potential. In the breakdown condition, relatively high electric fields can develop in a mesa region between trenches, and this high electric field can generate avalanche carriers (both holes and electrons) at a breakdown voltage. The breakdown voltage of the mesa region may be increased in a desirable fashion by configuring the elements of termination region such that the thickness of a dielectric within an active region of a trench can be decreased, a width of the mesa region can be decreased, a doping concentration in the drift region can be configured to cause the drift region to be normally depleted of electrons to support a charge-balanced condition, and/or so forth. The elements of the termination region can be configured so that the electric field during off-state conditions can be uniformly distributed along a centerline of the mesa region (e.g., a square-shaped or rectangular-shaped electric field profile) in a desirable fashion, thereby reducing a peak electric field (and thereby increasing the voltage at which avalanche carriers can be generated).

While many of the implementations described herein are with respect to a MOSFET device, the implementations described herein can also be applied to other device types, such as IGBT devices, rectifiers, and particularly in devices in which the above-described charge-balanced conditions exist. Additionally, in this description, the various implementations of are described, for purposes of illustration, as implementing n-type channel devices. However, in other implementations, the devices illustrated may be implemented a p-type channel devices (e.g., by using opposite conductivity types and/or biasing potentials).

Figure 2:
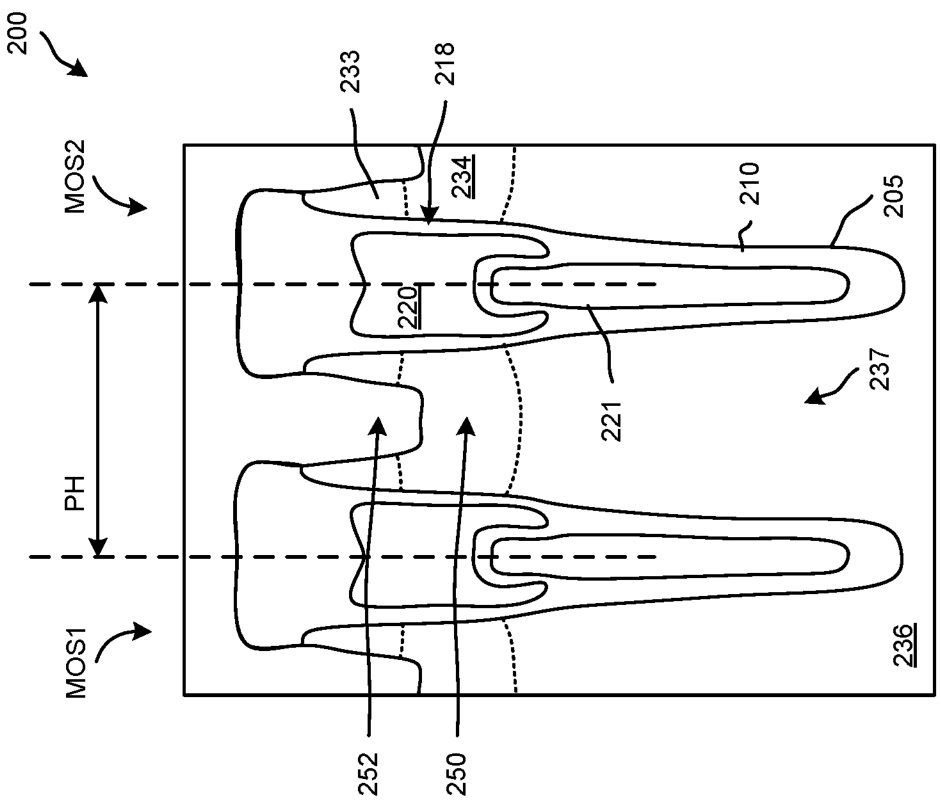
FIG. 2 is a cross-sectional diagram that illustrates a metal-oxide-semiconductor field-effect transistor (MOSFET) device, according to an implementation.

FIG. 2 is a cross-sectional diagram that illustrates a MOSFET device 200, according to an implementation. The MOSFET device 200 includes MOSFET device MOS1 and a MOSFET device MOS2. Because the MOSFET devices MOS1, MOS2 have similar features, the MOSFET devices MOS1, MOS2 will generally be discussed in terms of a single MOSFET device MOS2 (that is mirrored in the other MOSFET device MOS1 and/or mirrored within the MOSFET device MOS2). The MOSFET device 200 can be, for example, relatively high voltage devices (e.g., greater than 30V, 60V devices, 100V devices, 300V devices).

As shown in FIG. 2 the MOSFET device 200 is formed within an epitaxial layer 236 (e.g., N-type). Source regions 233 (e.g., N+ source regions) are disposed above body regions 234 (e.g., P-type) which is formed in the epitaxial layer 236. The epitaxial layer can be formed on, or in a substrate (e.g., a N+ substrate) (not shown). Trench 205 extends through body region 234 and terminates in a drift region 237 within the epitaxial layer 236 (also can be referred to as an epitaxial region). Trench 205 includes a dielectric 210 (which can include one or more dielectric layers such as a gate dielectric 218) disposed within the trench 205. A gate electrode 220 and a shield electrode 221 are disposed within the trench 205. The MOSFET devices 200 can be configured to operate by applying a voltage (e.g., a gate voltage) to the gate electrode 220 of the MOSFET device 200 which can turn the MOSFET device 200 ON by forming channels adjacent to the gate oxides 218 so that current may flow between the source regions 233 and a drain contact (not shown).

In accordance with the termination implementations described herein, the performance characteristics and dimensions of the MOSFET device 200 can be improved. For example, an ON-resistance of the MOSFET device 200 can be improved by approximately 50% (or more) and a pitch PH (and mesa region 250 width) between the MOSFET device MOS1 and the MOSFET device MOS2 can be decreased by approximately 20% (or more) with no decrease (or substantially no decrease) in breakdown voltage (while the MOSFET device 200 is OFF) and an increase in $Q_{g\text{-}total}$ increase of approximately 10% (or less). The increase in the ON-resistance of the MOSFET device 200 can be compensated for through an increase (e.g., a 30% increase) in dopant concentration within the epitaxial layer 236—which is enabled by the termination implementations described herein. In addition, trench mask critical dimensions (CDs) (e.g., distances, sizes) can be decreased by approximately 10% or more, the shield electrode 221 widths can be decreased by more than 10%, contact 252 widths can be decreased by more than 50%, and/or so forth.

Figure 3A:
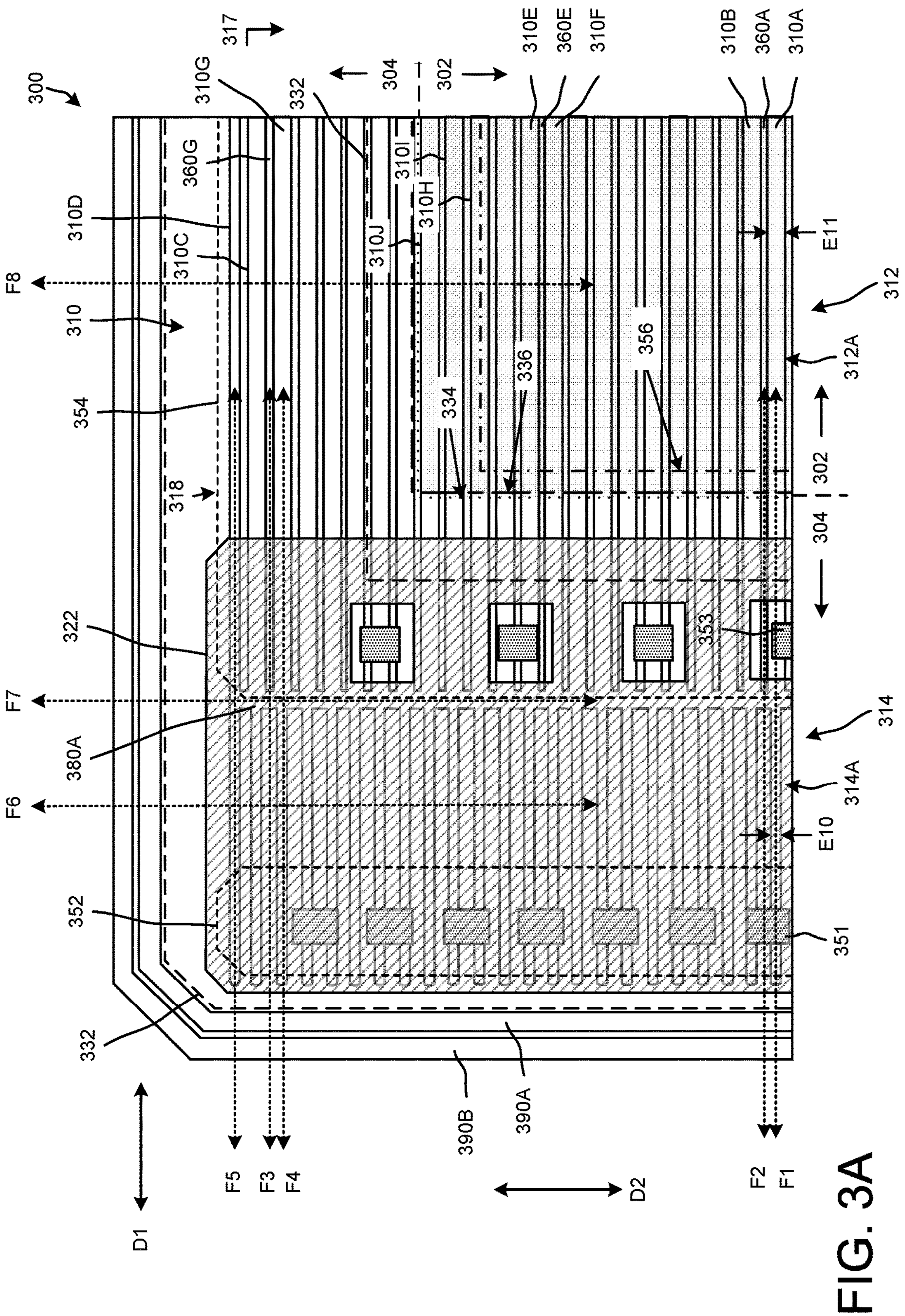
FIGS. 3A through 3I are diagrams that illustrate configurations of a termination region according to some implementations.

FIGS. 3A through 3I are diagrams that illustrate configurations of a termination region according to some implementations. FIG. 3A is a diagram that illustrates a plan view (or top view along the horizontal plane) of at least a portion of a semiconductor device 300 including an active region 302 and a termination region 304. FIGS. 3B through 3I are side cross-sectional views along different cuts (e.g., cuts F1 through F8) within the plan view FIG. 3A. To simplify the plan view shown in FIG. 3A some of the elements illustrated in the side cross-sectional views of FIGS. 3B through 3I are not shown. The side cross-sectional views along the different cuts included in FIGS. 3B through 3I are not necessarily drawn to the same scale (e.g., numbers of trenches, etc.) as the plan view shown in FIG. 3A.

As shown in FIG. 3A, a plurality of trenches 310, including for example trenches 310A through 310J, are aligned along a longitudinal axis D1 within the semiconductor device 300. The plurality of trenches 310 can be referred to as parallel trenches. At least some portions of the plurality of trenches 310 can be included in the active region 302 and at least some portions of the plurality of trenches 310 can be included in the termination region 304. For example, a portion of trench 310B is included in the active region 302 and a portion of the trench 310B is included in the termination region 304. As shown in FIG. 3A, trench 310G is entirely disposed within the termination region 304.

In this implementation, the trench 310D is entirely disposed within the termination region 304 and is the outermost trench from the plurality of trenches 310. Accordingly, the trench 310D can be referred to as an end trench. Trenches from the plurality of trenches 310 in the semiconductor device 300 that are lateral to (or interior to) the end trench 310D can be referred to as interior trenches 317 (or as non-end trenches).

As shown in FIG. 3A, the active region 302 is defined by an area of the semiconductor device 300 that corresponds with at least one of a source contact region 336 (e.g., a source contact region 336) or a shield dielectric edge region 334. The source contact region 336 defines an area within the semiconductor device 300 where source contacts (such as source contact 357 shown in FIG. 3I) are formed. The source contact region 336 can also correspond with, for example, a source conductor region (e.g., a source metal region). The source contacts can be contacted with source implants (such as source implant 363E within a mesa region 360E between trenches 310E and 310F shown in FIG. 3I) of one or more active devices. A source formation region 356 in FIG. 3A (which can be referred to as a source exclusion edge) defines an area within which mesa regions between the plurality of trenches 310 are doped as doped source regions of active devices.

Figure 3B:
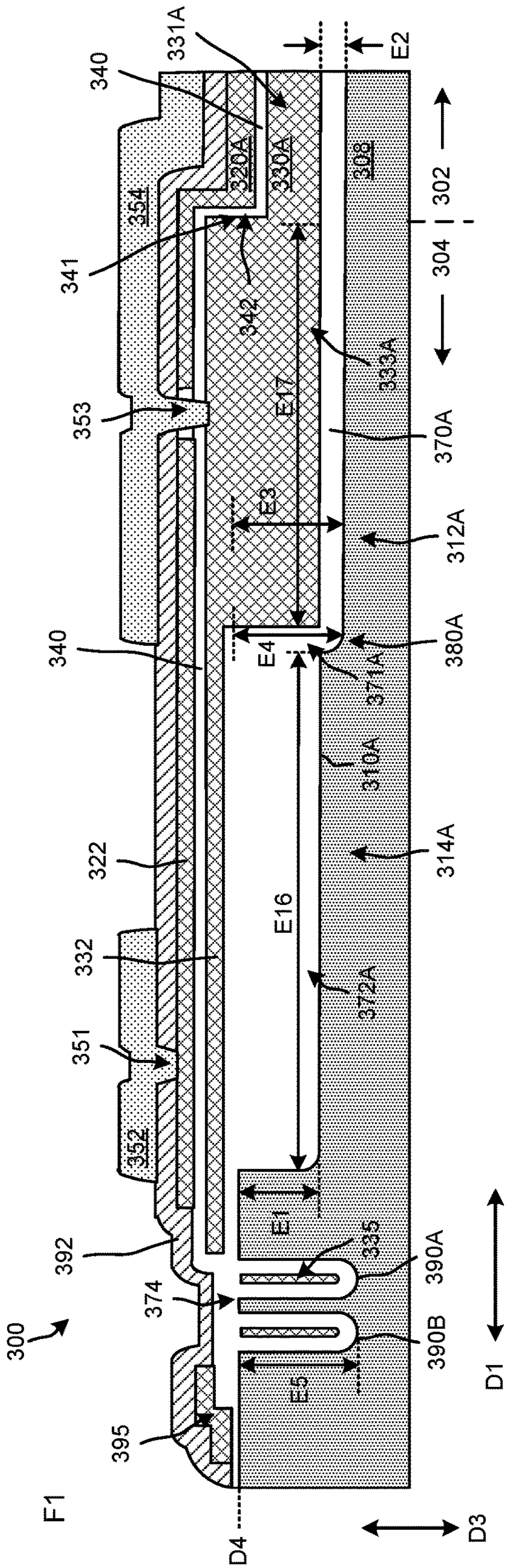

The shield dielectric edge region 334 shown in FIG. 3A corresponds with (e.g., approximately corresponds with), for example, an edge 341 of the inter-electrode dielectric 340 shown in FIG. 3B (which is a side cross-sectional view cut along line F1). At least a portion of the inter-electrode dielectric 340 can include a gate dielectric such as gate dielectric portion 342 shown in FIG. 3B.

As shown in FIG. 3A, the termination region 304 includes areas of the semiconductor device 300 outside of (e.g., excluded by) the active region 302. Accordingly, the termination region 304, similar to the active region 302, is defined by at least one of the source contact region 336 or the shield dielectric edge region 334.

As shown in FIG. 3A, a transverse trench 380A is aligned along a longitudinal axis D2 that is orthogonal to (e.g., substantially orthogonal to) the longitudinal axis D1. In other words, the transverse trench 380A intersects in an orthogonal direction, the plurality of trenches 310. Accordingly, the transverse trench 380A can be considered to be in fluid communication with, for example, trench 310A. The transverse trench 380A may intersect only a portion of the plurality of trenches 310. The transverse trench 380A can be referred to as an end of trench trench (EOTT) or as a perpendicular trench because the transverse trench 380A is perpendicularly oriented with respect to the parallel trenches (i.e., the plurality of trenches 310). The directions along the longitudinal axis D2 can be referred to as a lateral direction. For example, trench 310A can be referred to as being lateral to trench 310G.

In this implementation, the transverse trench 380A is disposed entirely within the termination region 304. Although not shown in FIG. 3A, the transverse trench 380A can have a least a portion disposed within the active region 302.

In this implementation, portions of the plurality of trenches 310 (that are interior trenches 317 and) disposed to the left of the transverse trench 380A can be referred to as trench extension portions 314. Portions of the plurality of trenches 310 (that are interior trenches 317 and) disposed to the right of the transverse trench 380A and extend into (or toward) the active region 302 can be referred to as main trench portions 312. For example, trench 310A includes a trench extension portion 314A (similarly shown as 314G in FIG. 3E) on the left side of the transverse trench 380A (toward the perimeter and in a distal direction away the active region 302) and the trench 310A includes a main trench portion 312A (similarly shown as 312G in FIG. 3E) on the right side of the transverse trench 380A (away from the perimeter and in a proximal direction toward the active region 302). In this implementation, at least a portion of the main trench portion 312A is included in (e.g., disposed within) the termination region 304, and a portion of the main trench portion 312A is included in (e.g., disposed within) the active region 302. The transverse trench 380A can be considered to be included in the trench extension portion 314A. In this implementation, the trench extension portions 314 can define at least a portion of a mesa (when viewed in a side cross-sectional view).

Although only one transverse trench is included in the semiconductor device 300, more than one transverse trench similar to transverse trench 380A can be included in the semiconductor device 300. For example, an additional transverse trench aligned parallel to the transverse trench 380A can be disposed within the trench extension portion 314A.

Figure 3C:
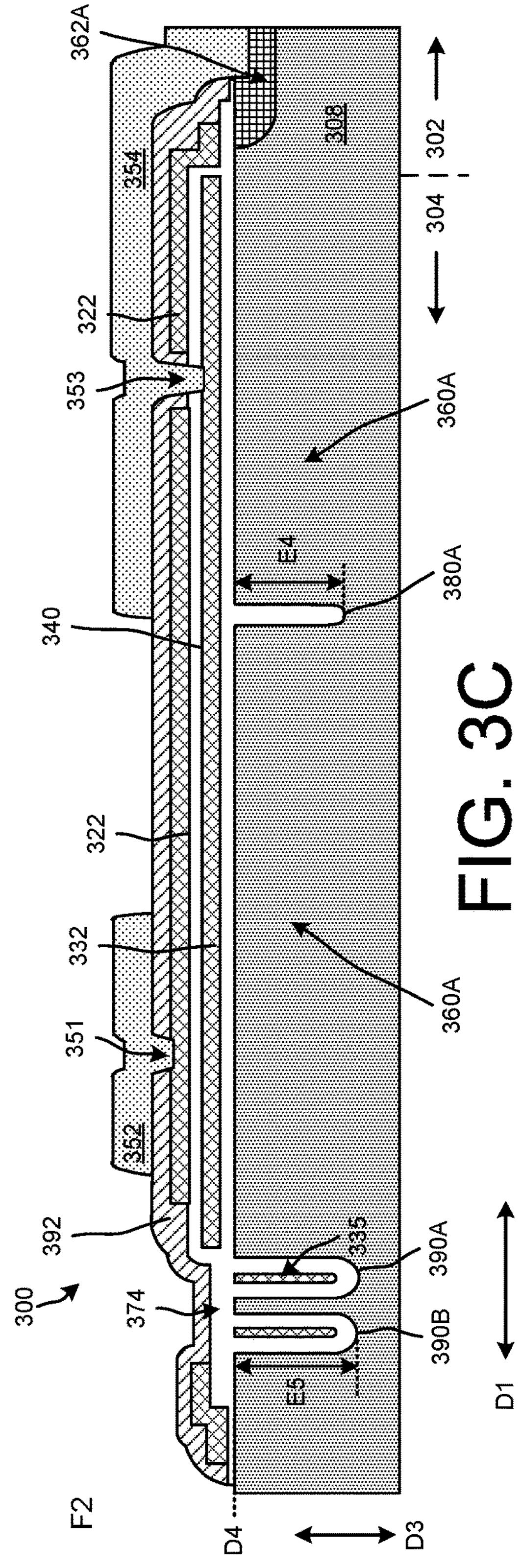

FIG. 3B is a diagram that illustrates a side cross-sectional view of the semiconductor device 300 cut along line F1. The cut line F1 is approximately along a centerline of the trench 310A so that the side cross-sectional view of the semiconductor device 300 is along a plane that approximately intersects a center of the trench 310A. A portion of the transverse trench 380A, which intersects the trench 310A, is shown in FIG. 3B. A side cross-sectional view of the transverse trench 380A cut along line F2, which is within the mesa region 360A between the trench 310A and the trench 310B, is shown in FIG. 3C. As shown in FIG. 3C, a well region 362A is formed (e.g., formed in a self-aligned fashion) in an area of the epitaxial layer 308 that is not blocked by the surface gate electrode 322 and the surface shield electrode 332. The features shown in FIG. 3B are disposed in an epitaxial layer 308 of the semiconductor device 300. Other portions of the substrate, drain contact, and/or so forth are not shown FIGS. 3A through 3I. Many of the views associated with other figures are disposed in an epitaxial layer and similarly do not show the substrate, drain contact, and so forth.

As shown in FIG. 3B, the trench 310A includes a dielectric 370A disposed therein. Specifically, a portion of the dielectric 370A is coupled to (e.g., lines, is disposed on) a sidewall and a portion of the dielectric 370A is coupled to a bottom surface of the trench 310A within the main trench portion 312A of the trench 310A. In this cross-sectional view the portion of the dielectric 370A coupled to the bottom surface of the trench 310A is shown, and the portion of the dielectric 370A coupled to the sidewall of the trench 310A is not shown. The portion of the dielectric 370A shown in FIG. 3B along the bottom surface of the main trench portion 312A of the trench 310A can be referred to as a bottom dielectric. The dielectric 370A can be coupled to, or can include, a field dielectric 374 (which can be referred to as a field dielectric portion).

As shown in FIG. 3B, a gate electrode 320A and a portion 331A of a shield electrode 330A are disposed in a portion of the main trench portion 312A that is included in the active region 302 of the semiconductor device 300. The gate electrode 320A and the shield electrode 330A are separated by at least a portion of the inter-electrode dielectric 340. The portion of the main trench portion 312A included in the termination region 304 has a portion 333A of the shield electrode 330A disposed therein and insulated from the epitaxial layer 308 by the dielectric 370A. The portion 333A of the shield electrode 330A can be referred to as a termination region portion of the shield electrode, and the portion 331A of the shield electrode 330A can be referred to as an active region portion of the shield electrode.

In this implementation, a surface shield electrode 332 is coupled to the shield electrode 330A, and a surface gate electrode 322 is coupled to the gate electrode 320A. The surface electrode 332 is insulated from the surface gate electrode 322 by at least a portion of the inter-electrode dielectric 340. A gate runner conductor 352 is coupled to the surface gate electrode 322 using a via 351. Similarly, a source runner conductor 354 (which is also coupled to a source) is coupled to the surface shield electrode 332 using a via 353 through an opening in the surface gate electrode 322.

As shown in FIG. 3A, an edge of the surface shield electrode 332 is disposed between the perimeter trenches 390A, 390B and an edge of the surface gate electrode 322. The surface gate electrode 322 has at least a portion disposed between at least a portion of the gate runner conductor 352 and the surface electrode 332. The surface gate electrode 322 also has at least a portion disposed between at least a portion of the source runner conductor 354 and the surface electrode 332. As shown in FIG. 3B, the surface electrode 332 and surface gate electrode 322 are disposed between at least a portion of a field dielectric 374 and an interlayer dielectric (ILD) 392.

Although not shown in FIGS. 3A through 3I, semiconductor device 300 can exclude the surface shield electrode 332 and/or the surface gate electrode 322. In other words, the semiconductor device 300 (or a portion thereof) can be configured without the surface electrode 332 and/or the surface gate electrode 322. More details related to such implementations are described below.

As shown in FIG. 3B, a portion 372A of the dielectric 370A (also referred to as an extension portion of the dielectric or as an extension dielectric) is included in the trench extension portion 314A. The portion 372A of the dielectric 370A is aligned along (e.g., extends in) a vertical direction D3 from a bottom of the trench extension portion 314A of the trench 310A to at least a top of the trench 310A. The top of the trench 310A (which includes the trench portion 314A and the main trench portion 312A) is aligned along a plane D4, which is aligned along a top surface of a semiconductor region of the semiconductor device 300. The semiconductor region of the semiconductor device 300 can correspond approximately with a top surface of the epitaxial layer 308. The dielectric 370A can include one or more dielectric layers and/or one or more dielectric types formed using one or more different formation processes.

As shown in FIG. 3B, a portion 371A of the dielectric 370A is included in the transverse trench 380A. The portion 371A of the dielectric 370A is aligned along (e.g., extends in) a vertical direction D3 from a bottom of the transverse trench 380A to at least a top of the transverse trench 380A. The top of the transverse trench 380A is aligned along the plane D4. The transverse trench 380A (and such similar transverse trenches in other implementations) can help to eliminate relatively high electric fields along the corner (bottom, left in FIG. 3B) of the shield electrode 330A.

The thickness of the dielectric 370A included in the trench 310A varies along the longitudinal axis D1 of the trench 310A. The portion 372A of the dielectric 370A included in the trench extension portion 314A has at least a thickness E1 in the trench extension portion 314A (also can be referred to as a height because it is aligned along the vertical axis D3)

that is greater than a thickness E2 of a portion of the dielectric 370A included in the main portion 312A (both in a termination region portion and in an active region portion) of the trench 310A. The thickness of the portion 372A of the dielectric 370A extends up to a bottom surface of a surface shield electrode 332 beyond the thickness E1. The thickness E1 corresponds approximately with a depth (along the vertical direction D3) of the trench extension portion 314A.

Also, the portion 371A of the dielectric 370A included in the transverse trench 380A has at least a thickness E4 (also can be referred to as a height) that is greater than the thickness E2 of a portion of the dielectric 370A included in the main portion 312A of the trench 310A and/or the thickness E1 of the portion 372A of the dielectric 370A included in the trench extension portion 314A. The thickness of the portion 371A of the dielectric 370A shown in FIG. 3B extends up to a bottom surface of a surface shield electrode 332 beyond the thickness E4. The thickness E4 corresponds approximately with a depth (along the vertical direction D3) of the transverse trench 380A. The depth (or height) of the transverse trench 380A is also illustrated within the mesa region 360A shown in FIG. 3C. Accordingly, a depth of the trench 310A varies along the longitudinal axis D1 from depth E3 to depth E1 through depth E4 of the transverse trench 380A.

Referring back to FIG. 3B, in this implementation, the trench extension portion 314A includes the portion 372A of the dielectric 370A and excludes a shield dielectric. Similarly, in this implementation, the transverse trench 380A includes the portion 371A of the dielectric 370A and excludes the shield dielectric 330A. Although not shown, a trench extension portion such as the trench extension portion 314A can include a portion of a shield dielectric (e.g., a portion of a shield dielectric, a recessed shield dielectric). Similarly, although not shown, a transverse trench such as the transverse trench 380A can include a portion of a shield dielectric (e.g., a portion of a shield dielectric, a recessed shield dielectric).

Although not shown in FIG. 3B, the thickness E2 of the portion of the dielectric 370A in the main portion 312A of the trench 310A can vary along the longitudinal axis D1. For example, a thickness of a portion of the dielectric 370A included in the termination region 304 of the main trench portion 312A can be greater than a thickness of a portion of the dielectric 370A included in the active region 302 of the main trench portion 312A, or vice versa. As shown in FIG. 3B, an equal potential ring or channel stopper 395 can be included in the semiconductor device 300.

In this implementation, the transverse trench 380A has a depth (which corresponds with E4) that is the same as, or approximately equal to, a depth (which corresponds with E3) of the main trench portion 312A and is greater than a depth (which corresponds with E1) of the trench extension portion 314A. Although not shown in FIGS. 3A through 3I, the transverse trench 380A can have a depth that is greater than a depth of the main trench portion 312A. Although not shown in FIGS. 3A through 3I, the transverse trench 380A can have a depth that is less than a depth of the main trench portion 312A and/or is less than a depth of the trench extension portion 314A. A depth (which corresponds with E3) of the main trench portion 312A can be the same as a depth (which corresponds with E1) of the trench extension portion 314A.

As shown in FIG. 3B, a length E16 of the trench extension portion 314A of the trench 310A is longer than a length E17 of a portion of the main trench portion 312A of the trench 310A included in the termination region 304 (up to the edge 341 of the gate dielectric portion 342 of the IED 340). Although not shown, the length E16 trench of extension portion 314A of the trench 310A can be equal to or shorter than the length E17 of the portion of the main trench portion 312A of the trench 310A included in the termination region 304.

The trench extension 314A (and trench extensions shown in other implementations) can eliminate a high electric field near the end of the trench 310A, thus increasing stability, reliability, and breakdown voltage of the semiconductor device 300 (and associated termination region 304). The trench extension 314A can also mitigate high lateral electric fields toward the end of the trench 310A (along direction D1 toward the left) and along the surface of the mesa 360A (shown in FIG. 3C) adjacent trench 310A. By maintaining breakdown in the active region 302, the on-resistance of the active region 302 can be minimized. The breakdown voltage, reliability during testing (e.g., unclamped inductive switching (UIS)), device performance, and/or so forth of the semiconductor device 300 can be maintained in the active region 302 using the trench extension 314A.

The thickness E2 of the portion 372A of the dielectric 370A included in the trench extension portion 314A is configured to have termination region advantages such as those described above. Specifically, an undesirable electric field or breakdown across the dielectric 370A included in the main trench portion 312A can be prevented or substantially prevented inclusion of the transverse trench 380A and/or the trench extension portion 314A within the semiconductor device 300. In other words, an undesirable electric field at the end of a trench (i.e., the main trench portion 312A without the transverse trench 380A and/or the trench extension portion 314A) or breakdown across a dielectric at the end of the trench could occur without features such as the transverse trench 380A and/or the trench extension portion 314A. The advantages described above can be applied to other transverse trenches described herein.

Referring back to FIG. 3A, perimeter trenches 390A, 390B are disposed around a perimeter of the plurality of trenches 310. As shown in FIG. 3B, the perimeter trenches 390A, 390B have a depth E5 that is approximately equal to a depth (e.g., distance E4) of the transverse trench 380A and a depth (e.g., distance E3) of the main trench portion 312A. The depth E5 of the perimeter trenches 390A, 390B is greater than a depth (e.g., distance E1) of the trench extension portion 314A. The depth of one or more of the perimeter trenches 390A, 390B can be less than or greater than the depth of the transverse trench 380A and/or the depth of the main trench portion 312A. The depth of one or more of the perimeter trenches 390A, 390B can be less than or equal to the depth of the trench extension portion 314A. The width of one or more of the perimeter trenches 390A, 390B can be approximately the same as or different than (e.g., narrower than, wider than) the width of the main trench portions 312 of the plurality of trenches 310. This description of the perimeter trenches above related to dimensions, electrodes, and/or numbers applies to all of the implementations described herein.

In this implementation, each of the perimeter trenches 390A, 390B includes at least a portion of a shield electrode. For example, the perimeter trench 390A includes a shield electrode 335 (or shield electrode portion). One or more of the perimeter trenches 390A, 390B can include a recessed electrode, or may not include a shield electrode (e.g., may exclude a shield electrode and can be substantially filled with a dielectric). The semiconductor device 300 can include more or less perimeter trenches than shown in FIGS. 3A through 3I.

Referring back to FIG. 3A, the trench extension portions 314 have widths that are less (e.g., narrower) than widths of the main trench portions 312. The widths of the trenches described herein can be measured across a cross-section of the trenches while being referenced along a horizontal plane through the trenches. The widths can be referred to as cross-sectional widths. As a specific example, the trench extension portion 314A of the trench 310A has a width E10 that is less than a width E11 of the main trench portion 312A of the trench 310A. This difference in width is also shown in, for example, trench 310E in the various views. Specifically, trench 310E shown in FIG. 3G (which is cut along line F6 through the trench extension portions 314 orthogonal to the plurality of trenches 310) has a width E8 that is smaller than a width E9 of the trench 310E shown in FIG. 3I (which is cut along line F8 through the main trench portions 312 orthogonal to the plurality of trenches 310). Although not shown in FIG. 3A, one or more of the trench extension portions 314 can have widths that equal to or are greater than the widths of one or more of the main trench portions 312.

Because the trench extension portions 314 are narrower than the main trench portions 312, the dielectric 370A, when formed (using one or more processes) in both the trench extension portions 314 and in the main trench portions 312 during semiconductor processing, can entirely fill (from a bottom of the trench to a top of the trench in a centerline of the trench) the trench extension portions 314 without entirely filling the main trench portions 312. Accordingly, the shield electrode 330A can be formed in the main trench portion 312A while not being formed in the trench extension portion 314A. Also, an advantage of the configuration shown in FIGS. 3A through 3I with the relatively narrow trench extension portions 314, the parallel trenches 310 can be etched using a single semiconductor process rather than etched using multiple semiconductor processes (to form the trench extension portions 314 separate from the main trench portions 312). More details related to the semiconductor processing are described below.

Although not shown in FIGS. 3A through 3I, the transverse trench 380A can be excluded from the semiconductor device 300. In such implementations, the narrowing trench widths of the plurality of trenches 310 with trench extension portions 314 can still be included in the semiconductor device 300. In such implementations, the transverse trench 380A would be excluded from the side cross-sectional views shown in FIGS. 3C and 3D. Accordingly, the mesa region 360A would be continuous along the top surface of the epitaxial layer 308 between the perimeter trench 390A and the well region 362 within the active region 302.

Figure 3D:
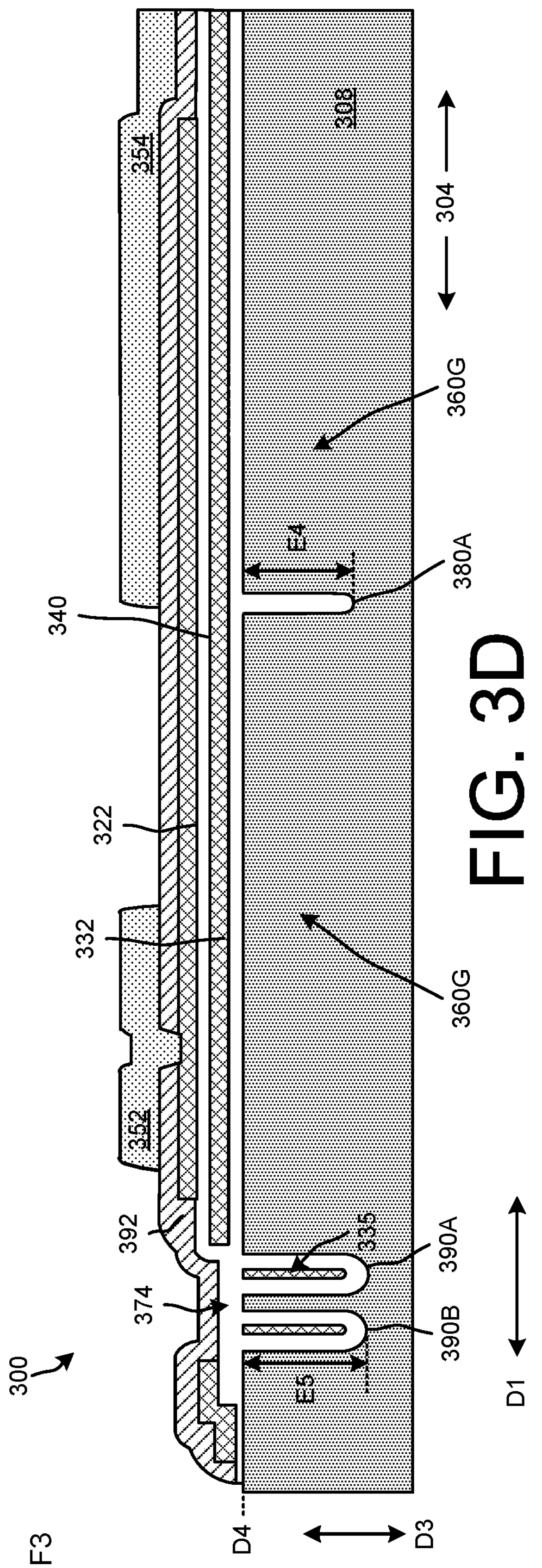

FIG. 3D is a side cross-sectional view of a mesa region 360G adjacent to trench 310G (which includes dielectric 370G) cut along line F3. In this implementation, the mesa region 360G is entirely disposed within the termination region 304. As shown in FIG. 3D, the source runner conductor 354 is not contacted with (e.g., is insulated from, is not electrically coupled to) the surface shield electrode 332.

Figure 3E:
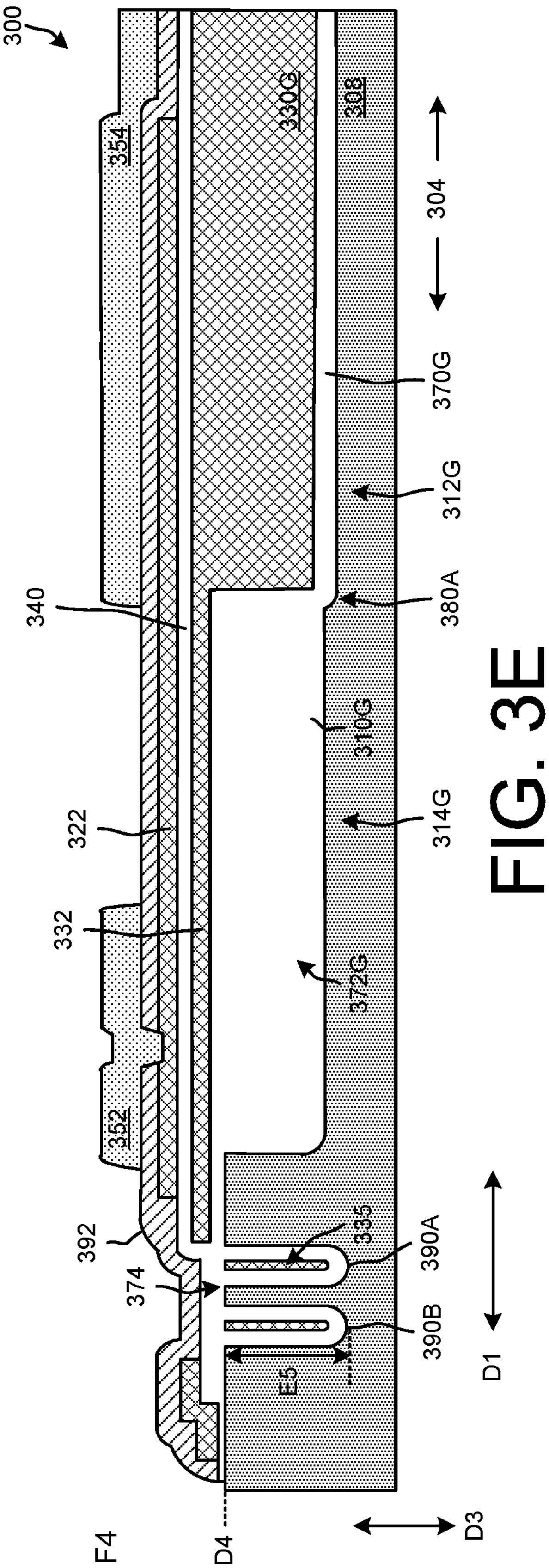

FIG. 3E is a side cross-sectional view of the trench 310G, which is cut along line F4 shown in FIG. 3A. In this implementation, the trench 310G is entirely disposed within the termination region 304. Trench 310G, and other trenches entirely disposed within the termination region 304, can be referred to as termination trenches 318. The dimension of the trench 310G is similar to the dimensions of (e.g., dimensions that are directly lateral to) the trench 310A shown in FIG. 3B. In some implementations, the dimensions of the trench 310G (which includes extension dielectric 372G) can be different than corresponding portions of the trench 310A shown in FIG. 3B. For example, the trench 310G can have a constant depth, which can be the same as or different than (e.g., deeper than, shallower than) the depth E1 of the trench extension portion 314A (shown in FIG. 3B) or the same as or different than (e.g., deeper than, shallower than) the depth E3 of the main trench portion 312A.

As shown in FIG. 3E, the source runner conductor 354 is not contacted with (e.g., is insulated from, is not electrically coupled to) the surface shield electrode 332 or the shield electrode 330G. The shield electrode 330G disposed within the trench 310G can be electrically floating. The shield electrode 330G disposed within the trench 310G can be electrically coupled to a source potential. Accordingly, the shield electrode 330G can be tied to the same source potential as the shield electrode 330A shown in FIG. 3B. The shield electrode 330G disposed within the trench 310G can be recessed.

Figure 3F:
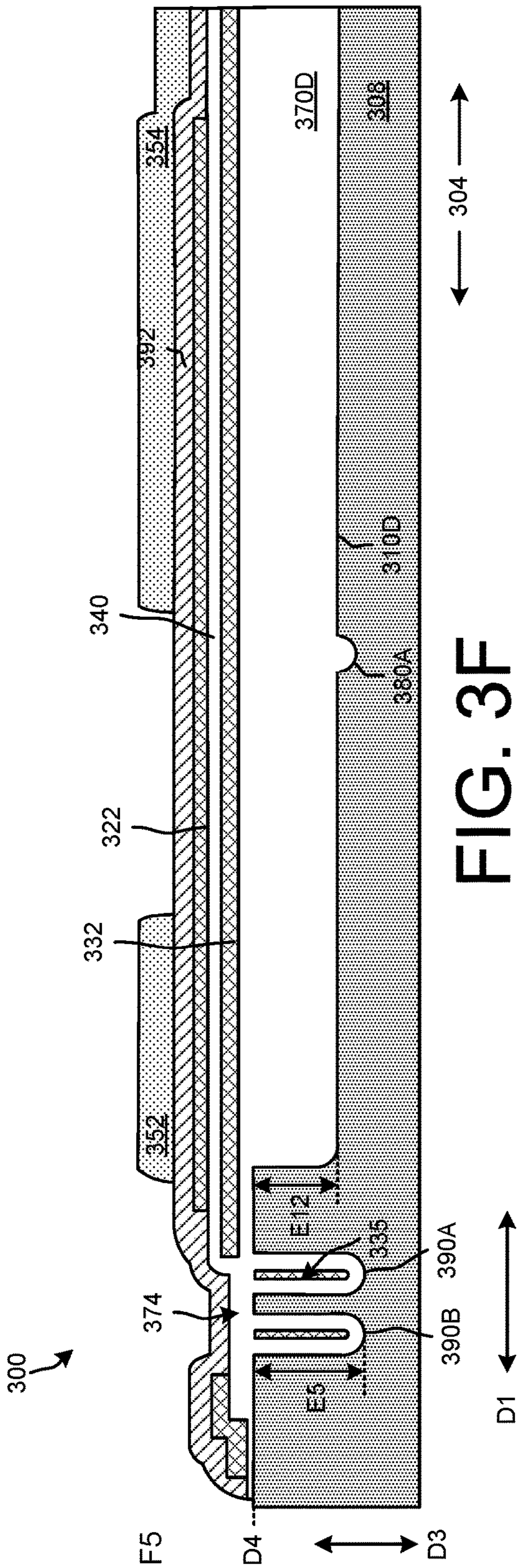

FIG. 3F is a side cross-sectional view of the end trench 310D, which is cut along line F5 shown in FIG. 3A. The end trench 310D has a dielectric 370D disposed therein (e.g., and filling the end trench 310D). Although not shown, in some implementations, at least a portion of the end trench 310D can include a shield electrode. The end trench 310D can have a length (along the longitudinal direction D1) that is approximately the same as a length of, for example, the trench 310A.

As shown in FIG. 3A, the transverse trench 380A terminates at the end trench 310D. The transverse trench 380A can terminate at a trench other than the end trench 310D such as one of the interior trenches 317 from the plurality of trenches 310.

Referring back to FIG. 3F, the end trench 310D has a depth E12 less than a depth E5 of the perimeter trenches 390A, 390B. The end trench 310D can have a depth E12 equal to, or greater than a depth of one or more of the perimeter trenches 390A, 390B. In this implementation, the depth E12 of the end trench 310D is approximately equal to a depth (e.g., distance E1) of the trench extension portion 314A (shown in FIG. 3B). The end trench 310D can have a depth E12 that is less than or greater than a depth (e.g., distance E1) of the trench extension portion 314A (shown in FIG. 3B). The end trench 310D can have a depth that varies, similar to the variation in depth of trench 310A.

In FIG. 3F, a bottom surface of the transverse trench 380A extends from (or protrudes from) a bottom surface of the end trench 310D. In other words, the end trench 310D has a recess that corresponds with the transverse trench 380A because the depth E12 of the end trench 310D is shallower than the depth E4 of the transverse trench 380A.

Although not shown, in some implementations, multiple trenches (e.g., multiple end trenches) similar to end trench 310D, which are filled with (e.g., substantially filled with, from a bottom of the end trench 310D to a top of the end trench 310D along the centerline E25 of the end trench 310D) a dielectric can be included in the semiconductor device 300. An example of such an implementation is described in connection with FIGS. 4A through 4E. Although not shown, in some implementations, a trench that varies with width and has a portion that includes a shield dielectric, such as trench 310C can be an end trench. In such implementations, the end trench 310D can be omitted.

As mentioned above, FIG. 3G is cut along line F6 (shown in FIG. 3A) through the trench extension portions 314 orthogonal to the plurality of trenches 310. As shown in FIG.

3G the end trench 310D has a width E13 that is approximately equal to the width E8 of the trench extension portion of trench 310E. The end trench 310D can have a width that is greater than, or less than, the width E8 of the trench extension portion of trench 310E.

A pitch E14 between the end trench 310D and trench 310C (which are adjacent trenches) is less than a pitch E15 between trench 310E and trench 310F (which are adjacent trenches). The pitch E14 between the end trench 310D and trench 310C can be the same as, or greater than, the pitch E15 between trench 310E and trench 310F.

Figure 3G:
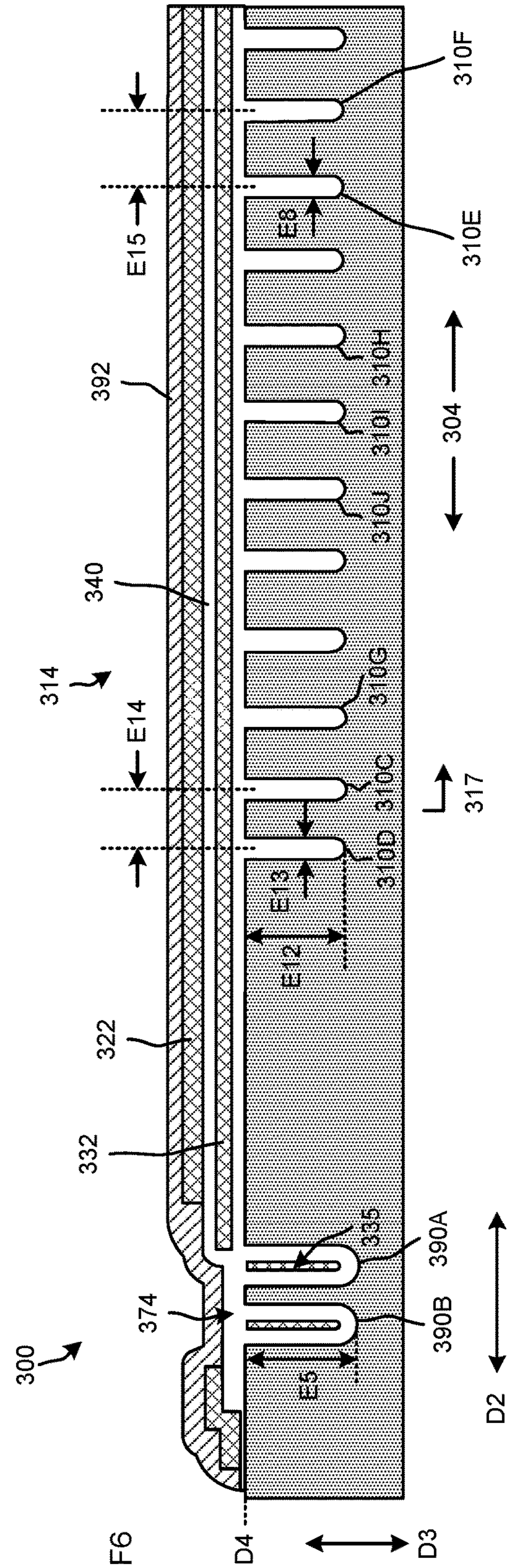
Figure 3H:
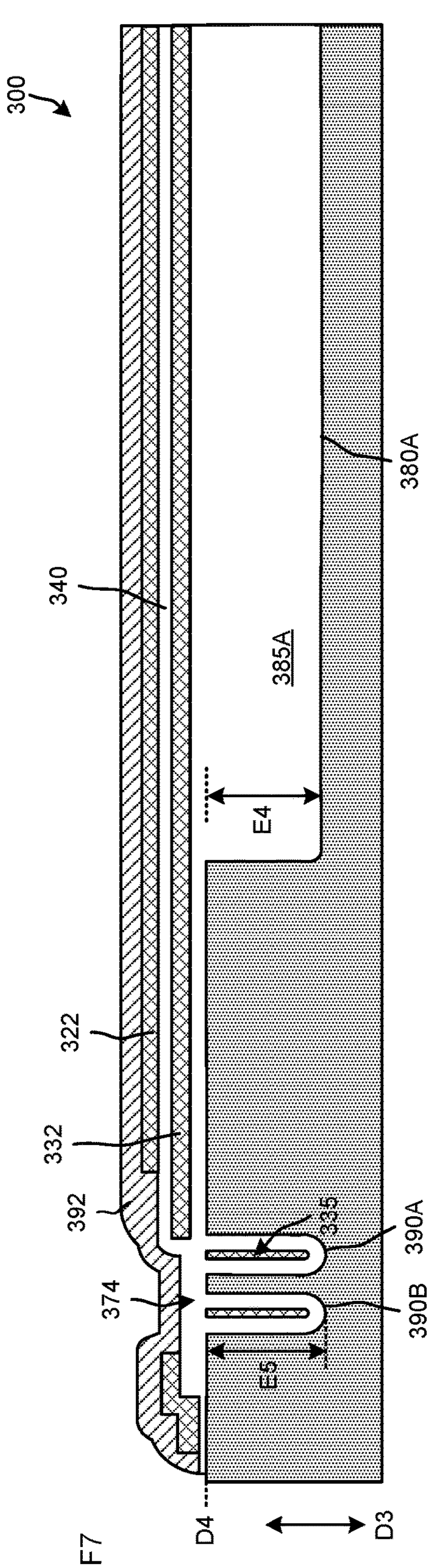

FIG. 3H is a side cross-sectional view of the transverse trench 380A, which is cut along line F7 shown in FIG. 3A. The line F7 is approximately along a centerline of the transverse trench 380A. The transverse trench 380A is filled with (e.g., substantially filled with) a dielectric 385A. Although not shown, in some implementations, at least a portion of the transverse trench 380A can include a shield electrode. In this implementation, the transverse trench 380A has a constant depth E4. The transverse trench 380A can have a depth that varies along the longitudinal axis D2.

Figure 3I:
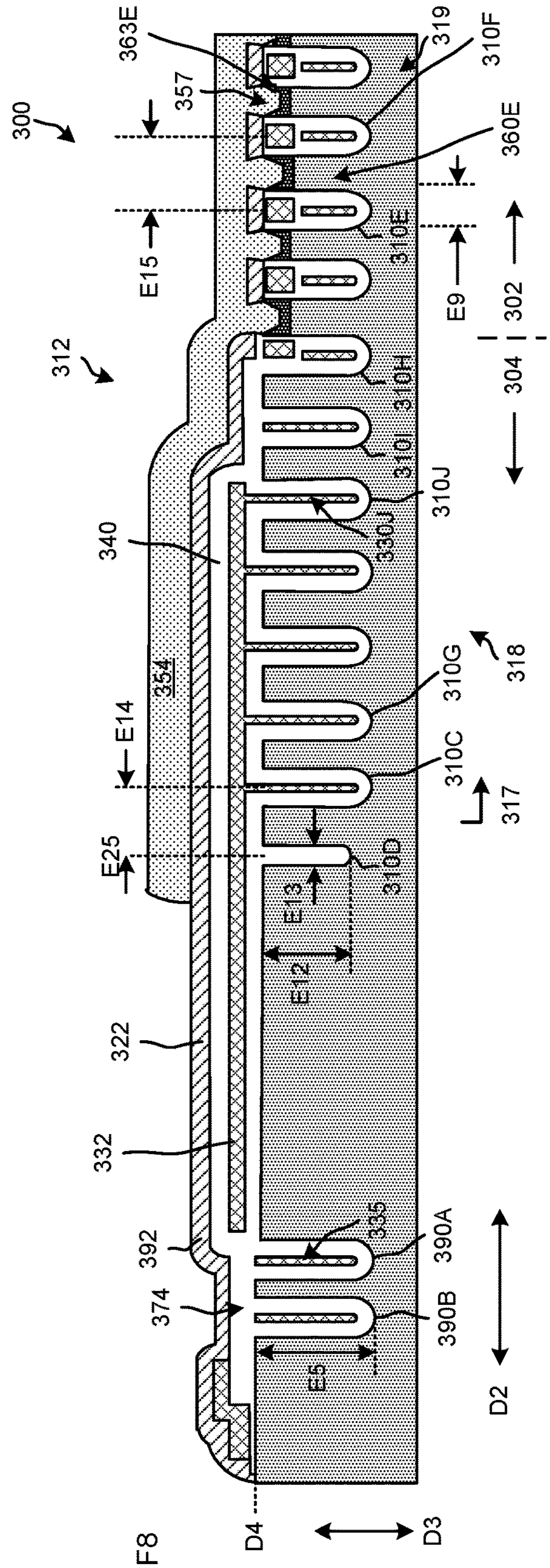

FIG. 3I is a side cross-sectional view of the main trench portions 312 of the plurality of trenches 310 cut along line F8 shown in FIG. 3A. A portion of the cross-sectional view of the plurality of trenches 310 is included in the termination region 304 and a portion of the cross-sectional view of the plurality of trenches 310 is included in the active region 302.

Because the width of the end trench 310D is substantially constant along the longitudinal axis D1 in this implementation, the width E13 of the end trench 310D (shown in FIG. 3I) is the same along cut line F8 as along cut line F6 (shown in FIG. 3G). In contrast, the width of at least some of the trenches such as, for example, trench 310C and trench 310E varies along the longitudinal axis D1. Specifically, the width E9 of the trench 310E (shown in FIG. 3I) is greater than the width E8 of the trench 310E (shown in FIG. 3G). Even though the width of the trench 310C varies, the pitch E14 between the end trench 310D and the trench 310C is substantially constant.

As shown in FIG. 3I, the trenches from the plurality of trenches 310 that include source implants therebetween can be referred to as active device trenches 319. As shown in FIG. 3I, the leftmost active device trench 310H includes a gate electrode with a width that is smaller than a gate electrode included in the remaining active device trenches 319. The trench 310H can be referred to as a partially active gate trench because a source implant is in contact with only one side of the trench 310H.

As noted above, the trenches (such as some of the trenches that are shown in FIG. 3I) that are entirely disposed within the termination region 304 can be referred to as termination trenches 318. Trench 310I is a termination trench that includes a shield electrode.

As shown in FIG. 3I, at least a portion of the termination trenches from the plurality of trenches 310 include a shield electrode. In some implementations, at least a portion of the termination trenches 318 can have a shield electrode that extends above a top portion of the trench. For example, trench 310J includes shield electrode 330J (or shield electrode portion) that extends to a distance above a top portion of the trench 310J aligned within the plane D4. The shield electrode 330J can extend to a depth that is the same as or different than (e.g., deeper than, shallower than) the depth E12 of, for example, the end trench 310D.

The termination trenches 318 (or portions thereof) that include a shield electrode can be referred to as shielded termination trenches. In some implementations, one or more of the shield electrodes included in one or more of the termination trenches 318 can be electrically floating (e.g., may not be coupled to a potential source) or can be coupled to a gate (e.g., a gate potential).

The directions D1, D2, and D3, and plane D4 are used throughout the various views below for simplicity. Also, for simplicity, not all elements are labeled in each of the figures or views.

FIGS. 4A through 4D are diagrams that illustrate variations on at least some of the features of on the semiconductor device 300 shown in FIGS. 3A through 3I. Accordingly, the reference numerals and features included in FIGS. 3A through 3I are generally maintained and some features are not described again in connection with FIGS. 4A through 4D. Additional end trenches (trenches 310X, 310Y, 310Z) similar to the end trench 310D are included in the semiconductor device 300 and are shown in FIGS. 4A through 4D. End trenches 310X, 310Y, 310Z, to further shield trench 310C from drain potential and reduce capacitance between surface shield electrode 332 and a drain (e.g., a back-side drain, the epitaxial layer 308). Specifically, each of the end trenches 313 can have a structure and dimensions similar to the end trench 310D (which is a side cross-sectional view cut along line H5) shown in FIG. 4B.

Figure 4A:
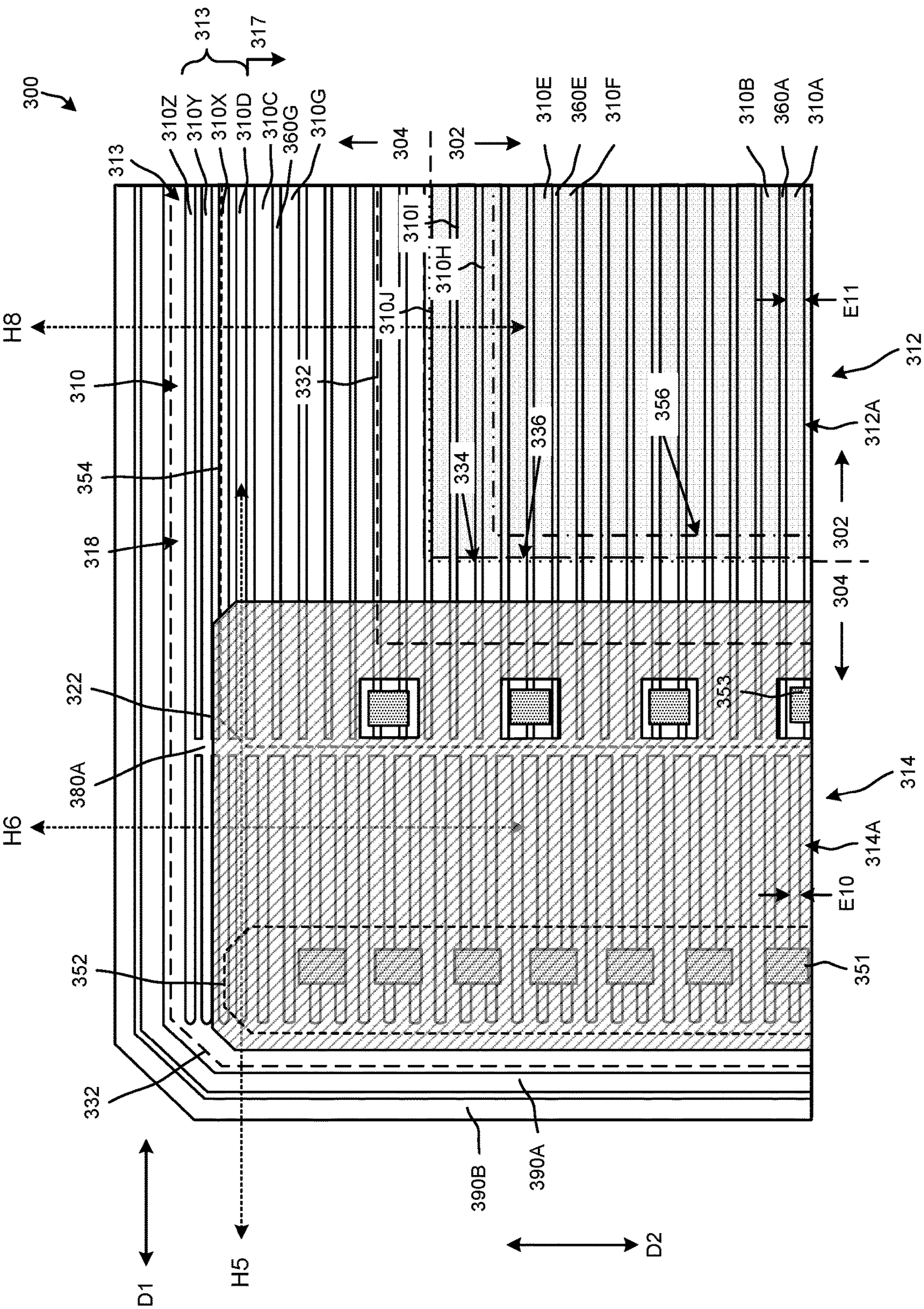
FIGS. 4A through 4D are diagrams that illustrate variations on at least some of the features of the semiconductor device shown in FIGS. 3A through 3I.
Figure 4B:
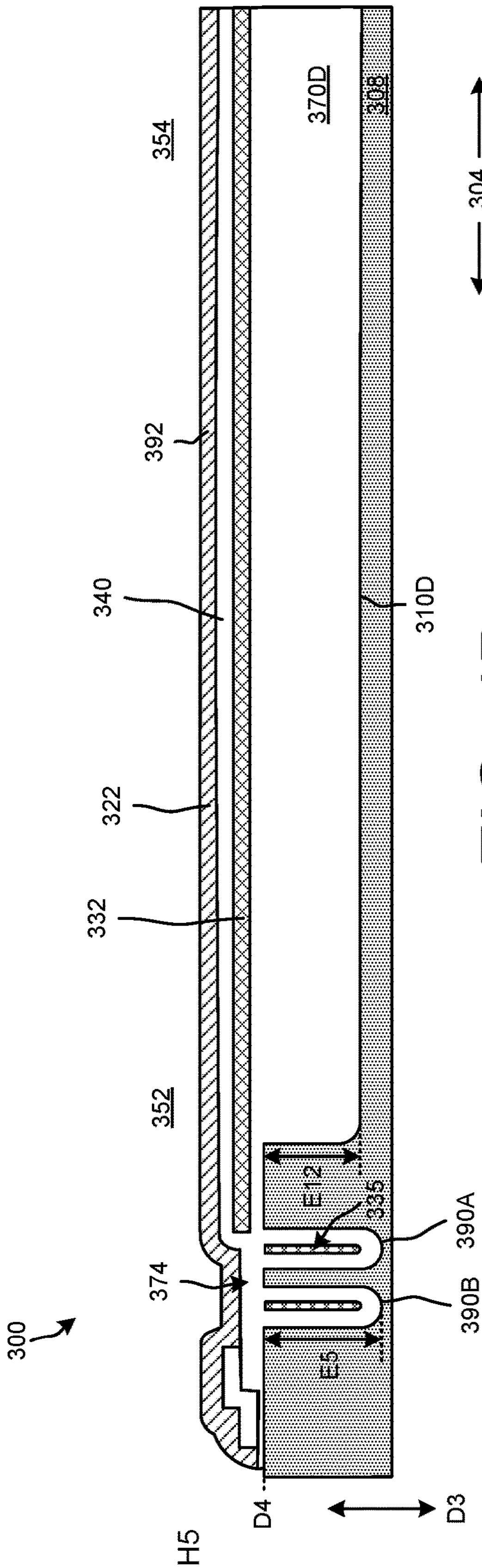

As shown in FIG. 4A, the transverse trench 380A intersects all of the end trenches 313, and terminates within the outermost end trench 310Z. The transverse trench 380A can intersect less than all of the end trenches 313. The transverse trench 380A can terminate within one of the end trenches 313 disposed between two other end trenches 313. The transverse trench 380A can terminate within the innermost end trench 310D.

Figure 4C:
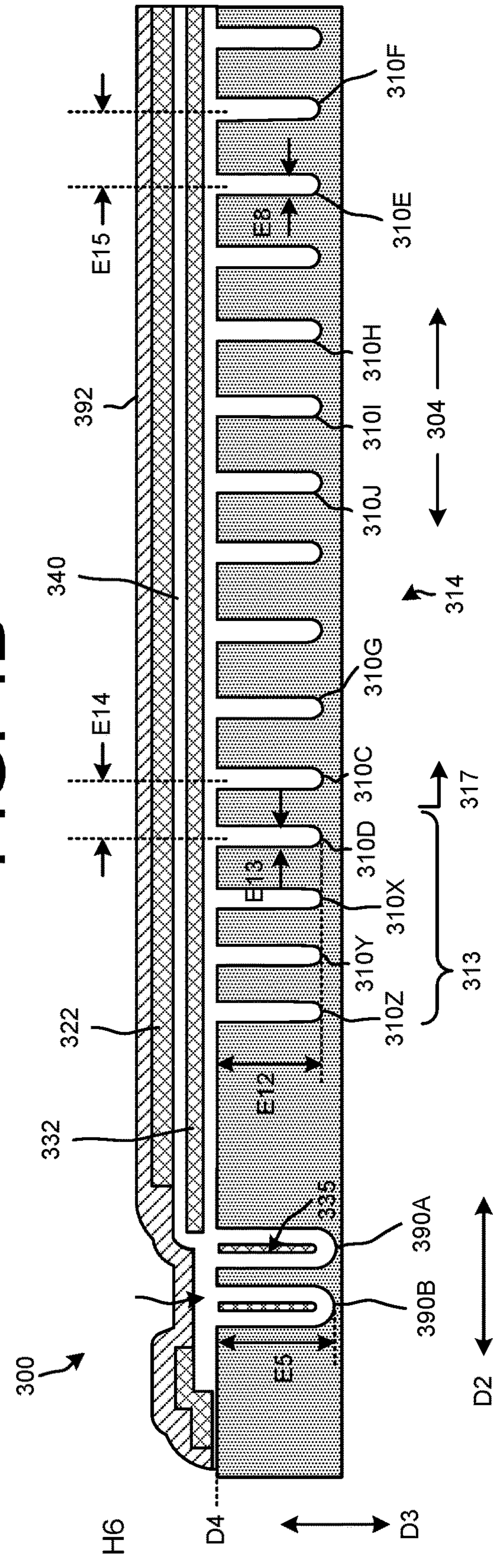

FIG. 4C is a diagram that illustrates the end trenches 313 cut along line H6. As shown in FIG. 4C, each of the end trenches 313 has the same depth shown as E12. Also each of the end trenches 313 has an equal cross-sectional width of E13. In some implementations, one or more of the end trenches 313 can have a different depth (e.g., a deeper depth, a shallower depth) and/or a different width (e.g., a greater width, and narrower width) than one or more of the other end trenches 313. Also, as shown in FIG. 4C, the end trenches 313 are each separated by the same pitch E14, which is less than the pitch E15 (of the remainder of the plurality of trenches 310 or the interior trenches 317). The pitch between the end trenches can be greater than that shown in FIG. 4C (e.g., equal to or greater than the pitch E15), or less than that shown in FIG. 4C.

Figure 4D:
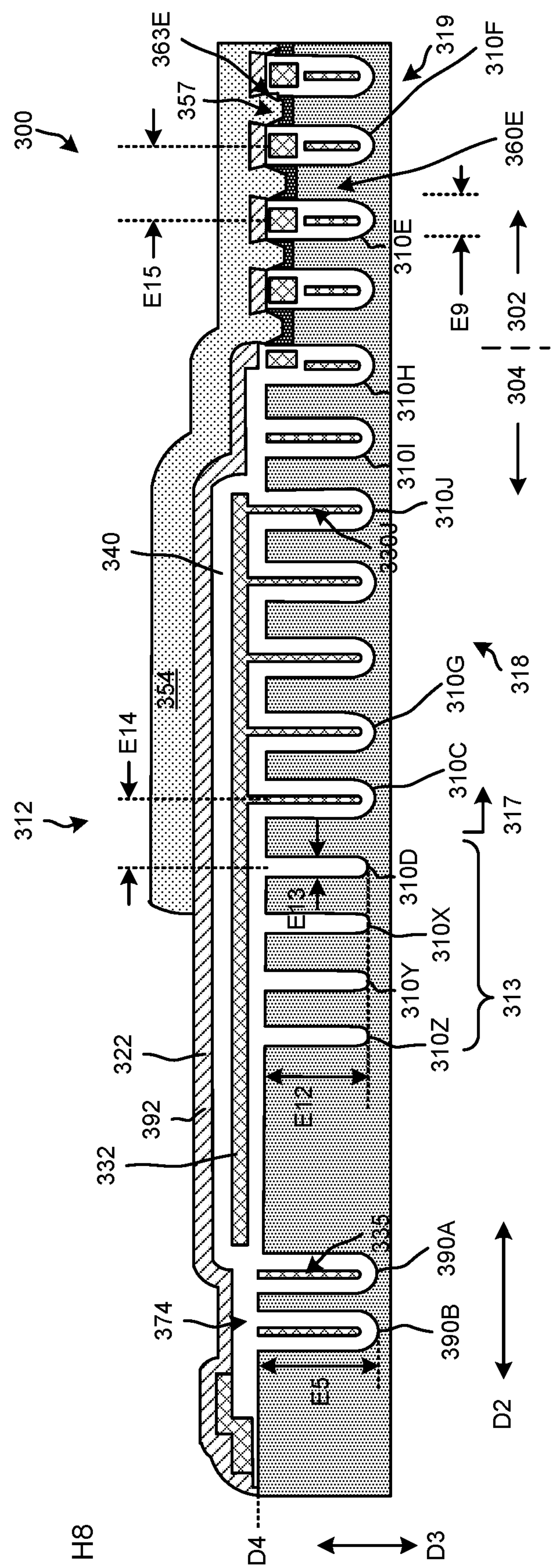

FIG. 4D is a side cross-sectional view of the main trench portions 312 of the plurality of trenches 310 cut along line H8 shown in FIG. 4A. A portion of the cross-sectional view of the plurality of trenches 310 is included in the termination region 304 and a portion of the cross-sectional view of the plurality of trenches 310 is included in the active region 302.

Because the width of the end trenches 313 (i.e., end trenches 310X, 310Y, 310Z, 310D) is substantially constant along the longitudinal axis D1 in this implementation, the widths of the end trenches 313 is the same along cut line H8 as along cut line H6 (shown in FIG. 4C).

In some implementations, one or more of the end trenches 313 can include at least a portion of a shield electrode (e.g., a floating shield electrode). For example, end trench 310X can include at least a portion of a shield electrode coupled to, for example, the surface shield electrode 332.

Figure 5A:
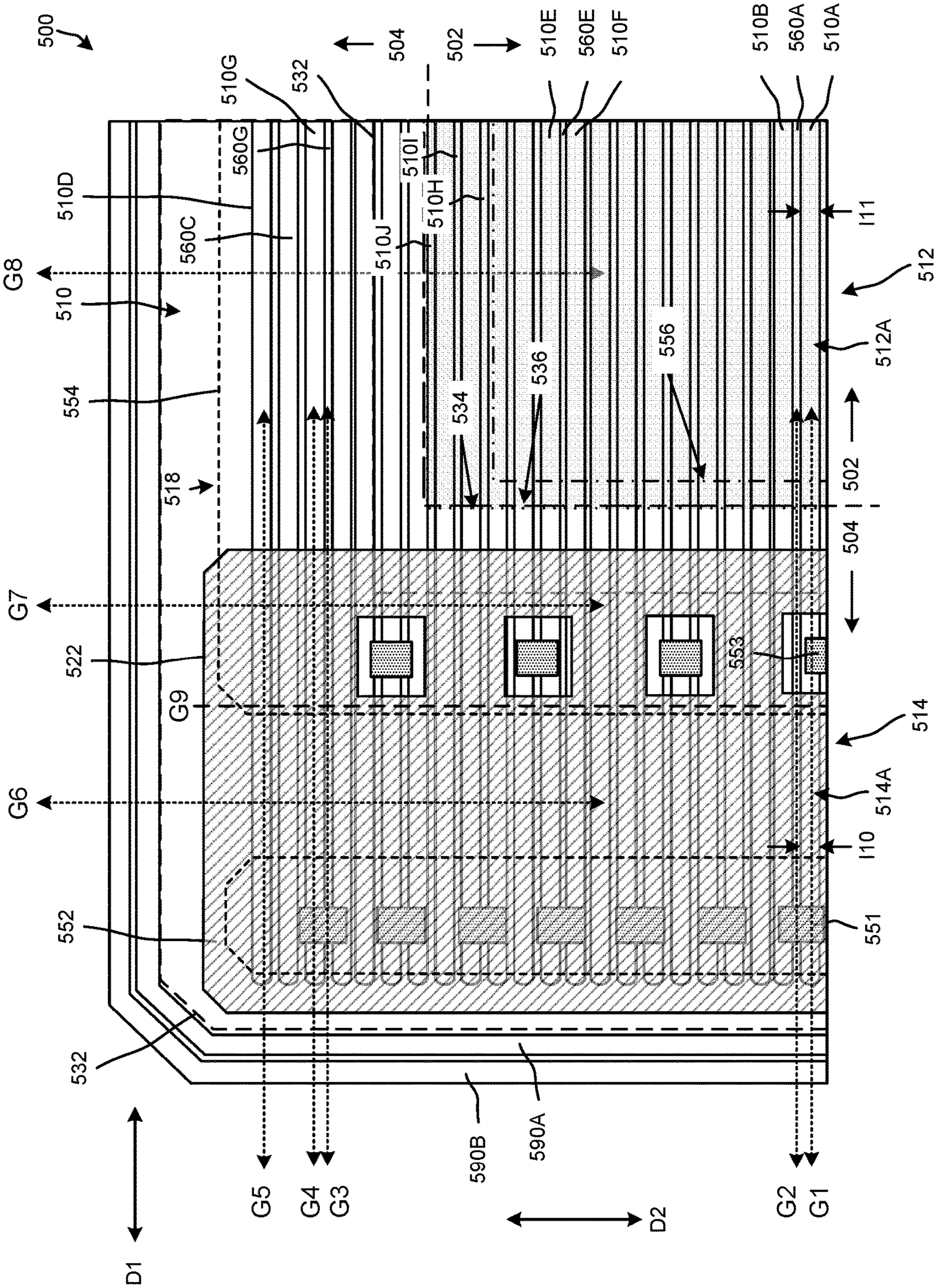
FIGS. 5A through 5I are diagrams that illustrate configurations of another termination region according to some implementations.

FIGS. 5A through 5I are diagrams that illustrate configurations of another termination region according to some implementations. FIG. 5A is a diagram that illustrates a plan view (or top view along a horizontal plane) of at least a portion of a semiconductor device 500 including an active region 502 and a termination region 504. FIGS. 5B through 5I are side cross-sectional views along different cuts (e.g., cuts G1 through G8) within the plan view FIG. 5A. To simplify the plan view shown in FIG. 5A some of the elements illustrated in the side cross-sectional views of FIGS. 5B through 5I are not shown. The side cross-sectional views along the different cuts included in FIGS. 5B through 5I are not necessarily drawn to the same scale (e.g., number of trenches, etc.) as the plan view shown in FIG. 5A.

As shown in FIG. 5A, a plurality of trenches 510 (or parallel trenches), including for example trenches 510A through 510J, are aligned along a longitudinal axis D1 within the semiconductor device 500. At least some portions of the plurality of trenches 510 can be included in the active region 502 and at least some portions of the plurality of trenches 510 can be included in the termination region 504.

In this implementation, the trench 510D is entirely disposed within the termination region 504 and is the outermost trench from the plurality of trenches 510. Accordingly, the trench 510D can be referred to as an end trench. Trenches from the plurality of trenches 510 in the semiconductor device 500 that are lateral to (or interior to) the end trench 510D can be referred to as interior trenches 517.

As shown in FIG. 5A, the active region 502 is defined by an area of the semiconductor device 500 that corresponds with at least one of a source contact region 536 (e.g., a source contact region 536) or a shield dielectric edge region 534. The source contact region 536 defines an area within the semiconductor device 500 where source contacts (such as source contact 557 shown in FIG. 5I) are formed. The source contact region 536 can also correspond with, for example, a source conductor region (e.g., a source metal region). The source contacts can be contacted with source implants (such as source implant 563E within a mesa region 560E between trenches 510E and 510F shown in FIG. 5I) of one or more active devices. A source formation region 556 (which can be referred to as a source exclusion edge) defines an area within which mesa regions between the plurality of trenches 510 are doped as doped source regions of active devices.

Figure 5B:
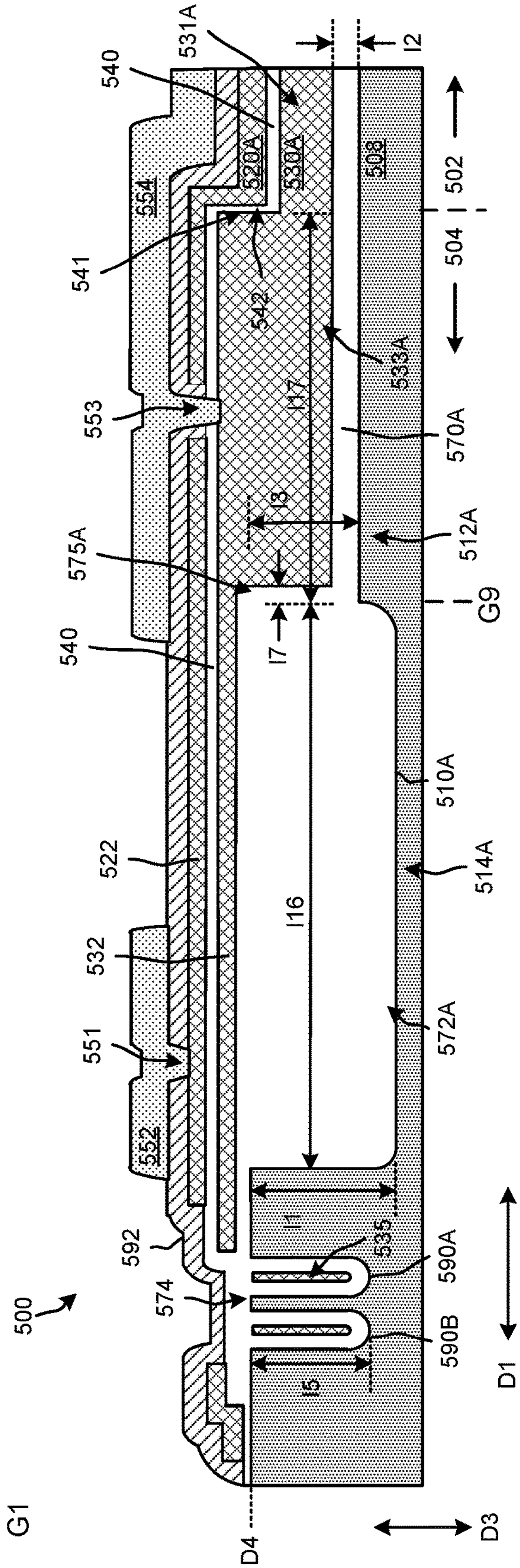

The shield dielectric edge region 534 shown in FIG. 5A corresponds with (e.g., approximately corresponds with), for example, an edge 541 of the inter-electrode dielectric 540 shown in FIG. 5B (which is a side cross-sectional view cut along line G1). In some implementations, at least a portion of the inter-electrode dielectric 540 can include a gate dielectric such as gate dielectric portion 542 shown in FIG. 5B.

As shown in FIG. 5A, the termination region 504 includes areas of the semiconductor device 500 outside of (e.g., excluded by) the active region 502. Accordingly, the termination region 504, similar to the active region 502, is defined by at least one of the source contact region 536 or the shield dielectric edge region 534.

Although not shown in FIG. 5A, one or more transverse trenches, similar to transverse trench 380A shown in FIGS. 3A through 3I, can be included in the semiconductor device 500. In such implementations, the transverse trench(es) can intersect in an orthogonal direction, the plurality of trenches 510 and can be disposed within the termination region 504. In such implementations, the transverse trench would be included in the side cross-sectional views shown in, for example, FIGS. 5C and 5D.

In this implementation, portions of the plurality of trenches 510 that are interior trenches 517 and disposed to the left of line G9 can be referred to as trench extension portions 514. Portions of the plurality of trenches 510 that are interior trenches 517 and that are disposed to the right of line and extend into (or toward) the active region 502 can be referred to as main trench portions 512. For example, trench 510A includes a trench extension portion 514A on the left side of line G9 (toward the perimeter and in a distal direction away from the active region 502) and the trench 510A includes a main trench portion 512A (also similarly shown as 512G in FIG. 5E) on the right side of line G9 (away from the perimeter and in a proximal direction toward the active region 502). In this implementation, at least a portion of the main trench portion 512A is included in (e.g., disposed within) the termination region 504, and a portion of the main trench portion 512A is included in (e.g., disposed within) the active region 502. In this implementation, the trench extension portions 514 can define recesses (when viewed in a side cross-sectional view).

Figure 5C:
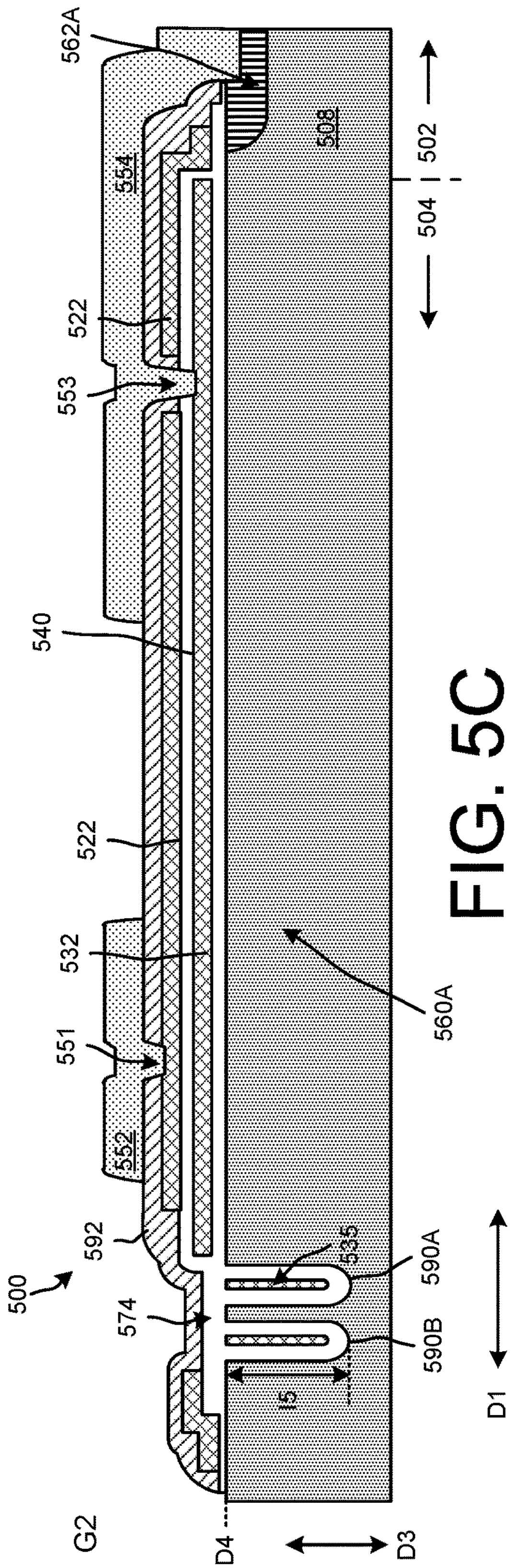

FIG. 5B is a diagram that illustrates a side cross-sectional view of the semiconductor device 500 cut along line G1. The cut line G1 is approximately along a centerline of the trench 510A so that the side cross-sectional view of the semiconductor device 500 is along a plane that approximately intersects a center of the trench 510A. A side cross-sectional view of the mesa region 560A between the trench 510A and the trench 510B, is shown in FIG. 5C. As shown in FIG. 5C, a well region 562A is formed in an area of the epitaxial layer 508 that is blocked by the surface gate electrode 522 and the surface shield electrode 532. The features shown in FIG. 5B are disposed in an epitaxial layer 508 of the semiconductor device 500.

As shown in FIG. 5B, the trench 510A includes a dielectric 570A disposed therein. Specifically, a portion of the dielectric 570A is coupled to (e.g., lines, is disposed on) a sidewall and a portion of the dielectric 570A is coupled to a bottom surface of the trench 510A within the main trench portion 512A of the trench 510A. In this cross-sectional view the portion of the dielectric 570A coupled to the bottom surface of the trench 510A is shown, and the portion of the dielectric 570A coupled to the sidewall of the trench 510A is not shown. The portion of the dielectric 570A shown in FIG. 5B along the bottom surface of the main trench portion 512A of the trench 510A can be referred to as a bottom dielectric. The dielectric 570A can be coupled to, or can include, a field dielectric 574 (which can be referred to as a field dielectric portion).

As shown in FIG. 5B, a gate electrode 520A and a portion 531A of a shield electrode 530A are disposed in a portion of the main trench portion 512A that is included in the active region 502 of the semiconductor device 500. The gate electrode 520A and the shield electrode 530A are separated by at least a portion of the inter-electrode dielectric 540. The portion of the main trench portion 512A included in the termination region 504 has a portion 533A of the shield electrode 530A disposed therein and insulated from the epitaxial layer 508 by the dielectric 570A. The portion 533A of the shield electrode 530A can be referred to as a termination region portion of the shield electrode, and the portion 531A of the shield electrode 530A can be referred to as an active region portion of the shield electrode.

In this implementation, a surface shield electrode 532 is coupled to the shield electrode 530A, and a surface gate electrode 522 is coupled to the gate electrode 520A. The surface electrode 532 is insulated from the surface gate electrode 522 by at least a portion of the inter-electrode dielectric 540. A gate runner conductor 552 is coupled to the surface gate electrode 522 using a via 551. Similarly, a source runner conductor 554 (which is also coupled to a source) is coupled to the surface shield electrode 532 using a via 553 through an opening in the surface gate electrode 522.

Although not shown in FIGS. 5A through 5I, semiconductor device 500 can exclude the surface shield electrode 532 and/or the surface gate electrode 522. In other words, the semiconductor device 500 (or a portion thereof) can be configured without the surface electrode 532 and/or the surface gate electrode 522. More details related to such implementations are described below.

As shown in FIG. 5B, a portion 572A of the dielectric 570A (also referred to as an extension portion of the dielectric or as an extension dielectric) is included in the trench extension portion 514A. The portion 572A (similarly shown in FIG. 5E as 572G) of the dielectric 570A is aligned along (e.g., extends in) a vertical direction D3 from a bottom of the trench extension portion 514A of the trench 510A to at least a top of the trench 510A. The top of the trench 510A (which includes the trench portion 514A and the main trench portion 512A) is aligned along a plane D4, which is aligned along a top surface of a semiconductor region of the semiconductor device 500. The dielectric 570A can include one or more dielectric layers and/or one or more dielectric types formed using one or more different formation processes.

The thickness of the dielectric 570A included in the trench 510A varies along the longitudinal axis D1 of the trench 510A. The portion 572A of the dielectric 570A included in the trench extension portion 514A has at least a thickness I1 in the trench extension portion 514A (also can be referred to as a height because it is aligned along the vertical axis D3) that is greater than a thickness I2 of a portion of the dielectric 570A included in the main portion 512A (both in a termination region portion and in an active region portion) of the trench 510A. The thickness of the portion 572A of the dielectric 570A extends up to a bottom surface of a surface shield electrode 532 beyond the thickness I1. The thickness I1 corresponds approximately with a depth (along the vertical direction D3) of the trench extension portion 514A. The thickness of the portion 572A can help to eliminate relatively high lateral and/or vertical electric fields at the end (toward the left end) of the trench 510A.

Referring back to FIG. 5B, in this implementation, the trench extension portion 514A includes the portion 572A of the dielectric 570A and excludes a shield electrode. Although not shown, in some implementations, a trench extension portion such as the trench extension portion 514A can include a portion of a shield electrode (e.g., a portion of a shield electrode, a recessed shield electrode).

Although not shown in FIG. 5B, the thickness I2 of the portion of the dielectric 570A in the main portion 512A of the trench 510A can vary along the longitudinal axis D1. For example, a thickness of a portion of the dielectric 570A included in the termination region 504 of the main trench portion 512A can be greater than a thickness of a portion of the dielectric 570A included in the active region 502 of the main trench portion 512A, or vice versa.

If including a transverse trench, the transverse trench can have a depth that is the same as, or different than (e.g., greater than, less than) a depth (which corresponds with I3) of the main trench portion 512A and/or a depth (which corresponds with I1) of the trench extension portion 514A. In some implementations, a depth (which corresponds with I3) of the main trench portion 512A can be the same as a depth (which corresponds with I1) of the trench extension portion 514A.

As shown in FIG. 5B, a length I16 of the trench extension portion 514A of the trench 510A is longer than a length I17 of a portion of the main trench portion 512A of the trench 510A included in the termination region 504. Although not shown, the length I16 of trench extension portion 514A of the trench 510A can be equal to or shorter than the length I17 of the portion of the main trench portion 512A of the trench 510A included in the termination region 504. As shown in FIG. 5B, the main trench portion 512A can include a portion 575A of the dielectric 570A that is in contact with the portion 572A of the dielectric 570A and has a thickness I7. The thickness I7 can be approximately equal to or different than (e.g., greater than, less than) the thickness I2.

The thickness I2 of the portion 572A of the dielectric 570A included in the trench extension portion 514A is configured to have termination region advantages such as those described above. Specifically, an undesirable electric field or breakdown across the dielectric 570A included in the main trench portion 512A can be prevented or substantially prevented inclusion of the trench extension portion 514A (and/or a transverse trench (not shown)) within the semiconductor device 500.

Referring back to FIG. 5A, perimeter trenches 590A, 590B are disposed around a perimeter of the plurality of trenches 510. As shown in FIG. 5B, the perimeter trenches 590A, 590B have a depth I5 that is approximately equal to a depth (e.g., distance I3) of the main trench portion 512A. At least trench 590B includes an electrode 535. The depth I5 of the perimeter trenches 590A, 590B is less than a depth (e.g., distance I1) of the trench extension portion 514A. The depth of one or more of the perimeter trenches 590A, 590B can be less than or greater than the depth of the main trench portion 512A. The width of one or more of the perimeter trenches 590A, 590B can be approximately the same as or different than (e.g., narrower than, wider than) the width of the main trench portions 512 and/or the extension portions 514 of the plurality of trenches 510.

Referring back to FIG. 5A, the trench extension portions 514 have widths that are the same as the widths of the main trench portions 512. As a specific example, the trench extension portion 514A of the trench 510A has a width I10 that is equal to (approximately equal to) a width I11 of the main trench portion 512A of the trench 510A. This equivalence in width is also shown in, for example, trench 510E in the various views. Specifically, trench 510E shown in FIG. 5G (which is cut along line G6 through the trench extension portions 514 orthogonal to the plurality of trenches 510) has a width I8 that is equal to (or approximately equal to) a width I9 of the trench 510E shown in FIG. 5I (which is cut along line G8 through the main trench portions 512 orthogonal to the plurality of trenches 510). Although not shown in FIG. 5A, one or more of the trench extension portions 514 can have widths that are less than or greater than the widths of one or more of the main trench portions 512.

Even though the trench extension portions 514 have a same width as the main trench portions 512, the dielectric 570A, when formed (using one or more processes) in both the trench extension portions 514 and in the main trench portions 512 during semiconductor processing, can entirely fill the trench extension portions 514 without entirely filling the main trench portions 512. Accordingly, the shield electrode 530A can be formed in the main trench portions 512A while not being formed in the trench extension portions 514A.

Figure 5D:
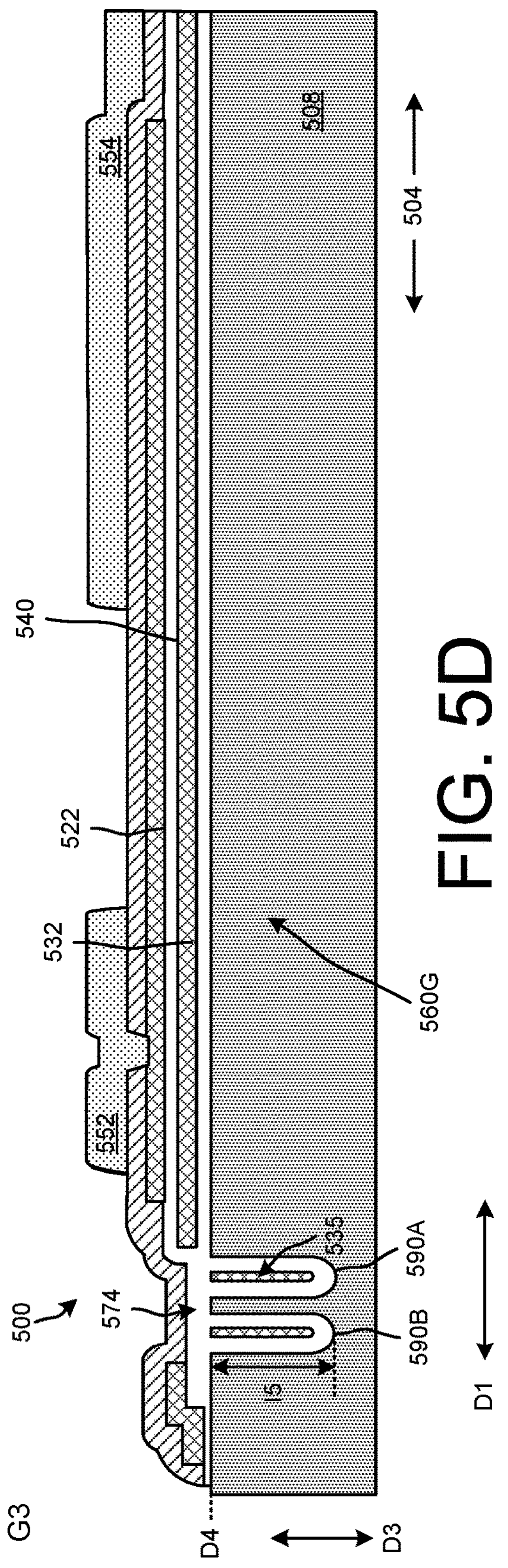

FIG. 5D is a side cross-sectional view of a mesa region 560G adjacent to trench 510G cut along line G3. In this implementation, the mesa region 560G is entirely disposed within the termination region 504. As shown in FIG. 5D, the source runner conductor 554 is not contacted with (e.g., is insulated from, is not electrically coupled to) the surface shield electrode 532.

Figure 5E:
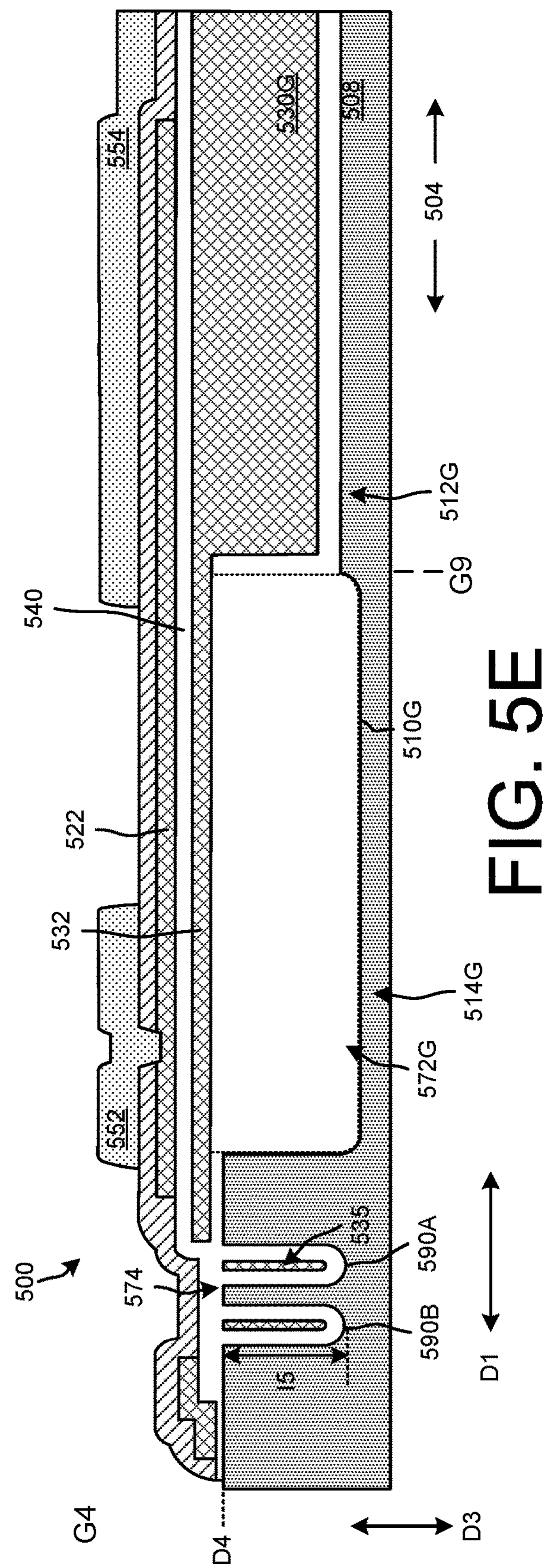

FIG. 5E is a side cross-sectional view of the trench 510E which is cut along line G4 shown in FIG. 5A. In this implementation, the trench 510G is entirely disposed within the termination region 504. Trench 510G, and other trenches entirely disposed within the termination region 504, can be referred to as termination trenches 518 (which can be a subset of the interior trenches 517). The dimension of the trench 510G is similar to the dimensions of (e.g., dimensions that are directly lateral to) the trench 510A shown in FIG. 5B. The dimensions of the trench 510G can be different than corresponding portions of the trench 510A shown in FIG. 5B. For example, the trench 510G can have a constant depth, which can be the same as or different than (e.g., deeper than, shallower than) the depth I1 of the trench extension portion 514A (shown in FIG. 5B) or the same as or different than (e.g., deeper than, shallower than) the depth I3 of the main trench portion 512A.

As shown in FIG. 5E, the source runner conductor 554 is not contacted with (e.g., is insulated from, is not electrically coupled to) the surface shield electrode 532 or the shield electrode 530C. The shield electrode 530C disposed within the trench 510G can be electrically floating. The shield electrode 530C disposed within the trench 510G can be electrically coupled to a source potential. Accordingly, the shield electrode 530C can be tied to the same source potential as the shield electrode 530A shown in FIG. 5B.

Figure 5F:
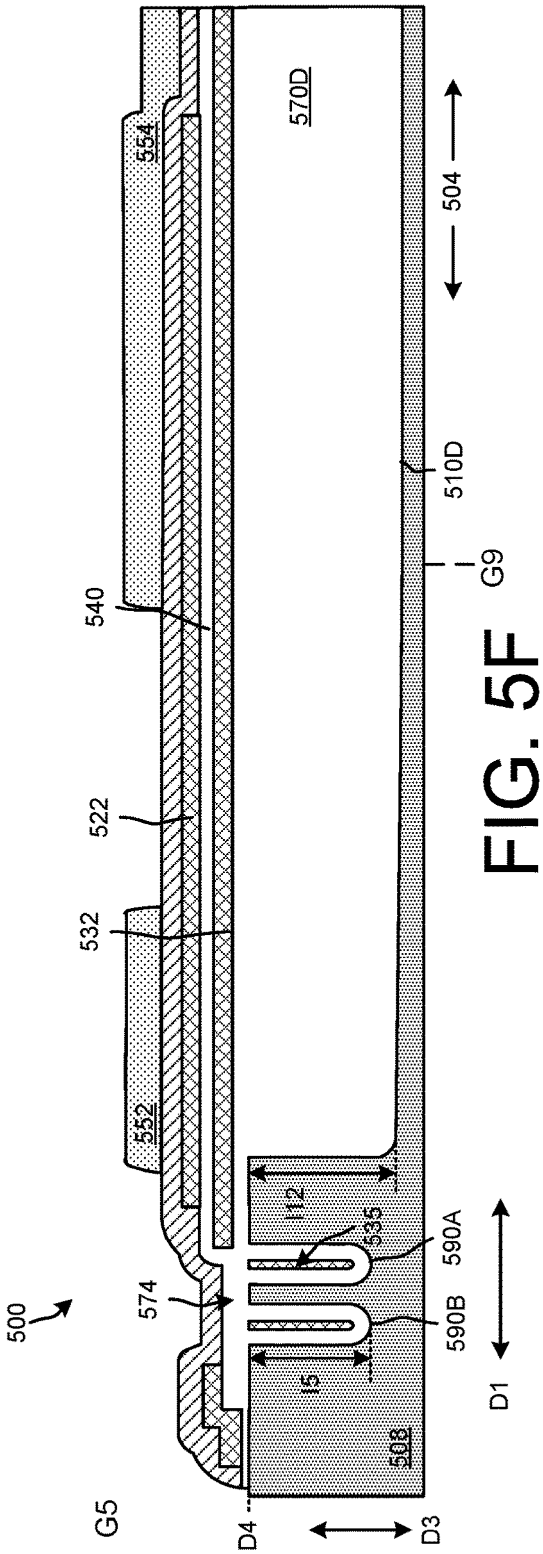

FIG. 5F is a side cross-sectional view of the end trench 510D, which is cut along line G5 shown in FIG. 5A. The end trench 510D is filled with (e.g., substantially filled with, from a bottom of the end trench 510D to a top of the end trench 510D along the centerline of the end trench 510D) a dielectric 570D. Although not shown, in some implementations, at least a portion of the end trench 510D can include a shield electrode. The end trench 510D can have a length (along the longitudinal direction D1) that is approximately the same as a length of, for example, the trench 510A.

Referring back to FIG. 5F, the end trench 510D has a depth I12 greater than a depth I5 of the perimeter trenches 590A, 590B. The end trench 510D can have a depth I12 equal to, or less than a depth of one or more of the perimeter trenches 590A, 590B. In this implementation, the depth I12 of the end trench 510D is approximately equal to a depth (e.g., distance I1) of the trench extension portion 514A (shown in FIG. 5B). The end trench 510D can have a depth I12 that is less than or greater than a depth (e.g., distance I1) of the trench extension portion 514A (shown in FIG. 5B). The end trench 510D can have a depth that varies, similar to the variation in depth of trench 510A.

Although not shown, in some implementations, multiple trenches similar to end trench 510D, which are filled with (e.g., substantially filled with) a dielectric can be included in the semiconductor device 500. Such dielectric filled trenches can be referred to as end trenches. Although not shown, in some implementations, a trench that varies with width and has a portion that includes a shield dielectric, such as trench 510C can be an end trench. In such implementations, the end trench 510D can be omitted.

Figure 5G:
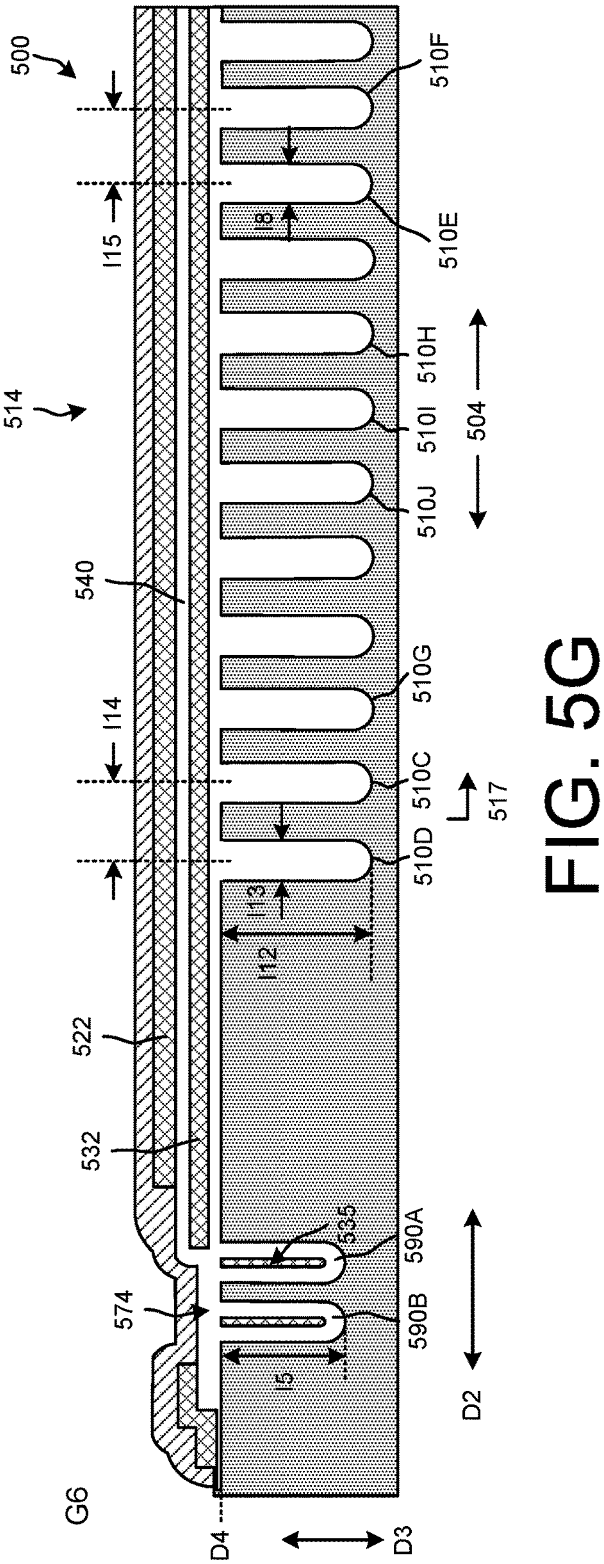

As mentioned above, FIG. 5G is cut along line G6 (shown in FIG. 5A) through the trench extension portions 514 orthogonal to the plurality of trenches 510. As shown in FIG. 5G the end trench 510D has a width I13 that is approximately equal to the width I8 of the trench extension portion of trench 510E. The end trench 510D can have a width that is greater than, or less than, the width I8 of the trench extension portion of trench 510E. In this implementation, the width I13 is approximately equal to each of the widths of the perimeter trenches 590A, 590B.

A pitch I14 between the end trench 510D and trench 510C (which are adjacent trenches) is approximately the same as a pitch I15 between trench 510E and trench 510F (which are adjacent trenches). The pitch I14 between the end trench 510D and trench 510C can be the less than, or greater than, the pitch I15 between trench 510E and trench 510F.

Figure 5H:
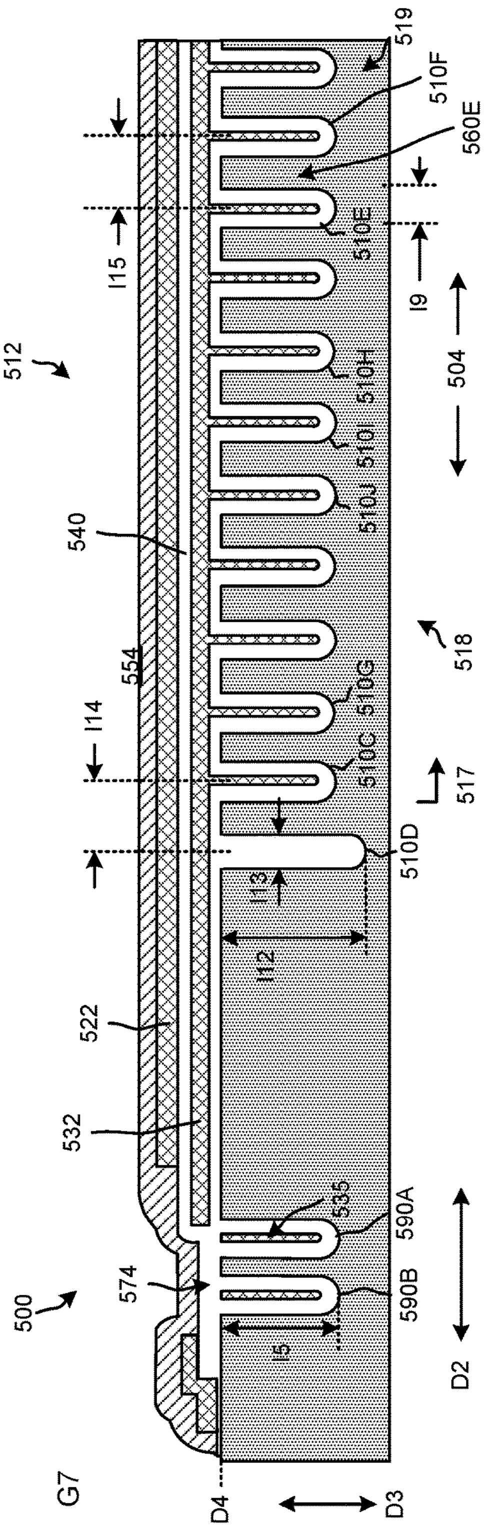

FIG. 5H is a side cross-sectional view of the main trench portions 512 of the plurality of trenches 510 cut along line G7 shown in FIG. 5A within the termination region 504. In this side cross-sectional view, each of the main trench portions 512 includes a shield electrode coupled to the surface shield electrode 532 except for the end trench 510D.

Figure 5I:
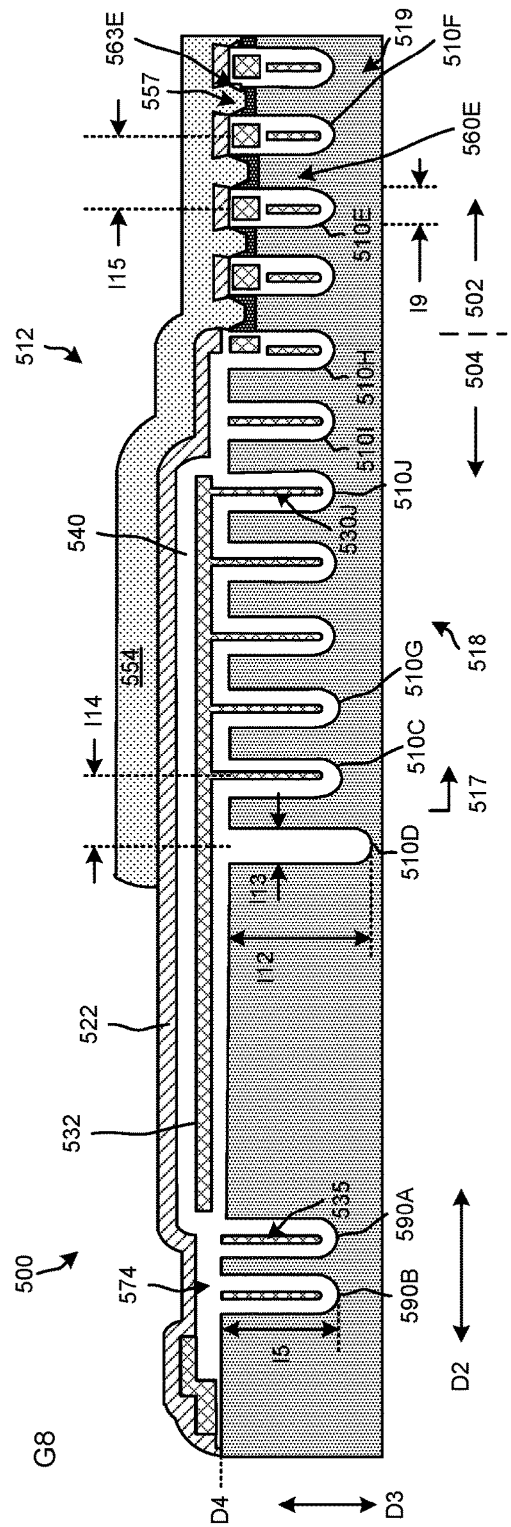

FIG. 5I is a side cross-sectional view of the main trench portions 512 of the plurality of trenches 510 cut along line G8 shown in FIG. 5A through the termination region 504 and into the active region 502. A portion of the cross-sectional view of the plurality of trenches 510 is included in the termination region 504 and a portion of the cross-sectional view of the plurality of trenches 510 is included in the active region 502.

Because the width of the end trench 510D is substantially constant along the longitudinal axis D1, in this implementation, the width I13 of the end trench 510D (shown in FIG. 5I) is the same along cut line G8 as along cut line G6 (shown in FIG. 5G). Similarly, the width of at least some of the trenches such as, for example, trench 510C and trench 510E is constant (substantially constant) along the longitudinal axis D1. Specifically, the width I9 of the trench 510E (shown in FIG. 5I) is equal to the width I8 of the trench 510E (shown in FIG. 5G).

As shown in FIG. 5I, the trenches from the plurality of trenches 510 that include source implants therebetween can be referred to as active device trenches 519. Because the general structure of the active device trenches 519, the partially active gate trench, the termination trenches 518, the source implants, and so forth are similar to those shown in FIG. 3I, these features will not be described again here in connection with FIG. 5I except as otherwise noted. Although not shown in FIG. 5I, the end trench 510D can include at least a portion of a shield electrode (e.g., a recessed shield electrode, a shield electrode with a thick bottom oxide disposed below, an electrically floating shield electrode, a shield electrode coupled to a source potential (e.g., via the surface shield electrode 532) or a gate potential (e.g., via the surface gate electrode 522)).

As shown in FIG. 5I, at least a portion of the termination trenches 518 from the plurality of trenches 510 include a shield electrode. In some implementations, at least a portion of the termination trenches 518 can have a shield electrode that extends above a top portion of the trench. For example, trench 510J includes shield electrode 530J (or shield electrode portion) that extends to a distance above a top portion of the trench 510J aligned within the plane D4. The shield electrode 530J can extend to a depth that is the same as or different than (e.g., deeper than, shallower than) the depth E12 of, for example, the end trench 510D.

The termination trenches 518 (or portions thereof) that include a shield electrode can be referred to as shielded termination trenches. In some implementations, one or more of the shield electrodes included in one or more of the termination trenches 518 can be electrically floating (e.g., may not be coupled to a potential source) or can be coupled to a gate (e.g., a gate potential).

FIGS. 6A through 6G are diagrams that illustrate variations on at least some of the features of on the semiconductor device 500 shown in FIGS. 5A through 5I. Accordingly, the reference numerals and features included in FIGS. 5A through 5I are generally maintained. In FIGS. 5A through 5I, the trench extension portions 514 are filled with the dielectric material, however, FIGS. 6A through 6G illustrate variations where the trench extension portions 514 include a shield electrode material.

Figure 6A:
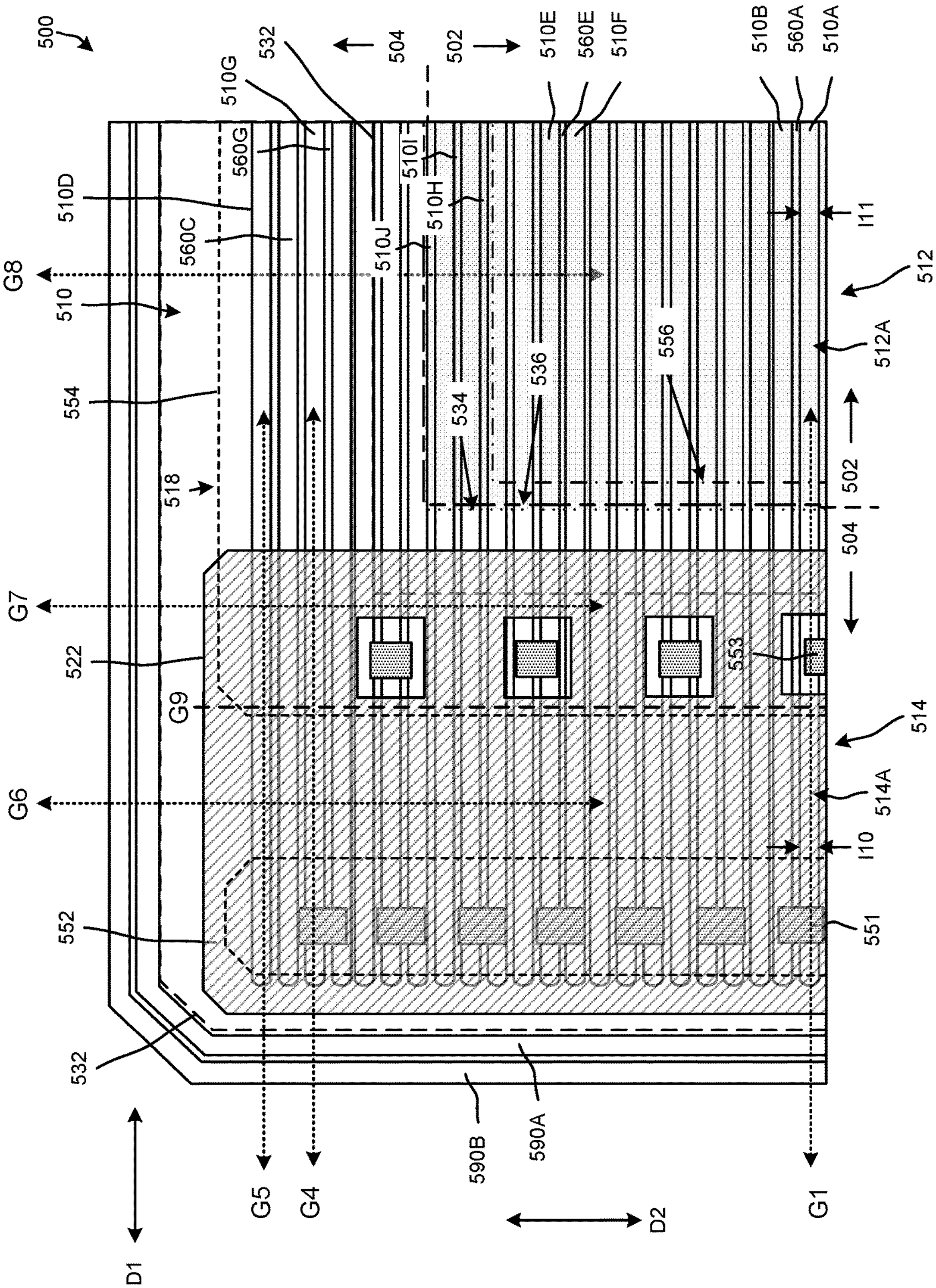
FIGS. 6A through 6G are diagrams that illustrate variations on at least some of the features of the semiconductor device shown in FIGS. 5A through 5I.
Figure 6B:
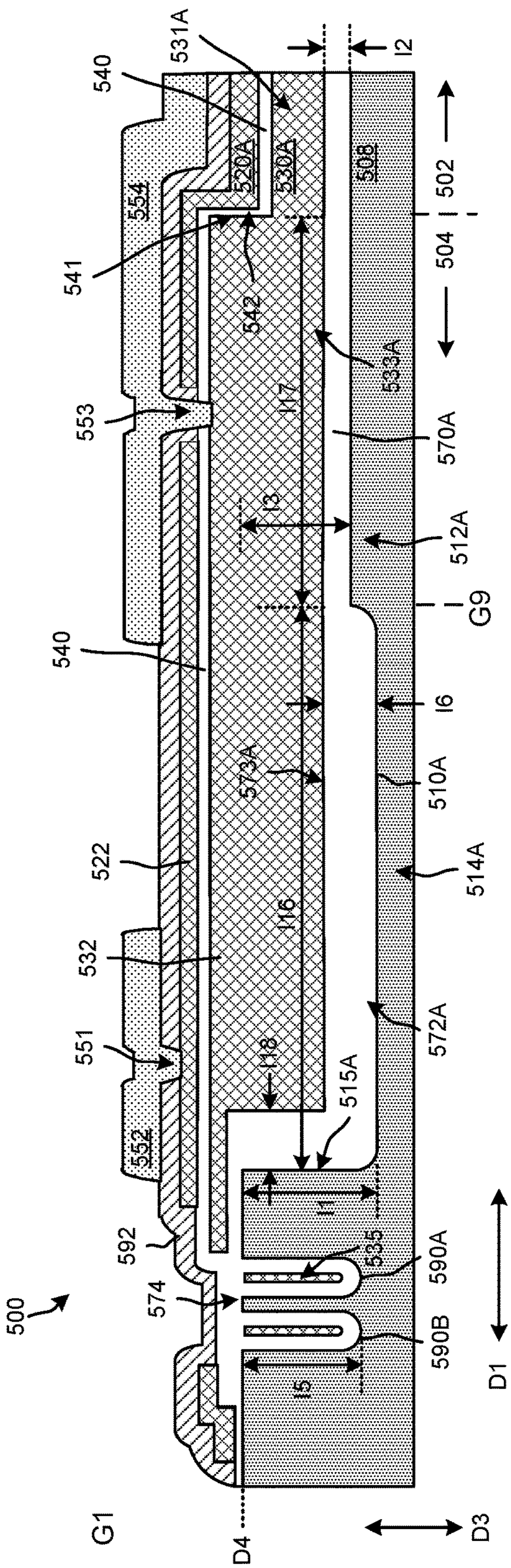

FIG. 6B is a diagram that illustrates a side cross-sectional view of the semiconductor device 500 cut along line G1. The cut line G1 is approximately along a centerline of the trench 510A so that the side cross-sectional view of the semiconductor device 500 is along a plane that approximately intersects a center of the trench 510A. As shown in FIG. 6B, the shield electrode 530A is disposed within (in a contiguous fashion) the trench extension portion 514A as well as the main trench portion 512A of the trench 510A.

As shown in FIG. 6B, the thickness of the dielectric 570A along the longitudinal axis D1 varies within the trench 510A. Specifically, a thickness I6 of the portion 572A of the dielectric 570A is greater than the thickness I2 of the dielectric 570A. however, the thickness I6 of the portion 572A of the dielectric 570A is less than the depth I1 of the trench extension portion 514A. The thickness I6 of the portion 572A of the dielectric 570A can be approximately equal to the thickness I2. The thickness I6 can be approximately equal to a thickness I18 of the dielectric 570A along a vertical sidewall 515A of the trench 510A at an end of the trench 510A within the termination region 504. The thickness I6 can be less than, or greater than the thickness I18 of the dielectric 570A along the vertical sidewall 515A of the trench 510A.

Figure 6C:
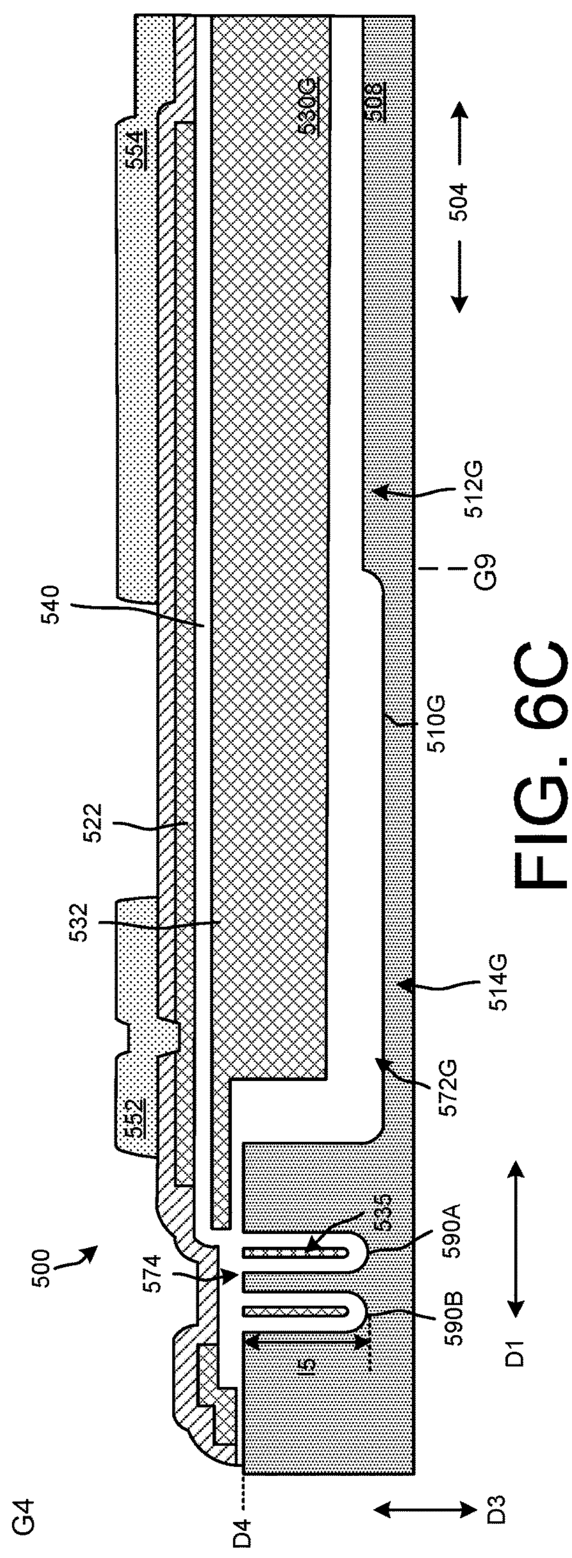

In this implementation, a top surface 573A of the dielectric 570A along the bottom surface of the trench 510A (at an interface between the dielectric 570A and a bottom surface of the shield electrode 530A) is substantially aligned along the longitudinal direction D1 and is constant or flat. The top surface 573A of the dielectric 570A can vary along the longitudinal direction D1. For example, if the thickness I6 of the portion 572A of the dielectric 570A is thinner than that shown in FIG. 6B, the top surface 573A can have an inflection between the main trench portion 512A and the trench extension portion 514A. FIG. 6C illustrates the trench 510G with approximately the same shield electrode 530G dimensions in the trench extension portion 514G (a profile of the trench extension portion is illustrated with a dashed line) as the dimensions of the shield electrode 530A in the trench extension portion 514A of the trench 510A (shown in FIG. 6B).

Figure 6D:
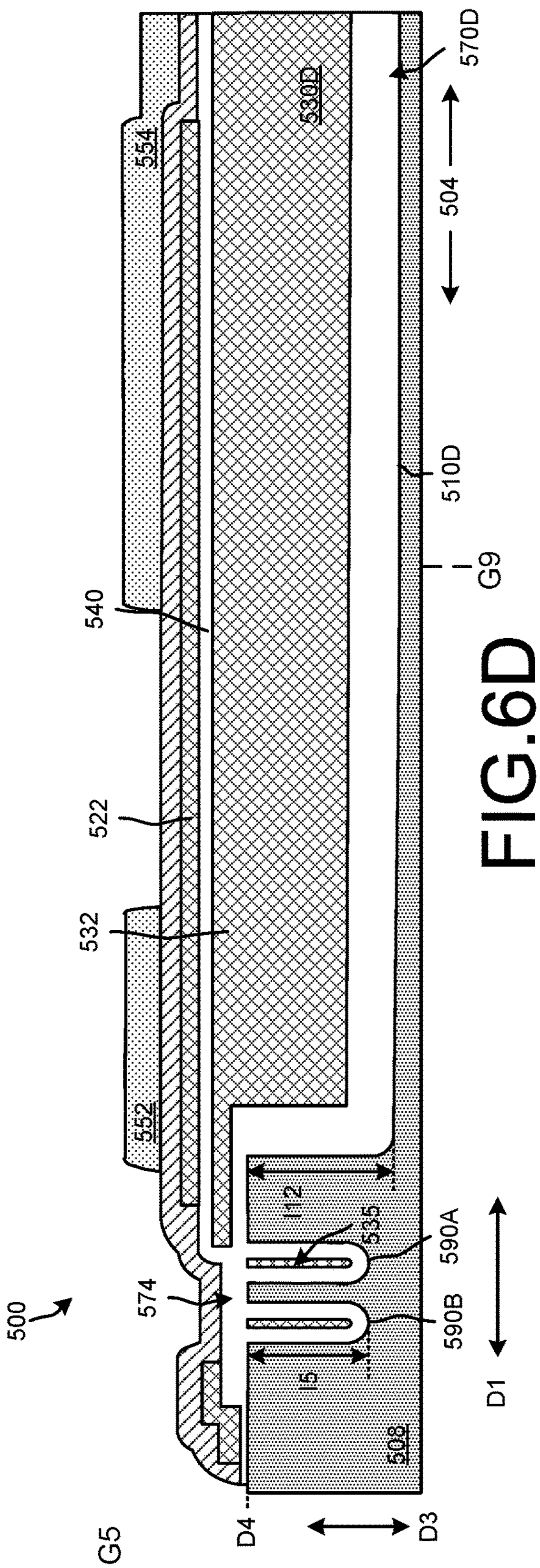

FIG. 6D is a side cross-sectional view of the end trench 510D, which is cut along line G5 shown in FIG. 6A. Rather than being filled entirely with a dielectric material as shown in FIG. 5F, the end trench 510D, in this implementation, includes a shield electrode 530D disposed within at least a portion of the dielectric 570D. In this implementation, the depth I12 of the end trench 510D is approximately equal to a depth (e.g., distance I1) of the trench extension portion 514A (shown in FIG. 5B). The end trench 510D can have a depth I12 that is less than or greater than a depth (e.g., distance I1) of the trench extension portion 514A (shown in FIG. 5B). The end trench 510D can have a depth that varies, similar to the variation in depth of trench 510A.

Figure 6E:
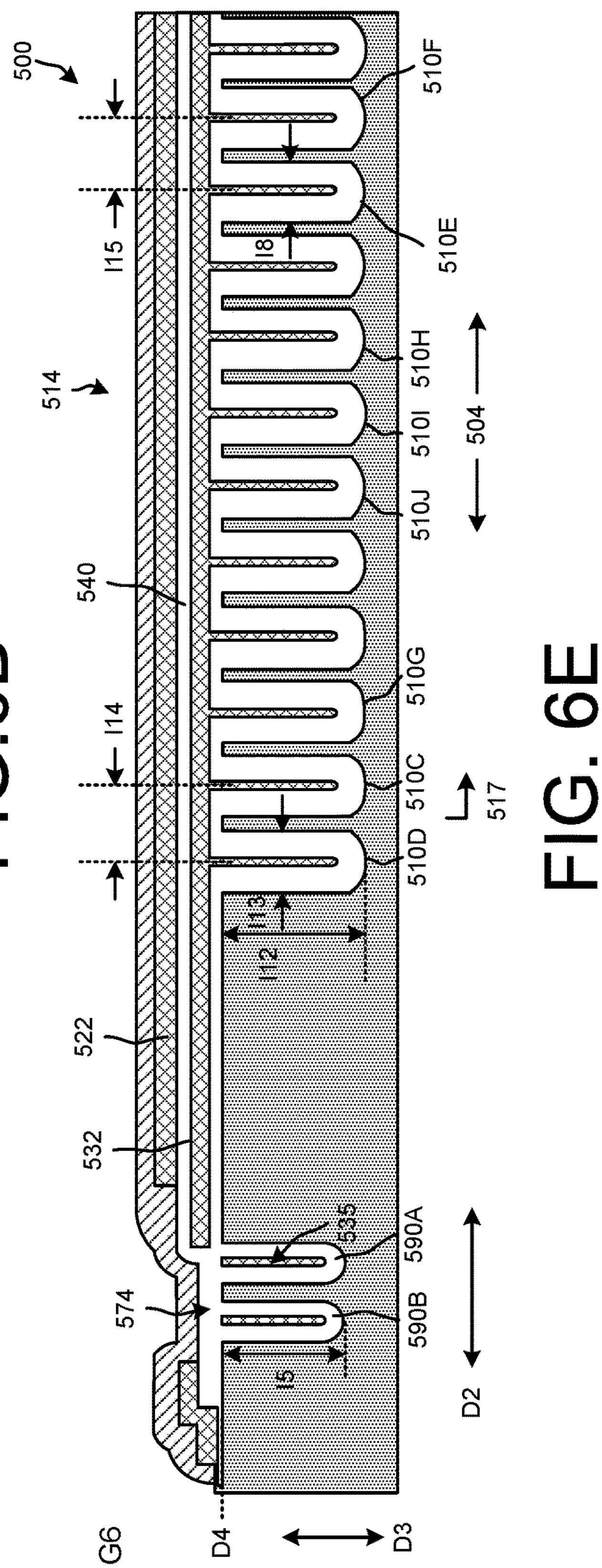

FIG. 6E is cut along line G6 (shown in FIG. 6A) through the trench extension portions 514 orthogonal to the plurality of trenches 510. As shown in FIG. 6E all of the trench extension portions 514 include shield electrodes. Also, the end trench 510D has a width I13 that is approximately equal to, for example, the width I8 of the trench extension portion of trench 510E. The end trench 510D can have a width that is greater than, or less than, the width I8 of the trench extension portion of trench 510E. In this implementation, the width I13 is approximately equal to each of the widths of the perimeter trenches 590A, 590B.

A pitch I14 between the end trench 510D and trench 510C (which are adjacent trenches) is approximately the same as a pitch I15 between trench 510E and trench 510F (which are adjacent trenches). The pitch I14 between the end trench 510D and trench 510C can be the less than, or greater than, the pitch I15 between trench 510E and trench 510F.

Figure 6F:
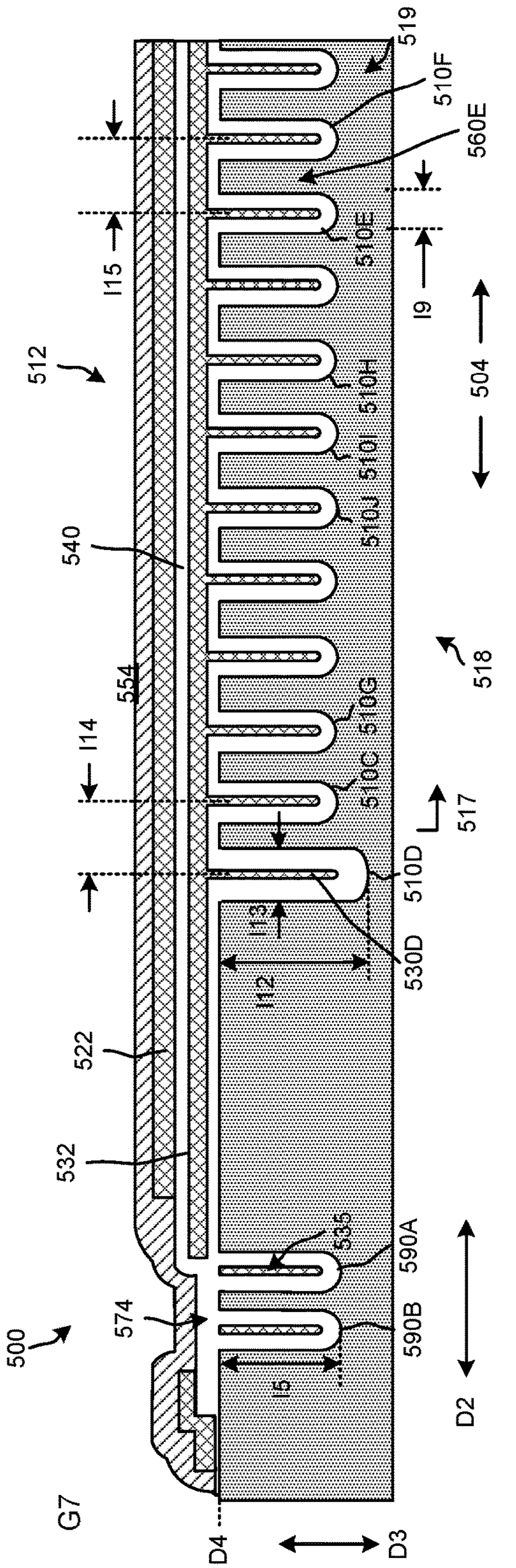

FIG. 6F is a side cross-sectional view of the main trench portions 512 of the plurality of trenches 510 cut along line G7 shown in FIG. 6A within the termination region 504. In this side cross-sectional view, each of the main trench portions 512, including the end trench 510D, includes a shield electrode coupled to the surface shield electrode 532. The shield electrode 530D included in the end trench 510D can be electrically floating.

Figure 6G:
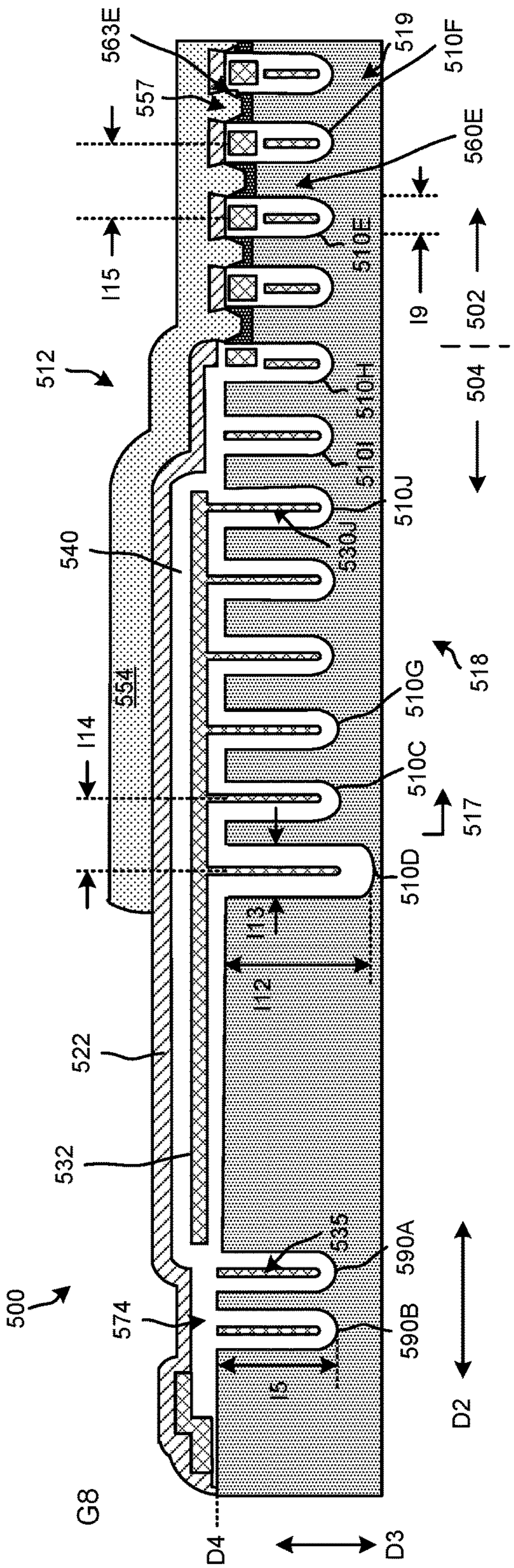

FIG. 6G is a side cross-sectional view of the main trench portions 512 of the plurality of trenches 510 cut along line G8 shown in FIG. 6A through the termination region 504 and into the active region 502. A portion of the cross-sectional view of the plurality of trenches 510 is included in the termination region 504 and a portion of the cross-sectional view of the plurality of trenches 510 is included in the active region 502.

Because the width of the end trench 510D is substantially constant along the longitudinal axis D1, in this implementation, the width I13 of the end trench 510D (shown in FIG. 6G) is the same along cut line G8, as along cut line G7 (shown in FIG. 6F) and as along cut line G6 (shown in FIG. 6E).

In contrast, the width of at least some of the trenches such as, for example, trench 510C and trench 510E is different along the longitudinal axis D1. For example, the width I9 of the trench 510E (shown in FIG. 6G and in FIG. 6F) is less than the width I8 of the trench 510E (shown in FIG. 6E).

As shown in FIG. 6G, the trenches from the plurality of trenches 510 that include source implants therebetween can be referred to as active device trenches 519. Because the general structure of the active device trenches 519, the partially active gate trench, the termination trenches 518, the source implants, and so forth are similar to those shown in FIG. 3I, these features will not be described again here in connection with FIG. 6G except as otherwise noted. Although not shown in FIG. 6G, the end trench 510D can include a variety of a shield electrodes (e.g., a recessed shield electrode, an electrically floating shield electrode, a shield electrode with a thick bottom oxide disposed below, a shield electrode coupled to a source potential (e.g., via the surface shield electrode 532) or a gate potential (e.g., via the surface gate electrode 522)).

Figure 7A:
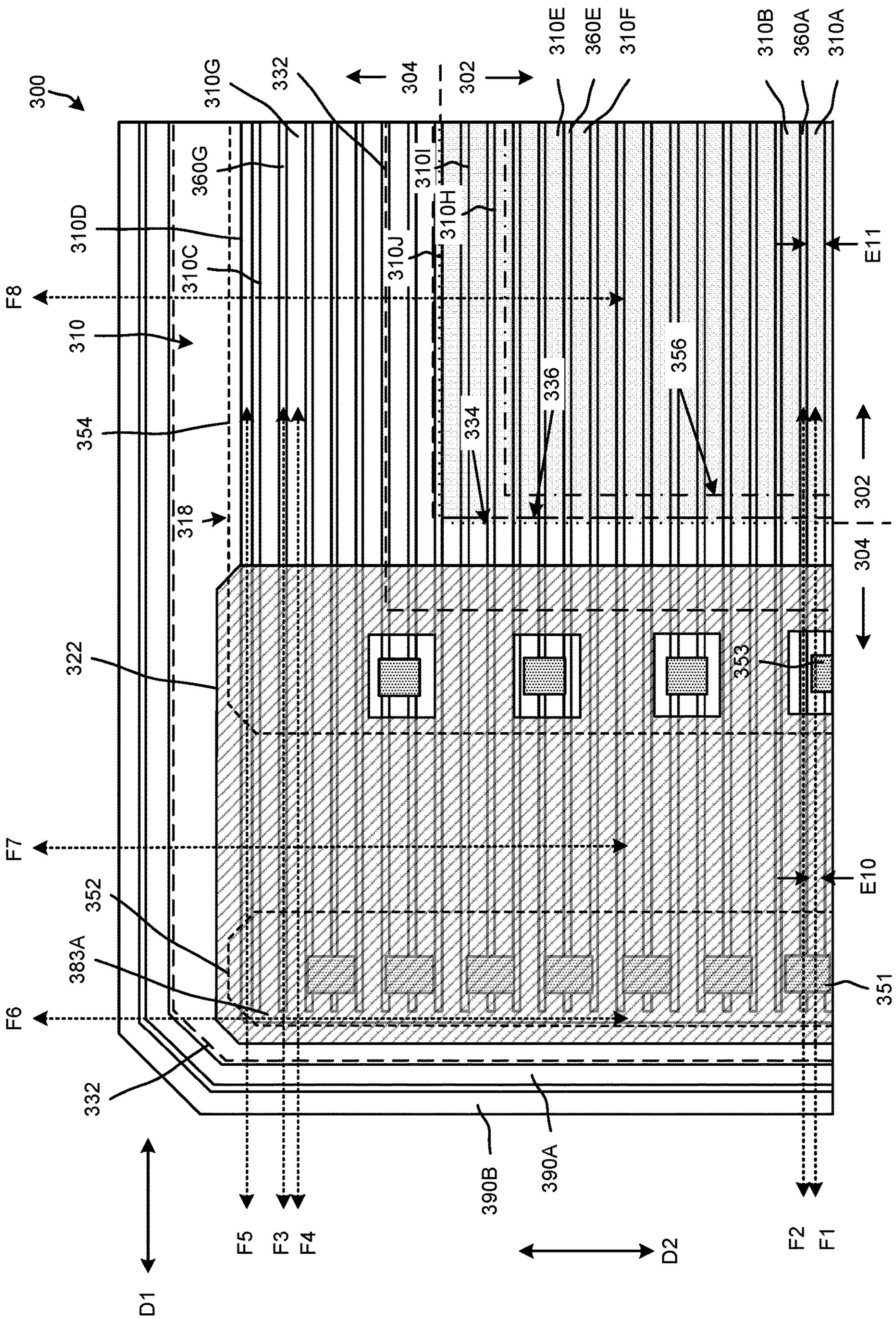
FIGS. 7A through 7J are diagrams that illustrate variations on at least some of the features of the semiconductor device shown in FIGS. 3A through 3I.

FIGS. 7A through 7J are diagrams that illustrate variations on at least some of the features of the semiconductor device 300 shown in FIGS. 3A through 3I. Accordingly, the reference numerals and features included in FIGS. 3A through 3I are generally maintained and some features are not described again in connection with FIGS. 7A through 7J. In FIGS. 3A through 3I the transverse trench 380A bisects the plurality of trenches 310 (or parallel trenches), however, in FIGS. 7A through 7J, a transverse trench 383A is disposed at an end of the plurality of trenches 310 (or parallel trenches). Accordingly, each of the plurality of trenches 310 is not bisected into trench extension portions and main trench portions as discussed in connection with FIGS. 3A through 3I. Specifically, the transverse trench 383A as shown in FIG. 7A is aligned parallel to the perimeter trenches 390A, 390B (along longitudinal axis D2), but is disposed between the perimeter trenches 390A, 390B and the ends of the plurality of trenches 310, which are orthogonally aligned to the transverse trench 383A. The side cross-sectional views along the different cuts included in FIGS. 7B through 7J are not necessarily drawn to the same scale (e.g., numbers of trenches, etc.) as the plan view shown in FIG. 7A.

In this implementation, the trench 310D is entirely disposed within the termination region 304 and is the outermost trench from the plurality of trenches 310. Accordingly, the trench 310D can be referred to as an end trench. Trenches from the plurality of trenches 310 in the semiconductor device 300 that are lateral to (or interior to) the end trench 310D can be referred to as interior trenches 317.

As shown in FIG. 7A, the transverse trench 383A is aligned along a longitudinal axis D2 that is orthogonal to (e.g., substantially orthogonal to) the longitudinal axis D1. As noted above, the transverse trench 383A is aligned parallel to the perimeter trenches 390A, 390B, but is disposed between the perimeter trenches 390A, 390B and the ends of the plurality of trenches 310, which are orthogonally aligned to the transverse trench 383A. The transverse trench 383A can be considered to be in fluid communication with, for example, trench 310A. The transverse trench 383A may intersect only a portion (e.g., less than all) of the plurality of trenches 310. The transverse trench 383A can be referred to as an end of trench trench (EOTT) or as a perpendicular trench because the transverse trench 383A is perpendicularly oriented with respect to the parallel trenches (i.e., the plurality of trenches 310). In this implementation, the transverse trench 383A is disposed entirely within the termination region 304.

Although only one transverse trench is included in the semiconductor device 300, in some implementations, more than one transverse trench similar to transverse trench 383A can be included in the semiconductor device 300. For example, an additional transverse trench aligned parallel to the transverse trench 383A and intersecting the plurality of trenches 310 (similar to the implementations described in connection with FIGS. 3A through 3I) can be included.

Figure 7B:
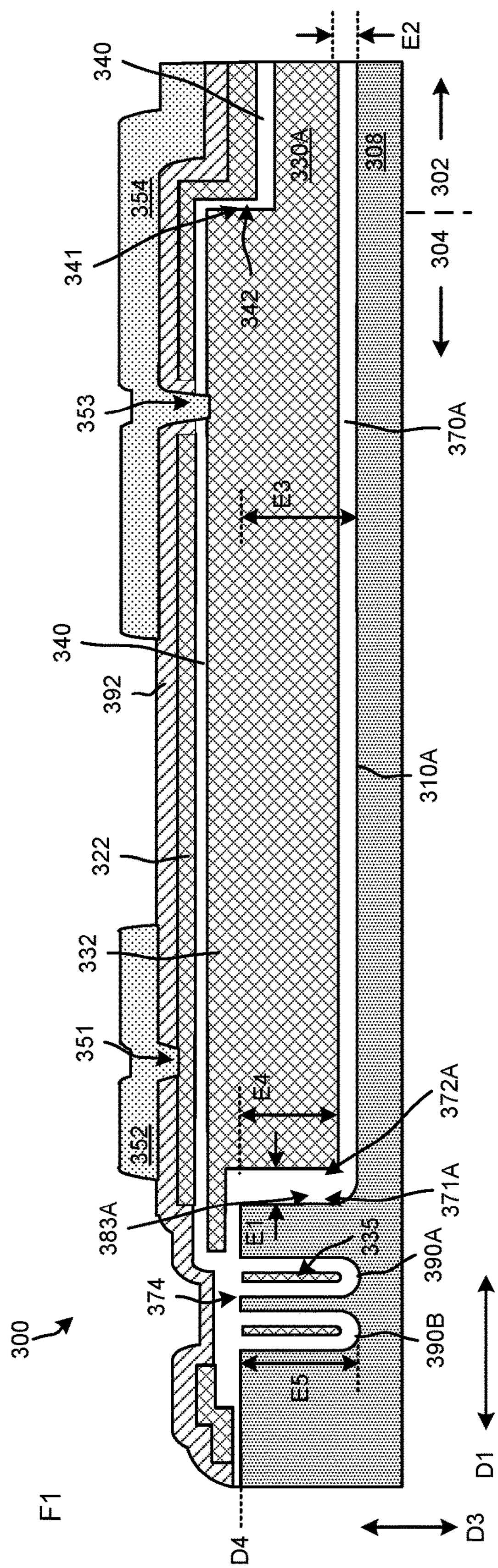
Figure 7C:
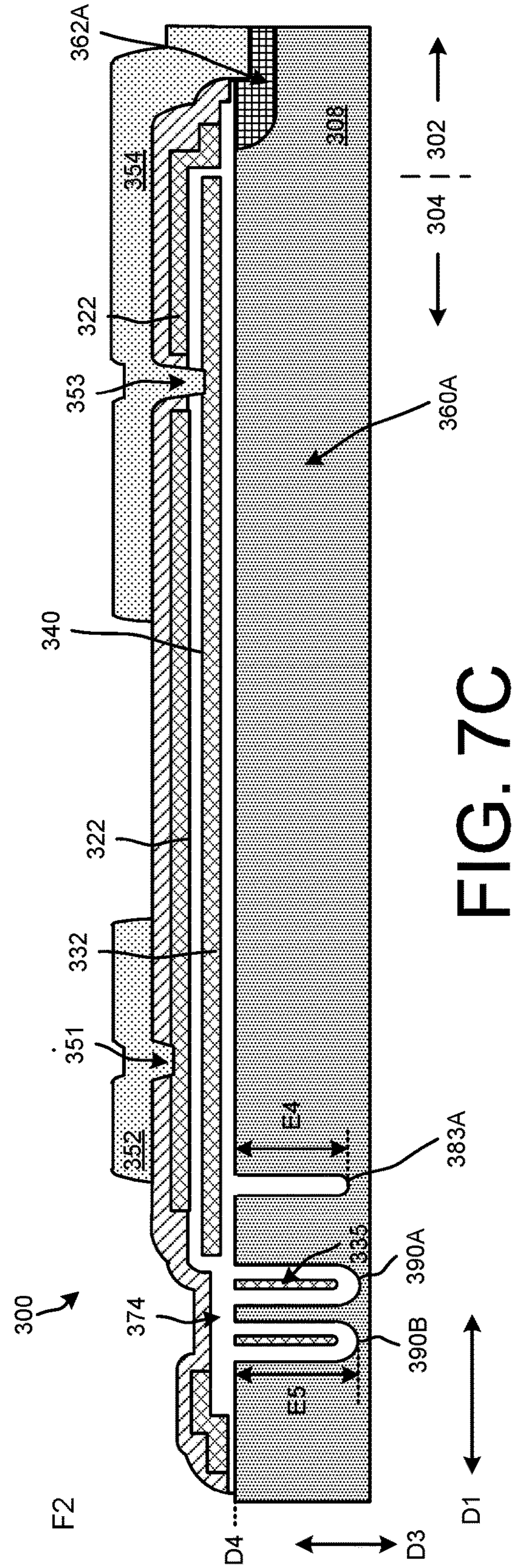

FIG. 7B is a diagram that illustrates a side cross-sectional view of the semiconductor device 300 cut along line F1. The cut line F1 is approximately along a centerline of the trench 310A so that the side cross-sectional view of the semiconductor device 300 is along a plane that approximately intersects a center of the trench 310A. A portion of the transverse trench 383A, which intersects the trench 310A, is shown in FIG. 7B. A side cross-sectional view of the transverse trench 383A cut along line F2, which is within the mesa region 360A between the trench 310A and the trench 310B, is shown in FIG. 7C.

As shown in FIG. 7B, the trench 310A includes a dielectric 370A disposed therein. Specifically, a portion of the dielectric 370A is coupled to (e.g., lines, is disposed on) a sidewall and a portion of the dielectric 370A is coupled to a bottom surface of the trench 310A within the main trench portion 312A of the trench 310A. In this cross-sectional view the portion of the dielectric 370A coupled to the bottom surface of the trench 310A is shown, and the portion of the dielectric 370A coupled to the sidewall of the trench 310A is not shown.

As shown in FIG. 7B, a portion 372A of the dielectric 370A is included in the trench 310A and a portion 371A of the dielectric 370A is included in the transverse trench 383A. The portion 372A of the dielectric 370A is aligned along (e.g., extends in) a vertical direction D3 from a bottom of the trench 310A to at least a top of the trench 310A. Similarly, the portion 371A of the dielectric 370A is aligned along (e.g., extends in) a vertical direction D3 from a bottom of the trench 310A to at least a top of the transverse trench 383A. The top of the trench 310A (which includes the trench portion 314A and the main trench portion 312A) is aligned along a plane D4, which is aligned along a top surface of a semiconductor region of the semiconductor device 300. The dielectric 370A can include one or more dielectric layers and/or one or more dielectric types formed using one or more different formation processes. For example, the portion 372A included in the trench 310A can be a first dielectric in contact (e.g., can abut) the portion 371A can be a second dielectric included in the transverse trench 383A. The portion 371A and the portion 372A can be formed using the same dielectric formation process.

A thickness E1 of the dielectric 370A included in the trench 310A is constant (e.g., substantially constant) along the longitudinal axis D1 of the trench 310A. The portions 371A and 372A of the dielectric 370A have at least a combined thickness E1 that is greater than a thickness E2 of a portion of the dielectric 370A along the bottom of the trench 310A. In some implementations the portion 372A of the dielectric can have a thickness approximately equal to the thickness E2, and/or the portion 371A of the dielectric can have a thickness less than the thickness E2. In some implementations the portion 372A of the dielectric can have a thickness approximately different than (e.g., greater than, less than) the thickness E2, and/or the portion 371A of the dielectric can have a thickness equal to or greater than the thickness E2.

Also, the portion 371A of the dielectric 370A included in the transverse trench 383A has at least a thickness E4 (also can be referred to as a height) that is greater than the thickness E2 of a portion of the dielectric 370A included in the main portion 312A of the trench 310A and/or the thickness E1 of the portion 372A of the dielectric 370A included in the trench extension portion 314A. The thickness of the portion 371A of the dielectric 370A shown in FIG. 7B extends up to a bottom surface of a surface shield electrode 332 beyond the thickness E4. The thickness E4 corresponds approximately with a depth (along the vertical direction D3) of the transverse trench 383A. The depth (or height) of the transverse trench 383A is also illustrated within the mesa region 360A shown in FIG. 7C.

Although not shown, in some implementations, a transverse trench such as the transverse trench 383A can include a portion of a shield electrode (e.g., a portion of the shield electrode 330A, a recessed shield electrode).

Although not shown in FIG. 7B, the thickness E2 of the portion of the dielectric 370A in the main portion 312A of the trench 310A can vary along the longitudinal axis D1. For example, a thickness of a portion of the dielectric 370A included in the termination region 304 of the main trench portion 312A can be greater than a thickness of a portion of the dielectric 370A included in the active region 302 of the main trench portion 312A, or vice versa.

The profile of the trench 310A shown in FIG. 3B can be included with the transverse trench 383A shown in FIG. 7B (with or without transverse trench 380A). Such an implementation without transverse trench 380A is shown in FIG. 7J.

In this implementation, the transverse trench 383A has a depth (which corresponds with E4) that is the same as, or approximately equal to, a depth (which corresponds with E3) of the trench portion 310A. Although not shown in FIGS. 7A through 7J, the transverse trench 383A can have a depth that is greater than a depth of the trench 310A. Although not shown in FIGS. 7A through 7J, the transverse trench 383A can have a depth that is less than a depth of the trench 310A.

Referring back to FIG. 7A, perimeter trenches 390A, 390B are disposed around a perimeter of the plurality of trenches 310. As shown in FIG. 7B, the perimeter trenches 390A, 390B have a depth E5 that is approximately equal to a depth (e.g., distance E4) of the transverse trench 383A and a depth (e.g., distance E3) of the trench 310A. The depth of one or more of the perimeter trenches 390A, 390B can be less than or greater than the depth of the transverse trench 383A and/or the depth of the trench 310A.

Figure 7D:
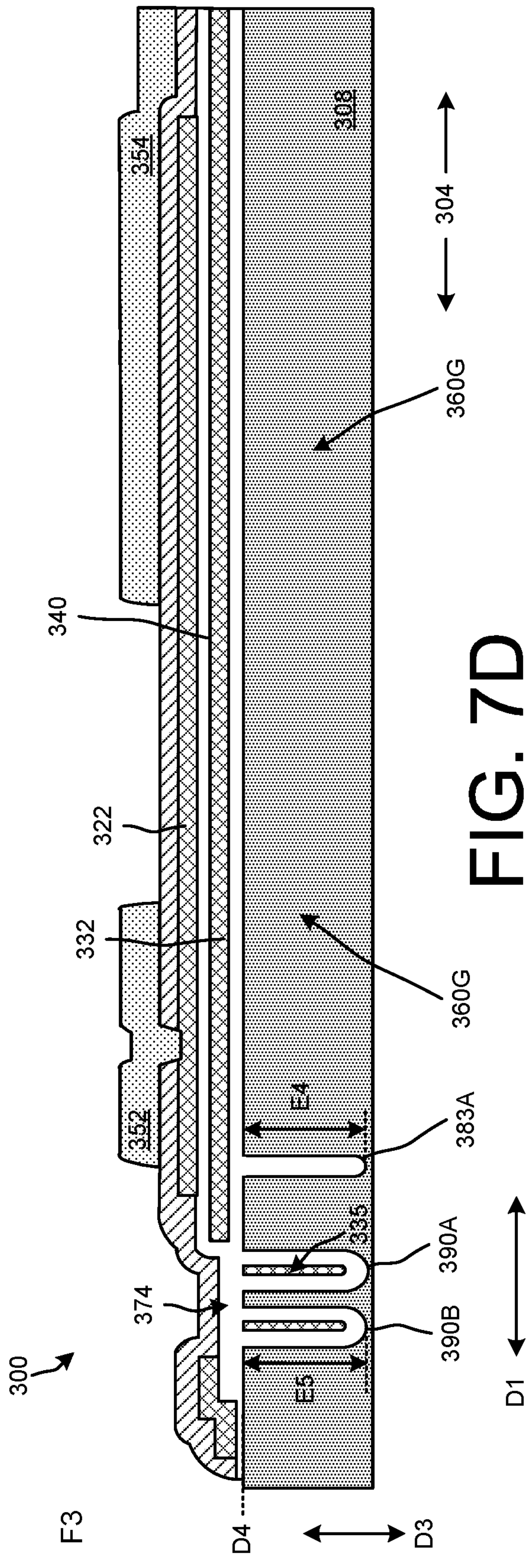

FIG. 7D is a side cross-sectional view of a mesa region 360G adjacent to trench 310G cut along line F3. In this implementation, the mesa region 360G is entirely disposed within the termination region 304. As shown in FIG. 7D, the source runner conductor 354 is not contacted with (e.g., is insulated from, is not electrically coupled to) the surface shield electrode 332.

Figure 7E:
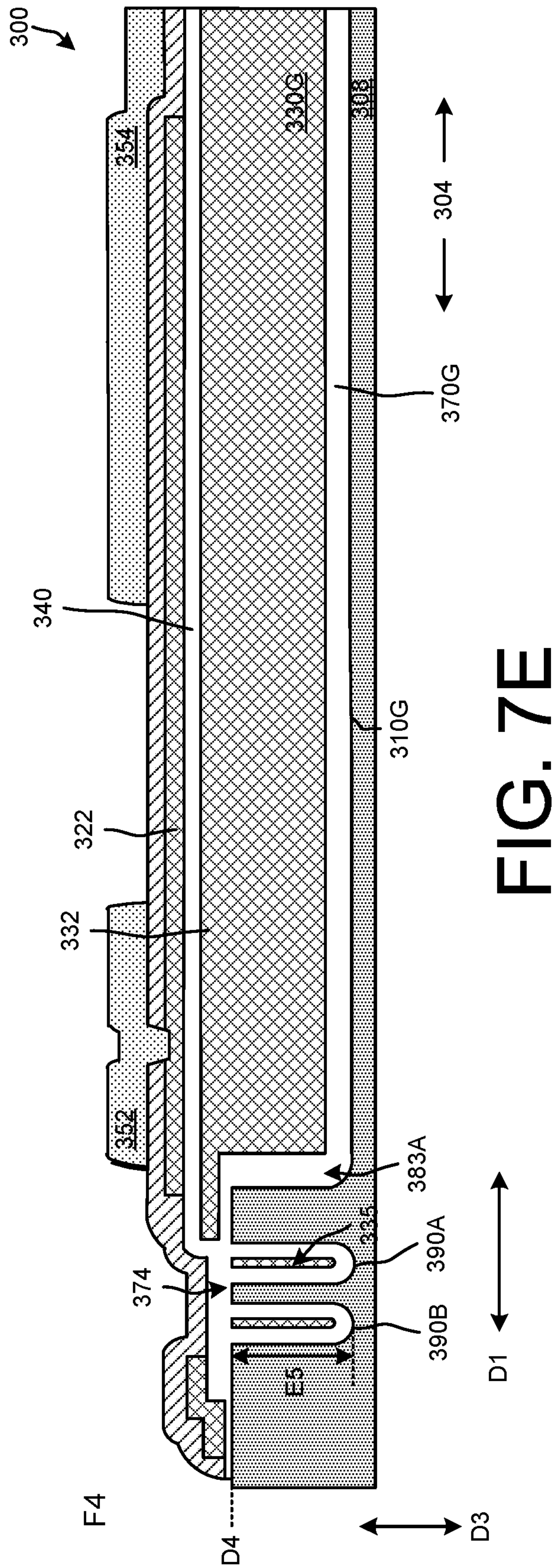

FIG. 7E is a side cross-sectional view of the trench 310G which is cut along line F4 shown in FIG. 7A. In this implementation, the trench 310G is entirely disposed within the termination region 304. Trench 310G, and other trenches entirely disposed within the termination region 304, can be referred to as termination trenches 318. The dimension of the trench 310G is similar to the dimensions of (e.g., dimensions that are directly lateral to) the trench 310A shown in FIG. 7B. The dimensions of the trench 310G can be different than corresponding portions of the trench 310A shown in FIG. 7B.

As shown in FIG. 7E, the source runner conductor 354 is not contacted with (e.g., is insulated from, is not electrically coupled to) the surface shield electrode 332 or the shield electrode 330G. The shield electrode 330G disposed within the trench 310G can be electrically floating. The shield electrode 330G disposed within the trench 310G can be electrically coupled to a source potential. Accordingly, the shield electrode 330G can be tied to the same source potential as the shield electrode 330A shown in FIG. 7B. The shield electrode 330G disposed within the trench 310G can be recessed.

Figure 7F:
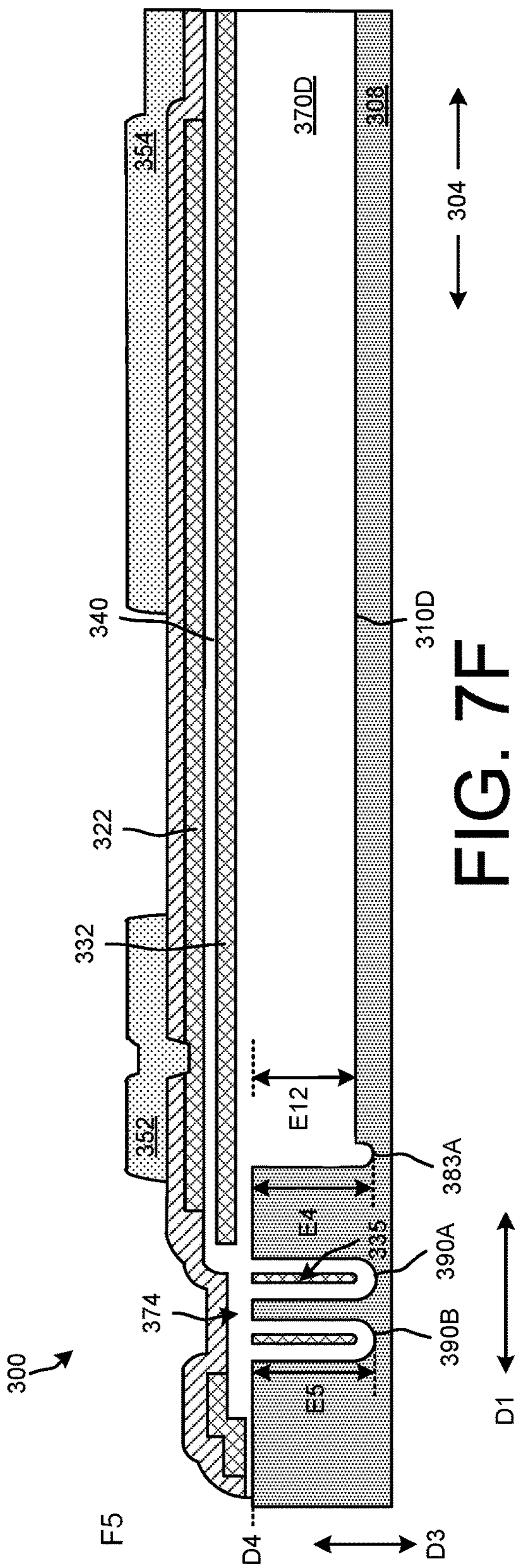

FIG. 7F is a side cross-sectional view of the end trench 310D, which is cut along line F5 shown in FIG. 7A. The end trench 310D is filled with a dielectric 370D. Although not shown, in some implementations, at least a portion of the end trench 310D can include a shield electrode. The end trench 310D can have a length (along the longitudinal direction D1) that is approximately the same as a length of, for example, the trench 310A.

As shown in FIG. 7A, the transverse trench 383A terminates at the end trench 310D. The transverse trench 383A can terminate at a trench other than the end trench 310D such as one of the interior trenches 317 from the plurality of trenches 310.

Referring back to FIG. 7F, the end trench 310D has a depth E12 less than a depth E5 of the perimeter trenches 390A, 390B and the transverse trench E4. The end trench 310D can have a depth E12 equal to, or greater than a depth of one or more of the perimeter trenches 390A, 390B and/or the transverse trench E4.

Figure 7G:
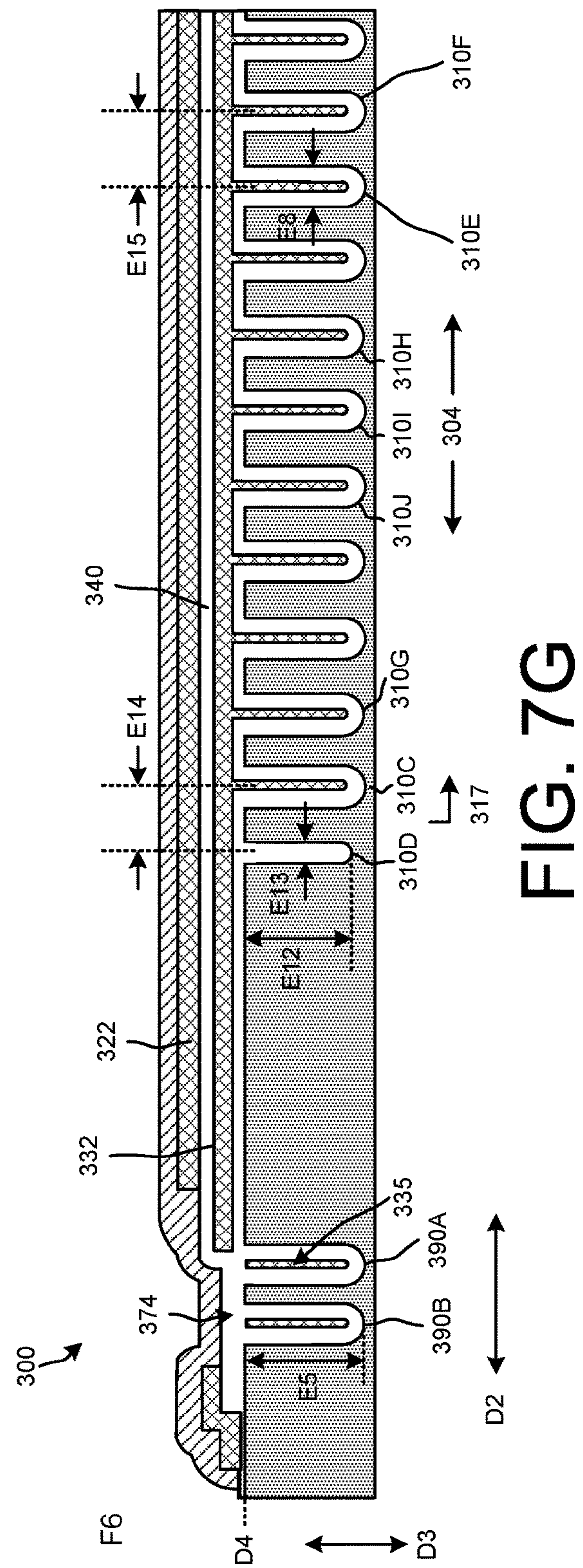

As mentioned above, FIG. 7G is cut along line F6 (shown in FIG. 7A) orthogonal to the plurality of trenches 310 through an area entirely within the termination region 304. As shown in FIG. 7G each interior trenches 317 (excluding the end trench 310D) from the plurality of trenches 310 includes a shield electrode. This is contrasted with the trench extension portions 314A shown in FIG. 3G. Accordingly, the end trench 310D has a width E13 that is less than the width E8 of a portion of the trench 310E within the termination region 304.

The end trench 310D can have a width that is greater than, or equal to, the width E8 of the trench 310E. Also, the end trench 310D can have a depth that is greater than, or equal to, a depth of one or more of the perimeter trenches 380A, 390A and/or the interior trenches 317 from the plurality of trenches 310.

A pitch E14 between the end trench 310D and trench 310C (which are adjacent trenches) is less than a pitch E15 between trench 310E and trench 310F (which are adjacent trenches). The pitch E14 between the end trench 310D and trench 310C can be the same as, or greater than, the pitch E15 between trench 310E and trench 310F.

Figure 7H:
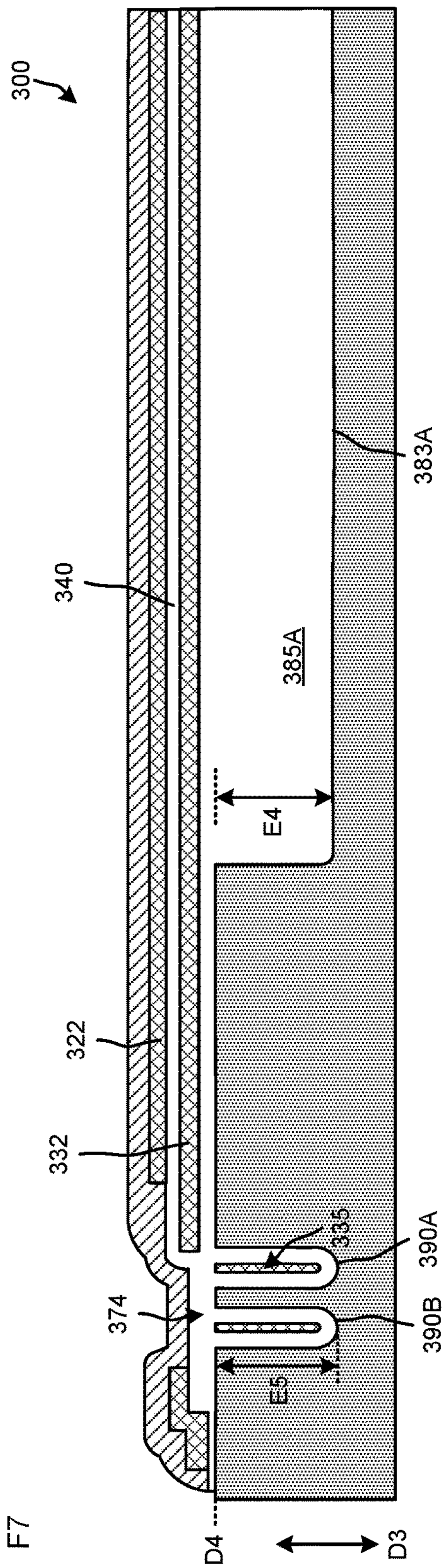

FIG. 7H is a side cross-sectional view of the transverse trench 383A, which is cut along line F7 shown in FIG. 7A. The line F7 is approximately along a centerline of the transverse trench 383A. The transverse trench 383A is filled with a dielectric 385A. Although not shown, in some implementations, at least a portion of the transverse trench 383A can include a shield electrode. In this implementation, the transverse trench 383A has a constant depth E4. The transverse trench 383A can have a depth that varies along the longitudinal axis D2.

Figure 7I:
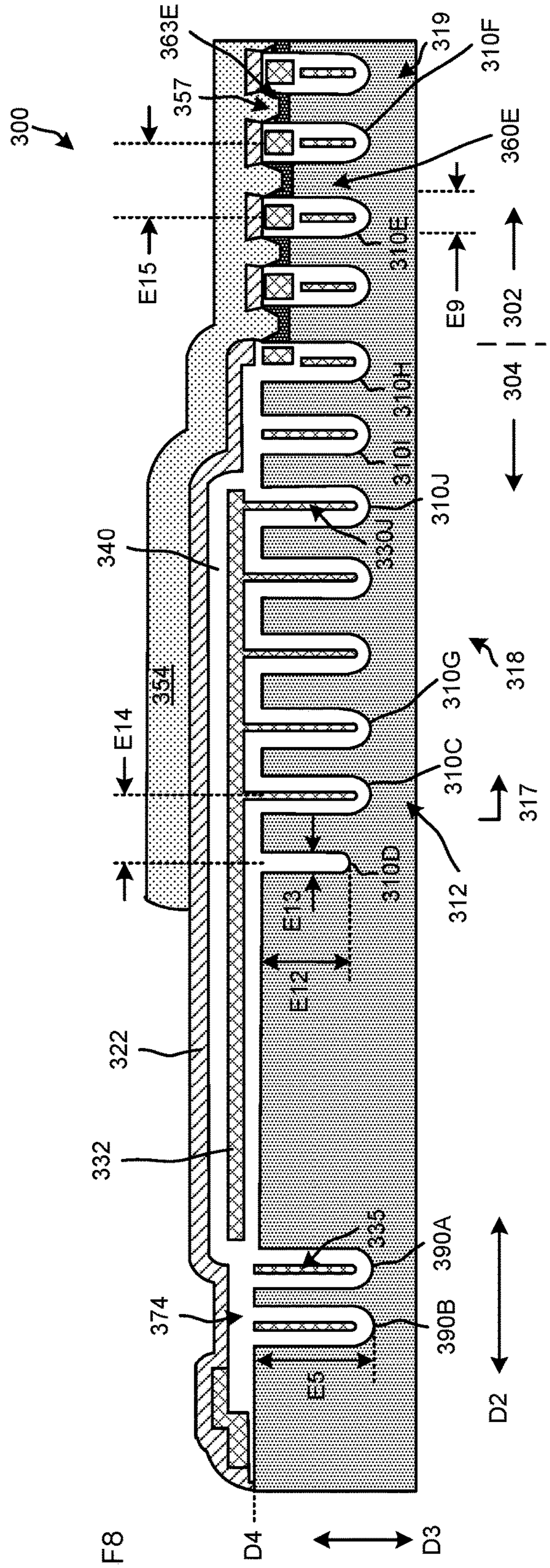
Figure 7J:
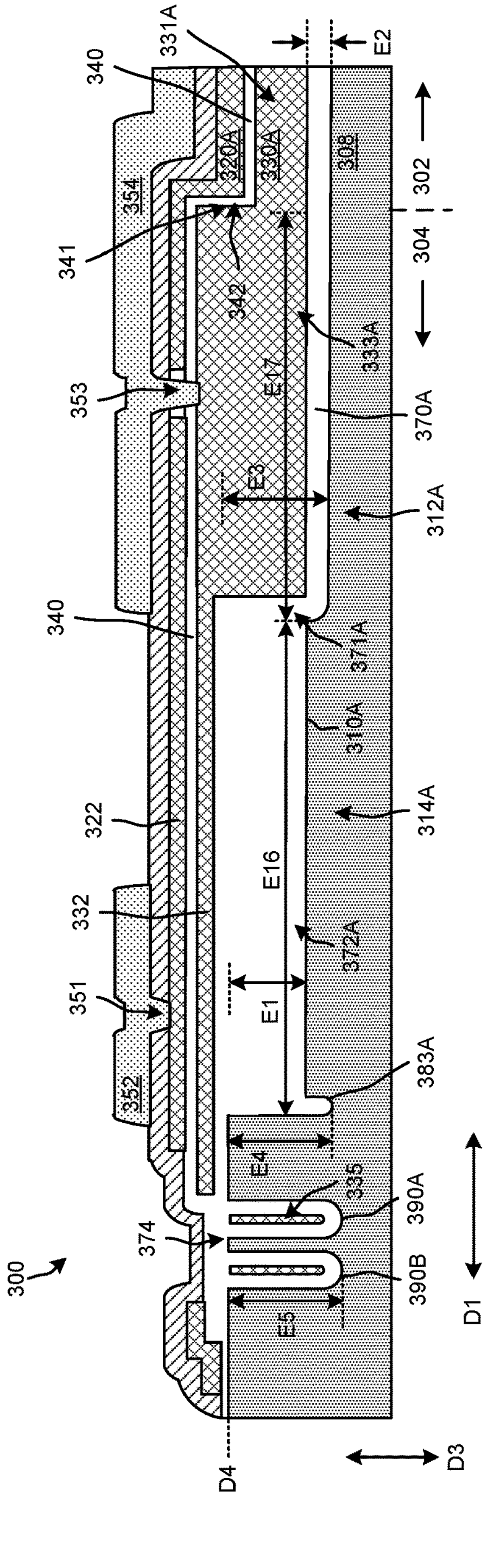

FIG. 7I is a side cross-sectional view of the main trench portions 312 of the plurality of trenches 310 cut along line F8 shown in FIG. 7A. A portion of the cross-sectional view of the plurality of trenches 310 is included in the termination region 304 and a portion of the cross-sectional view of the plurality of trenches 310 is included in the active region 302.

Because the width of the end trench 310D is substantially constant along the longitudinal axis D1 in this implementation, the width E13 of the end trench 310D (shown in FIG. 7I) is the same along cut line F8 as along cut line F6 (shown in FIG. 7G). Similarly, the width of at least some of the trenches such as, for example, trench 310C and trench 310E is substantially constant along the longitudinal axis D1. This is contrasted with the plurality of trenches 310 shown in FIG. 3A, which vary along the longitudinal axis. Specifically, the width E9 of the trench 310E (shown in FIG. 7I) is approximately equal to the width E8 of the trench 310E (shown in FIG. 7G).

The end trench 310D can have a width that is greater than, or equal to, the width E9 of the trench 310E. Also, the end trench 310D can have a depth that is greater than, or equal to, a depth of one or more of the perimeter trenches 380A, 390A and/or the interior trenches 317 (e.g., active trenches) from the plurality of trenches 310.

Figure 8:
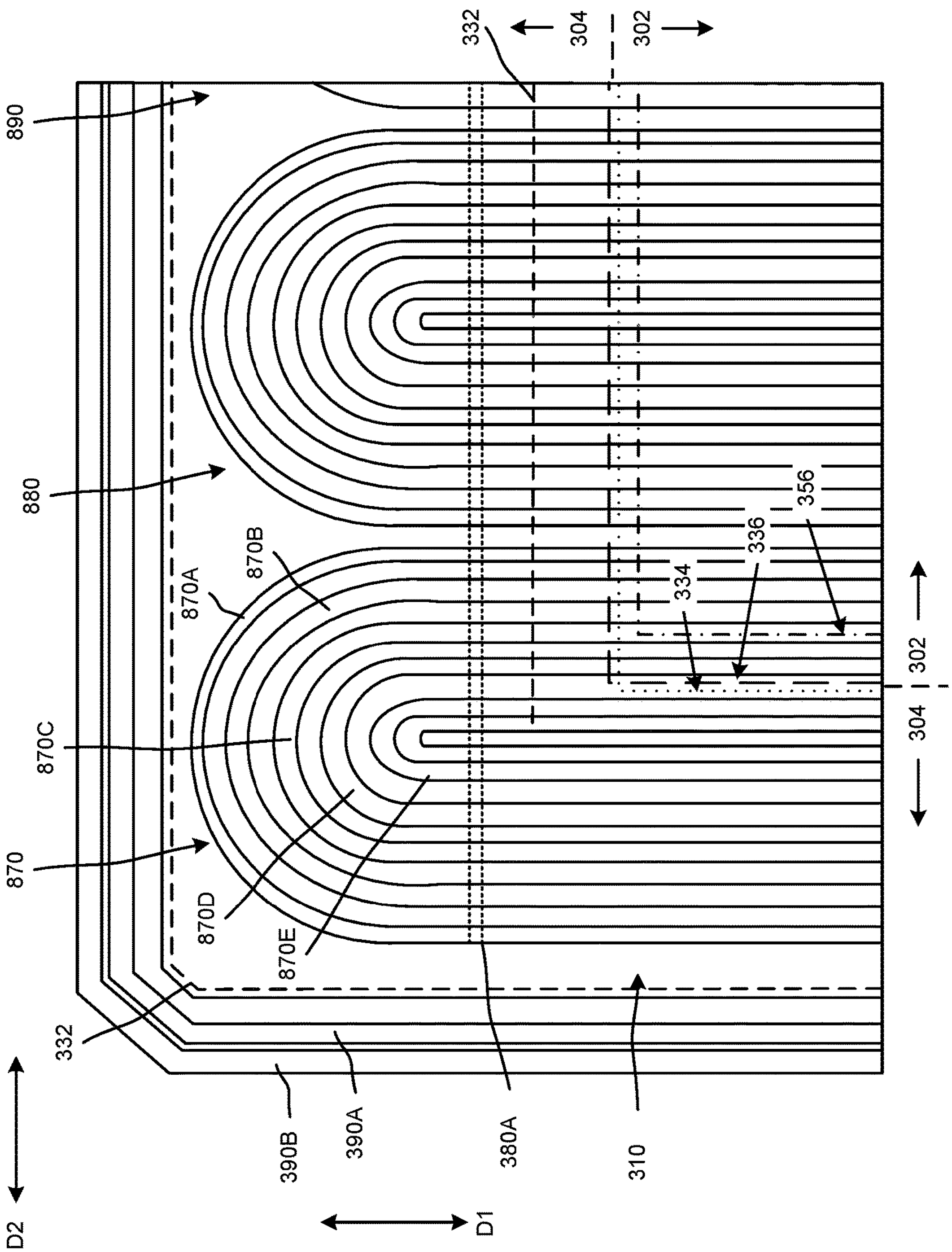
FIG. 8 is a diagram that illustrates another semiconductor device, according to an implementation.

FIG. 8 is a diagram that illustrates a semiconductor device 800, according to an implementation. In this implementation, many of the features included in this implementation are similar to those described above. Accordingly, the reference numerals used in conjunction with same or similar features are used to describe this implementation.

As shown in FIG. 8, the semiconductor device 800 can optionally include a transverse trench 380A (illustrated by a dashed line) that intersects the parallel trenches 310 (e.g., ends of the parallel trenches). Also, as shown in FIG. 8, the semiconductor device 800 includes several sets of end trenches 870, 880, and 890. Each of the sets of end trenches 870, 880, and 890 has a semicircular shape and includes several concentric end trenches. For example, the set of end trenches 870 (which includes end trenches 870A, 870B, 870D, and 870E) has an end trench 870A that is coupled at a first end aligned with (or coupled to) one of the plurality of trenches 310 via the transverse trench 380A, and has a second end aligned with (or coupled to) another of the plurality of trenches 310 via the transverse trench 380A.

Although not shown in FIG. 8, one or more of the end trenches from the sets of end trenches 870, 880, and/or 890 can have a trench width that is different than (e.g., wider than, narrower than) a width of one or more of the plurality of trenches 310. For example, and trench 870A can have a trench width that is less than a trench width of one of the plurality of trenches 310 corresponding with the trench 870A.

In some implementations, a transverse trench can be excluded from the semiconductor device 800. In some implementations, multiple transverse trenches similar to transverse trench 380A can be included in the semiconductor device 800 and intersecting one or more of the plurality of trenches 310 and/or one or more of the sets of end trenches 870, 880, and/or 890.

Although illustrated as having a semicircular shape, in some implementations, one or more of the sets of end trenches 870, 880, and/or 890, can define a different pattern or a different shape. For example, although not shown, a set of end trenches can define a set of rectangular shaped end trenches that can be concentric. The spacing (or mesa width) between each trench from a set of end trenches can be approximately equal or can vary (e.g., can increase in width from the innermost end trench to the outermost end trench, can decrease in width from the innermost end trench to the outermost end trench).

Figure 9A:
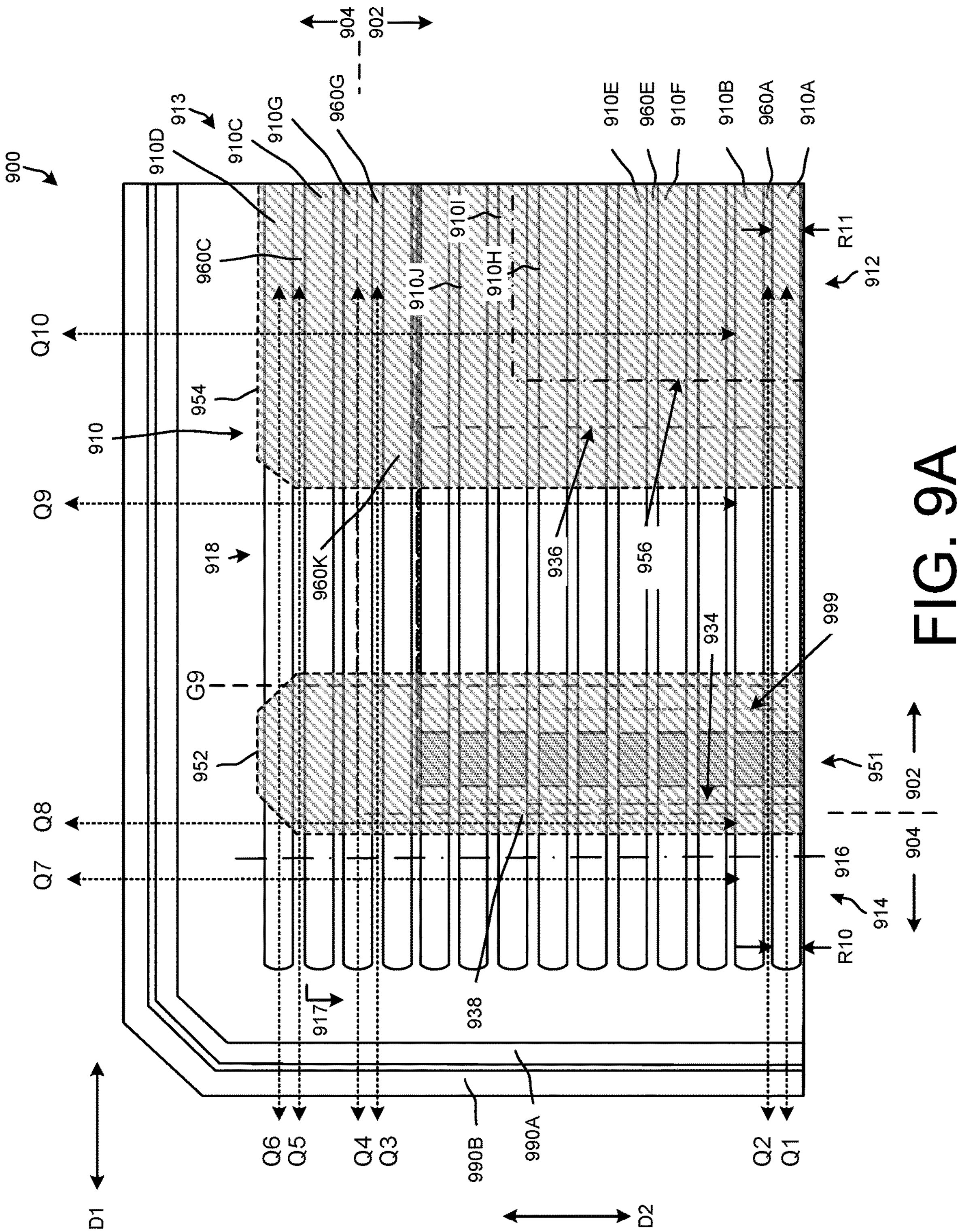
FIGS. 9A through 9N are diagrams that illustrate configurations of a termination region according to some implementations.
Figure 9B:
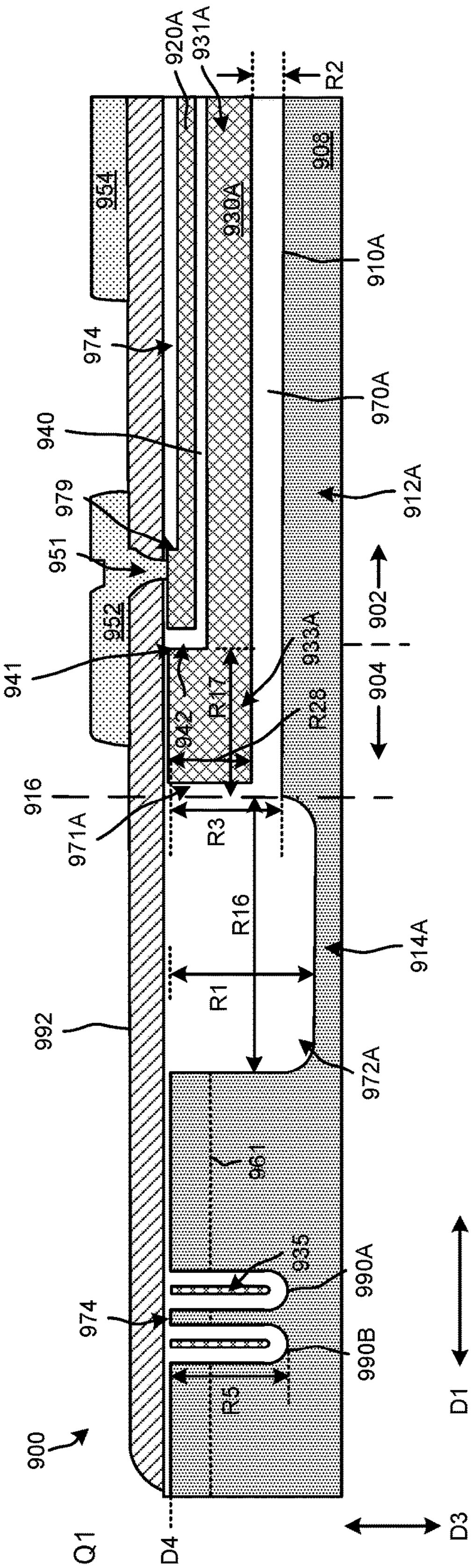
Figure 9C:
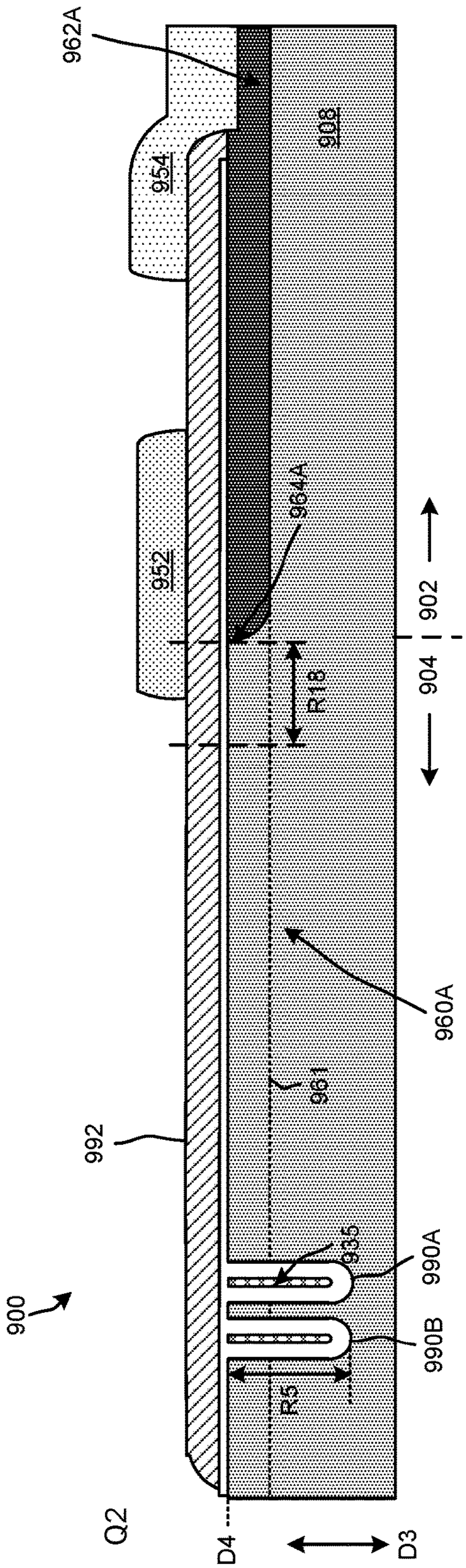
Figure 9D:
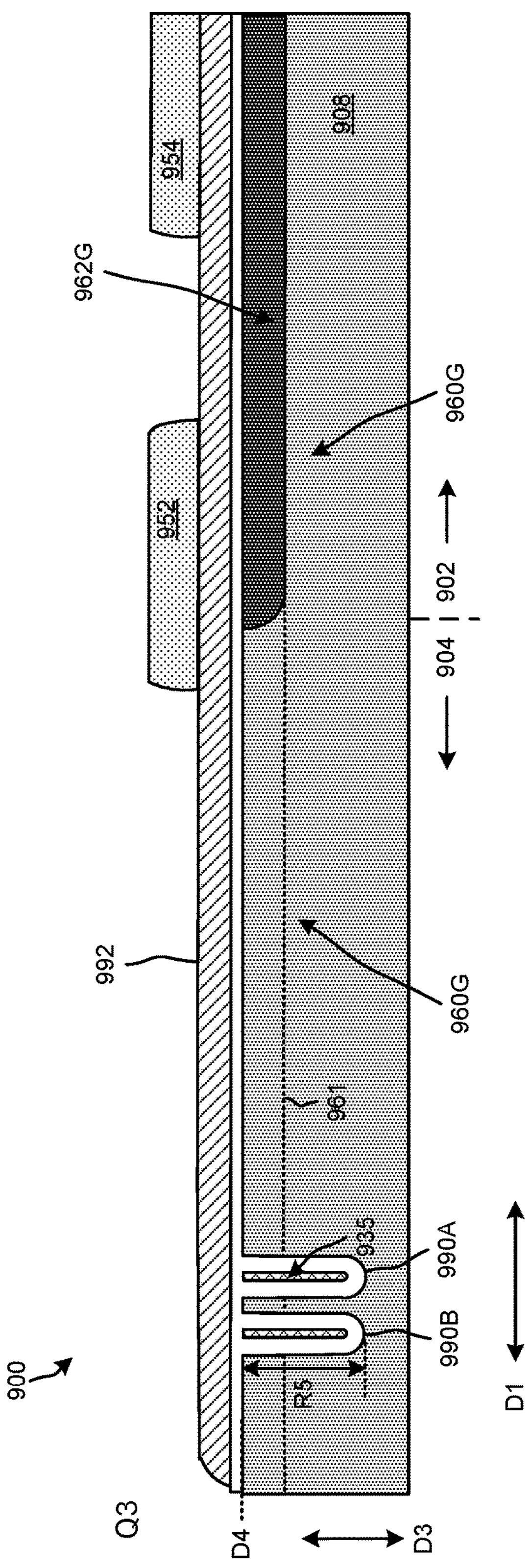
Figure 9E:
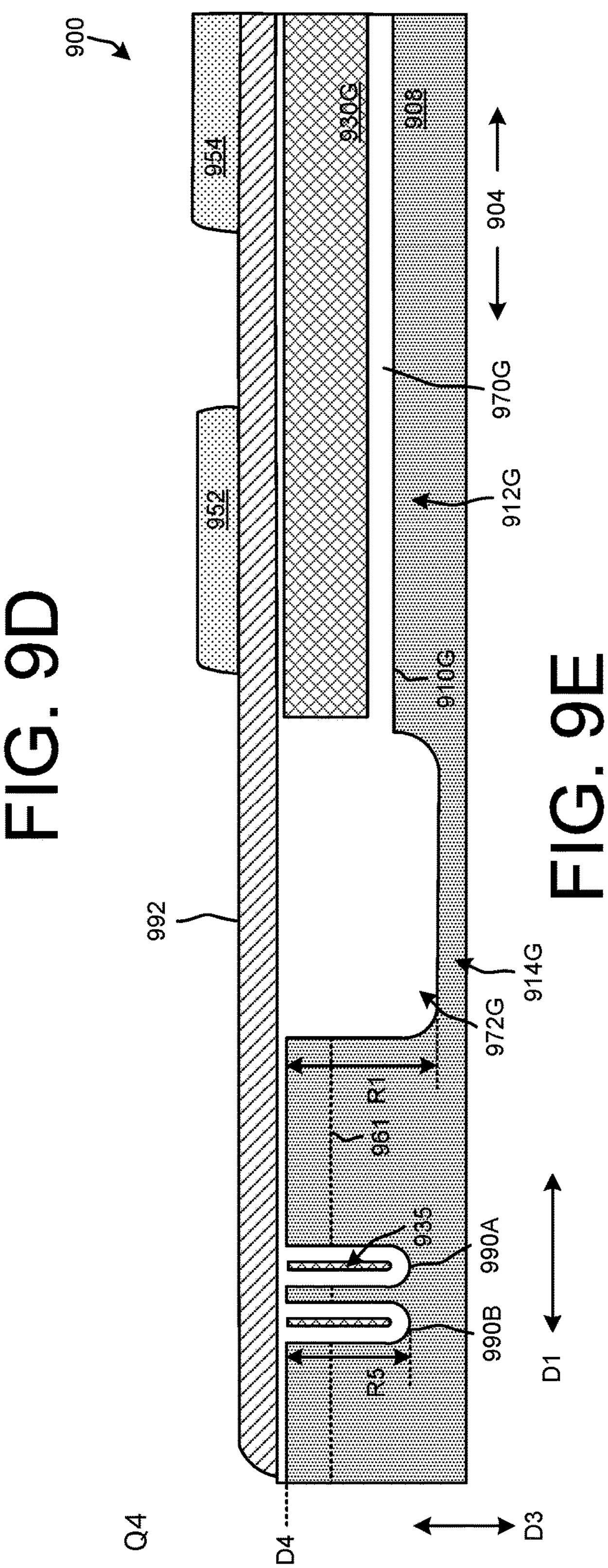
Figure 9F:
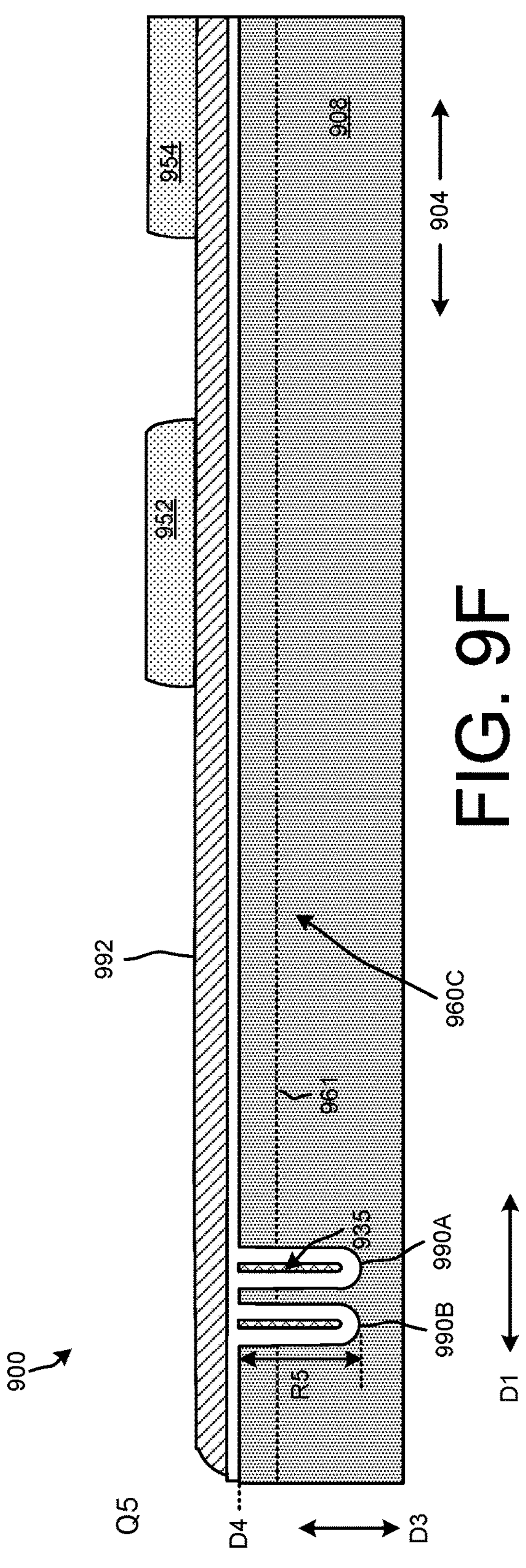
Figure 9G:
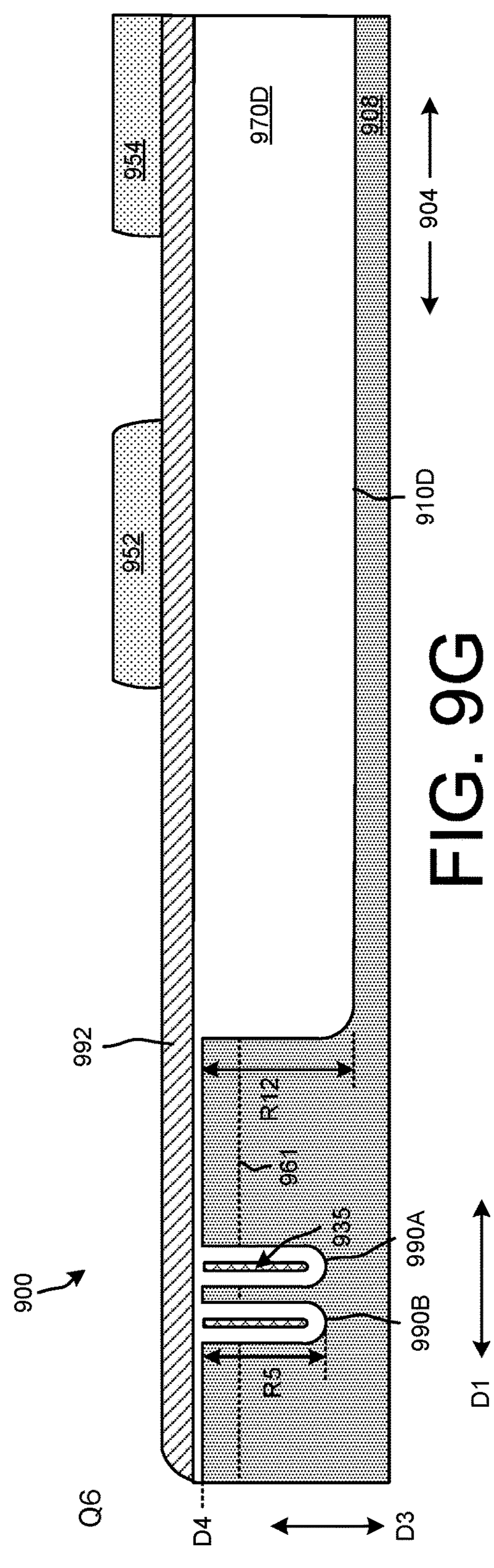
Figure 9H:
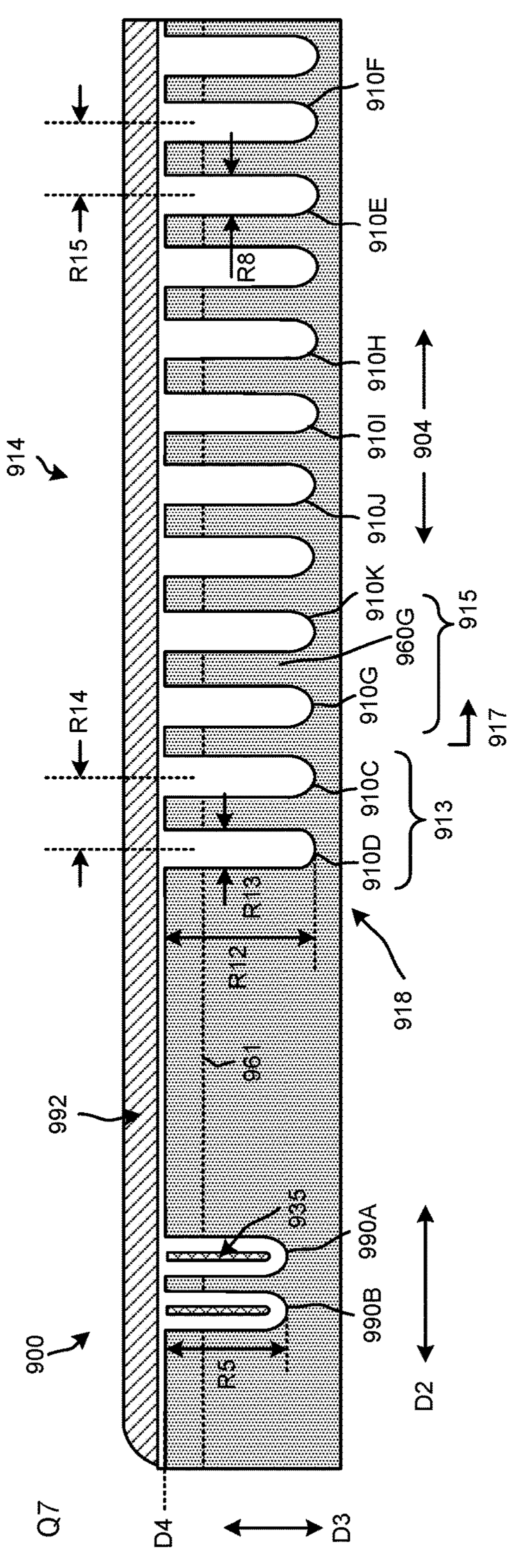
Figure 9I:
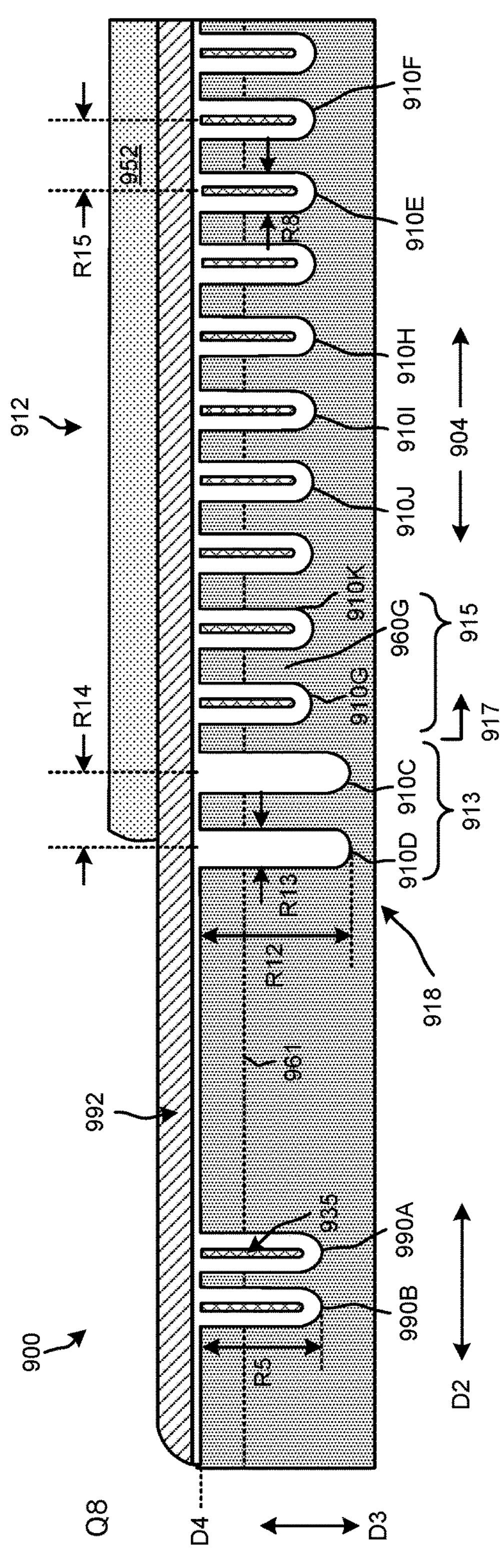
Figure 9J:
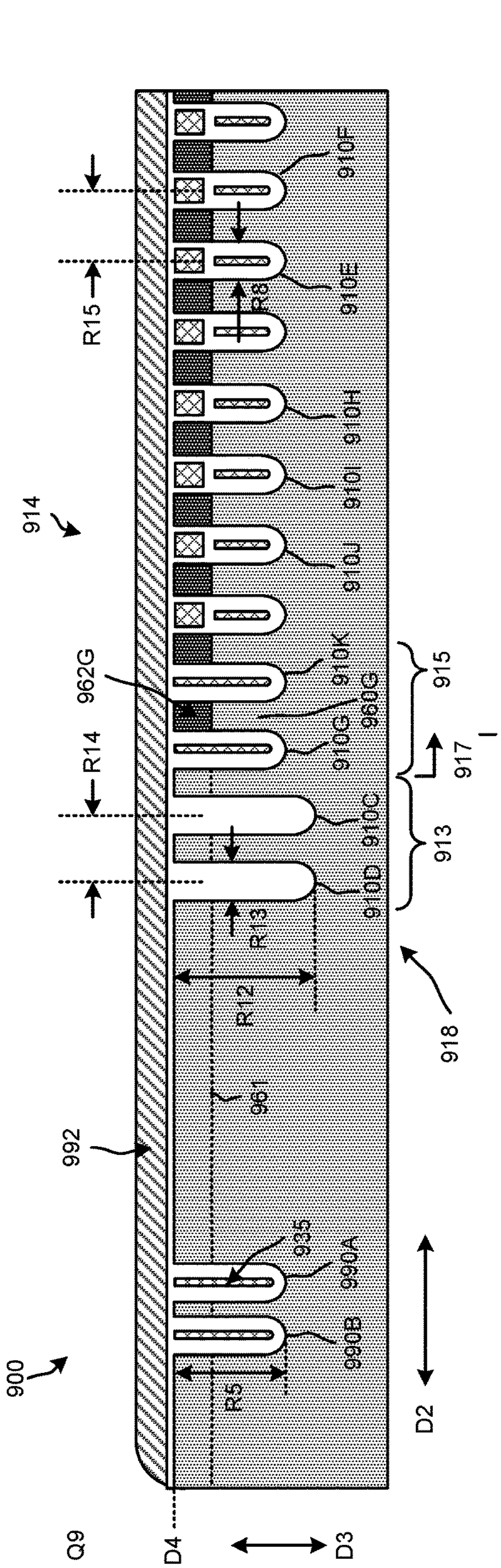
Figure 9K:
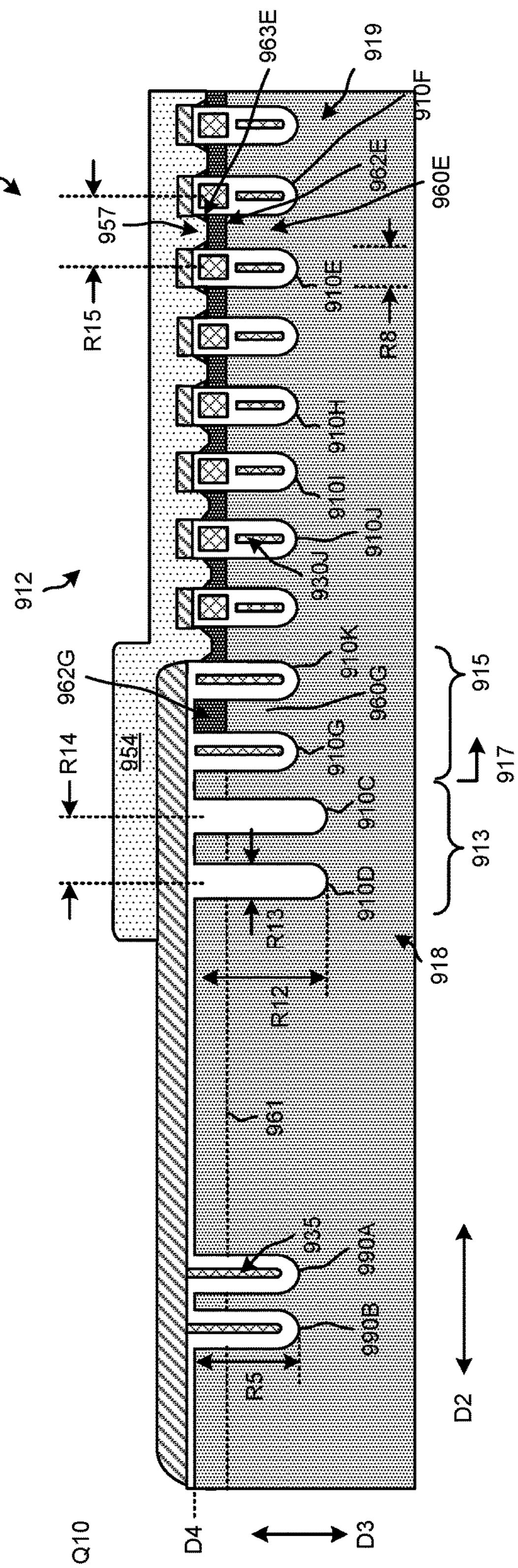
Figure 9L:
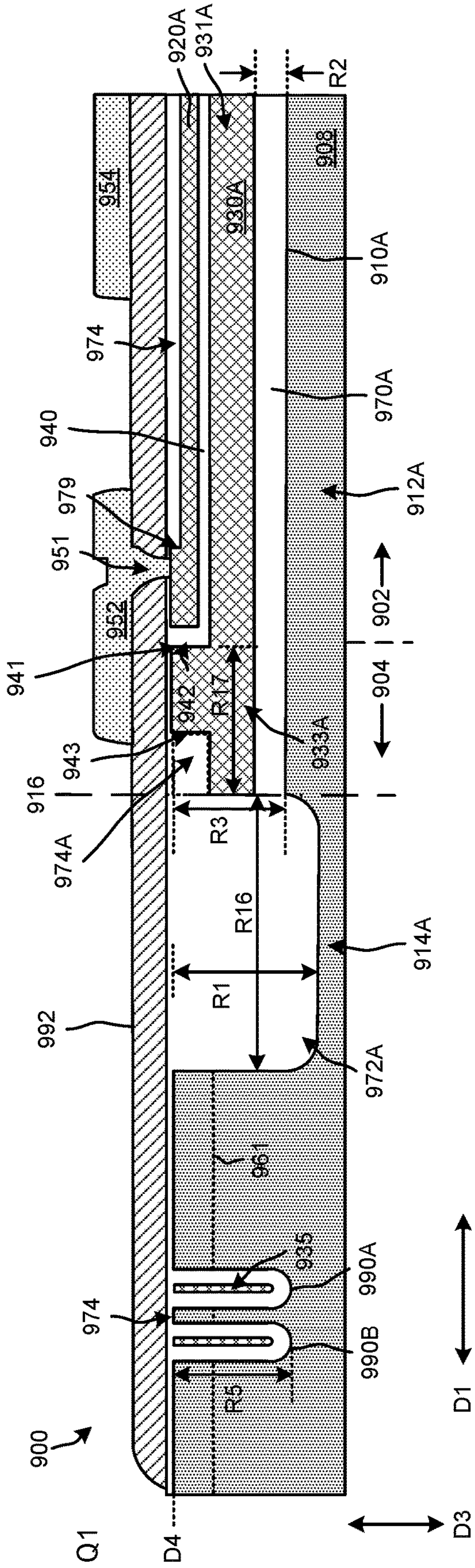
Figure 9M:
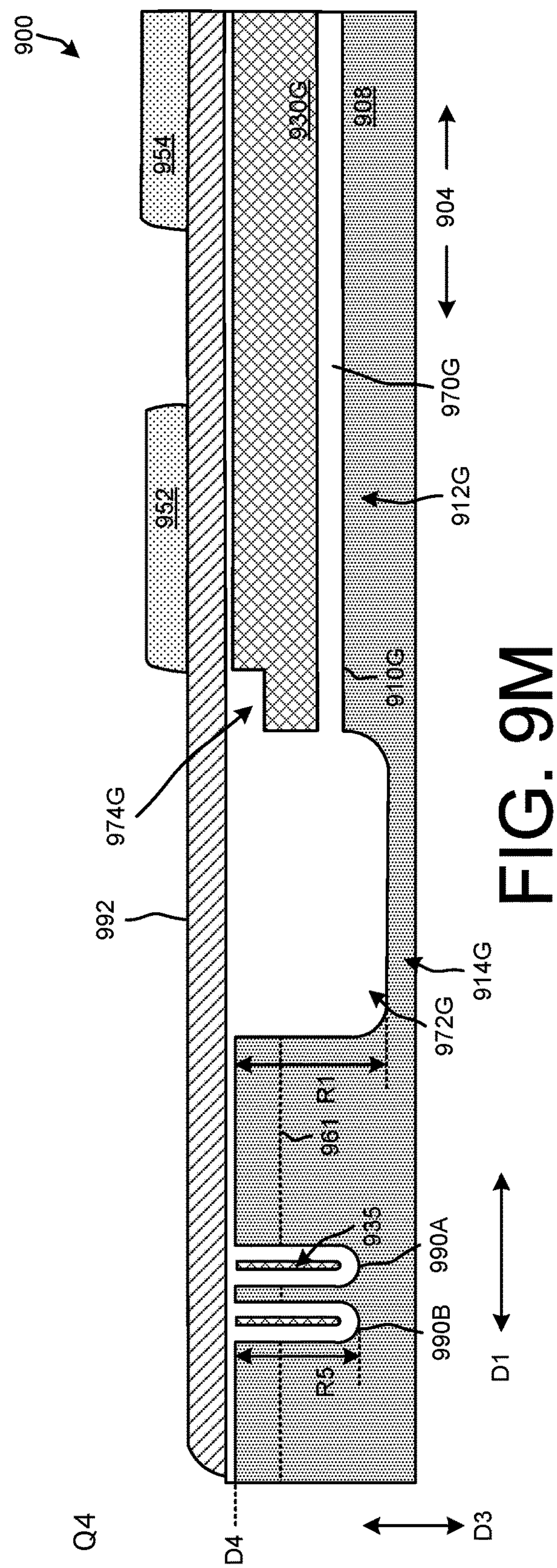
Figure 9N:
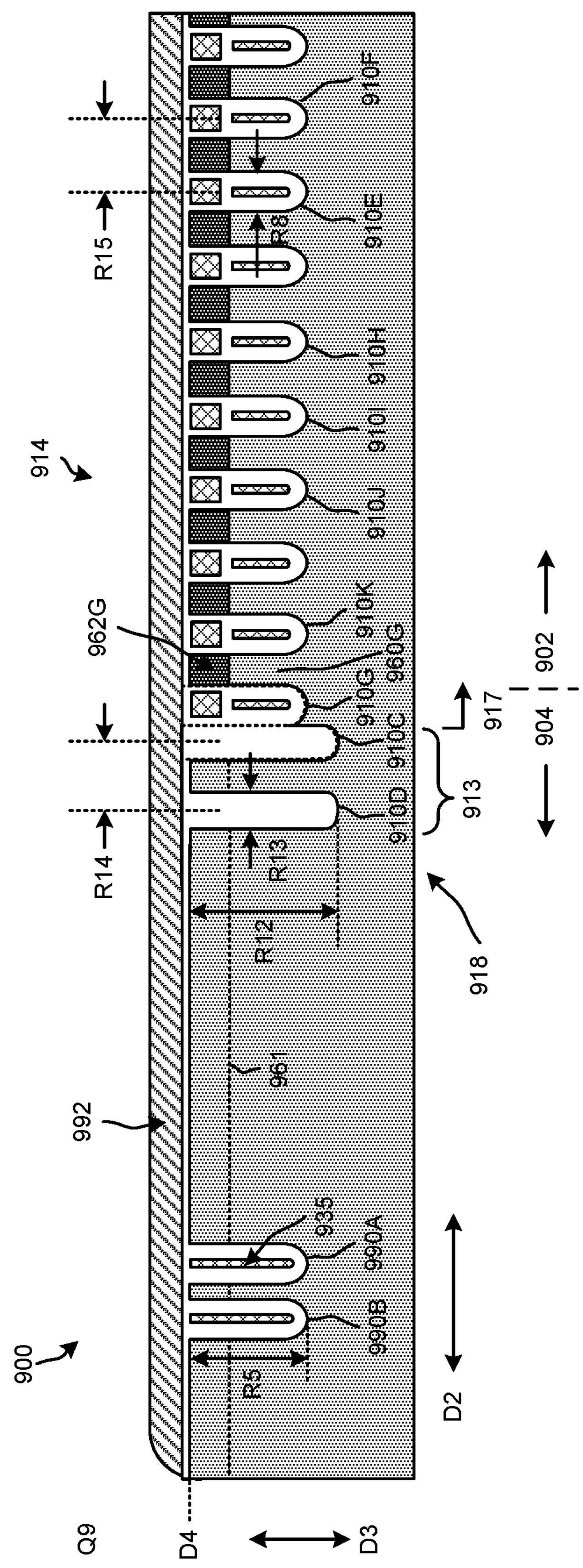

FIGS. 9A through 9N are diagrams that illustrate configurations of a termination region according to some implementations. FIG. 9A is a diagram that illustrates a plan view (or top view along the horizontal plane) of at least a portion of a semiconductor device 900 including an active region 902 and a termination region 904. FIGS. 9B through 9N are side cross-sectional views along different cuts (e.g., cuts Q1 through Q10) within the plan view FIG. 9A. To simplify the plan view shown in FIG. 9A some of the elements illustrated in the side cross-sectional views of FIGS. 9B through 9N are not shown. The side cross-sectional views along the different cuts included in FIGS. 9B through 9N are not necessarily drawn to the same scale (e.g., numbers of trenches, etc.) as the plan view shown in FIG. 9A. Variations of the semiconductor device 900, which can be combined in any combination, are illustrated in at least FIGS. 10A through 13L (and are numbered with the same or similar reference numerals).

As shown in FIG. 9A, a plurality of trenches 910, including for example trenches 910A through 910J, are aligned along a longitudinal axis D1 within the semiconductor device 900. At least some portions of the plurality of trenches 910 can be included in the active region 902 and at least some portions of the plurality of trenches 910 can be included in the termination region 904. For example, a portion of trench 910B is included in the active region 902 and a portion of the trench 910B is included in the termination region 904. As shown in FIG. 9A, trench 910G (which includes an electrode 931G) is entirely disposed within the termination region 904.

In this implementation, the trench 910C and 910D (which can be referred to as end trenches 913) are entirely disposed within the termination region 904 and are the outermost trenches from the plurality of trenches 910. Accordingly, the trenches 910C and 910D can be referred to as end trenches. Trenches from the plurality of trenches 910 in the semiconductor device 900 that are lateral to (or interior to) the end trenches 910C and 910D can be referred to as interior trenches 917.

As shown in FIG. 9A, a source contact region 936 defines an area within the semiconductor device 900 where source contacts (not shown) (such as source contact 957 shown in FIG. 9K) are formed. The source contact region 936 can also correspond with, for example, a source conductor region (e.g., a source metal region). The source contacts can be contacted with source implants (such as source implant 963E within a mesa region 960E between trenches 910E and 910F shown in FIG. 9K) of one or more active devices. A source formation region 956 (which can be referred to as a source exclusion edge) defines an area within which mesa regions between the plurality of trenches 910 are doped as doped source regions of active devices.

A shield dielectric edge region 934 shown in FIG. 9A corresponds with (e.g., approximately corresponds with), for example, an edge 941 of the inter-electrode dielectric 940 shown in FIG. 9B (which is a side cross-sectional view cut along line Q1). In some implementations, at least a portion of the inter-electrode dielectric 940 can include a gate dielectric such as gate dielectric portion 942 shown in FIG. 9B.

In this implementation, the active region 902 is defined by an area of the semiconductor device 900 that corresponds with a shield dielectric edge region 934. The termination region 904 includes areas of the semiconductor device 900 outside of (e.g., excluded by) the active region 902. Accordingly, the termination region 904, similar to the active region 902, is defined by the shield dielectric edge region 934. The shield dielectric edge region 934 corresponds approximately with a mask area for a shield electrode, a gate electrode, and an inter-electrode dielectric active area recess. Shield electrodes, in this implementation, are recessed below gate electrodes. For example, as shown in FIG. 9B, at least a portion of a shield electrode 930A is recessed below and insulated from a gate electrode 920A by the inter-electrode dielectric 940 in trench 910A.

In this implementation, portions of the plurality of trenches 910 (that are interior trenches 917 and) starting at line 916 (along longitudinal axis 916) in the plurality of trenches 910 can be referred to as trench extension portions 914. Portions of the plurality of trenches 910 (that are interior trenches 917 and) disposed to the right of line 916 and extend into (or toward) the active region 902 can be referred to as main trench portions 912. The line 916 can indicate a point at which a change in depth (e.g., a recess) of one or more of the plurality of trenches 910 starts.

For example, trench 910A includes a trench extension portion 914A on the left side of line 916 (toward the perimeter and in a distal direction away from the active region 902) and the trench 910A includes a main trench portion 912A (similarly shown as 912G in FIG. 9E) on the right side of line 916 (away from the perimeter and in a proximal direction toward the active region 902). In this implementation, at least a portion of the main trench portion 912A is included in (e.g., disposed within) the termination region 904, and a portion of the main trench portion 912A is included in (e.g., disposed within) the active region 902.

FIG. 9B is a diagram that illustrates a side cross-sectional view of the semiconductor device 900 cut along line Q1. The cut line Q1 is approximately along a centerline of the trench 910A so that the side cross-sectional view of the semiconductor device 900 is along a plane that approximately intersects a center of the trench 910A. The features shown in FIG. 9B are disposed in an epitaxial layer 908 of the semiconductor device 900. Other portions of the substrate, drain contact, and/or so forth are not shown FIGS. 9A through 9N. Many of the views associated with other figures are disposed in an epitaxial layer and similarly do not show the substrate, drain contact, and so forth.

As shown in FIG. 9B, the trench 910A includes a dielectric 970A disposed therein. Specifically, a portion of the dielectric 970A is coupled to (e.g., lines, is disposed on) a sidewall and a portion of the dielectric 970A is coupled to a bottom surface of the trench 910A within the main trench portion 912A of the trench 910A. In this cross-sectional view the portion of the dielectric 970A coupled to the bottom surface of the trench 910A is shown, and the portion of the dielectric 970A coupled to the sidewall of the trench 910A is not shown. The portion of the dielectric 970A shown in FIG. 9B along the bottom surface of the main trench portion 912A of the trench 910A can be referred to as a bottom dielectric. The dielectric 970A can be coupled to, or can include, a field dielectric 974 (which can be referred to as a field dielectric portion).

As shown in FIG. 9B, a gate electrode 920A and a portion 931A of a shield electrode 930A are disposed in a portion of the main trench portion 912A that is included in the active region 902 of the semiconductor device 900. The gate electrode 920A and the shield electrode 930A are separated by (e.g., insulated by) at least a portion of the inter-electrode dielectric 940. The portion of the main trench portion 912A included in the termination region 904 has a portion 933A of the shield electrode 930A disposed therein and insulated from the epitaxial layer 908 by the dielectric 970A. The portion 933A of the shield electrode 930A can be referred to as a termination region portion of the shield electrode, and the portion 931A of the shield electrode 930A can be referred to as an active region portion of the shield electrode. As shown in FIG. 9B, the portion 933A of the shield electrode 930A extends up to and contacts a bottom surface of an interlayer dielectric (ILD) 992 (which could include another dielectric such as field dielectric 974 (and/or a gate oxide)) along a thickness R28. The portion 933A of the shield electrode 930A has a vertical height (or top surface) within the trench 910A higher than a top surface of the portion 931A of the shield electrode 930A, which is recessed within the trench 910A. The portion 933A of the shield electrode 930A also has a thickness (e.g., vertical thickness) within the trench 910A greater than a thickness of the portion 931A of the shield electrode 930A. The portion 933A extends vertically along a profile (e.g., a sidewall profile) (not shown) of the trench extension portion 914A (similarly shown as 914G in FIG. 9E). The portion 933A of the shield electrode 930A has a portion is disposed between an edge of the gate electrode 920A (and the edge 941 of the inter-electrode dielectric 940 and/or the gate dielectric portion 942) and the transverse trench 983A.

In this implementation, a surface shield electrode and a surface gate electrode are excluded from the semiconductor device 900. This is contrasted with the semiconductor device 300 shown in FIGS. 3A through 3I which includes a surface shield electrode and a surface gate electrode. As shown in FIG. 9A, a gate runner conductor 952 is coupled directly to the gate electrodes included in at least some of the plurality of trenches 910 through vias 951. For example, gate electrodes in multiple (e.g., more than three) adjacent trenches from the plurality of trenches 910 are coupled to the gate runner through vias 951. Specifically, each of gate electrodes of the plurality of trenches 910 that includes an active device is coupled to the gate runner conductor 952 through vias 951. Similar to the gate runner conductor 952, a source runner conductor 954 (which is similar to portion 933A) is brought up to at least a surface of the epitaxial layer (aligned with plane D4) in the active region 902 and (which is configured to be coupled to a source potential) is coupled to each source within the plurality of trenches 910 using one or more vias (not shown).

As shown in FIG. 9A, a doping region 938 is an area within which a well implant (e.g., a p-type well implant, an n-type well implant) is performed. In this implementation, the doping region 938 is associated a p-well dopant region (e.g., well dopant region 962A shown in FIG. 9C). In this implementation, because a surface shield electrode and a surface gate electrode are excluded from the semiconductor device 900 the well implant can be performed over a larger area of the semiconductor device 900. For example, the area within which a well implant can be performed within the semiconductor device 300 was limited by a surface area of the surface shield electrode 332 and/or a surface area of the surface gate electrode 322, which block implantation to form the well implant. As a specific example, in FIGS. 3B and 3C, areas of the epitaxial layer 308 (such as the mesa region 360A) under the gate runner conductor 352 and/or the source runner conductor 354 could not be implanted with a well implant because the surface shield electrode 332 and the surface gate electrode 322 are disposed below the gate runner conductor 352 and below the source runner conductor 354.

In contrast, because the semiconductor device 900 does not include a surface shield electrode or a surface gate electrode, implantation to form a well implant is not blocked. Accordingly, a well implant can be performed over virtually the entire surface area of the semiconductor device 900.

As shown in FIG. 9C, a well dopant region 962A extends below the source runner 954 and below the gate runner conductor 952. Although not shown, the well dopant region 962A can extend below under only the source runner 954 or only below the gate runner conductor 952 (if in a different location). Although not shown, the well dopant region 962A can be extended toward the perimeter (e.g., in a distal direction away from the active region 920).

An area where the well dopant region 962A can be optionally expanded is illustrated with line 961. In other words, the well dopant region 962A can be expanded up to (e.g., can extend to, can be disposed up to and abut or contact) one or more of the perimeter trenches 990A, 990B. In such embodiments, the expansion of the well dopant region 962A along line 961 can be implemented in conjunction with the addition of, for example, a transverse trench such as transverse trench 383A shown in FIG. 3A or transverse trench 983A shown in FIG. 10A as a few examples. The transverse trench can be a transverse trench that has an edge substantially aligned with, for example, an edge (e.g., a terminating edge) of the shield electrode 930A that is disposed within the trench 910A.

The well dopant region can be expanded beyond (e.g., can extend beyond, can be disposed beyond) one or more of the perimeter trenches 990A, 990B. The line 961 is illustrated in additional figures associated with FIGS. 9A through 9N. By doping, for example, the entire surface of the semiconductor device 900, a doping mask associated with, for example, doping region 938 can be obviated.

In this implementation, for desirable charge balancing, a length R18 (which can be referred to as a lateral balance length) is equal to or greater than depth R3 (shown in FIG. 9B). The length R18 extends from an end of the main trench portion 912A (starting at line 916 shown in FIG. 9B) to an edge 964A of the well dopant region 962A (shown in FIG. 9C). In some implementations, length R18 can be less than or equal to length R17, or greater than length R17. When edge 964A of the well dopant region 962A is spaced laterally (such that R18 is approximately greater than R3, for example) the breakdown can be maintained in the active region 902 rather than occurring in the termination region 904. The breakdown voltage, reliability during testing (e.g., unclamped inductive switching (UIS)), device performance, and/or so forth of the semiconductor device 900 can be maintained in the active region 902 when the depletion edge laterally from the edge 964A of the well dopant region 962A is greater than the vertical depletion associated with distance R3. By doing so, the electric field in the vertical direction can be greater than the electric field in the lateral direction.

Referring back to FIG. 9B, a portion 972A of the dielectric 970A (also referred to as an extension portion of the dielectric or as an extension dielectric) is included in the trench extension portion 914A. The portion 972A of the dielectric 970A is aligned along (e.g., extends in) a vertical direction D3 from a bottom of the trench extension portion 914A of the trench 910A to at least a top of the trench 910A. The top of the trench 910A (which includes the trench portion 914A and the main trench portion 912A) is aligned along a plane D4, which is aligned along a top surface of a semiconductor region of the semiconductor device 900. The semiconductor region of the semiconductor device 900 can correspond approximately with a top surface of the epitaxial layer 908. The dielectric 970A can include one or more dielectric layers and/or one or more dielectric types formed using one or more different formation processes.

As shown in FIG. 9B, a portion 971A of the dielectric 970A is included in at an end of the main trench portion 912A. The portion 971A of the dielectric 970A is aligned along (e.g., extends in) a vertical direction D3 from a bottom of the transverse main trench portion 912A to at least a top of the main trench portion 912A. The top of the main trench portion 912A is aligned along the plane D4.

The thickness of the dielectric 970A included in the trench 910A varies along the longitudinal axis D1 of the trench 910A. The portion 972A of the dielectric 970A included in the trench extension portion 914A has at least a thickness R1 in the trench extension portion 914A (also can be referred to as a height because it is aligned along the vertical axis D3) that is greater than a thickness R2 of a portion of the dielectric 970A included in the main portion 912A (both in a termination region portion and in an active region portion) of the trench 910A. The thickness of the portion 972A of the dielectric 970A extends up to the bottom surface of the inter-layer dielectric (IED) 992 beyond the thickness R1. The thickness R1 corresponds approximately with a depth (along the vertical direction D3) of the trench extension portion 914A.

Also, the portion 971A of the dielectric 970A included in the main trench portion 912A has at least a thickness R3 (also can be referred to as a height) that is greater than the thickness R2 of a portion of the dielectric 970A included in the main portion 912A of the trench 910A and is less than the thickness R1 of the portion 972A of the dielectric 970A included in the trench extension portion 914A. The thickness of the portion 971A of the dielectric 970A shown in FIG. 9B extends up to a bottom surface of the inter-layer dielectric 992 beyond the thickness R3. The thickness R3 corresponds approximately with a depth (along the vertical direction D3) of the main trench portion 912A. Accordingly, a depth of the trench 910A varies along the longitudinal axis D1 from depth R3 to depth R1.

Referring back to FIG. 9B, in this implementation, the trench extension portion 914A includes the portion 972A of the dielectric 970A and excludes a shield electrode. Although not shown, in some implementations, a trench extension portion such as the trench extension portion 914A can include a portion of a shield electrode (e.g., a portion of a shield electrode, a recessed shield electrode).

Although not shown in FIG. 9B, the thickness R2 of the portion of the dielectric 970A in the main portion 912A of the trench 910A can vary along the longitudinal axis D1. For example, a thickness of a portion of the dielectric 970A included in the termination region 904 of the main trench portion 912A can be greater than a thickness of a portion of the dielectric 970A included in the active region 902 of the main trench portion 912A, or vice versa.

As shown in FIG. 9B, a length R16 of the trench extension portion 914A of the trench 910A is longer than a length R17 of a portion of the main trench portion 912A of the trench 910A included in the termination region 904 (up to the edge 941 of the gate dielectric portion 942 of the IED 940). Although not shown, the length R16 of trench extension portion 914A of the trench 910A can be equal to or shorter than the length R17 of the portion of the main trench portion 912A of the trench 910A included in the termination region 904.

The thickness R2 of the portion 972A of the dielectric 970A included in the trench extension portion 914A is configured to have termination region advantages such as those described above. Specifically, an undesirable electric field or breakdown across the dielectric 970A included in the main trench portion 912A can be prevented or substantially prevented inclusion of the trench extension portion 914A within the semiconductor device 900. In other words, an undesirable electric field at the end of a trench (i.e., the main trench portion 912A without the trench extension portion 914A) or breakdown across a dielectric at the end of the trench could occur without features such as the trench extension portion 914A.

Referring back to FIG. 9A, perimeter trenches 990A, 990B are disposed around a perimeter of the plurality of trenches 910. As shown in FIG. 9B, the perimeter trenches 990A, 990B have a depth R5 that is approximately equal to a depth (e.g., distance R3) of the main trench portion 912A. The depth R5 of the perimeter trenches 990A, 990B is less than a depth (e.g., distance R1) of the trench extension portion 914A. The depth of one or more of the perimeter trenches 990A, 990B can be less than or greater than the depth of the main trench portion 912A. The depth of one or more of the perimeter trenches 990A, 990B can be greater than or equal to the depth of the trench extension portion 914A. The width of one or more of the perimeter trenches 990A, 990B can be approximately the same as or different than (e.g., narrower than, wider than) the width of the main trench portions 912 of the plurality of trenches 910.

In this implementation, each of the perimeter trenches 990A, 990B includes at least a portion of a shield electrode. For example, the perimeter trench 990A includes a shield electrode 935 (or shield electrode portion). In some implementations, one or more of the perimeter trenches 990A, 990B can include a recessed electrode, or may not include a shield electrode (e.g., may exclude a shield electrode and can be substantially filled with a dielectric). The semiconductor device 900 can include more or less perimeter trenches than shown in FIGS. 9A through 9N.

As shown in FIG. 9A, a portion of the gate electrode 920A is recessed below the ILD 992. The recessing of the gate electrode 920A defines an edge 979 (shown in FIG. 9B) that corresponds with a mask layer 999 shown in FIG. 9A. The recessing can be performed for a self-aligned dimple contact (using contact 951) active area of the gate electrode 920A. For an aligned contact a relatively shallow recess can be formed across the gate electrode 920A. An example of such an embodiment is shown in FIG. 10E. A portion of the gate electrode 920A in electrical contact with the gate runner conductor 952 through the via 951 is not recessed. More details related to recessing of a gate electrode are discussed below in connection with, for example, FIG. 10B.

Referring back to FIG. 9A, the trench extension portions 914 have widths that are approximately equal to widths of the main trench portions 912. The widths of the trenches described herein can be measured across a cross-section of the trenches while being referenced along a horizontal plane through the trenches. The widths can be referred to as cross-sectional widths. As a specific example, the trench extension portion 914A of the trench 910A has a width R10 that is approximately equal to a width R11 of the main trench portion 912A of the trench 910A. This consistency in width is also shown in, for example, trench 910E in the various views. Specifically, trench 910E shown in FIG. 9H (which is cut along line Q7 through the trench extension portions 914 orthogonal to the plurality of trenches 910) has a width R8 that is approximately equal to, for example, the width R8 of the trench 910E shown in FIG. 9I (which is cut along line Q8 through the main trench portions 912 orthogonal to the plurality of trenches 910). Although not shown in FIG. 9A, one or more of the trench extension portions 914 can have widths that are less than or are greater than the widths of one or more of the main trench portions 912.

Although not shown, one or more transverse trenches can be included in the semiconductor device 900 and can be aligned along a longitudinal axis D2 that is orthogonal to (e.g., substantially orthogonal to) the longitudinal axis D1. The transverse trench(es) can be similar to the transverse trenches (e.g., transverse trench 380A, transverse trench 383A) described above.

FIG. 9D is a side cross-sectional view of a mesa region 960G adjacent to trench 910G cut along line Q3. In this implementation, the mesa region 960G is entirely disposed within the termination region 904. As shown in FIG. 9D, well dopant region 962G is included in the mesa region 960G. As mentioned above, an area where the well dopant region 962G could be expanded is illustrated with line 961.

FIG. 9E is a side cross-sectional view of the trench 910G which is cut along line Q4 shown in FIG. 9A. In this implementation, the trench 910G is entirely disposed within the termination region 904. Trench 910G and other trenches entirely disposed within the termination region 904, can be referred to as termination trenches 918. The dimension of the trench 910G (which includes extension dielectric 972G) is similar to the dimensions of (e.g., dimensions that are directly lateral to) the trench 910A shown in FIG. 9B. The dimensions of the trench 910G can be different than corresponding portions of the trench 910A shown in FIG. 9B. For example, the trench 910G can have a constant depth, which can be the same as or different than (e.g., deeper than, shallower than) the depth R1 of the trench extension portion 914A (shown in FIG. 9B) or the same as or different than (e.g., deeper than, shallower than) the depth R3 of the main trench portion 912A.

The shield electrode 930G disposed within the trench 910G can be electrically floating. The shield electrode 930G disposed within the trench 910G can be electrically coupled to a source potential. Accordingly, the shield electrode 930G can be tied to the same source potential as the shield electrode 930A shown in FIG. 9B. The shield electrode 930G disposed within the trench 910G can be recessed. As mentioned above, an area where the well dopant region 962G could be expanded is illustrated with line 961.

FIG. 9F is a side cross-sectional view of a mesa region 960C adjacent to the end trench 910D, which is cut along line Q5 shown in FIG. 9A. In this implementation, the mesa region 960C is disposed outside of the doping region 938. Accordingly, a well dopant region is excluded from the mesa region 960C. As mentioned above, an area where a well dopant region can be included in one or more portions of a cross-sectional area is illustrated with line 961.

FIG. 9G is a side cross-sectional view of the end trench 910D, which is cut along line Q6 shown in FIG. 9A. The end trench 910D is filled with a dielectric 970D. Although not shown, in some implementations, at least a portion of the end trench 910D can include a shield electrode. The end trench 910D can have a length (along the longitudinal direction D1) that is approximately the same as a length of, for example, the trench 910A.

The end trench 910D has a depth R12 greater than a depth R5 of the perimeter trenches 990A, 990B. The end trench 910D can have a depth E12 equal to, or less than a depth of one or more of the perimeter trenches 990A, 990B. In this implementation, the depth R12 of the end trench 910D is approximately equal to a depth (e.g., distance R1) of the trench extension portion 914A (shown in FIG. 9B). The end trench 910D can have a depth R12 that is less than or greater than a depth (e.g., distance R1) of the trench extension portion 914A (shown in FIG. 9B). The end trench 910D can have a depth that varies, similar to the variation in depth of trench 910A.

Although not shown, in some implementations, multiple trenches similar to end trench 910D, which are filled with a dielectric can be included in the semiconductor device 900. An example of such an implementation is described in connection with FIGS. 4A through 4E above. Although not shown, in some implementations, a trench that varies with width and has a portion that includes a shield electrode, such as trench 910C can be an end trench. In such implementations, the end trench 910D can be omitted.

As mentioned above, FIG. 9H is cut along line Q7 (shown in FIG. 9A) through the trench extension portions 914 orthogonal to the plurality of trenches 910. In this implementation, the widths of the plurality of trenches 910 in the trench extension portions are the same as the widths of the plurality of trenches 910 in the main trench portions. Also, each of widths of the plurality of trenches 910 is the same across the plurality of trenches 910 within the trench extension portions. For example, as shown in FIG. 9H the end trench 910D has a width R13 that is approximately equal to the width R8 of the trench extension portion of trench 910E. The end trench 910D can have a width that is greater than, or less than, the width R8 of the trench extension portion of trench 910E.

A pitch R14 between the end trench 910D and end trench 910C (which are adjacent trenches) is approximately equal to a pitch R15 between trench 910E and trench 910F (which are adjacent trenches). The pitch R14 between the end trench 910D and end trench 910C can be the less than, or greater than, the pitch R15 between trench 910E and trench 910F.

FIG. 9I is a side cross-sectional view cut along line Q8 (shown in FIG. 9A) through the main trench portions 912 orthogonal to the plurality of trenches 910. In this implementation, the gate runner conductor 952 is disposed above the plurality of trenches 910, and the line Q8 intersects along a relatively shallow portion of the interior trenches 917 from the plurality of trenches 910. Both end trench 910D and 910C (i.e., end trenches 913) include a dielectric without a shield electrode, while the remainder of the plurality of trenches 910 along this cutline Q9 (which includes the interior trenches 917) each include a shield electrode. Also, the depth R12 of end trenches 910D, 910C is greater than a depth of the remainder of the trenches (e.g., non-end trenches, interior trenches 917), which include shield electrodes.

As mentioned above, in this implementation, the widths of the plurality of trenches 910 in the trench extension portions are the same as the widths of the plurality of trenches 910 in the main trench portions. Also, each of the widths of the plurality of trenches 910 is the same across the plurality of trenches 910 within the main trench portions. For example, as shown in FIG. 9I the end trench 910D in the main trench portion has a width R13 that is approximately equal to the width R8 of the main trench portion of trench 910E. The end trench 910D can have a width in the main trench portion that is greater than, or less than, the width R8 of the main trench portion of trench 910E.

FIG. 9J is a side cross-sectional view cut along line Q9 (shown in FIG. 9A) through the main trench portions 912 orthogonal to the plurality of trenches 910 between the gate runner conductor 952 and the source runner conductor 954. Different types of interior trenches 917 from the plurality of trenches 910 are included in this view. The end trenches 913 include a dielectric without a shield electrode, while the remainder of the plurality of trenches 910 along this cutline Q9 each include at least a shield electrode. Specifically, both trench 910G and 910K, which can be referred to as transition region trenches 915 (which are included in the interior trenches 917), include a shield electrode that is grounded and each does not include a gate electrode. The remaining trenches (excluding the end trenches 913 and the transition region trenches 915) each includes a gate electrode as well as a shield electrode.

The end trenches 913 can include less than two trenches or more than two trenches, and the transition region trenches 915 can include less than two trenches or more than two trenches. For example, the transition region trenches 915 can be excluded or converted to an active trench. In such implementations, the end trench 910C can be in contact with an active trench. Such an implementation is illustrated in, for example, FIG. 9E (and are described in connection with additional variations to semiconductor device 900 below).

As shown in FIG. 9E, the end trench 910C is in contact with or overlaps in parallel with the active trench 910G In other words, a profile of the end trench 910C (shown with a dashed line) intersects (e.g., overlaps, contacts) a profile of the active trench 910G (shown with a dashed line). Accordingly, the active trench 910G is self-aligned to the end trench 910C. Similar structures are described and shown in other variations, however, the trench profiles are not shown in all of the figures. In FIG. 9E, a surface shield conductor and a surface gate conductor are excluded.

The shield electrodes included in the transition region trenches 915 can be electrically floating. Trenches 910C, 910D, 910G, and 910K, which are trenches entirely disposed (along the longitudinal axis D1 within the termination region 904, can be referred to as termination trenches 918.

In this implementation, the mesa region 960G (and the well dopant region 962G) can be a grounded or electrically floating mesa region. The mesa region 960G (and the well dopant region 962G) can be coupled to a source potential. In such implementations, a source contact such as source contact 957 can be coupled to the mesa region 960G. In some implementations, a mesa region between one or more end trenches such as the end trenches 913 and/or a mesa region between transition region trenches such as the transition region trenches 915 can be electrically floating or grounded. The mesa region between the one or more transition region trenches can be coupled to a source potential. Also, in some implementations, a mesa region disposed between the transition region trenches 915 and the end trenches 913 can be electrically floating.

FIG. 9K is a side cross-sectional view of the main trench portions 912 of the plurality of trenches 910 cut along line Q10 shown in FIG. 9A through the termination region 904 and into the active region 902. A portion of the cross-sectional view of the plurality of trenches 910 is included in the termination region 904 and a portion of the cross-sectional view of the plurality of trenches 910 is included in the active region 902.

Because the width of the end trench 910D is substantially constant along the longitudinal axis D1, in this implementation, the width R13 of the end trench 910D (shown in FIG. 9K) is the same along cut line Q10 as along, for example, cut line Q7 (shown in FIG. 9H). Similarly, the width of at least some of the trenches such as, for example, trench 910C and trench 910E is constant (substantially constant) along the longitudinal axis D1.

As shown in FIG. 9K, the trenches from the plurality of trenches 910 that include source implants therebetween can be referred to as active device trenches 919. Because the general structure of the active device trenches 919, the partially active gate trench, the termination trenches 918, the source implants, and so forth are similar to those shown in FIG. 3I, these features will not be described again here in connection with FIG. 9K except as otherwise noted. Although not shown in FIG. 9K, the end trenches 910D and/or 910C can include at least a portion of a shield electrode (e.g., a recessed shield electrode, a shield electrode with a thick bottom oxide disposed below, an electrically floating shield electrode, a shield electrode coupled to a source potential (e.g., via the source conductor runner 954) or a gate potential (e.g., via the gate conductor runner 952)).

FIG. 9L is a variation of FIG. 9B. As shown in FIG. 9B, length R17 extends between an edge (not labeled) of the dielectric 970A and edge 941 such that portion 971A (shown in FIG. 9B) is excluded. In some implementations, portion 971A can be included. As shown in FIG. 9L, the semiconductor device 900 includes a dielectric portion 974A (which can also be referred to as protrusion dielectric and is illustrated in FIG. 9L with a dashed line) that is recessed (similar to or the same as the dielectric disposed above the recessed portion 936G of the shield electrode 930G shown in FIG. 12H). Accordingly, a portion of the shield electrode 930A is recessed below the dielectric portion 974A. The dielectric portion 974A intersects (e.g., is in contact with, overlaps), or is a part of, the portion 972A of the dielectric 970A included in the trench extension portion 914A (or intersects a profile (which is not shown with a dashed line in this figure) of the trench extension portion 914A). The depth of the recess of the shield electrode 930A below dielectric portion 974A is approximately at a same depth as a bottom surface of the inter-electrode dielectric 940. As shown in FIG. 9B, the shield electrode 930G (from the left to right) is recessed (e.g., first recess) below dielectric portion 974A, is not recessed (e.g., protrudes vertically, extends up to a top of the trench 910A) between an edge 943 of the dielectric portion 974A and the edge 941 of the inter-electrode dielectric 940, and then is also recessed (e.g., second recess) below inter-electrode dielectric 940. FIG. 9M is a diagram that illustrates trench 910G including dielectric 974G (which can be referred to as a protrusion dielectric), which corresponds with dielectric 974A shown in FIG. 9L. Many of the other features of the semiconductor device 900, such as the edge 964A of the well dopant region 962A shown in FIG. 9C, can be integrated with the features shown in FIGS. 9L and 9M.

The dielectric 974A (and similar protrusion dielectrics shown in other implementations) can eliminate a high electric field near the end of the trench 910A, thus increasing stability, reliability, and breakdown voltage of the semiconductor device 900 (and associated termination region 904). The dielectric 974A can also mitigate high lateral electric fields toward the end of the trench 910A (along direction D1 toward the left and near the portion 972A of the dielectric 970A) that could be due to relatively light surface doping concentrations near the end of the trench 910A.

Figure 10A:
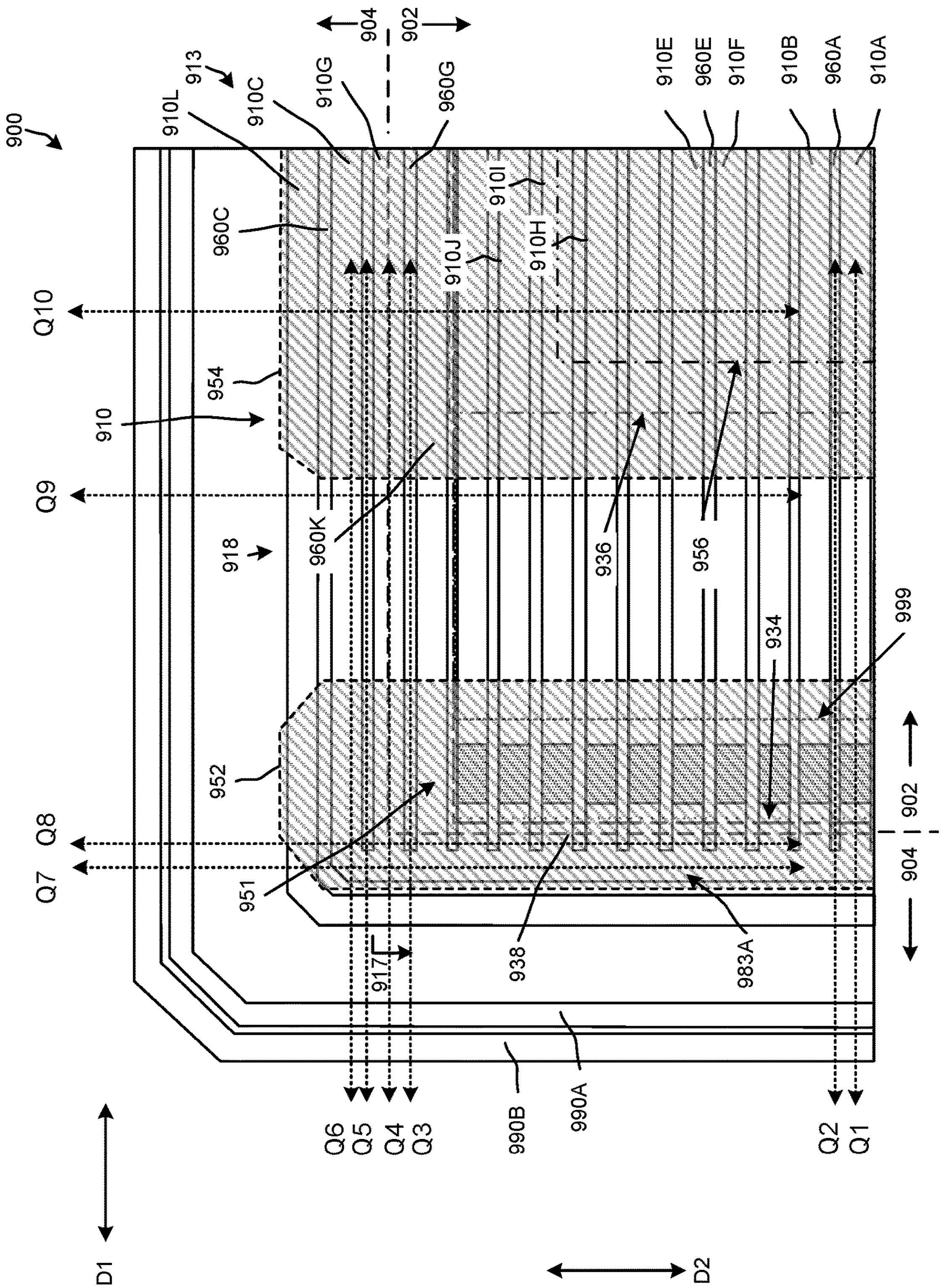
FIGS. 10A through 10O are diagrams that illustrate variations on at least some of the features of the semiconductor device shown in FIGS. 9A through 9N.
Figure 10B:
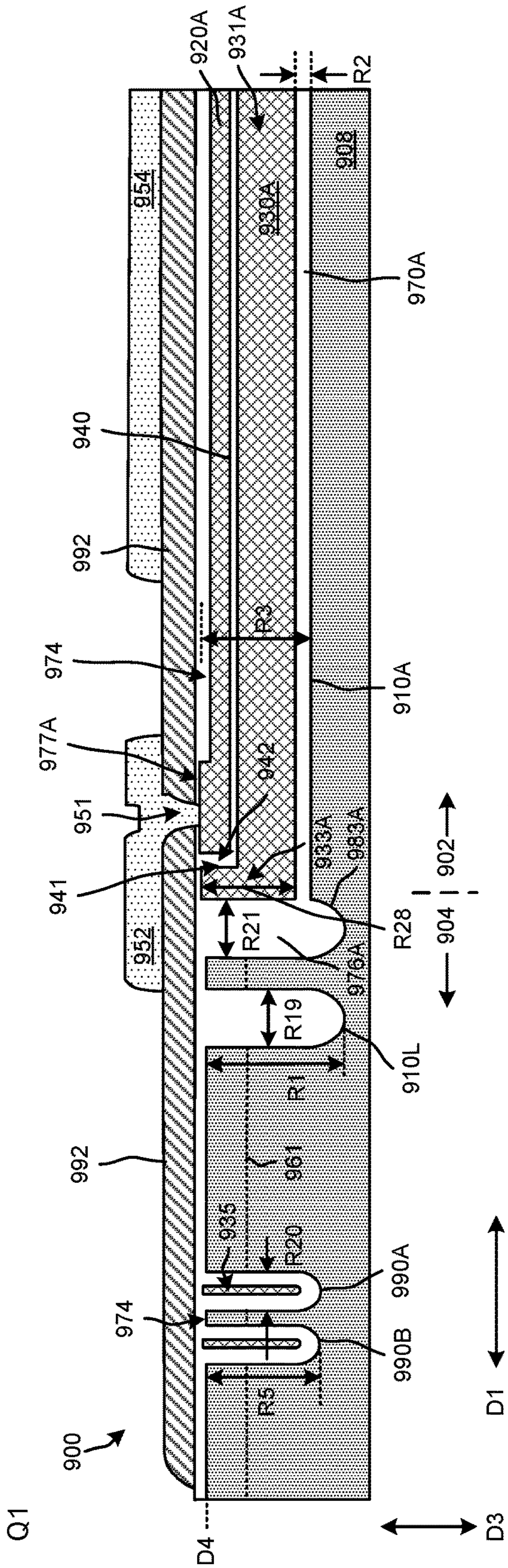
Figure 10C:
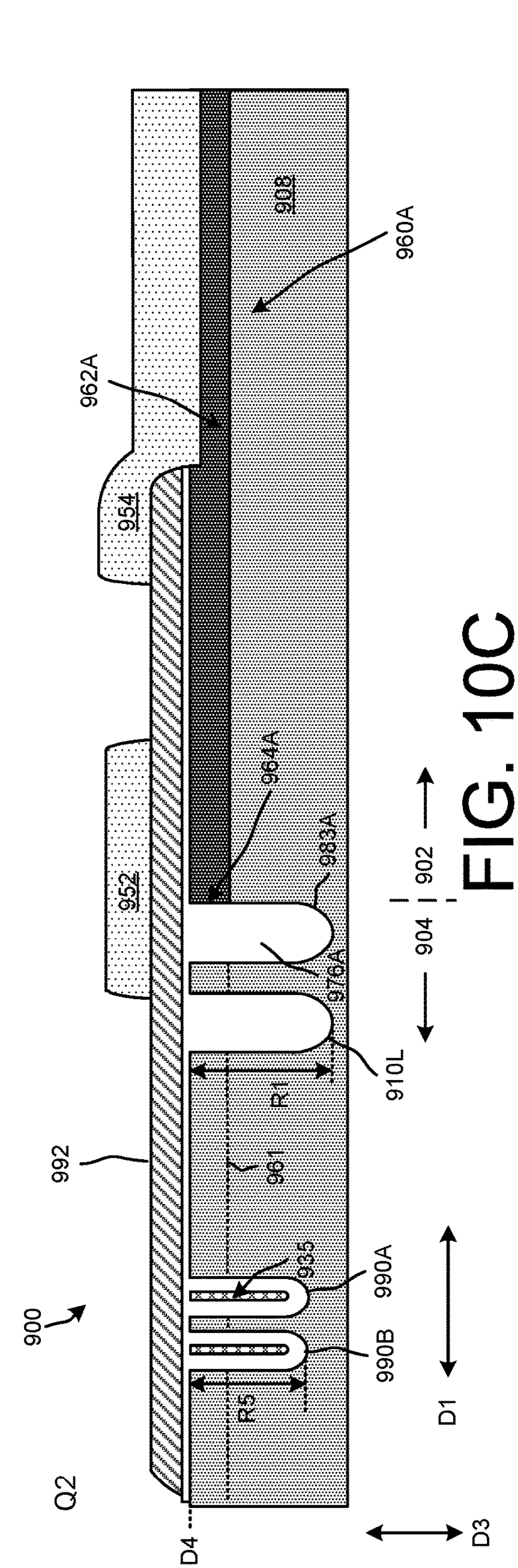
Figure 10D:
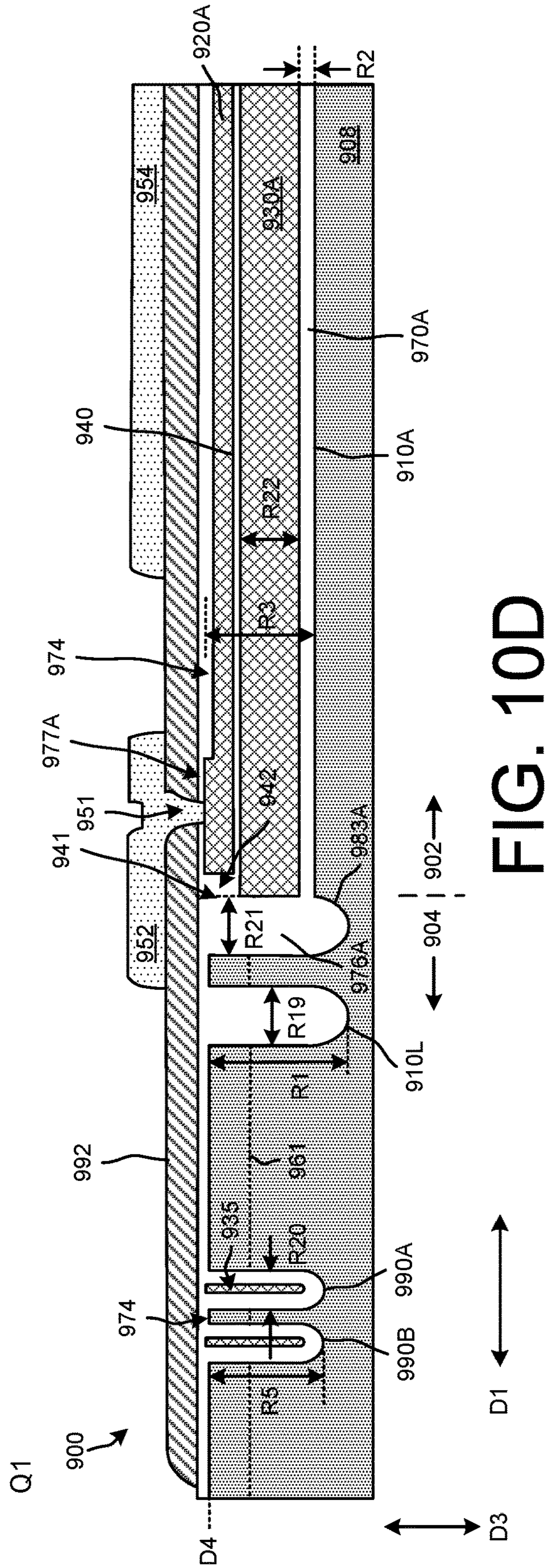
Figure 10E:
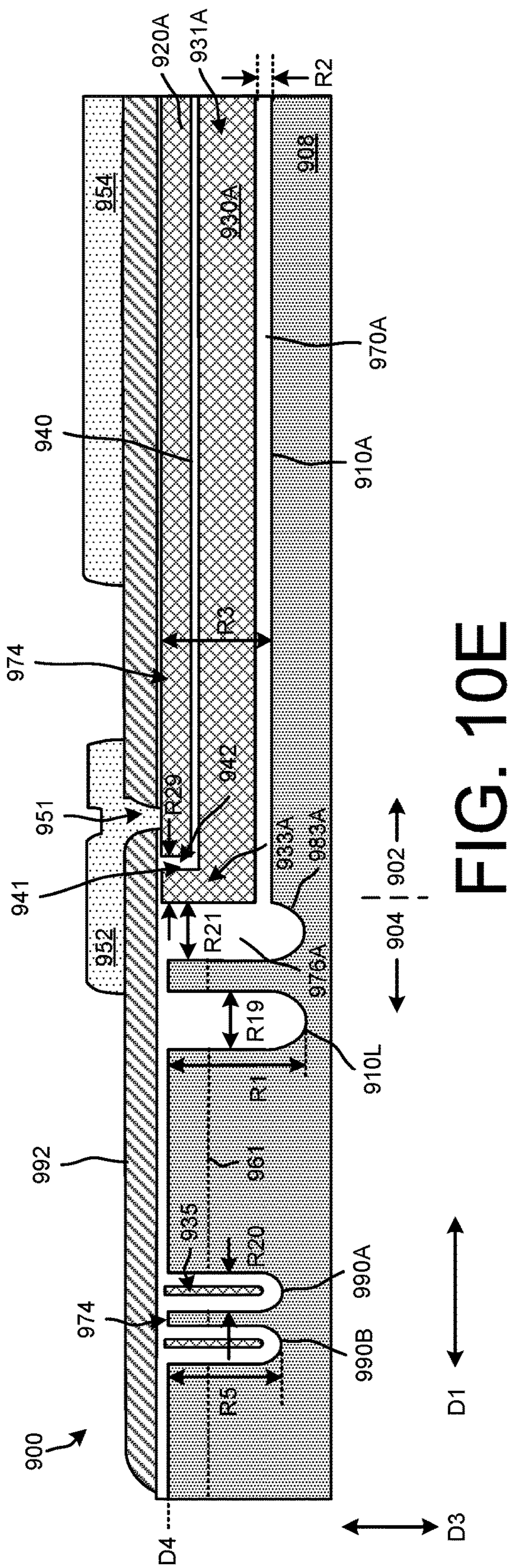
Figure 10F:
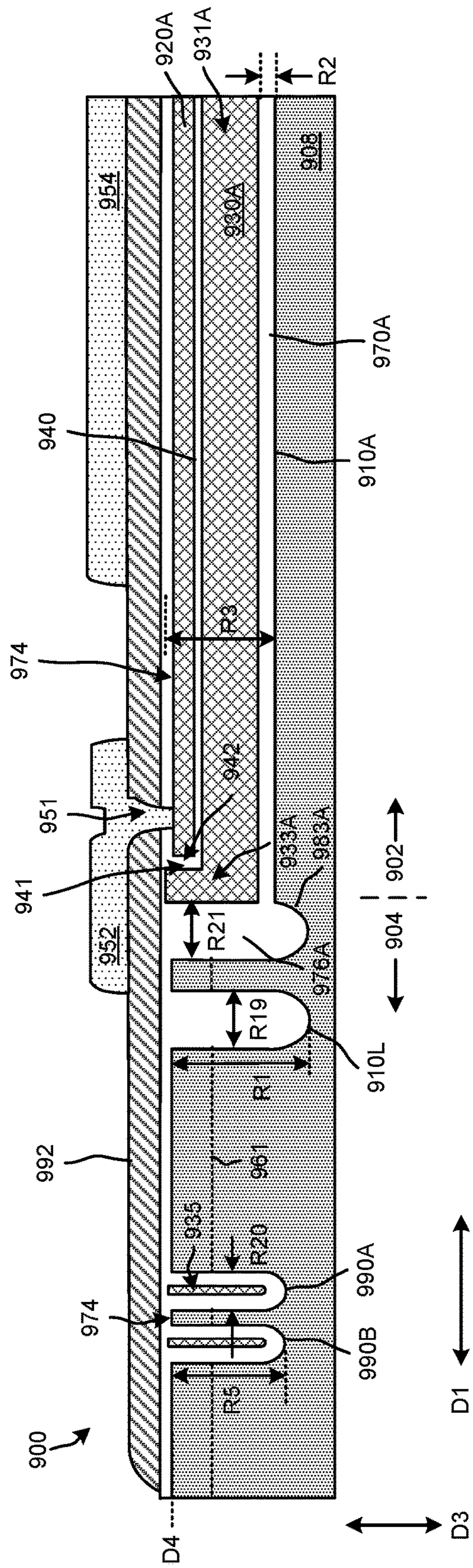
Figure 10G:
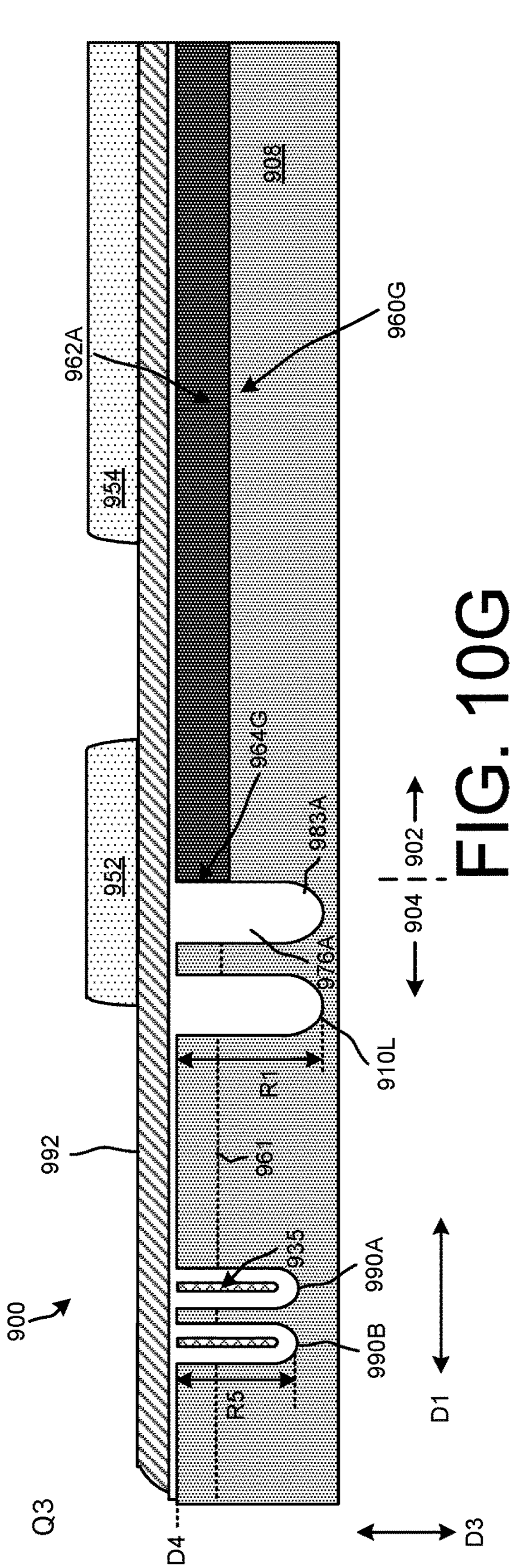
Figure 10H:
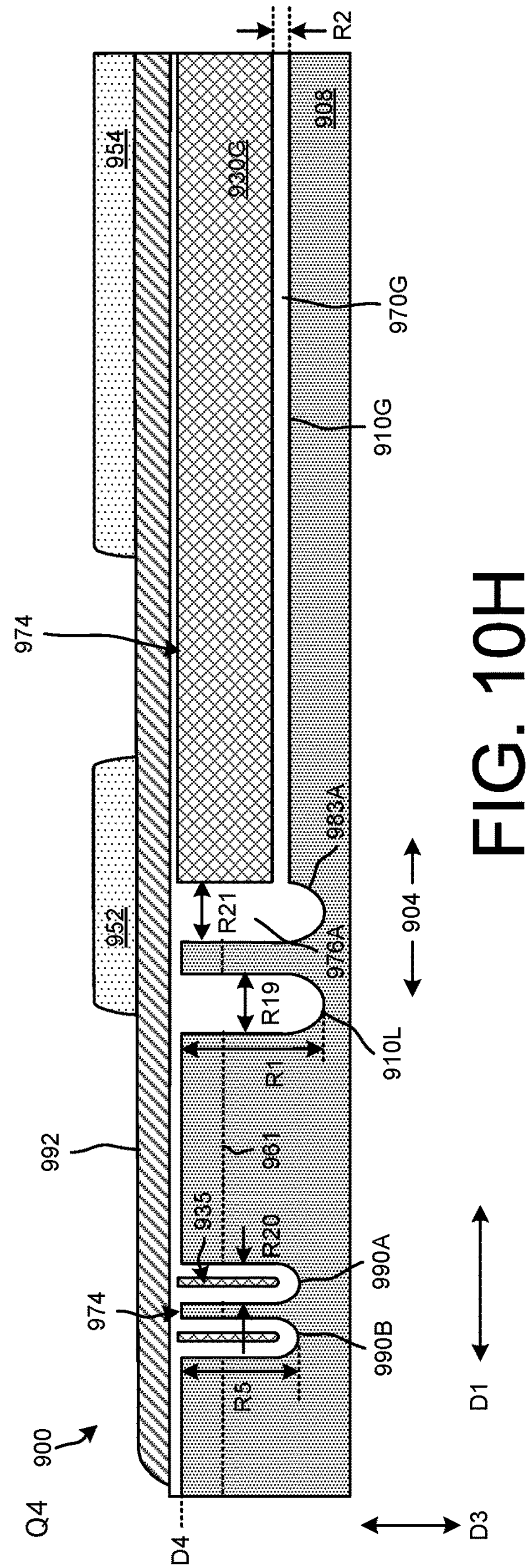
Figure 10I:
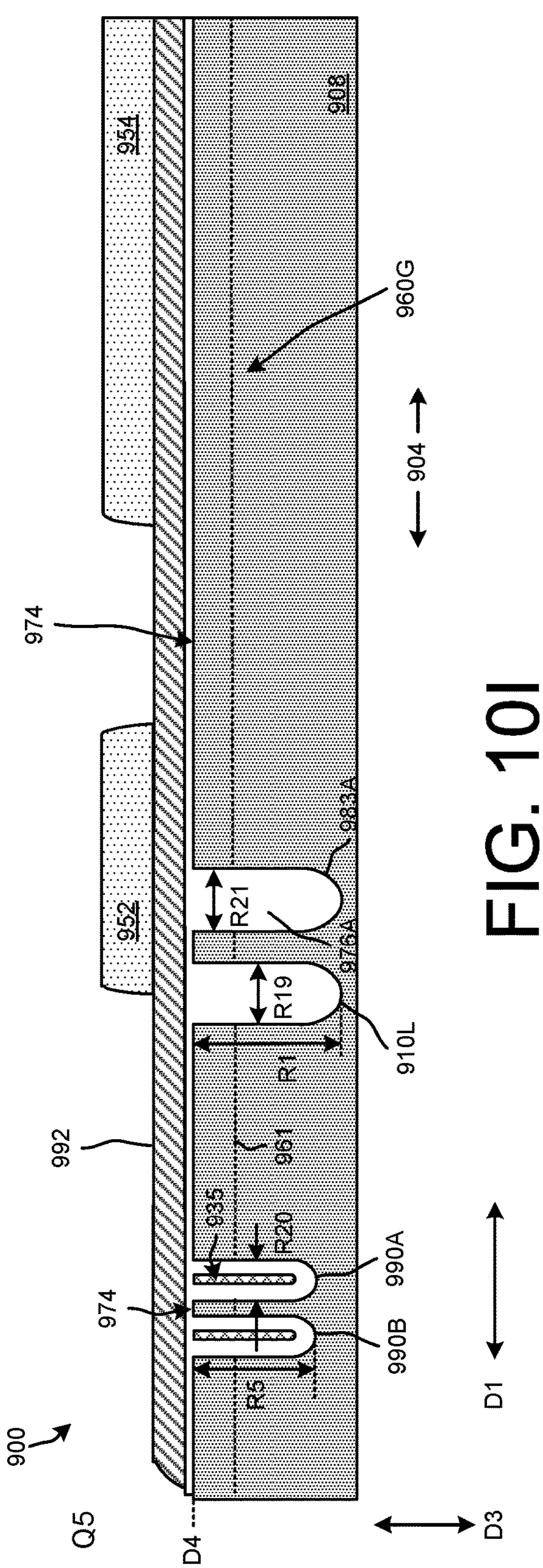
Figure 10J:
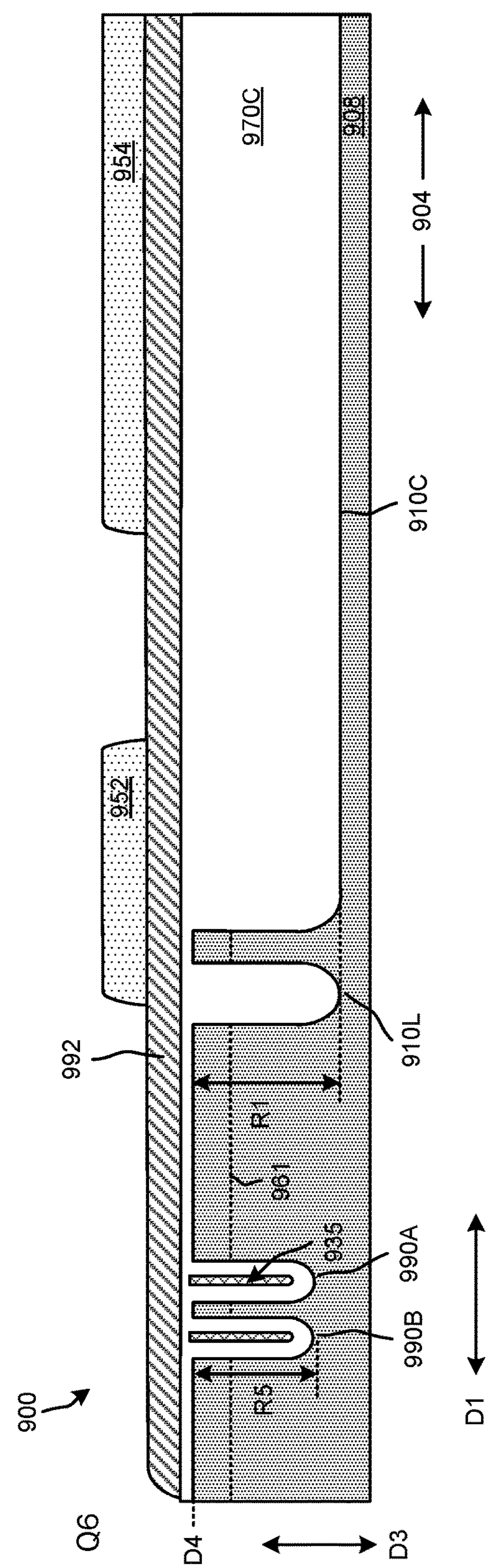
Figure 10K:
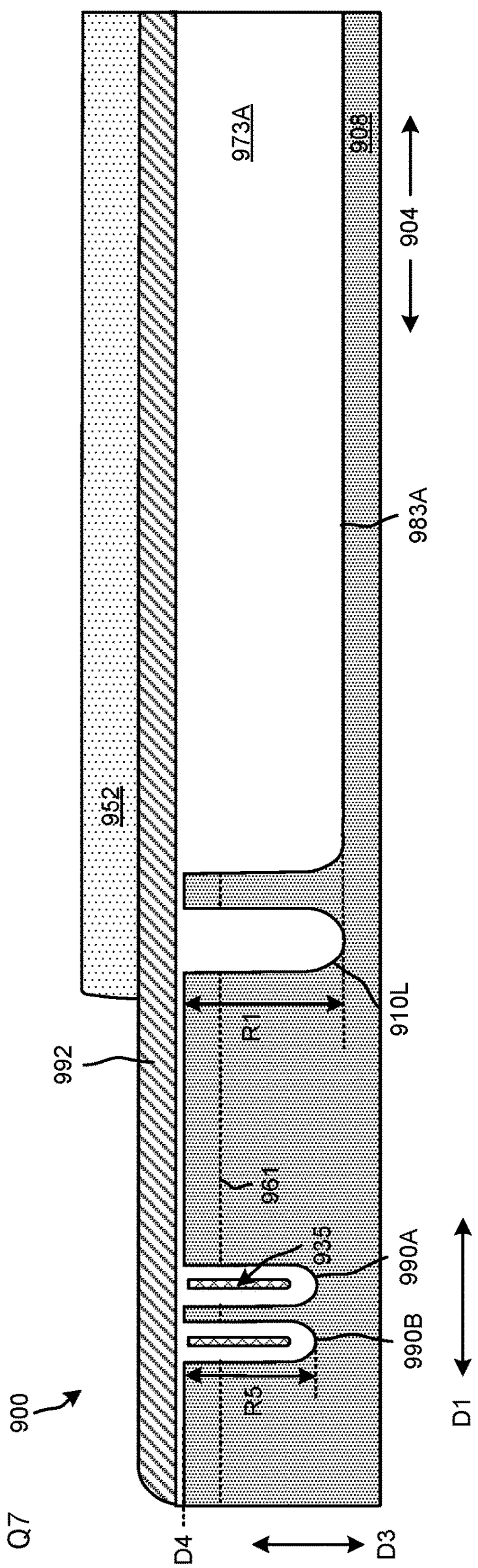
Figure 10L:
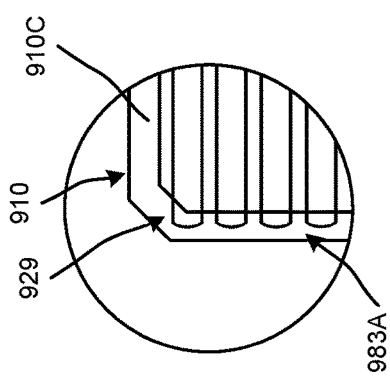
Figure 10M:
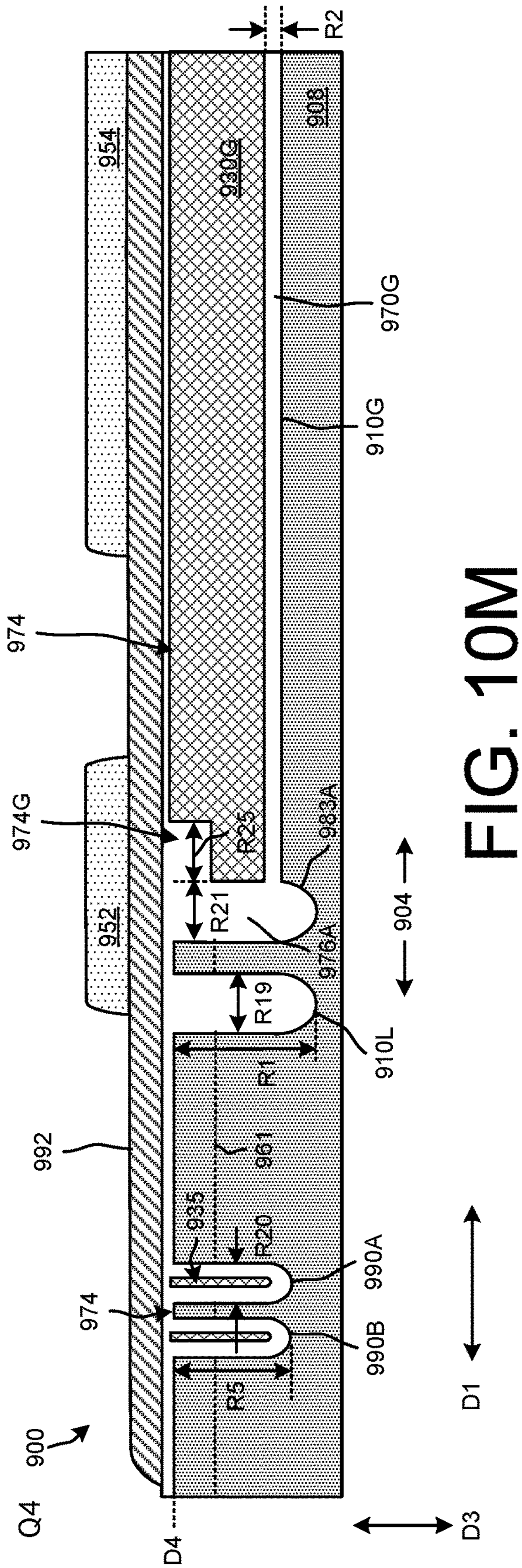
Figure 10N:
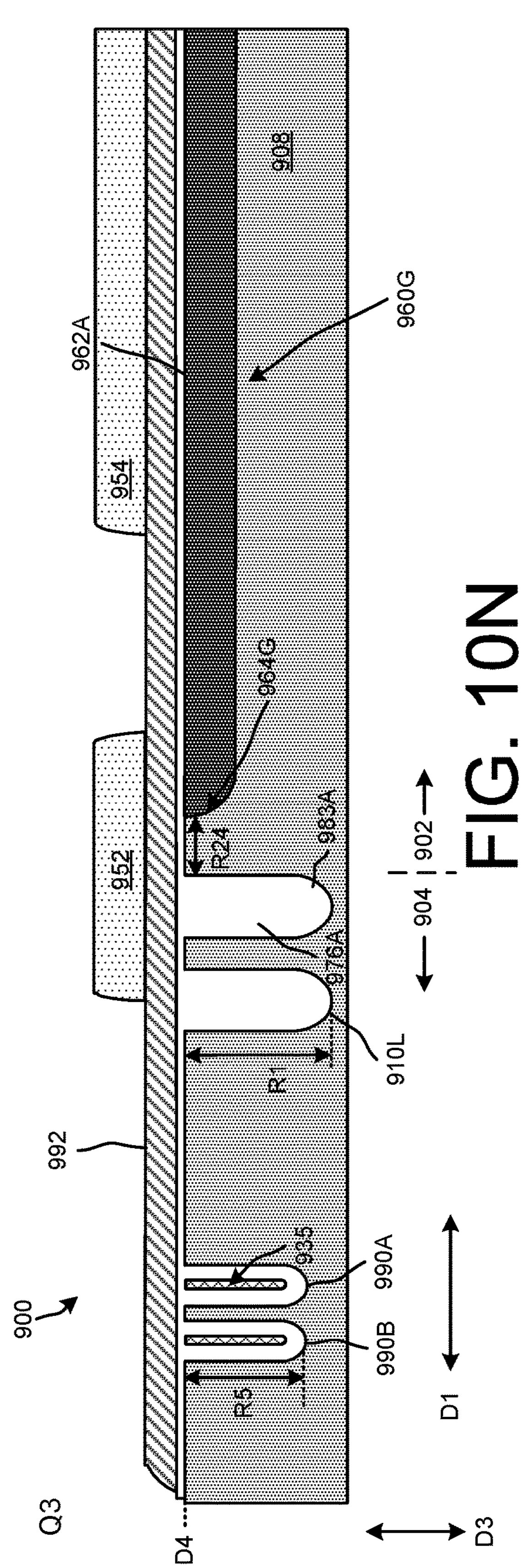
Figure 10O:
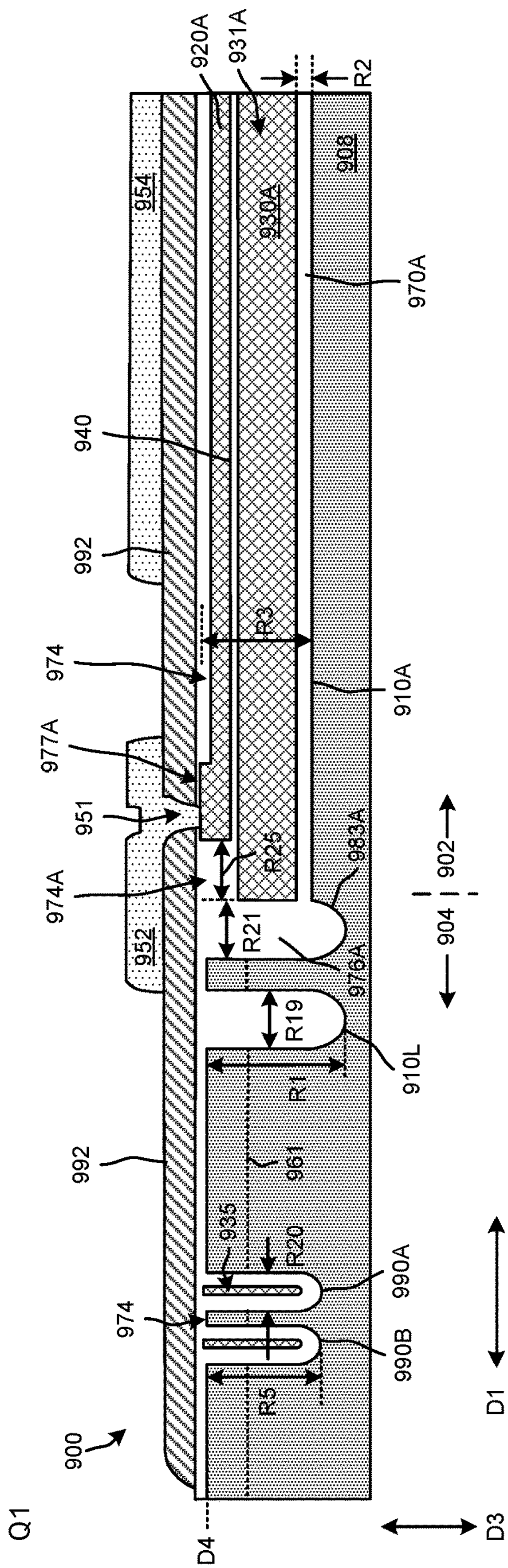

FIGS. 10A through 10O are diagrams that illustrate variations on at least some of the features of the semiconductor device 900 shown in FIGS. 9A through 9N. Accordingly, the reference numerals and features included in FIGS. 9A through 9N are generally maintained and some features are not described again in connection with FIGS. 10A through 10O.

In FIGS. 10A through 10O, a perimeter trench 910L similar to the end trench 910C is disposed within the semiconductor device 900. The perimeter trench 910L includes a portion aligned along the longitudinal axis D1 that is included within the plurality of trenches 910. The perimeter trench 910L is different from the perimeter trenches 990A, 990B because the perimeter trench 910L is filled with the dielectric (and excludes a shield electrode) while the perimeter trenches 990A, 990B each include a shield electrode.

Also, as shown in FIGS. 10A through 10O, the end trench 910C is coupled to a transverse trench 983A. The end trench 910C and the transverse trench 983A can collectively be referred to as a perimeter trench that has a transverse portion. The end trench 910C, the transverse trench 983A, and/or the perimeter trench 910L can be produced using the same etching process, or multiple separate etching processes.

The transverse trench 983A is similar to the transverse trench 383A shown and described in connection with FIGS. 7A through 7J. Because the transverse trench 983A is disposed at the ends of the plurality of trenches 910 (or parallel trenches). Accordingly, each of the plurality of trenches 910 is not bisected into trench extension portions and main trench portions as discussed in connection with FIGS. 9A through 9N. Specifically, the transverse trench 983A as shown in FIG. 9A is aligned parallel to the perimeter trenches 990A, 990B, 910L (along the longitudinal axis D2), but is disposed between the termination trench 990A, 990B, 910L and the ends of the plurality of trenches 910, which are orthogonally aligned to the transverse trench 983A. The side cross-sectional views along the different cuts included in FIGS. 10B through 100 are not necessarily drawn to the same scale (e.g., numbers of trenches, etc.) as the plan view shown in FIG. 10A.

FIG. 10B is a diagram that illustrates a side cross-sectional view of the semiconductor device 900 cut along line Q1. The cut line Q1 is approximately along a centerline of the trench 910A so that the side cross-sectional view of the semiconductor device 900 is along a plane that approximately intersects a center of the trench 910A. As shown in FIG. 10B, the trench 910A includes a dielectric 970A disposed therein. Specifically, a portion of the dielectric 970A is coupled to (e.g., lines, is disposed on) a sidewall and a portion of the dielectric 970A is coupled to a bottom surface of the trench 910A within the main trench portion 912A of the trench 910A.

As shown in FIG. 10B, a gate electrode 920A and a portion 931A of a shield electrode 930A are disposed in the trench 910A that is included in the active region 902 of the semiconductor device 900. The gate electrode 920A and the shield electrode 930A are separated by (e.g., insulated by) at least a portion of the inter-electrode dielectric 940. A portion 933A of the shield electrode 930A is also disposed in the trench 910A and insulated from the epitaxial layer 908 by the dielectric 970A. The portion 933A of the shield electrode 930A can be referred to as a termination region portion of the shield electrode, and the portion 931A of the shield electrode 930A can be referred to as an active region portion of the shield electrode.

A dielectric portion 976A is disposed within the transverse trench 983A. The dielectric portion 976A of the transverse trench 983A is coupled to the dielectric 970A included in the trench 910A. The dielectric portion 976A and the dielectric 970A can be formed using one or more different dielectric formation processes (e.g., a thermal dielectric formation process, a deposition process). Accordingly, the dielectric portion 976A and the dielectric 970A can be different dielectrics.

The perimeter trench 910L and the transverse trench 983A have a depth R1 that is greater than a thickness R2 of a portion of the dielectric 970A included in the trench 910A. The perimeter trenches 990A, 990B have a depth R5 that is approximately equal to a depth R3 of the trench 910A. The depth R5 of the perimeter trenches 990A, 990B is less than the depth R1 of the perimeter trench 910L and the transverse trench 983A. The depth of one or more of the perimeter trenches 990A, 990B can be less than or greater than the depth of the transverse trench 983A and/or the depth of the perimeter trench 910L. The depth of one or more of the perimeter trenches 990A, 990B can be greater than or equal to the depth of the trench 910A. Although not shown, the transverse trench 983A can have a depth that is approximately equal to the depth R3 of the trench 910A.

The width of one or more of the perimeter trenches 990A, 990B can be approximately the same as or different than (e.g., narrower than, wider than) the width of the plurality of trenches 910, the width of the transverse trench 983A, and/or the width of the perimeter trench 910L. The perimeter trench 910L can have a width R19 greater than a width R20 of the perimeter trench 990A. Similarly, the transverse trench 983A can have a width R21 greater than the width R20 of the perimeter trench 990A. Although the cross-sectional dimensions of the transverse trench 983A and the cross-sectional dimensions of the perimeter trench 910L are approximately the same, the cross-sectional dimensions can be different.

In this implementation, the portion 933A of the shield electrode 930A is in contact with a dielectric portion 976A disposed within the transverse trench 983A. Also, the portion 933A of the shield electrode 930A is insulated from the interlayer dielectric 992 by a dielectric portion 977A. The dielectric portion 977A is disposed below the gate runner conductor 952, and has a thickness that is less than a thickness of the field dielectric 974. The gate electrode 920A can be referred to as having a first portion that is recessed relative to a bottom surface of the ILD 992 below the field dielectric 974 compared with a second portion that is recessed to a lesser degree (or not recess at all) relative to the bottom surface of the ILD 992 and disposed below the dielectric portion 977A. In other words, the gate electrode 920A can include a first recessed portion (which can be disposed below the dielectric portion 977A and below the gate runner conductor 952) and a second recessed portion (which can have at least a portion disposed below the field dielectric 974 and below the source runner conductor 954).

The dielectric portion 977A can be a portion of the field dielectric 974. The dielectric portion 977A can be disposed around (e.g., can define a perimeter around) the via 951. The dielectric portion 977A can be in contact with or can be disposed on the gate dielectric portion 942.

In this implementation, the transverse trench 983A can be used for self-aligned etching of one or more of the plurality of trenches 910. Specifically, a first mask used to form the transverse trench 983A can overlap with a second mask used to form the plurality of trenches 910. Accordingly, misalignment of the first mask and the second mask may not be problematic because of the overlap, which will result in the transverse trench 983A still intersecting with one or more of the plurality of trenches 910 (or the ends thereof). An illustration of the overlap (from a masking perspective) is shown in FIG. 10L. As shown in FIG. 10L, ends 929 of the plurality of trenches 910 intersect with the transverse trench 983A.

Referring back to FIG. 10B, in this implementation, the perimeter trench 910L and the transverse trench 983A each exclude a shield dielectric. Although not shown, in some implementations, at least a portion of the perimeter trench 910L and/or at least a portion of the transverse trench 983A can include a portion of a shield electrode (e.g., electrically floating shield electrode, a recessed shield electrode).

FIG. 10C is a side cross-sectional view of the mesa region 960A cut along line Q2. In this cross-sectional view, the well dopant region 962A extends below the source runner conductor 954 and below the gate runner conductor 952. In this implementation, the well dopant region 962A contacts the dielectric portion 976A included in the transverse trench 983A. In accordance with prior examples, an area where the well dopant region 962A could be expanded is illustrated with line 961.

As mentioned above, an area where the well dopant region 962A could be expanded is illustrated with line 961. In other words, the well dopant region 962A can be expanded up to (e.g., can extend to, can be disposed up to and abut or contact) one or more of the perimeter trenches 990A, 990B. The well dopant region can be expanded beyond (e.g., can extend beyond, can be disposed beyond) one or more of the perimeter trenches 990A, 990B. The line 961 is illustrated in additional figures associated with FIGS. 10A through 10K.

The well dopant region 962A can be truncated to (e.g., can extend to, can be disposed up to and abut or contact) end between the left edge of gate electrode 920A and left edge of shield electrode 933A.

Similar structures and features are illustrated in the cross-sectional view of the mesa region 960G cut along line Q3 as illustrated in FIG. 10G. In FIG. 10G the mesa region 960G is entirely disposed within the termination region 904. Accordingly, the source runner conductor 954 has a substantially flat bottom surface that can be insulated from (e.g., does not contact) the mesa region 960G. The source runner conductor 954 can be configured to come in contact with at least a portion of the mesa region 960G using, for example, one or more vias.

FIG. 10D is a side cross-sectional view of a variation of the trench 910A of the semiconductor device 900 cut along line Q1. In this implementation, the shield electrode 930A is in contact with the dielectric portion 976A included in the transverse trench 983A. The shield electrode 930A, however, has a constant thickness R22 along the longitudinal axis D1 of the trench 910A. In this implementation, the termination region 904 is approximately aligned along a side wall of the transverse trench 983A. Also, the shield electrode 930A is disposed entirely within the active region 902, rather than having a first portion disposed in the termination region 904 and a second portion disposed in the active region 902. Also, the gate dielectric portion 942 of the IED 940 is in contact with the dielectric portion 976A included in the transverse trench 983A. In such implementations, the gate dielectric portion 942 of the IED can be referred to as, and can function as, a protrusion dielectric (similar to, for example, protrusion dielectric 974A shown in FIG. 9L).

FIGS. 10E and 10F illustrates side cross-sectional views that are variations of the trench structure of trench 910A illustrated in FIG. 10A. As shown in FIG. 10E, gate electrode 920A is recessed to a lesser extent than the gate electrode 920A shown in FIG. 10F. Accordingly, the field dielectric 974 disposed between the gate electrode 920A and the interlayer dielectric 992 is thinner in FIG. 10E than in FIG. 10F.

Within FIG. 10E, a first portion of the field dielectric 974 within the active region 902 has a thickness that is less than a thickness of a second portion of the field dielectric 974 included in the termination region 904. Also as shown in FIG. 10E, the field dielectric 974 has a relatively constant thickness along a top surface of the gate electrode 920A.

Within FIG. 10F, a first portion of the field dielectric 974 within the active region 902 has a thickness that approximately the same as a thickness of a second portion of the field dielectric 974 included in the termination region 904. In FIG. 10F, the field dielectric 974 has a third portion disposed above the portion 933A of the shield dielectric 930A (and below the ILD 992) that has a thickness is less than the thickness of the first portion of the field dielectric 974 and/or the first portion of the field dielectric 974. Also as shown in FIG. 10E, the field dielectric 974 has a relatively constant thickness along a top surface of the gate electrode 920A. The features illustrated in FIGS. 10B, 10D, 10E, and 10F, can be combined in any combination except for mutually exclusive combinations.

FIG. 10H is a side cross-sectional view of the trench 910G, which is cut along line Q4 shown in FIG. 10A. In this implementation, the trench 910G is entirely disposed within the termination region 904. As shown in FIG. 10H, the shield electrode 930G has a thickness that extends from the dielectric 970G along a bottom of the trench 910G to the field oxide 974. The field oxide 974 can be aligned along plane D4. The shield electrode 930G disposed within the trench 910G can be recessed.

FIG. 10I is a side cross-sectional view of a mesa region 960G adjacent to the end trench 910C, which is cut along line Q5 shown in FIG. 10A. In this implementation, the mesa region 960G is disposed outside of the doping region 938. Accordingly, a well dopant region is excluded from the mesa region 960G.

FIG. 10J is a side cross-sectional view of the end trench 910C, which is cut along line Q6 shown in FIG. 10A. The end trench 910C has a dielectric 970C disposed therein. Although not shown, in some implementations, at least a portion of the end trench 910C can include a shield electrode. The end trench 910C can have a length (along the longitudinal direction D1) that is approximately the same as a length of, for example, the trench 910A.

FIG. 10K is a side cross-sectional view of the transverse trench 983A, which is cut along line Q7 (along longitudinal axis D2) shown in FIG. 10A. The transverse trench 983A has a dielectric 973A disposed therein (e.g., from a bottom of the transverse trench 983A to a top of the transverse trench 983A). Although not shown, in some implementations, at least a portion of the transverse trench 983A can include a shield electrode. The transverse trench 983A can have a length (along the longitudinal direction D1) that is approximately the same as a length of, for example, the trench 910A.

FIG. 10M is a variation of FIG. 10H. As shown in FIG. 10M, the semiconductor device 900 includes a dielectric portion 974G that is recessed (similar to or the same as the dielectric disposed above the shield electrode 930G shown in FIG. 9M). Accordingly, a portion of the shield electrode 930G is recessed below the dielectric portion 974G (e.g., protrusion dielectric) and the dielectric portion 974G is coupled to the dielectric portion 976A included in the transverse trench 983A. Yet another variation of the semiconductor device 900, which includes a dielectric portion 974A (that corresponds with dielectric portion 974G shown in FIG. 10M), is shown in FIG. 10O. FIG. 10O is a variation of FIG. 10B, and portion 933A of the shield electrode 930A is excluded.

FIG. 10N illustrates another variation on the semiconductor device 900. As shown in FIG. 10N, an edge 964G of the well dopant region 962A is separated from the transverse trench 983A (e.g., a sidewall of the transverse trench 983A) by a gap (e.g., a semiconductor region) having a length R24. The length R24 can be less than or equal to length R25 (shown in FIG. 10M or 10O), or greater than length R25. The length R24 can be less than or equal to length R29 (shown in FIG. 10E from the transverse trench 983A to an edge of the gate electrode 920A, or greater than length R29. The length R29 is also shown in other figures such as FIG. 10F. In this implementation, for desirable charge balancing, a length R24 (which can be referred to as a lateral balance length) is equal to or greater than depth R3 (shown in FIGS. 10B, 10D, 10E, 10F, & 10O).

The general features of cross-sections along lines Q8 through Q10 in this implementation associated with FIG. 10A are similar to the features along cut lines Q8 through Q10 illustrated in FIGS. 9I through 9K and 9N. Accordingly, cross-sectional diagrams along lines Q8 through Q10 are not shown in connection with FIG. 10A.

FIGS. 11A through 11E are diagrams that illustrate variations on at least some of the features of the semiconductor device 900 shown in FIGS. 9A through 9N and FIGS. 10A through 10O. Accordingly, the reference numerals and features included in FIGS. 9A through 9N and FIGS. 10A through 10O are generally maintained and some features are not described again in connection with FIGS. 11A through 11E. Specifically, FIGS. 11B through 11E illustrate variations along cut lines Q8 through Q10, respectively.

Figure 11A:
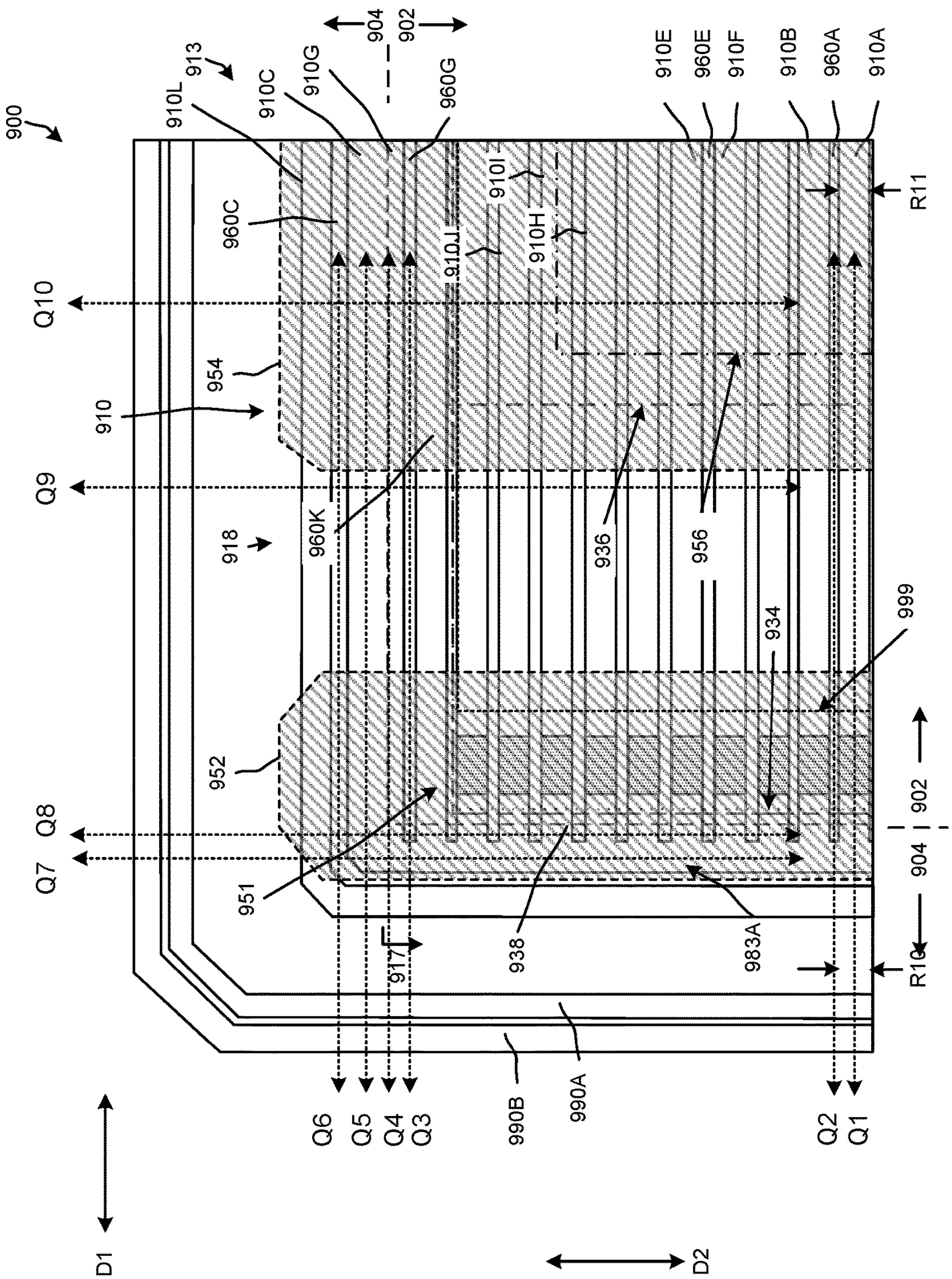
FIGS. 11A through 11E are diagrams that illustrate variations on at least some of the features of the semiconductor device shown in FIGS. 9A through 9N and FIGS. 10A through 10O.

As shown in FIG. 11A, the perimeter trench 910L includes a portion aligned along the longitudinal axis D1 that is included within the plurality of trenches 910. The perimeter trench 910L is different from the perimeter trenches 990A, 990B because the perimeter trench 910L is filled with the dielectric (and excludes a shield electrode) while the perimeter trenches 990A, 990B each include a shield electrode.

Also, as shown in FIGS. 11A through 11M, the end trench 910C is coupled to a transverse trench 983A. The end trench 910C and the transverse trench 983A can collectively be referred to as a perimeter trench that has a transverse portion.

In this implementation, at least a portion of the end trench 910C is coupled to (e.g., overlaps with) trench 910G which is the outermost of the interior trenches 917. The end trench 910C and the trench 910G are coupled along the longitudinal axis D1. Accordingly, a mesa region between end trench 910C and trench 910G is excluded from the semiconductor device 900. In other words, end trench 910C and trench 910G are combined to form a single trench structure.

Figure 11B:
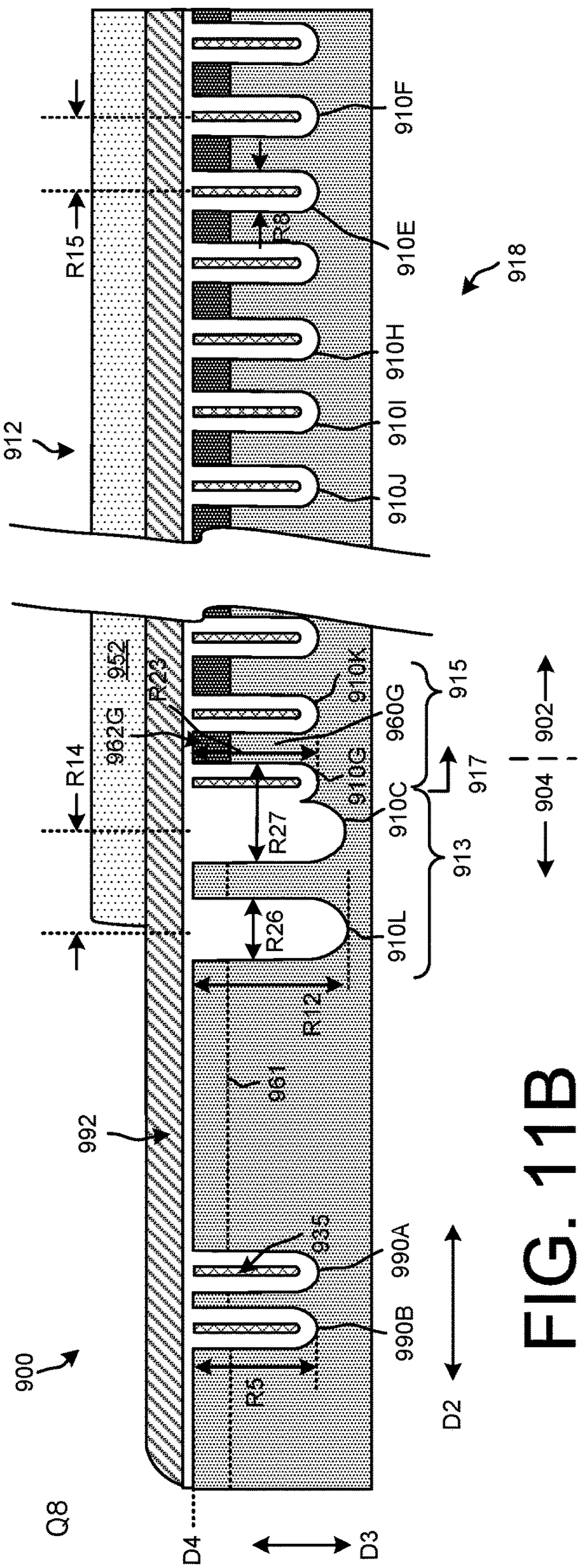

FIG. 11B is a side cross-sectional view cut along line Q8 (shown in FIG. 11A) through the main trench portions 912 orthogonal to the plurality of trenches 910. In this implementation, the gate runner conductor 952 is disposed above the plurality of trenches 910, and the line Q8 intersects along a relatively shallow portion of the interior trenches 917 from the plurality of trenches 910. Both end trench 910L and 910C (i.e., end trenches 913) include a dielectric without a shield electrode, while the remainder of the plurality of trenches 910 (which includes the interior trenches 917) along this cutline Q8 each include a shield electrode. Also, the depth R12 of end trenches 910L, 910C is greater than a depth of the remainder of the trenches (e.g., non-end trenches, interior trenches 917), which include shield electrodes.

As shown in FIG. 11B, the end trench 910C is coupled to the trench 910G In other words, a profile of the end trench 910C intersects with or overlaps a profile of the active trench 910G. The trench 910G has a depth R23 that is shallower than the depth R12 of the end trench 910C. Also, the trench 910G includes a shield electrode (along the cross-sectional centerline of the trench 910G) while the end trench 910C does not include a shield electrode (e.g., excludes a shield electrode, includes a dielectric along the cross-sectional centerline of the trench 910C). The end trench 910C can include a shield electrode (e.g., a recessed electrode, electrically floating shield electrode, etc.). The trench 910G can be filled with a dielectric (along the cross-sectional centerline of the trench 910G) such that the shield electrode is excluded from at least this cross-sectional view of the trench 910G.

The single trench structure defined by end trench 910C and trench 910G can have two recesses or trench bottoms (or dimples) where the depth of one of the trenches from the single trench structure is greater than a depth of the other trench (or adjacent or coupled trench) from the single trench structure. In the implementation shown in FIG. 11B the depth of trench 910C is is greater than trenches 910G & 910K. Although not shown, the depth of trench 910G can be greater than trench 910C, the depth of trench 910G can be great than trench 910K, or the depth of trench 910G can be great than both trenches 910K & 910C. Because the two trench structures overlap, the combined trenches (e.g., trench 910G and end trench 910C) can define a point 911 (or apex). The overlapping of trenches such as trenches 910G and 910C can be included in any of the embodiments described herein such as those associated with FIGS. 3A through 7J, 9A through 10O, and/or 12A through 17J.

As shown in FIG. 11B, the mesa regions between the interior trenches 917 include well dopant regions. In this implementation, the mesa region 960G (and the well dopant region 962G) can be a grounded or electrically floating mesa region. The mesa region 960G (and the well dopant region 962G) can be coupled to a source potential. In some implementations, a mesa region between one or more end trenches such as the end trenches 913 and/or a mesa region between transition region trenches such as the transition region trenches 915 can be electrically floating or grounded. The mesa region between the one or more end trenches and/or the mesa region between transition region trenches can be coupled to a source potential. Also, in some implementations, a mesa region disposed between the transition region trenches 915 and the end trenches 913 can be electrically floating or grounded. The mesa region disposed between the transition region trenches 915 and the end trenches 913 can be coupled to a source potential.

In this implementation, the width of each of the end trenches 913 is greater than the width of the interior trenches 917. For example, as shown in FIG. 11B the end trench 910L in the main trench portion has a width R26 that is greater than the width R8 of the main trench portion of trench 910E. Also, as shown in FIG. 11B, a width R27 of the combination of the end trench 910C and the trench 910G is greater than the width R26 of the end trench 910L. Although not shown, the end trench 910C and/or the trench 910G can have a width that is defined so that the width R27 of the combination of the end trench 910C and the trench 910G is equal to or less than the width R26 of the end trench 910L. In other implementations the width of trench 910G can be greater than or less than trench 910K.

Figure 11C:
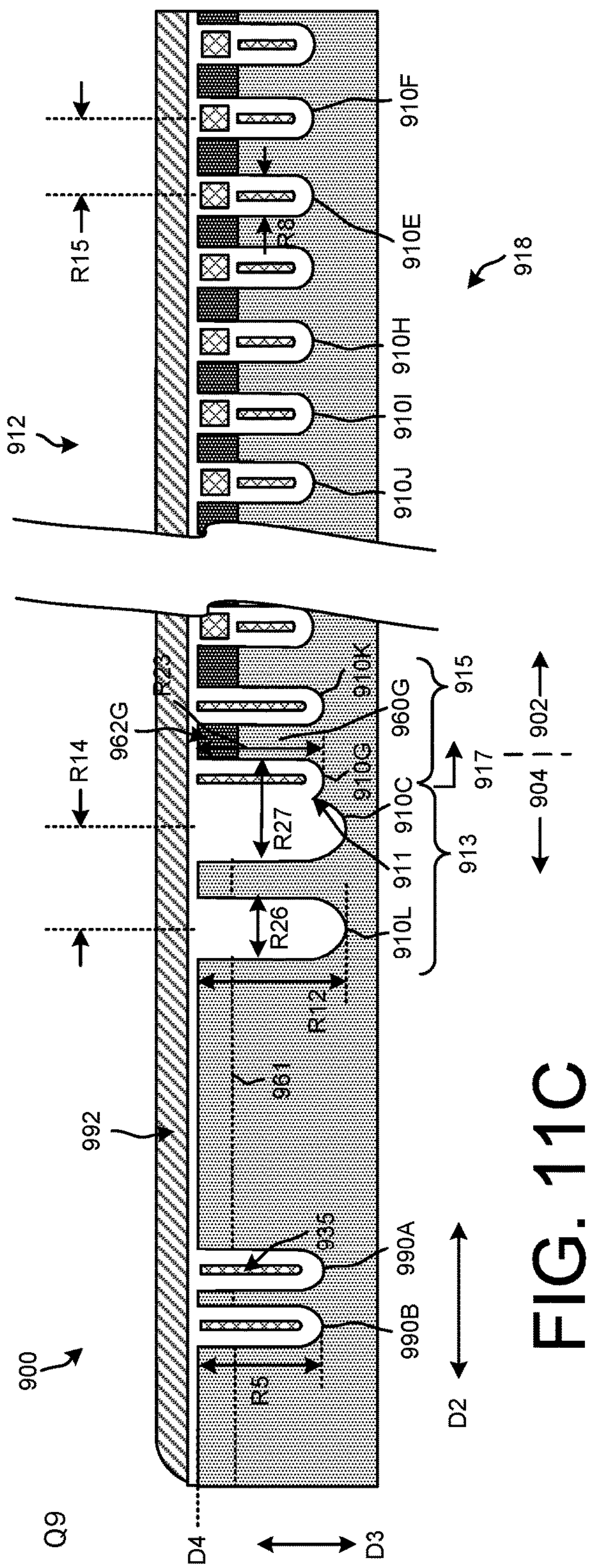

FIG. 11C is a side cross-sectional view cut along line Q9 (shown in FIG. 11A) through the main trench portions 912 orthogonal to the plurality of trenches 910 between the gate runner conductor 952 and the source runner conductor 954. Different types of interior trenches 917 from the plurality of trenches 910 are included in this view. The end trenches 913 include a dielectric without a shield electrode, while the remainder of the plurality of trenches 910 along this cutline Q9 each include at least a shield electrode. Specifically, both trench 910G and 910K, which can be referred to as transition region trenches 915 (which are included in the interior trenches 917), include a shield electrode that is grounded and each does not include a gate electrode. The remaining trenches (excluding the end trenches 913 and the transition region trenches 915) each includes a gate electrode as well as a shield electrode. Because many of the features described above with respect to cut line Q9 apply in this implementation, they will not be described again here.

Figure 11D:
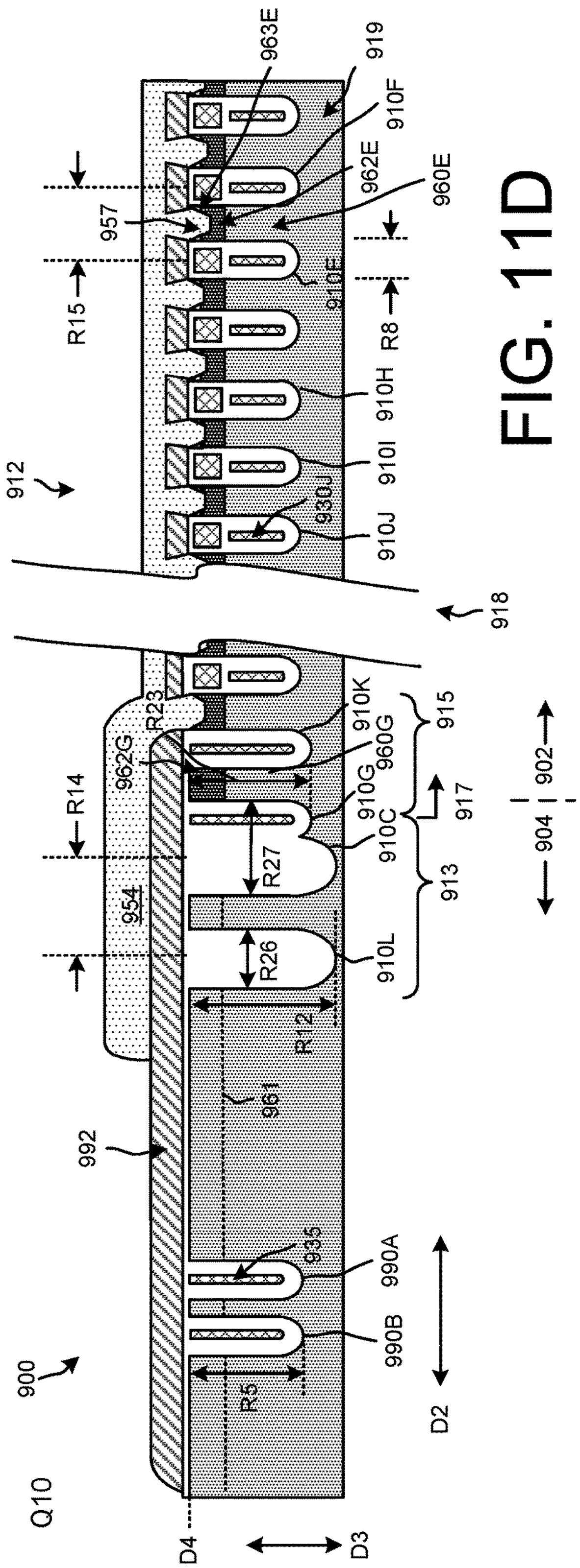

FIG. 11D is a side cross-sectional view of the main trench portions 912 of the plurality of trenches 910 cut along line Q10 shown in FIG. 11A through the termination region 904 and into the active region 902. A portion of the cross-sectional view of the plurality of trenches 910 is included in the termination region 904 and a portion of the cross-sectional view of the plurality of trenches 910 is included in the active region 902. Because many of the features described above with respect to cut line Q10 apply in this implementation, they will not be described again here.

Figure 11E:
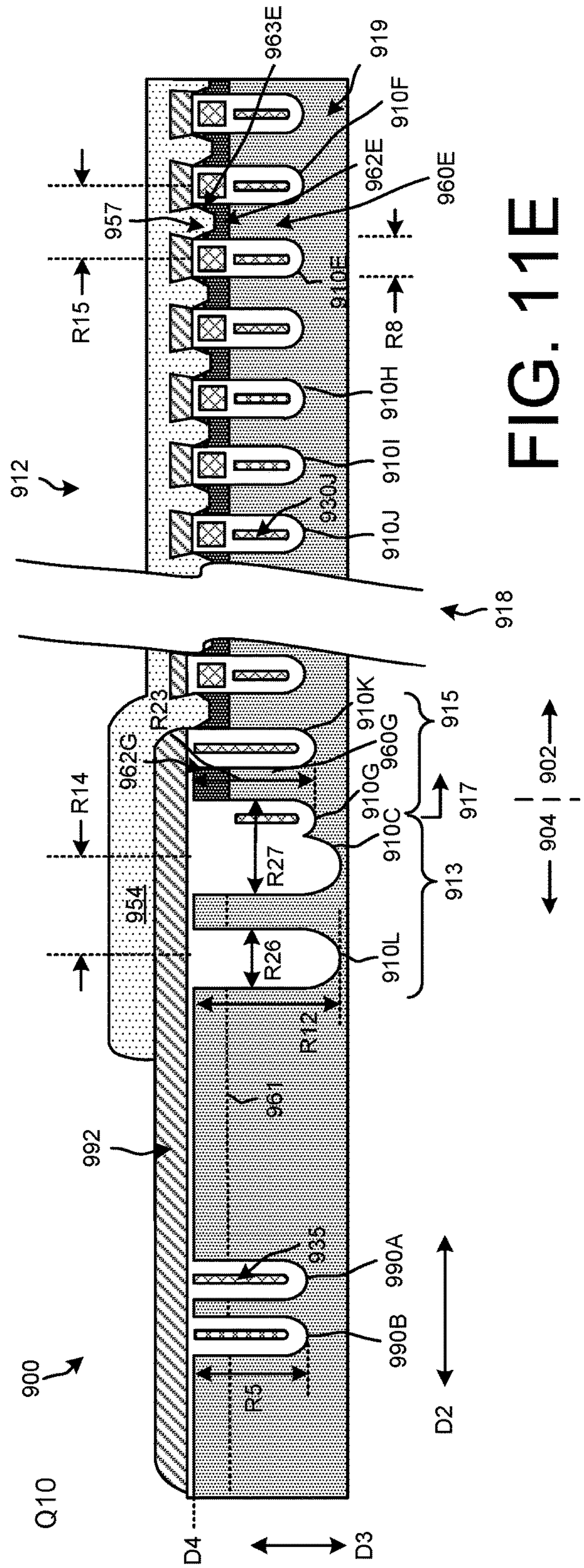

FIG. 11E is a side cross-sectional view of a variation of FIG. 11D that includes a recessed shield electrode in trench 910G. Such recessed shield electrodes can be included in one or more of the trenches (e.g., trench 910G, 910K, 910I, and/or so forth illustrated in, for example, FIGS. 11B through 11D). Although not shown in FIG. 11E, in some implementations, one or more of trench 910G and 910K can be active trenches (which include a gate electrode and a shield electrode).

FIGS. 12A through 12L are diagrams that illustrate variations on at least some of the features of the semiconductor device 900 described above. Accordingly, the reference numerals and features described above in connection with semiconductor device 900 are generally maintained and some features are not described again in connection with FIGS. 12A through 12L. The perimeter trench 910L (shown in FIGS. 10A through 11E), although excluded in the implementations shown in FIGS. 12A through 12L, can be optionally included.

As shown in FIGS. 12A through 12L, the end trench 910C is coupled to the transverse trench 983A. The end trench 910C and the transverse trench 983A can collectively be referred to as a perimeter trench that has a transverse portion. The end trench 910C and/or the transverse trench 983A can be produced using the same etching process, or multiple separate etching processes.

Figure 12A:
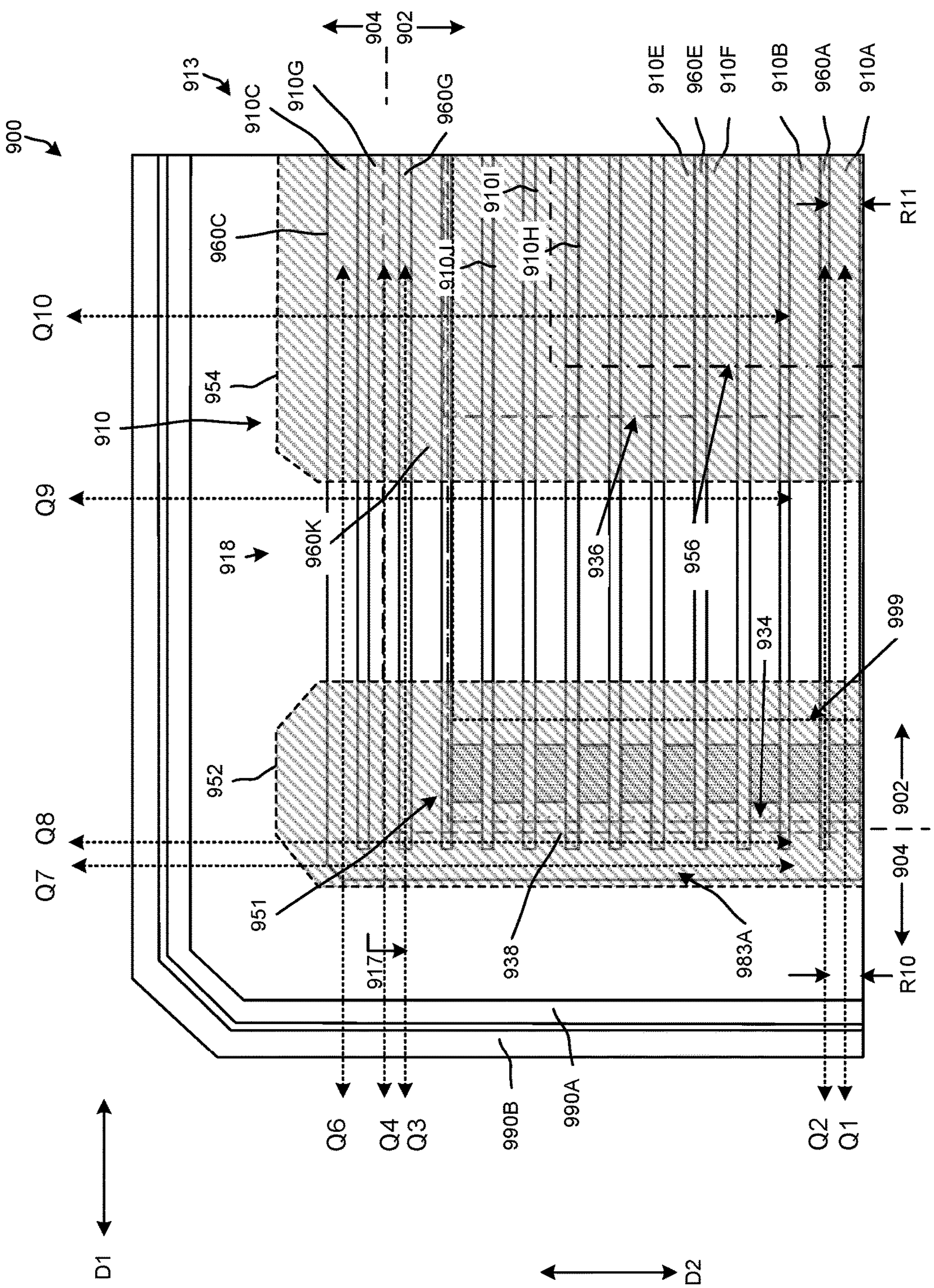
FIGS. 12A through 12L are diagrams that illustrate variations on at least some of the features of a semiconductor device.
Figure 12B:
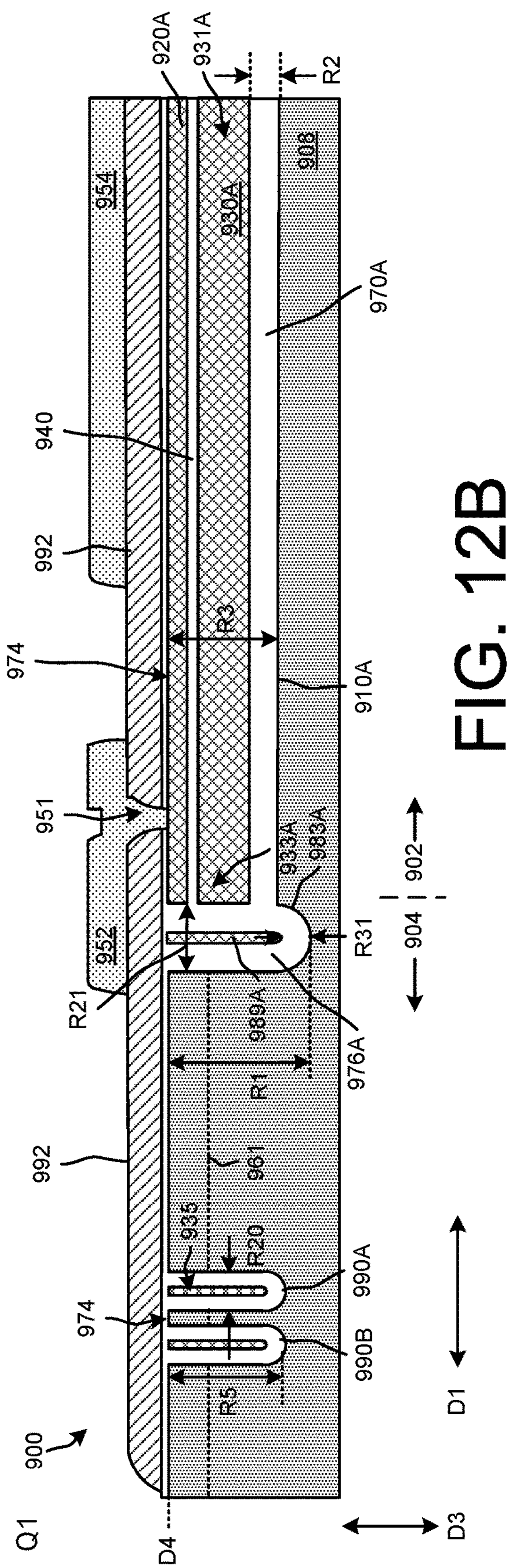

FIG. 12B is a diagram that illustrates a side cross-sectional view of the semiconductor device 900 cut along line Q1. The trench 910A includes the dielectric 970A disposed therein. As shown in FIG. 12B, the gate electrode 920A and the shield electrode 930A are disposed in the trench 910A, and are separated by (e.g., insulated by) at least a portion of the inter-electrode dielectric 940. In this implementation, a shield electrode 989A is disposed within the transverse trench 983A. In FIG. 12B, the shield electrode 930A has approximately a constant thickness. The shield electrode 930A can have a thickness that varies along longitudinal axis D1.

The dielectric portion 976A disposed within the transverse trench 983A has a bottom thickness R31 that is approximately equal to the thickness R2 of the dielectric 970A included in the trench 910A. The thickness R31 is measured along a centerline of the transverse trench 983A and is measured between a bottom surface of the shield electrode 989A disposed within the transverse trench 983A and a bottom surface of the transverse trench 983A. The thickness R31 can be different than (e.g., greater than, less than) the thickness R2.

The dielectric portion 976A of the transverse trench 983A is coupled to the dielectric 970A included in the trench 910A. The dielectric portion 976A and the dielectric 970A can be formed using one or more different dielectric formation processes (e.g., a thermal dielectric formation process, a deposition process). Accordingly, the dielectric portion 976A and the dielectric 970A can be different dielectrics.

Figure 12C:
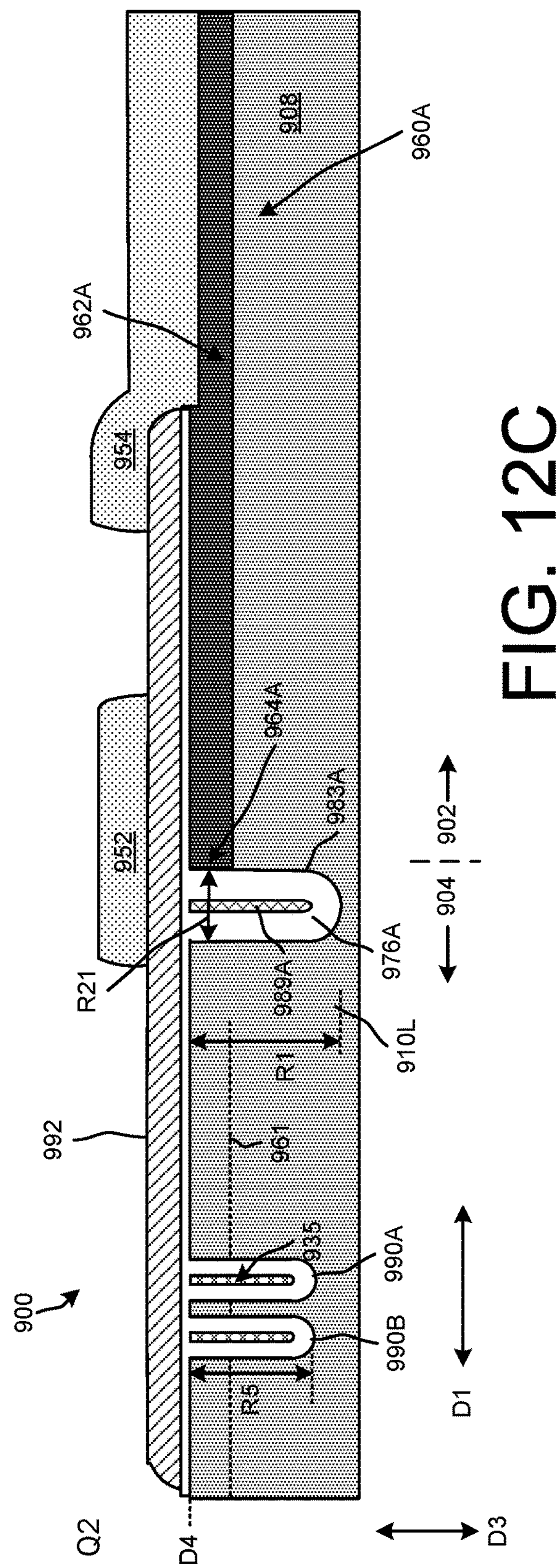

FIG. 12C is a side cross-sectional view of the mesa region 960A cut along line Q2. In this cross-sectional view, the well dopant region 962A extends below the source runner 954 and below the gate runner conductor 952. In this implementation, the well dopant region 962A contacts the dielectric portion 976A included in the transverse trench 983A. The edge 964A of the well dopant region 962A is separated (by a gap (e.g., a semiconductor region)) from the transverse trench 983A similar to that shown in, for example, FIG. 10N. In this implementation, for desirable charge balancing, the separation (which can be referred to as a lateral balance length) is equal to or greater than depth R3 (shown in FIGS. 12B, 12D, 12E, & 12G).

Figure 12D:
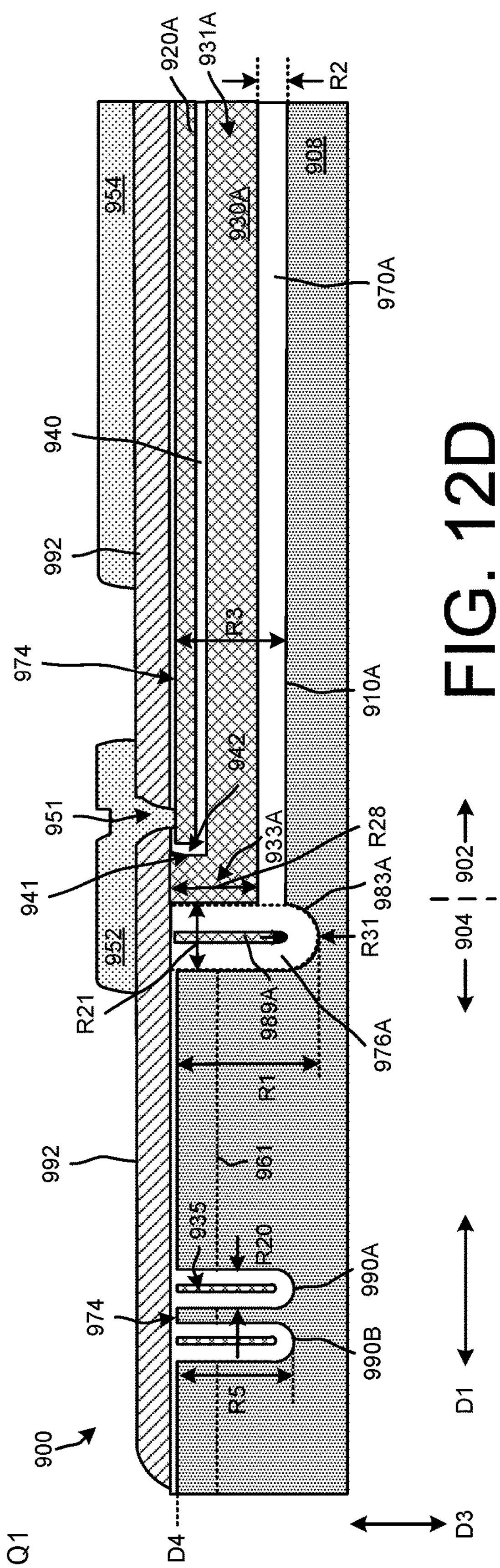
Figure 12E:
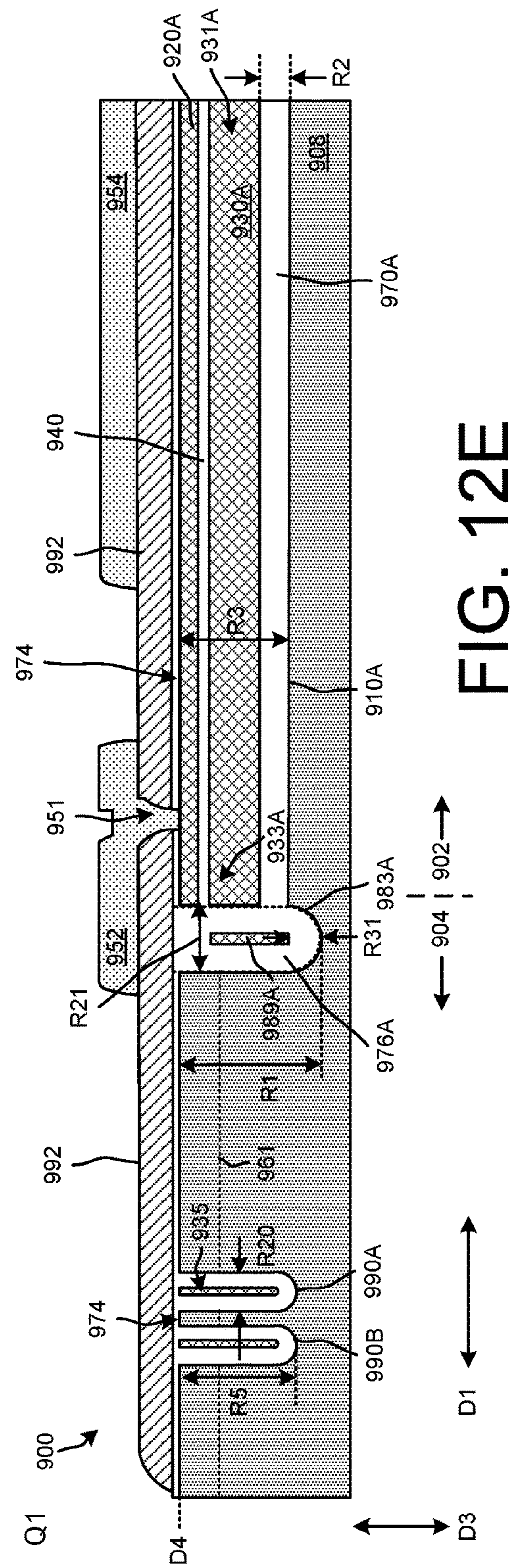
Figure 12F:
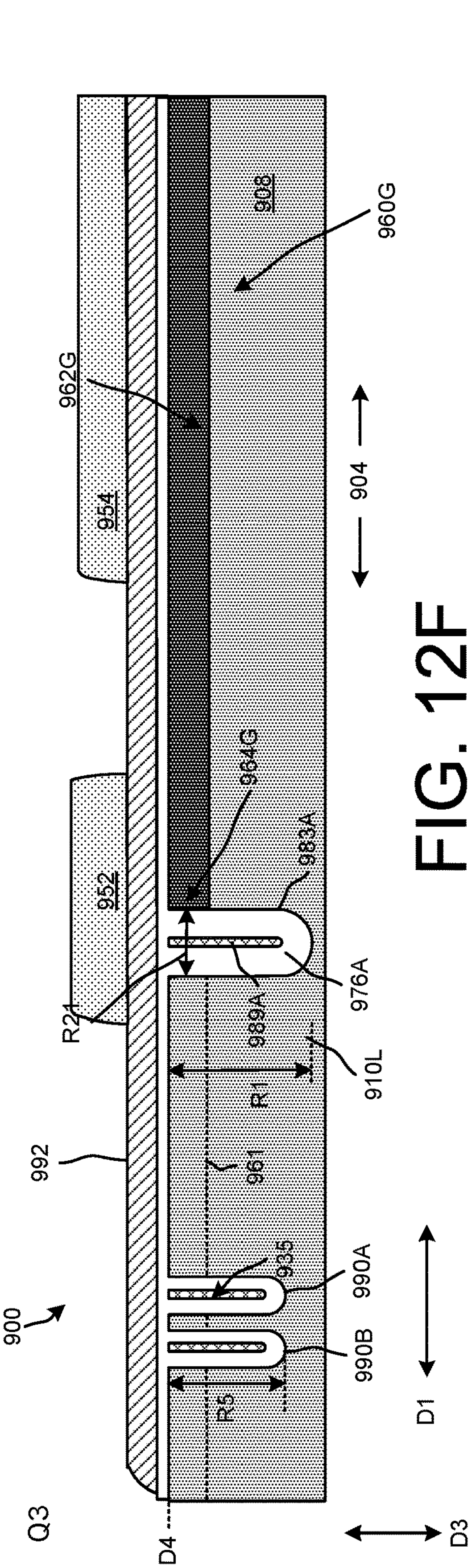

Similar structures and features are illustrated in the cross-sectional view of the mesa region 960G cut along line Q3 as illustrated in FIG. 12F. In FIG. 12F, the mesa region 960G is entirely disposed within the termination region 904. The edge 964G of the well dopant region 962G is separated (by a gap (e.g., a semiconductor region)) from the transverse trench 983A similar to that shown in, for example, FIG. 10N.

FIG. 12D is a side cross-sectional view of a variation of the trench 910A of the semiconductor device 900 cut along line Q1. In this implementation, the shield electrode 930A and the gate electrode 920A have a configuration similar to that shown in FIG. 10B. In addition to the features described in connection with FIG. 10B, this cross-sectional view illustrates that the gate electrode 920A can optionally have a constant thickness without a recessed portion. The portion 933A of the shield electrode 930A has a vertical height (or top surface) within the trench 910A higher than a top surface of the portion 931A of the shield electrode 930A, which is recessed within the trench 910A. The portion 933A of the shield electrode 930A also has a thickness (e.g., vertical thickness) within the trench 910A greater than a thickness of the portion 931A of the shield electrode 930A. The portion 933A extends vertically along a profile (e.g., a sidewall profile) of the transverse trench 983A (illustrated with a dashed line). The portion 933A of the shield electrode 930A has a portion is disposed between an edge of the gate electrode 920A (and the gate dielectric portion 942) and the transverse trench 983A.

FIG. 12E is a side cross-sectional view of another variation of the trench 910A of the semiconductor device 900 cut along line Q1. In this implementation, the shield electrode 930A and the gate electrode 920A have a configuration similar to that shown in FIG. 12B. In addition to the features described in connection with, for example, FIG. 10B and FIG. 12B, this cross-sectional view illustrates that the shield electrode 989A can optionally be a recessed shield electrode (or a non-recessed electrode (not shown)). As shown in FIG. 12E, the gate electrode 920A has an edge that intersects (e.g., contacts, overlaps) the transverse trench 983A. Also, the shield electrode 930A has an edge that intersects (e.g., contacts, overlaps) the transverse trench 983A. The edge of the gate electrode 920A is aligned vertically with the edge of the shield electrode 930A, and the edge of the gate electrode 920A and the edge of the shield electrode 930A are aligned vertically with a sidewall (e.g., a sidewall profile shown with a dashed line) of the transverse trench 983A.

Figure 12G:
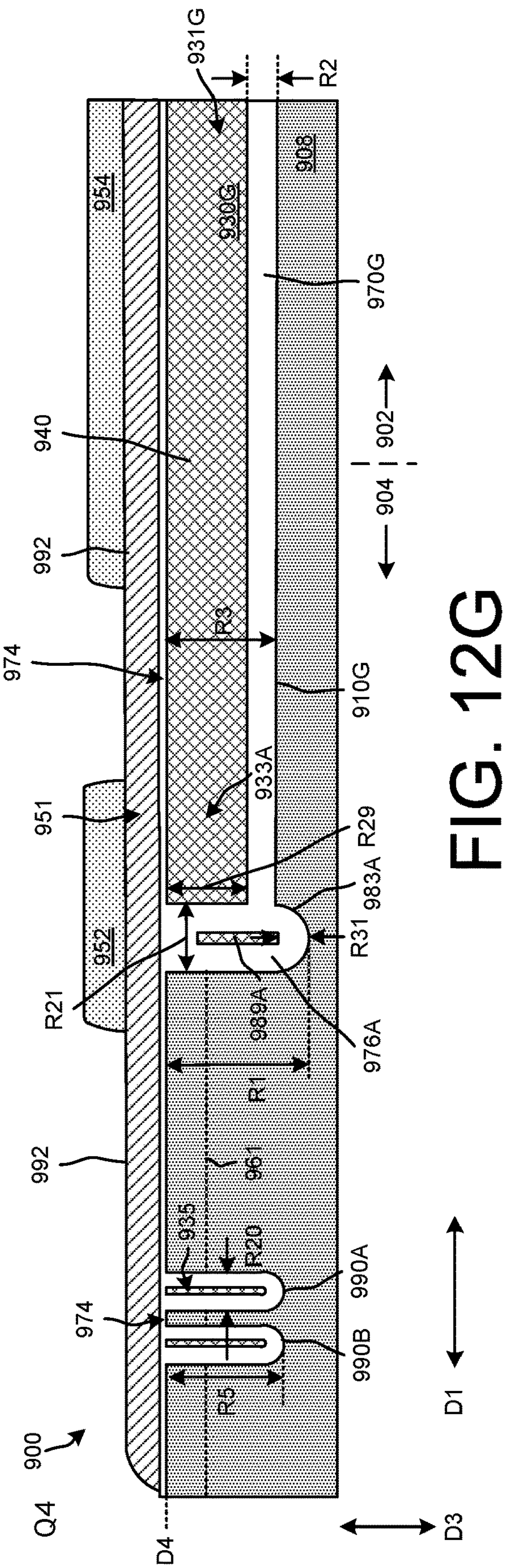

FIG. 12G is a side cross-sectional view of another variation of trench 910G of the semiconductor device 900 cut along line Q4. In this implementation, the shield electrode 930A has a configuration similar to that shown in FIG. 10H. In addition to the features described in connection with, for example, FIG. 10H, this cross-sectional view illustrates that the shield electrode 989A can optionally be a recessed shield electrode (or a non-recessed electrode (not shown)).

Figure 12H:
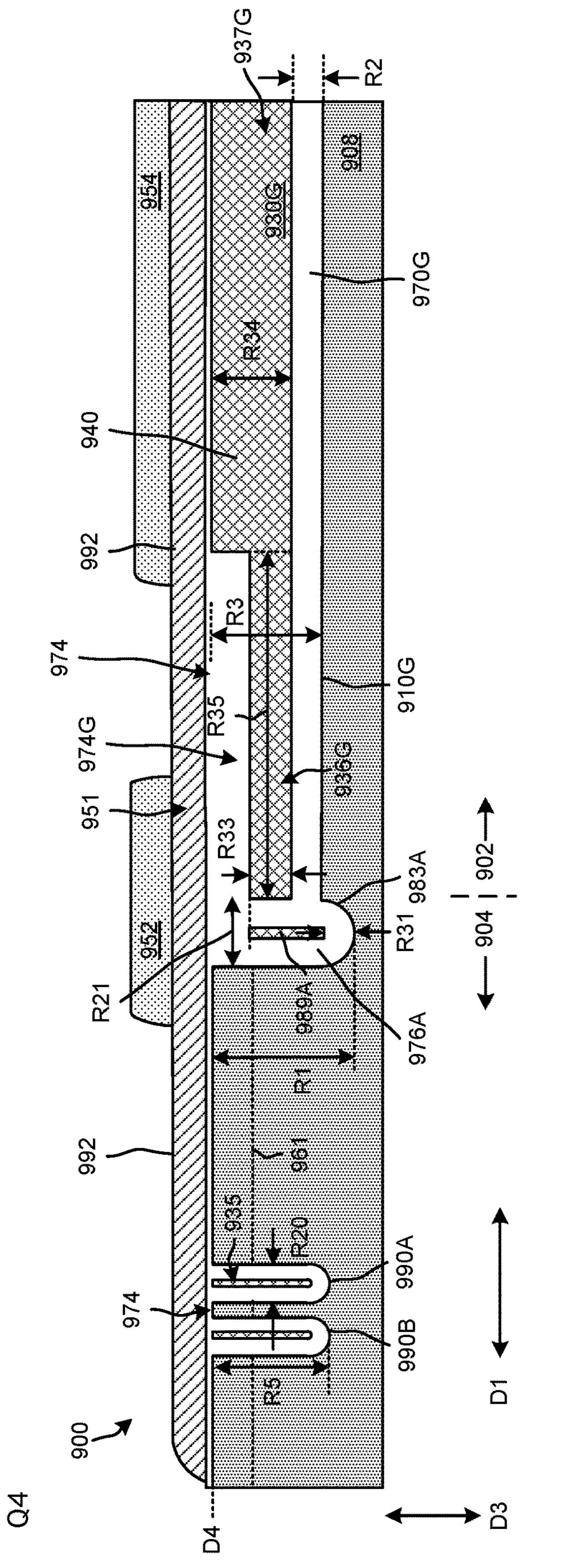

FIG. 12H is a side cross-sectional view of another variation of trench 910G of the semiconductor device 900 cut along line Q4. In this implementation, the shield electrode 930G has a recessed portion 936G and a non-recessed portion 937G the recessed portion 936G of the shield electrode 930G has a thickness R33 that is less than a thickness R34 of the non-recessed portion 937G of the shield electrode 930G. As shown in FIG. 12H, the field dielectric 974 as a portion with a thickness above (e.g., between the recessed portion 936G and the ILD 992) the recessed portion 936G of the shield electrode 930G that is greater than a thickness of the field dielectric 974 above the non-recessed portion 937G of the shield electrode 930G (e.g., between the non-recessed portion 937G and the ILD 992).

Shown in FIG. 12H, a top surface of the recessed portion 936G can be aligned (e.g., horizontally aligned) approximately with a top surface of the shield electrode 989A (which is illustrated by a dashed line). However, a bottom surface of the shield electrode 989A can be deeper than a bottom surface of the portion 936G of the shield electrode 930G. The bottom surface of the shield electrode 989A can be approximately the same as, or less than, the bottom surface of the portion 936G of the shield electrode 930G. The top surface of the recessed portion 936G may not be aligned with the top surface of the shield electrode 989A. The shield electrode 989A can optionally be a non-recessed electrode (not shown).

In some implementations, a length R35 of the recessed portion 936G of the shield electrode 930G (below and corresponding with dielectric portion 974G, which can be referred to as a protrusion dielectric) can be disposed within the termination region 904. In this implementation, the length R35 of the recessed portion 936G of the shield electrode 930G has at least a first portion that is disposed below (e.g., vertically disposed below) the gate runner conductor 952 and a second portion that is disposed below (e.g., is vertically disposed below) the source runner conductor 954. In some implementation, the length R35 of the recessed portion 936G of the shield electrode 930G has at least a first portion that is disposed below (e.g., vertically disposed below) the gate runner conductor 952 and does not have a second portion that is disposed below (e.g., is vertically disposed below) the source runner conductor 954. The recessed portion 936G can terminate below the gate runner conductor 952. The length R35 of the recessed portion 936G of the shield electrode 930G can extend into the active region 902. Accordingly, in some implementations, at least a portion of the recessed portion 936G of the shield electrode 930G can be disposed within the termination region 904, and a portion of the recessed portion 936G of the shield electrode 930G can be disposed within the active region 902. The shield electrode 930G can be recessed along a relatively large portion of (or nearly an entirety of) the trench 910G as shown in FIG. 12L.

Figure 12I:
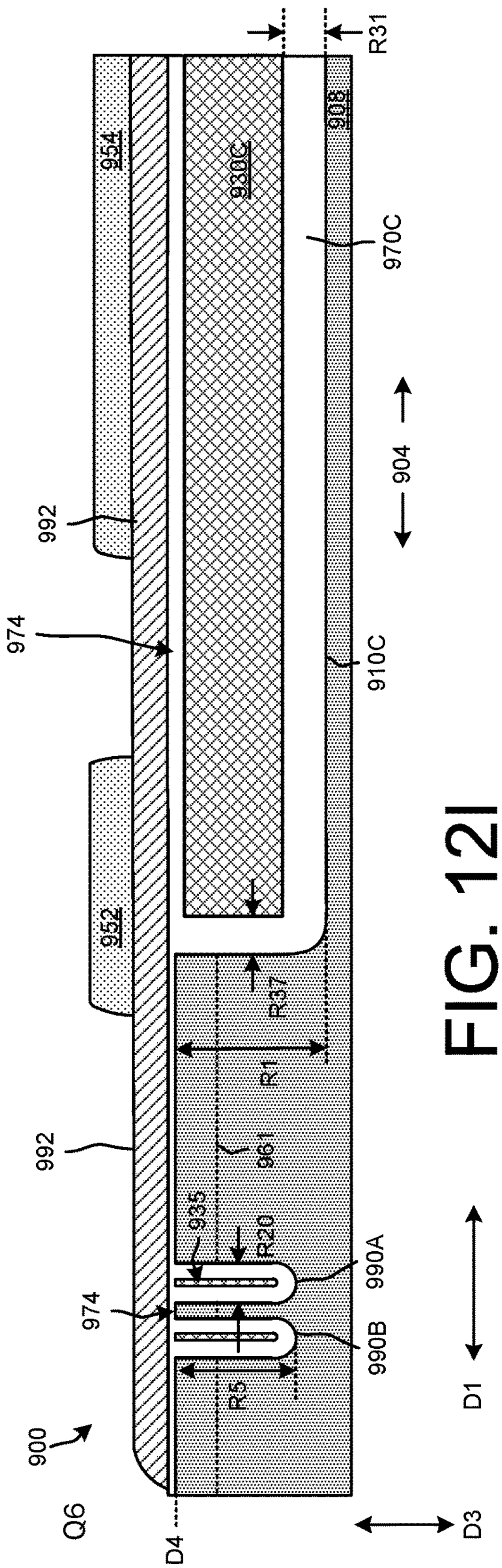

FIG. 12I is a side cross-sectional view of the end trench 910C, which is cut along line Q6 shown in FIG. 12A. The end trench 910C has a shield electrode 930C and dielectric 970C disposed therein. The end trench 910C can have a length (along the longitudinal direction D1) that is approximately the same as a length of, for example, the trench 910C. In this implementation, the dielectric 910C has a thickness R37 along an end surface (e.g., a vertical end surface) of the trench 970C that is approximately equal to the thickness R31 along the bottom surface of the trench. The thickness R37 and the thickness R31 can be approximately the same as the thickness R2 shown in, for example, FIG. 12B. The thickness R37 and/or the thickness R31 can be different than (e.g., greater than, less than) the thickness R2 shown in, for example, FIG. 12B.

Although not shown in FIG. 12I, the shield electrode 930C (or a portion thereof) can be recessed within the trench 910C. In such implementations, the thickness of the shield electrode 930C can be less than that shown in FIG. 12I. The shield electrode 930C can be electrically floating, or can be coupled to a source potential via the source runner conductor 954. Because the features (and options) of the transverse trench 983A, are nearly identical to those of the end trench 910C, a cross-sectional view of the transverse trench 983A cut along line Q7 is not shown.

Figure 12J:
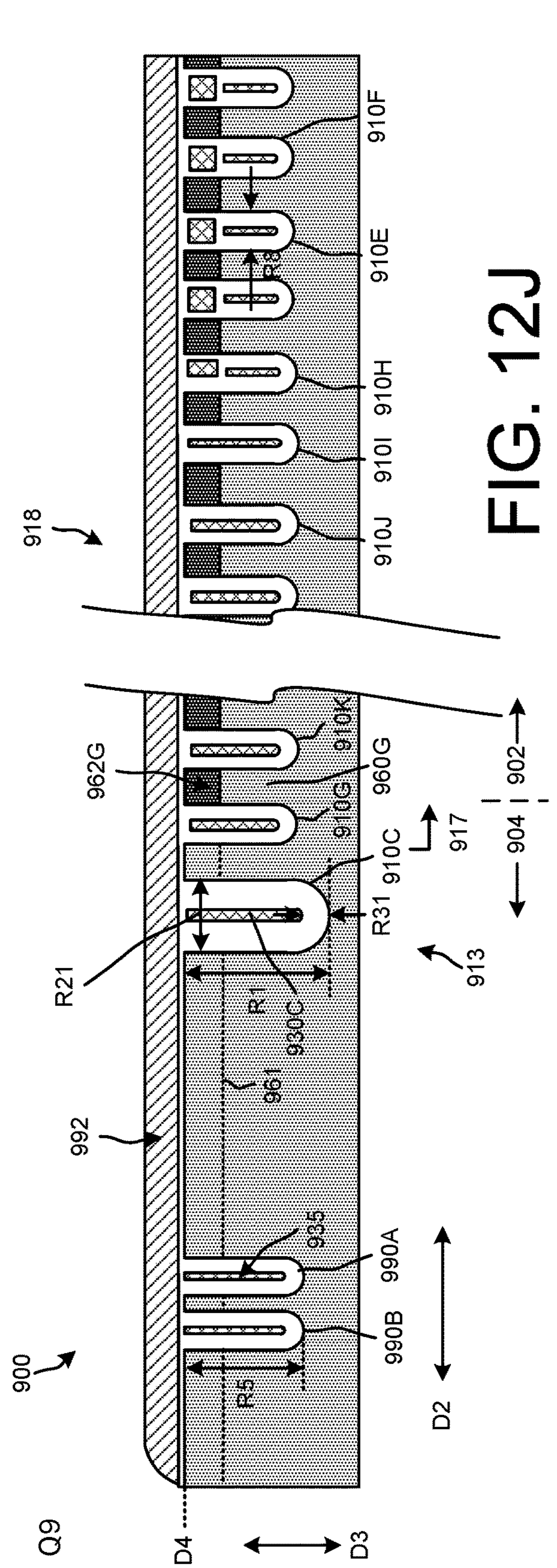

FIG. 12J is a side cross-sectional view cut along line Q9 (shown in FIG. 12A) orthogonal to the plurality of trenches 910 between the gate runner conductor 952 and the source runner conductor 954. Different types of interior trenches 917 from the plurality of trenches 910 are included in this view. The end trench 910C include a shield electrode 930C (along a vertical centerline), and the remainder of the plurality of trenches 910 along this cutline Q9 each include at least a shield electrode.

Figure 12K:
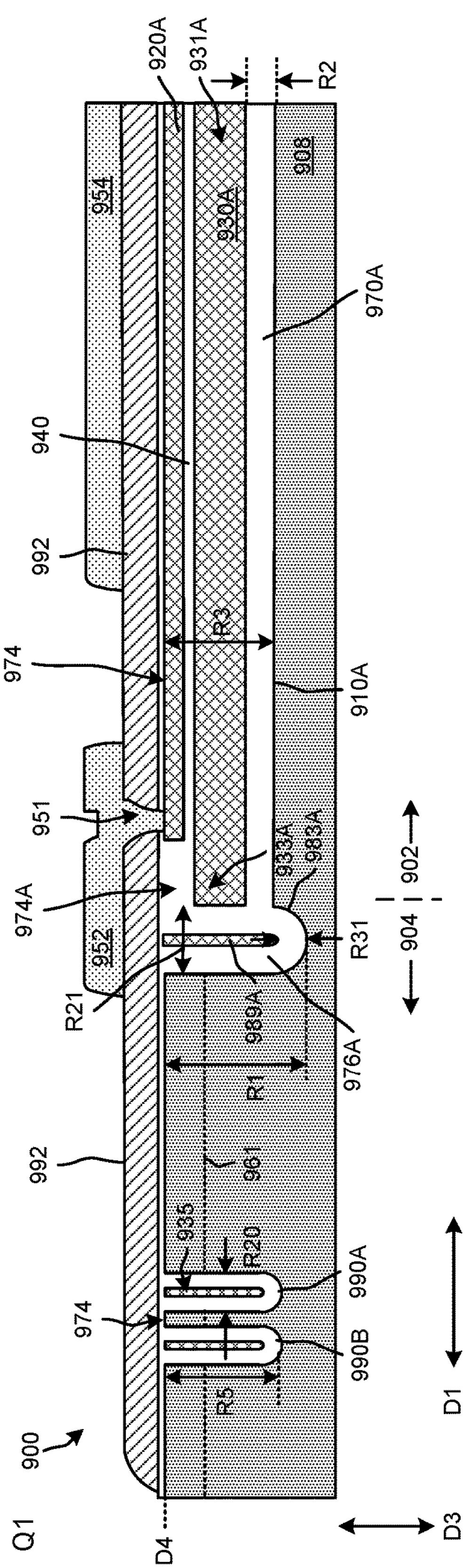
Figure 12L:
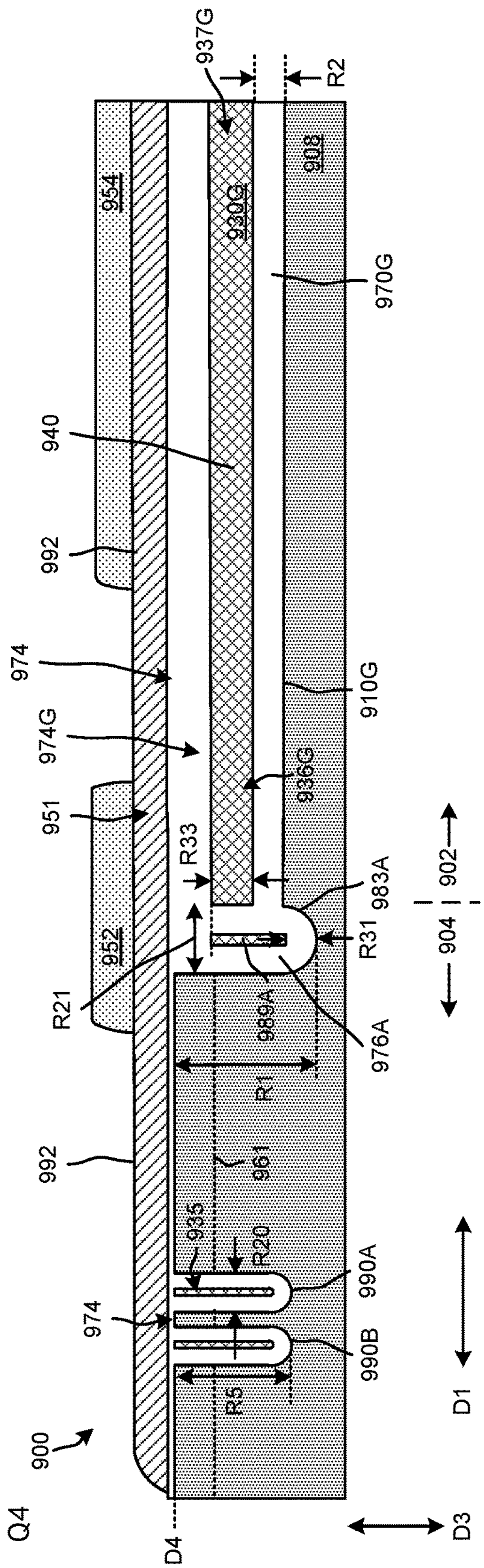

FIG. 12K is a diagram that illustrates a variation of the portion of the semiconductor device 900 shown in FIG. 12E. As shown in FIG. 12K, the semiconductor device 900 includes a dielectric portion 974A (similar to the portions (e.g., protrusion dielectrics) described in connection with, for example, FIGS. 9 and 10). The dielectric portion 974A is coupled to the dielectric portion 976A included in the transverse trench 983A.

FIG. 10N illustrates another variation on the semiconductor device 900. As shown in FIG. 10N, an edge 964G of the well dopant region 962A is separated from the transverse trench 983A (e.g., a sidewall of the transverse trench 983A) by a gap having a length R24. The length R24 can be less than or equal to length R25 (shown in FIG. 10M or 10O), or greater than length R25. The length R24 can be less than or equal to length R29 (shown in FIG. 10E from the transverse trench 983A to an edge of the gate electrode 920A, or greater than length R29. The length R29 is also shown in other figures such as FIG. 10F.

FIGS. 13A through 13L are diagrams that illustrate variations on at least some of the features of the semiconductor device 900 shown in FIGS. 9A through 9N. Accordingly, the reference numerals and features included in FIGS. 9A through 9N are generally maintained and some features are not described again in connection with FIGS. 13A through 13L.

As shown in FIGS. 13A through 13L, capacitance reduction trenches 998 (which include capacitance reduction trenches 998A through 998E) are disposed below the gate runner conductor 952. Also as shown in at least FIG. 13A, surface gate contacts 953 are disposed between the capacitance reduction trenches 998 and the gate runner conductor 952. In this implementation, a surface gate electrode 922 is included in the semiconductor device 900. A well implant (which is defined by the doping region 938A) is at least partially blocked by the surface gate electrode 992. In some implementations, at least a portion of the surface electrode 922 can be recessed low a mesa region. In other implementations the oxide filled trenches are disposed under surface gate poly in the device gate pad (not shown).

Figure 13A:
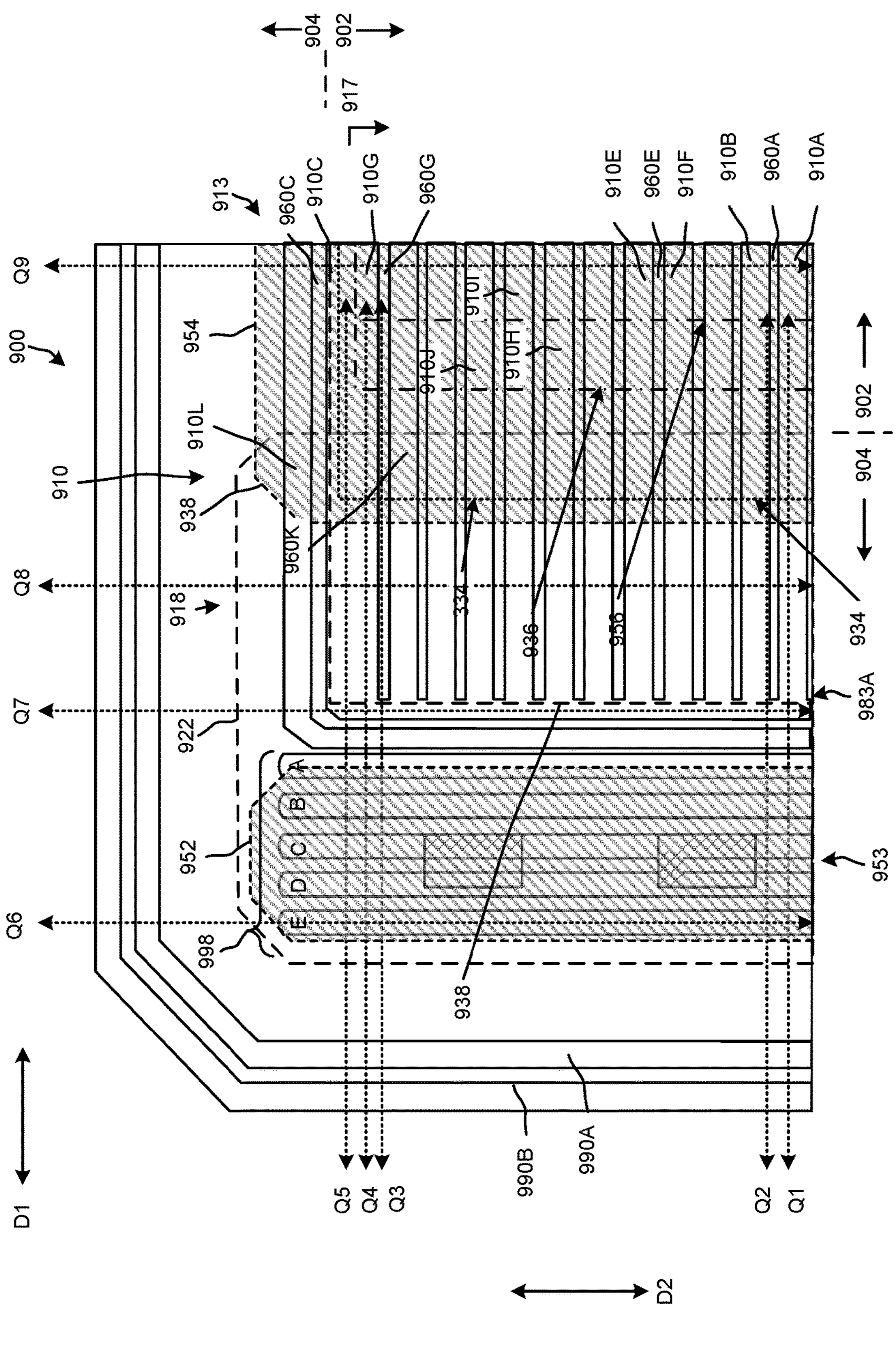
FIGS. 13A through 13L are diagrams that illustrate variations on at least some of the features of the semiconductor device shown in FIGS. 9A through 9N.
Figure 13B:
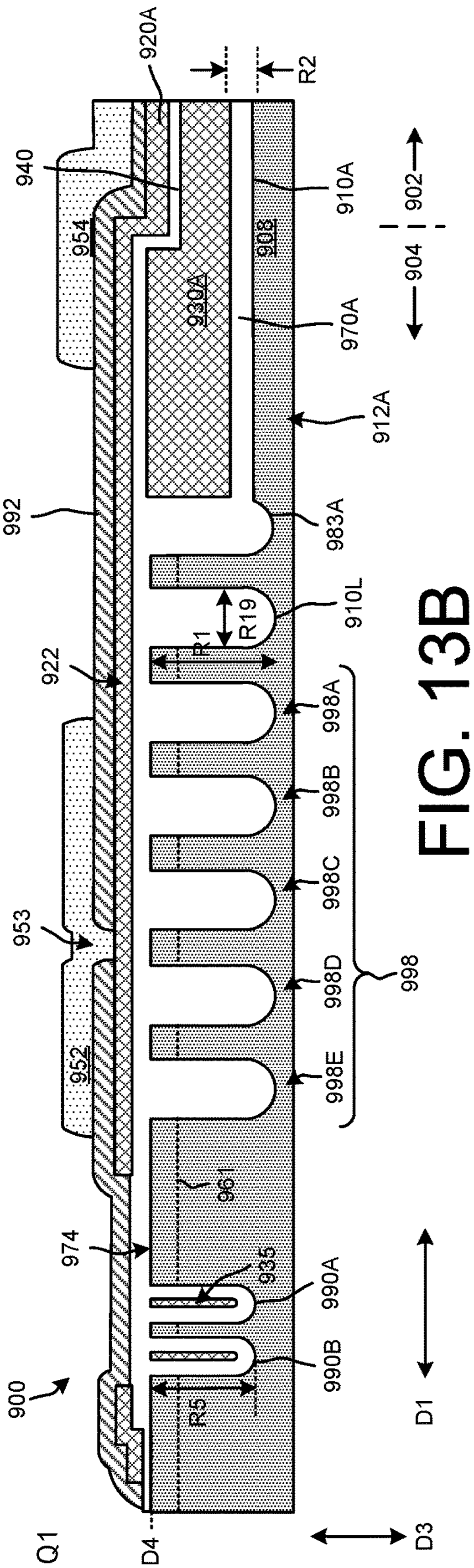

FIG. 13B is a diagram that illustrates a side cross-sectional view of the semiconductor device 900 cut along line Q1. As shown in FIG. 13B, the capacitance reduction trenches 998 each have a depth that is approximately equal to the depth R1 of the perimeter trench 910L and/or the transverse trench 983A. Each of the capacitance reduction trenches 998 also has a width that is approximately equal to the width R19 of the perimeter trench 910L (and the transverse trench 983A). In some implementations, one or more of the capacitance reduction trenches 998 can be formed using the same process that is used to form the perimeter trench 910L and/or the transverse trench 983A.

In some implementations, one or more of the capacitance reduction trenches 998 can have a depth and/or a width different than the perimeter trench 910L and/or the transverse trench 983A. For example, one or more of the capacitance reduction trenches 998 can have a depth and or a width similar to the perimeter trenches 990A and/or 990B. In some embodiments, one or more of the capacitance reduction trenches 998 can include a shield electrode (not shown).

Figure 13C:
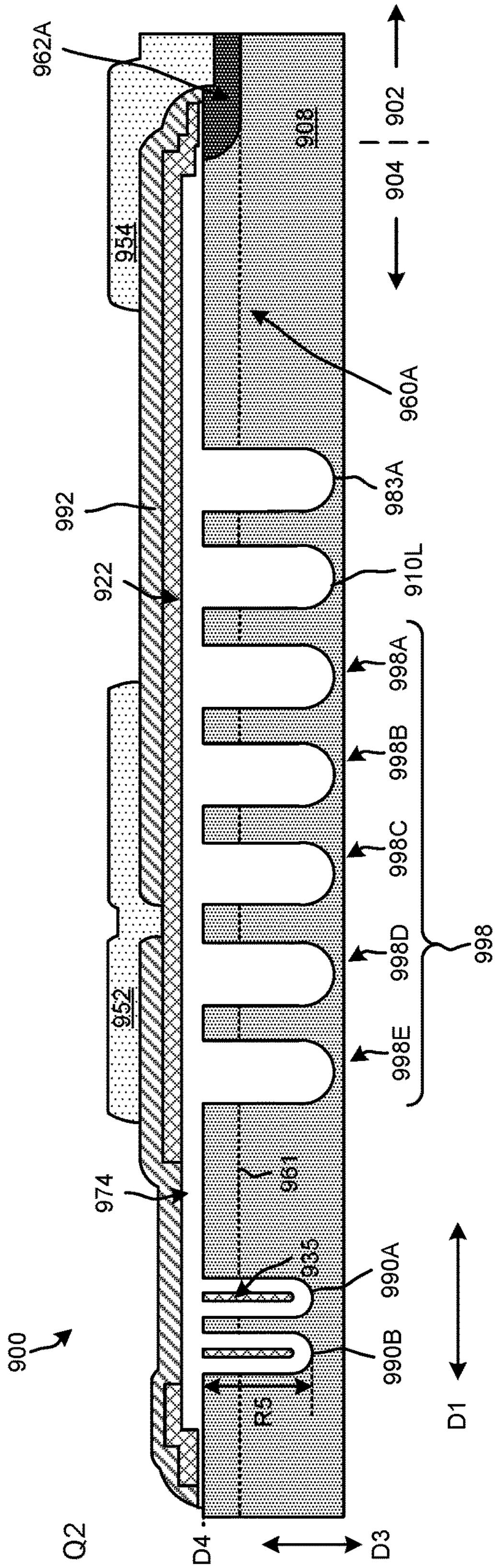
Figure 13D:
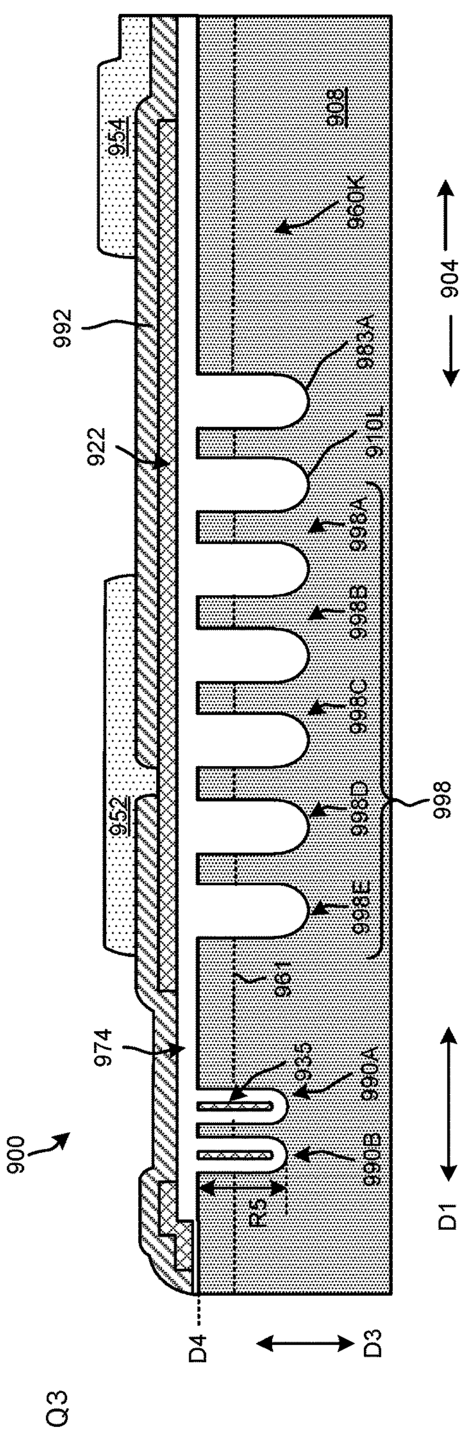
Figure 13E:
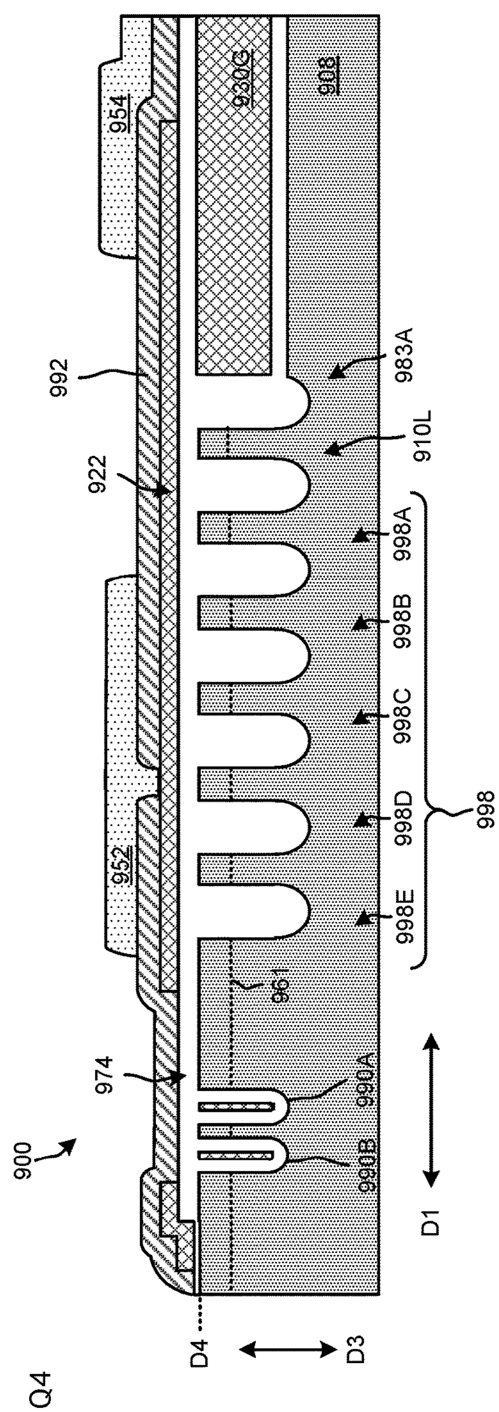
Figure 13F:
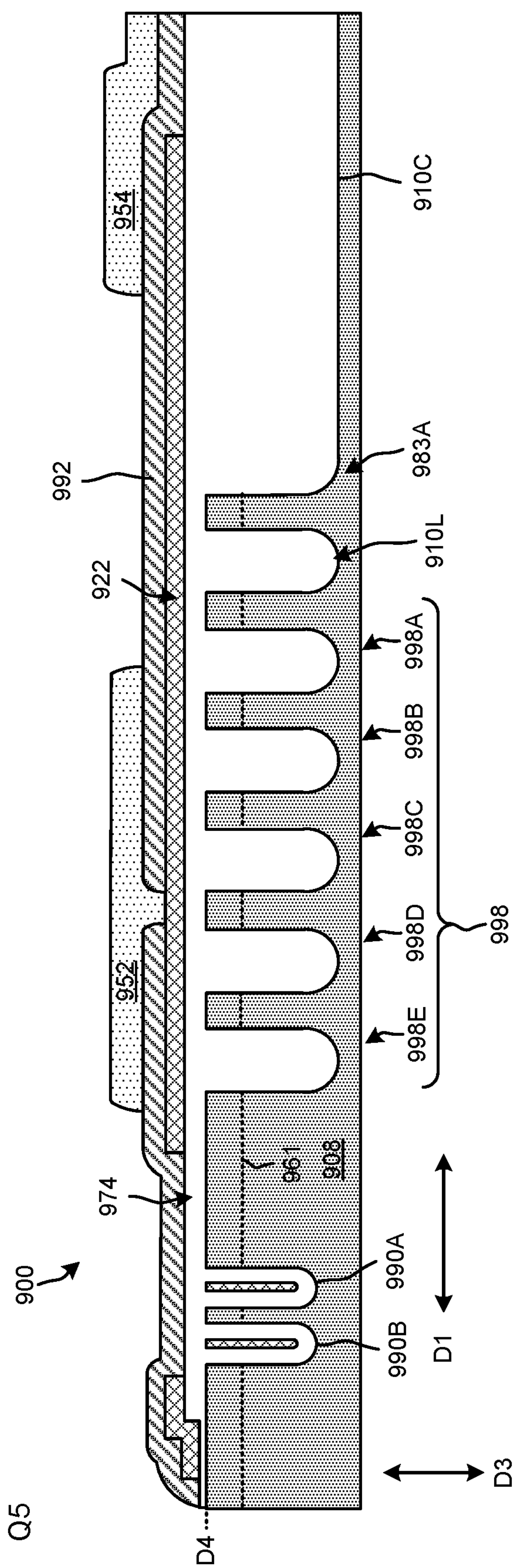
Figure 13G:
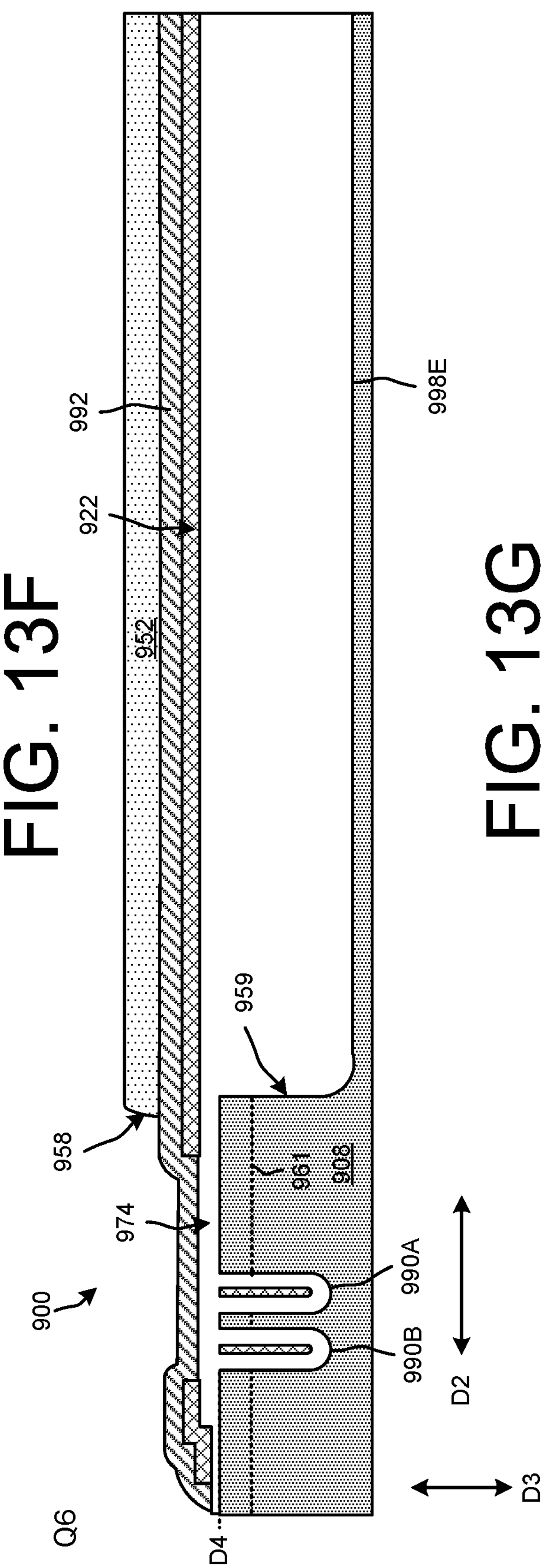
Figure 13H:
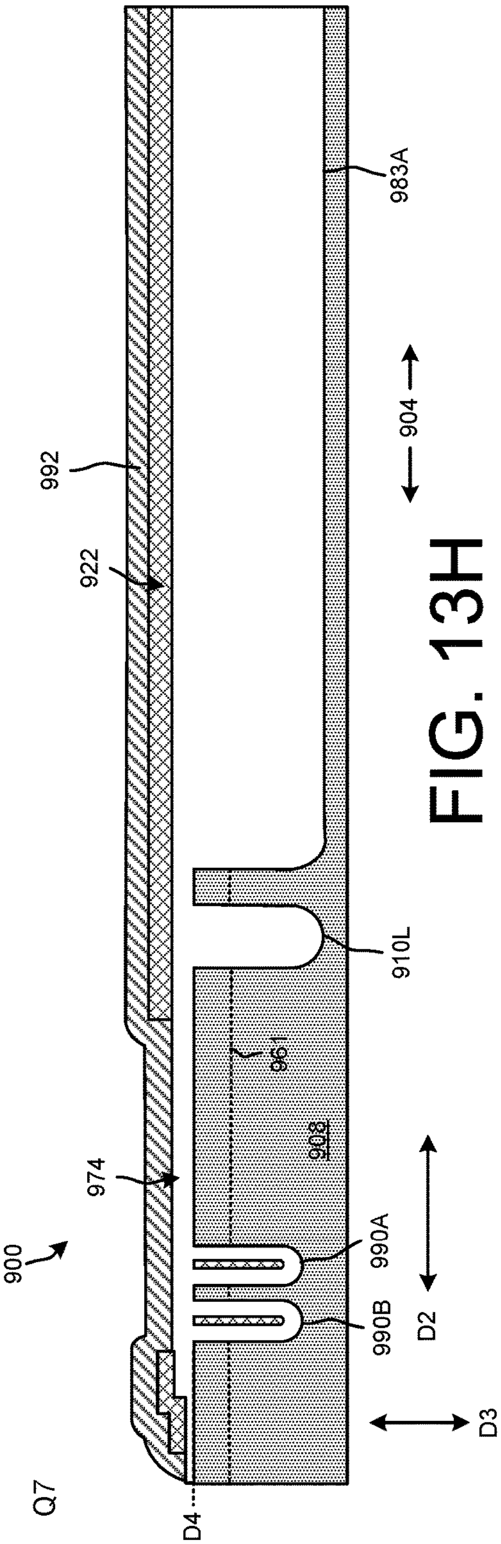
Figure 13I:
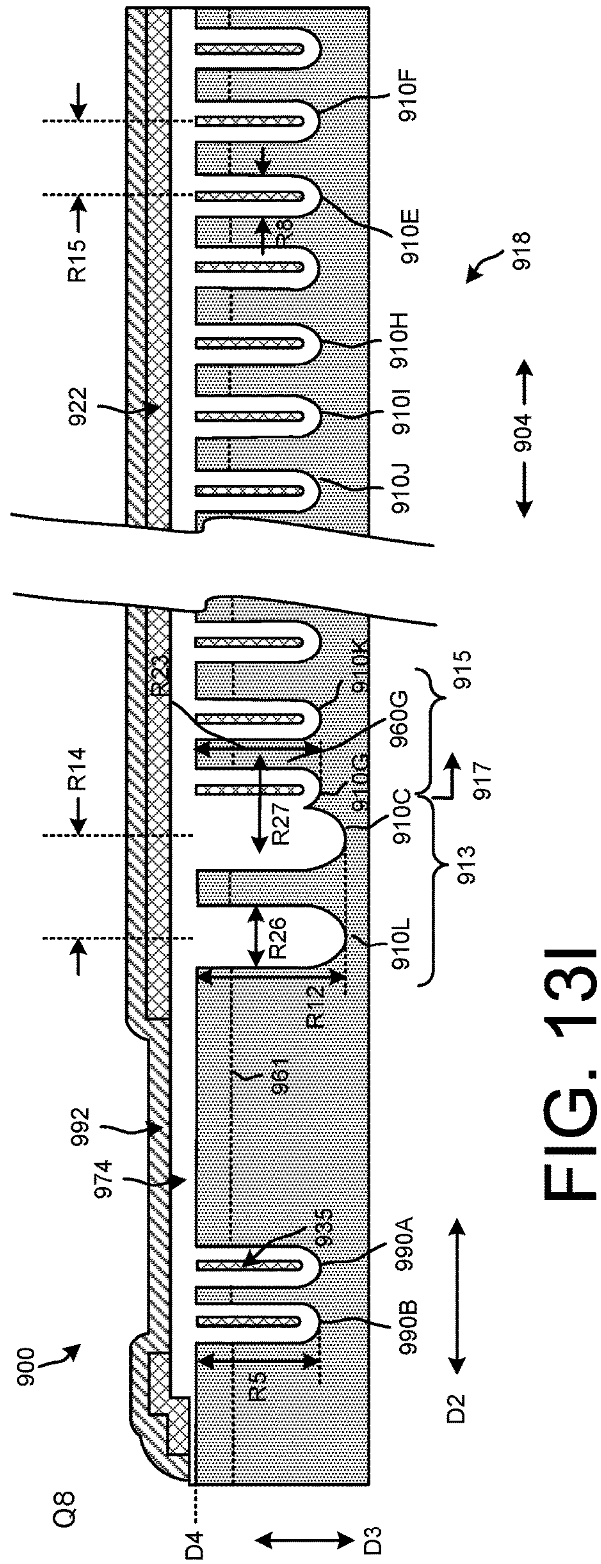
Figure 13J:
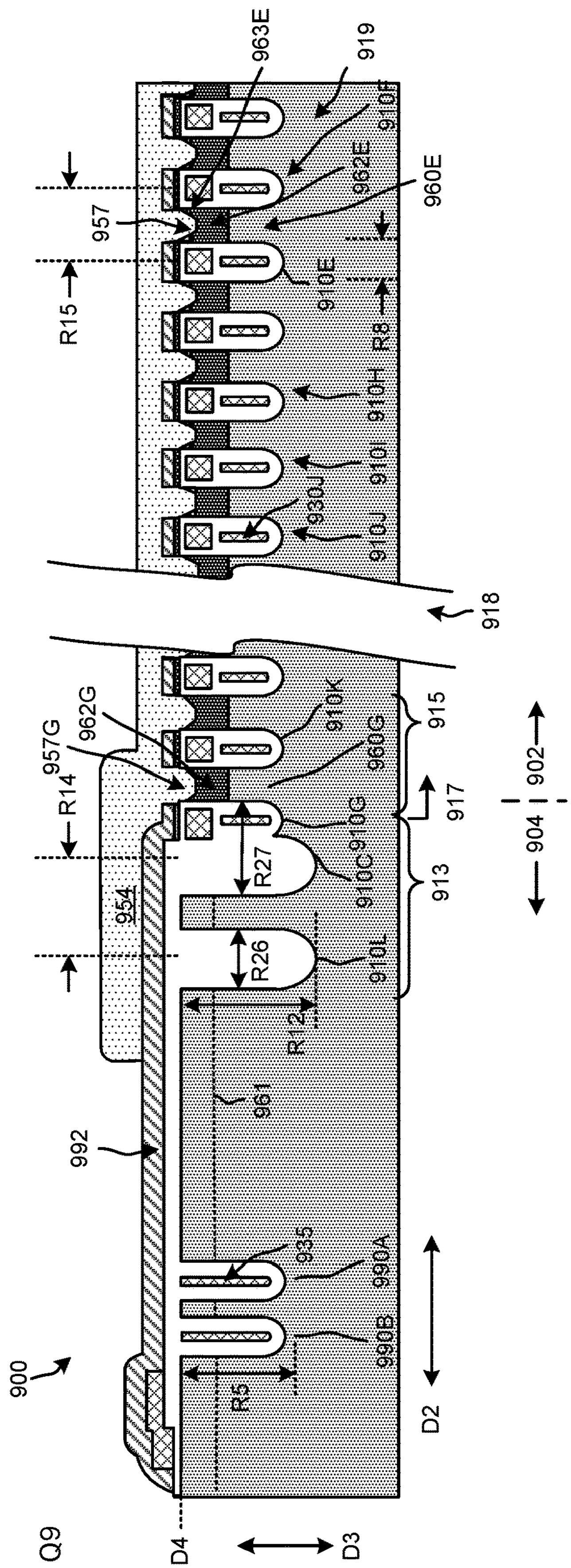
Figure 13K:
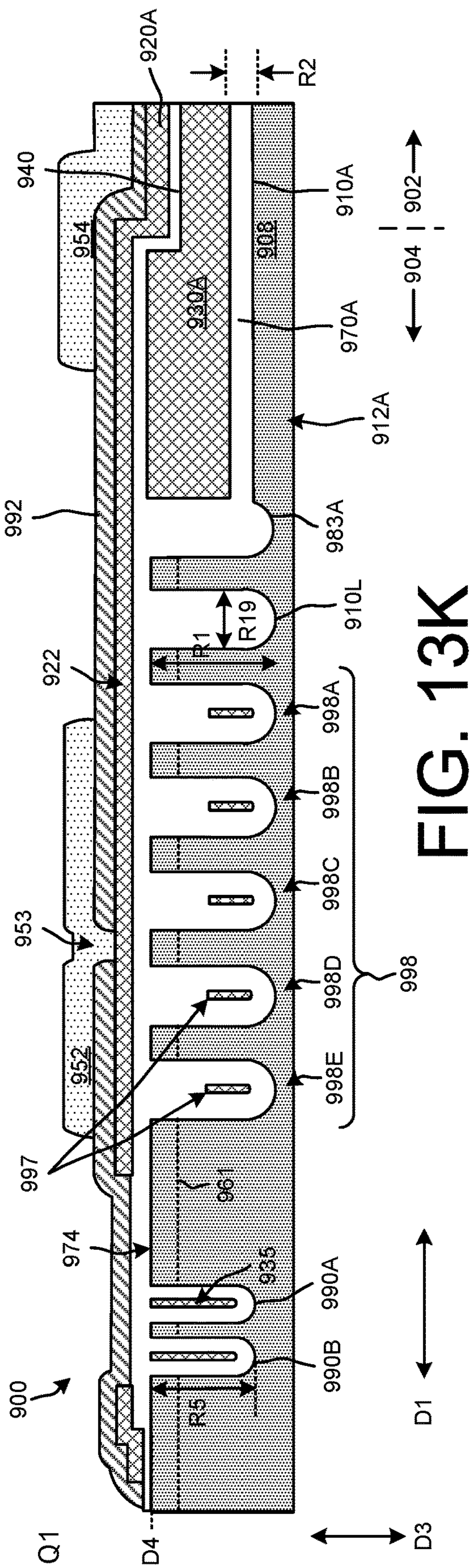
Figure 13L:
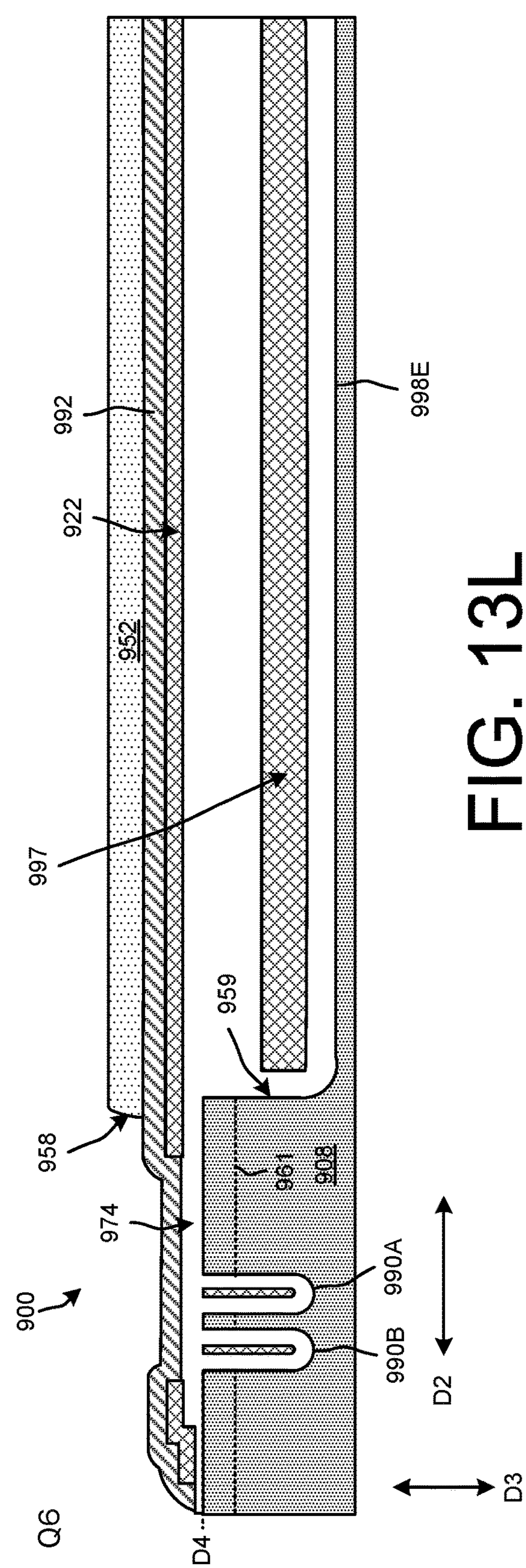

An example of one or more of the capacitance reduction trenches 998 shown in FIG. 13B including shield electrodes 997 are shown in FIG. 13K. In some implementations, less than all of the capacitance reduction trenches 998 can include a shield electrode 997. In this implementation, the shield electrodes 997 are recessed within the capacitance reduction trenches 998. The shield electrodes 997 may not be recessed within the capacitance reduction trenches 998. One or more shield electrodes 997 can be included in one or more of the capacitance reduction trenches 998 shown in, for example, FIGS. 13C, 13D, 13E, and/or 13F. A cross-sectional view of the shield electrode 997 along capacitance reduction trench 998E (cut Q6) is shown in FIG. 13L.

Referring back to FIG. 13B, a surface gate electrode 922 is disposed between the inter-electrode dielectric 992 and the capacitance reduction trenches 998. At least a portion of the epitaxial layer 908 is insulated from the surface gate electrode 922 by the field dielectric 974. At least a portion of the field dielectric 974 is disposed between the surface gate electrode 922 and one or more of the capacitance reduction trenches 998.

Because the capacitance reduction trenches 998 are disposed between the gate runner conductor 953 and a drain (not shown), the capacitance reduction trenches 998 can reduce a gate to drain capacitance. In some implementations, one or more capacitance reduction trenches similar to the capacitance reduction trenches 998 can be formed below, for example, a gate pad (not shown).

FIG. 13C is a side cross-sectional view of the mesa region 960A cut along line Q2. In this cross-sectional view, the well dopant region 962A extends below the source runner conductor 954. In this implementation, the well dopant region 962A contacts the dielectric portion 976A included in the transverse trench 983A. In accordance with prior examples, an area where the well dopant region 962A could be expanded is illustrated with line 961.

As shown in FIG. 13C, well dopant region 962A is separated from, for example, the transverse trench 983A by at least a portion of the epitaxial layer 908. In some implementations, a distance between the well dopant region 962A and the transverse trench 983A can be less than shown in FIG. 13C, or greater than shown in FIG. 13C.

Similar structures and features (as included in FIG. 13C) are illustrated in the cross-sectional view of the mesa region 960G cut along line Q3 (shown in FIG. 13D). In FIG. 13D, the mesa region 960G is entirely disposed within the termination region 904.

FIG. 13E is a side cross-sectional view of the trench 910G, which is cut along line Q4 shown in FIG. 13A. In this implementation, the trench 910G is entirely disposed within the termination region 904. As shown in FIG. 13E, the shield electrode 930G has a thickness that extends from the dielectric 970G along a bottom of the trench 910G to the field oxide 974. The field oxide 974 can be aligned along plane D4. The shield electrode 930G disposed within the trench 910G can be recessed.

FIG. 13F is a side cross-sectional view cut along line Q5 shown in FIG. 13A. At least a portion of this cross-sectional view intersects the capacitance reduction trenches, the perimeter trench 910L, and the transverse trench 983A. Also, at least a portion of this cross-sectional view is a long trench 910C, which is a dielectric filled trench.

FIG. 13G is a side cross-sectional view cut along line Q6 shown in FIG. 13A. This cross-sectional view is aligned along capacitance reduction trench 998E. As shown in FIG. 13G the capacitance reduction trench 998E has an end 959 that extends in a horizontal direction up to or nearly to an edge 958 of the gate runner conductor 952 (which is vertically above the end 959). Accordingly, the end 959 of the capacitance reduction trench 998E can be disposed below (e.g., vertically below) at least a portion of the gate runner conductor 952. In some embodiments, the end 959 of the capacitance reduction trench 998E can extend beyond the edge 958 of the gate runner conductor 952 such that the end 959 of the capacitance reduction trench 998E is not vertically disposed below an area of the gate runner conductor 952 when view from above. Similarly, the end 959 of the capacitance reduction trench 998E can be disposed below, or can extend beyond an area defined by surface gate electrode 922 when viewed from above.

FIG. 13H is a side cross-sectional view cut along line Q7 shown in FIG. 13A. This cross-sectional view is intersects perimeter trench 910L and is aligned along transverse trench 983A. As shown in FIG. 13H, both the perimeter trench 910L and the transverse trench 983A are disposed below the surface gate electrode 922.

FIG. 13I is a side cross-sectional view cut along line Q8 (shown in FIG. 13A) orthogonal to the plurality of trenches 910. In this implementation, the mesa regions between the interior trenches do not include a well dopant. In this implementation, the surface gate electrode 922 is disposed above the plurality of trenches 910, and the line Q8 intersects along a relatively shallow portion of the interior trenches 917 from the plurality of trenches 910. Both end trench 910L and 910C (i.e., end trenches 913) include a dielectric without a shield electrode, while the remainder of the plurality of trenches 910 (which includes the interior trenches 917) along this cutline Q8 each include a shield electrode. Also, the depth R12 of end trenches 910L, 910C is greater than a depth of the remainder of the trenches (e.g., non-end trenches, interior trenches 917), which include shield electrodes.

FIG. 13J is a side cross-sectional view of the plurality of trenches 910 cut along line Q9 shown in FIG. 13A through the termination region 904 and into the active region 902. A portion of the cross-sectional view of the plurality of trenches 910 is included in the termination region 904 and a portion of the cross-sectional view of the plurality of trenches 910 is included in the active region 902. Because many of the features described above with respect to cut line Q9 apply in this implementation, many elements will not be described again here.

As shown in FIG. 13J, the well dopant region 962G is contacted to the source runner conductor 954 using a source contact 957G. Accordingly, the outermost trench (closest to the perimeter trenches 990A, 990B) from the interior trenches 917 is in contact with well dopant region 962G which is contacted to the source runner conductor 954 through the source contact 957G. In this implementation, the outermost trench from the interior trenches 917 is trench 910G, which is coupled to end trench 910C. In some embodiments, the outermost trench from the interior trenches 917 (which can be adjacent to a well dopant region that is electrically coupled to a source) can be a standalone trench that is not coupled to an end trench.

FIGS. 14A through 14K are side cross-sectional diagrams that illustrate a method for making one or more features of a semiconductor device 1400. The semiconductor device 1400 can be similar to the semiconductor devices described above. The method can be referred to as a single hard mask process. The trenches can be aligned along a longitudinal axis (e.g., longitudinal axis D1) and can be included in a set of parallel trenches (e.g., the plurality of trenches 310 shown in FIG. 3A).

Figure 14A:
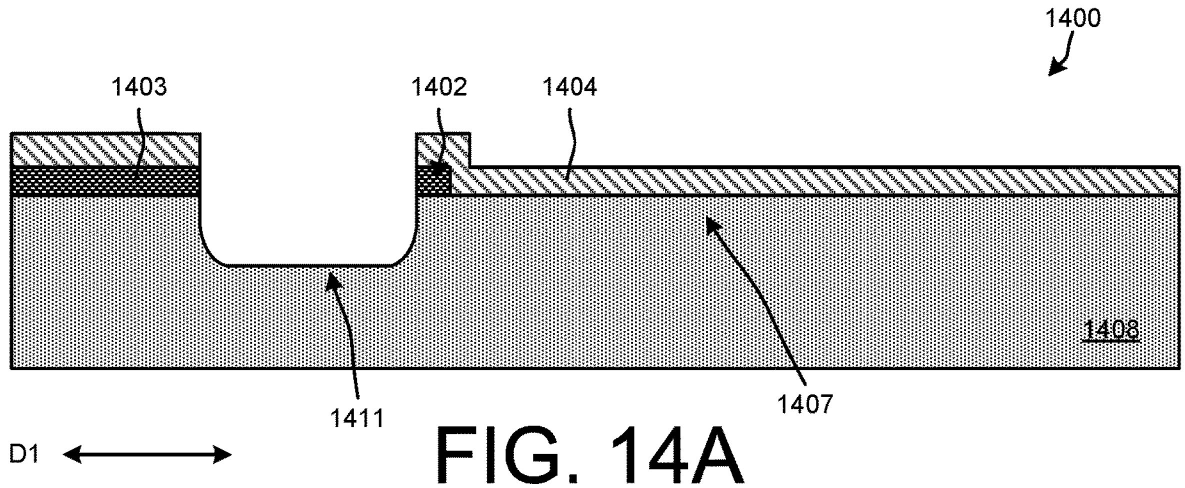
FIGS. 14A through 14K are side cross-sectional diagrams that illustrate a method for making one or more features of a semiconductor device.
Figure 14B:
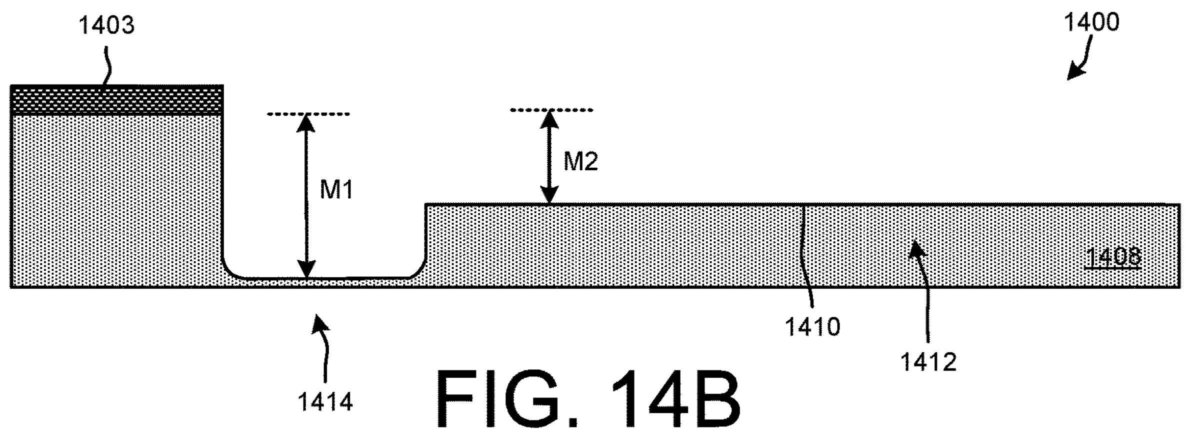

As shown in FIG. 14A, a first mask 1403 is formed on an epitaxial layer 1408 of a semiconductor substrate (not shown). A second mask 1404 is formed over at least a portion of the first mask 1403. In some embodiments, the first mask 1403 can be a hard mask (e.g., an oxide-based mask) (rather than a polymeric or other organic material that can be a soft mask). FIG. 14A illustrates a portion 1411 of a trench 1410 (shown in FIG. 14B) formed in the epitaxial layer 1408. The portion 1411 of the trench 1410 can be associated with a transverse trench, a perimeter trench, a trench extension portion, and/or so forth.

After the portion 1411 of the trench 1410 has been formed, the second mask 1404 is removed, leaving the first mask 1403. Etching of the portion 1411 and the exposed region 1407 is commenced to form the trench 1410 shown in FIG. 14B.

The processing steps described herein can be modified such that a transverse trench can be formed within and in a perpendicular direction to at least a portion of the trench 1410.

Figure 14C:
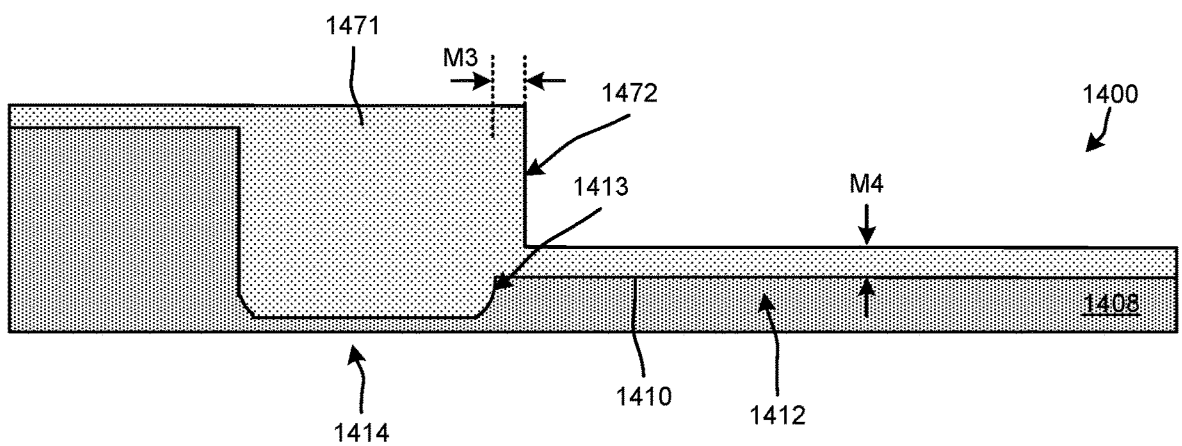

FIG. 14C illustrates formation of a dielectric 1471 within the trench 1410. The first mask 1403 is removed before the dielectric 1471 is formed within the trench 1410.

In this embodiment, because the first portion 1414 is narrower than the second portion 1412, the dielectric 1471 can fill the first portion 1414 of the trench 1410 while lining a sidewall and a bottom surface of the second portion 1412 of the trench 1410. As shown in FIG. 14C, an edge 1472 of the dielectric 1471 is offset (e.g., laterally offset) from an edge 1413 of the first portion 1414 of the trench 1410.

Figure 14D:
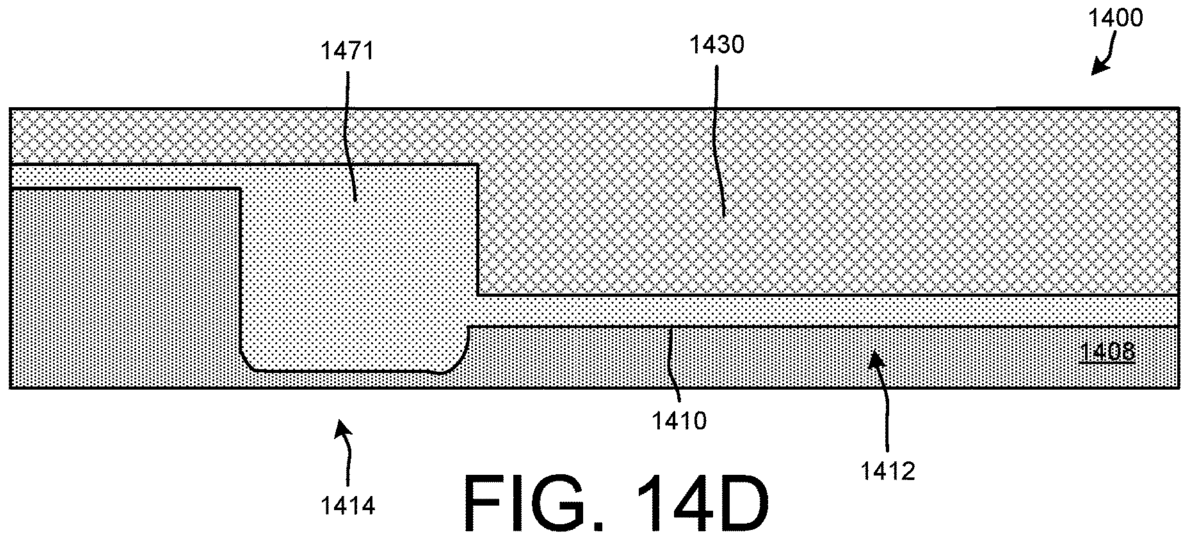
Figure 14E:
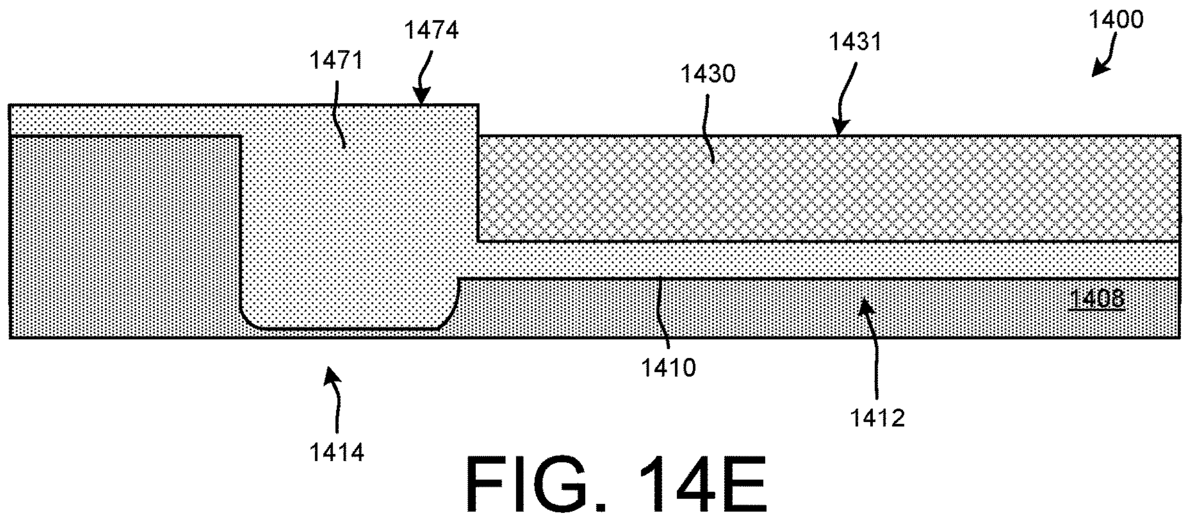

FIG. 14D illustrates formation of a shield electrode 1430 in the trench 1410. After the shield electrode 1430 has been formed within the trench 1410, a portion of the shield electrode 1430 can be removed as shown in FIG. 14E. A portion of the shield electrode 1430 can be etched to recess the shield electrode 1430 within the trench 1410. Although not shown, in some implementations a surface shield electrode can also be formed.

Figure 14F:
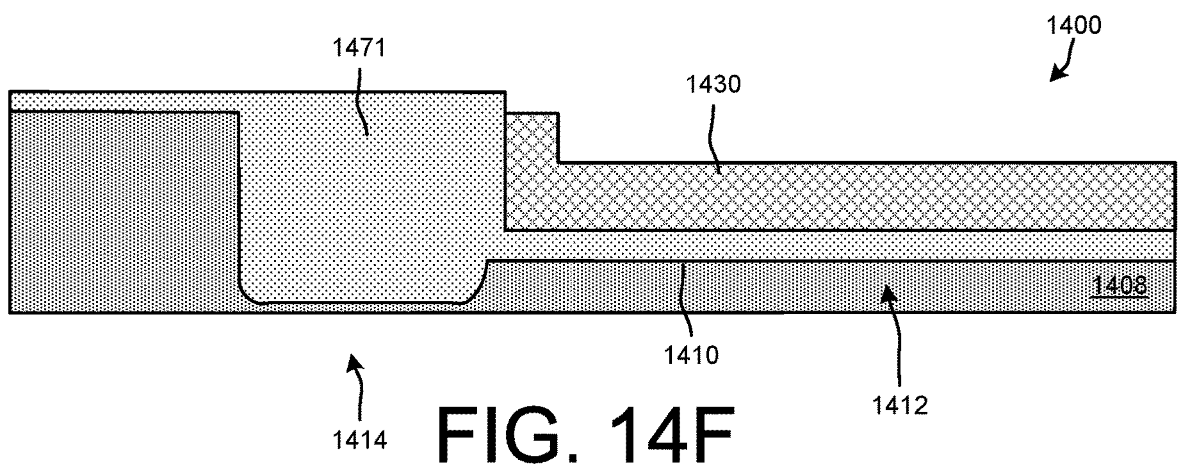
Figure 14G:
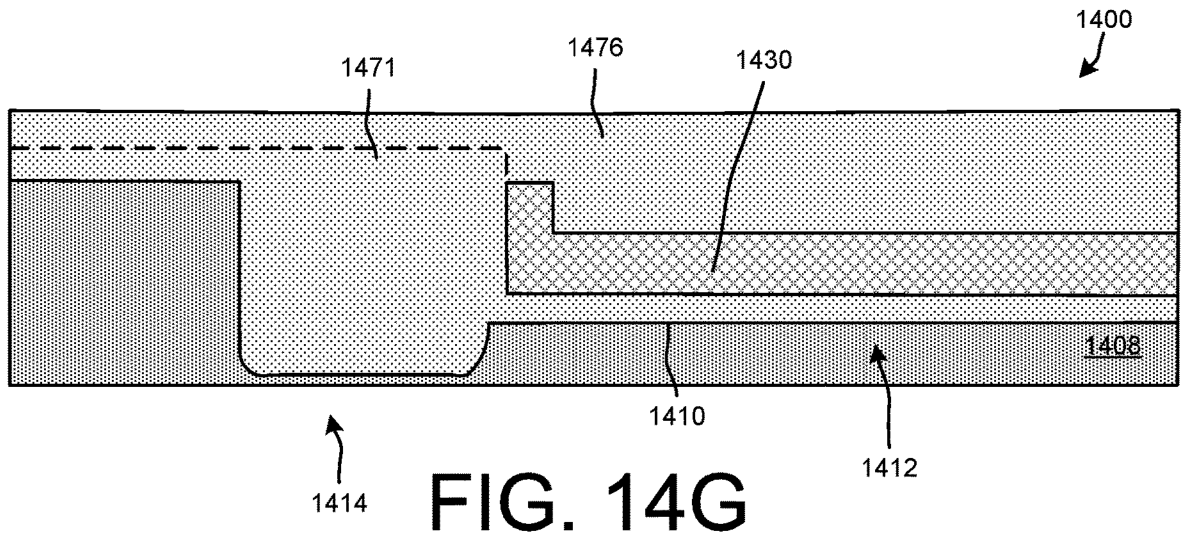

As shown in FIG. 14F, the shield electrode 1430 is further recessed within the trench 1410. A dielectric 1476 is formed as shown in FIG. 14G after a profile of the shield electrode 1430 has been formed. Although not shown, a gate dielectric can also be formed after the inter-electrode dielectric 1440 has been formed.

Figure 14H:
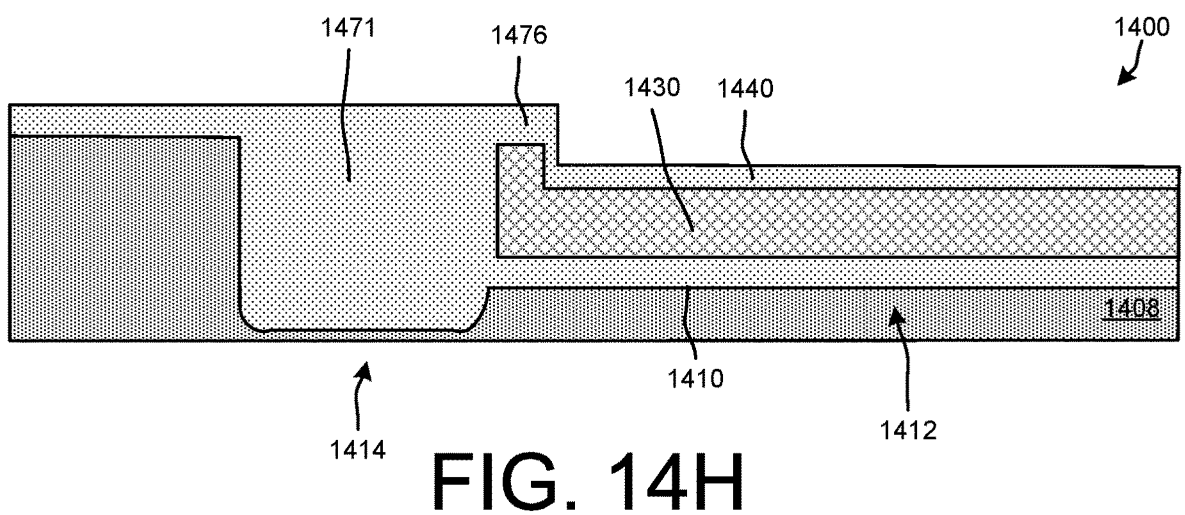

As shown in FIG. 14H, the inter-electrode dielectric 1440 can be defined and recessed using any combination of a CMP process or an etch process. As shown in FIG. 14H, the inter-electrode dielectric 1440 is recessed within the second portion 1412 of the trench 1410.

Figure 14I:
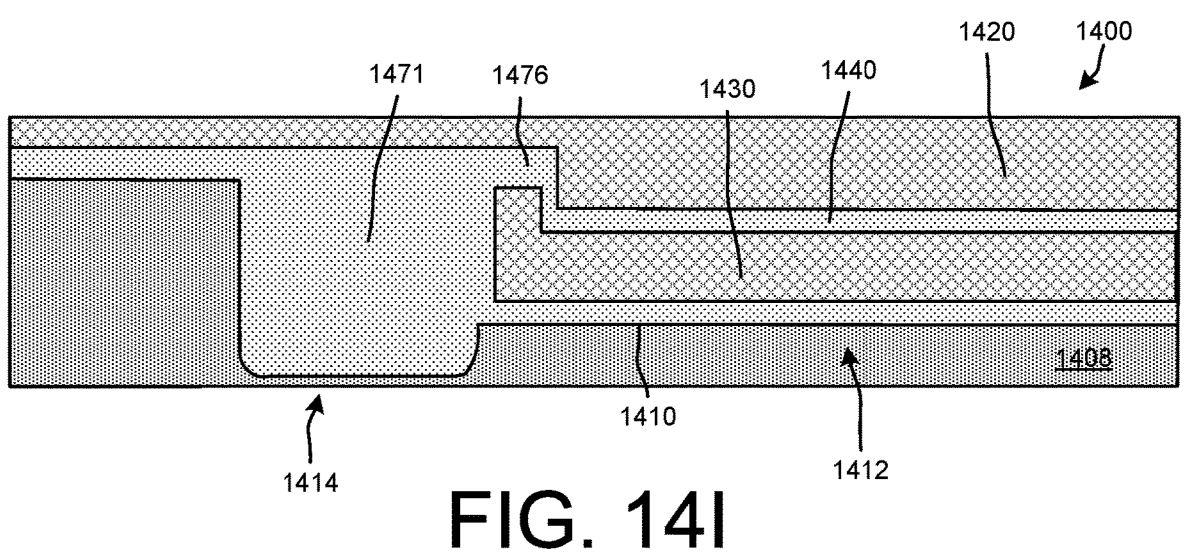
Figure 14J:
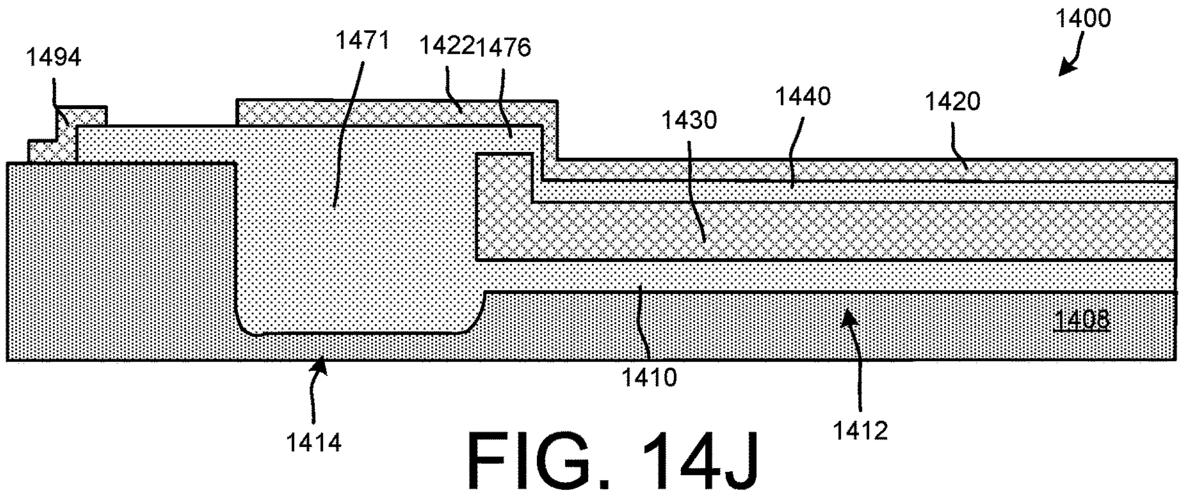

After a profile of the inter-electrode dielectric 1440 has been formed as shown in FIG. 14H, a gate electrode 1420 can be formed as shown in FIG. 14I. The gate electrode 1420 is recessed to form the gate electrode 1420 profile shown in FIG. 14J. In this implementation, a surface gate electrode 1422 and a channel stopper 1494 are formed.

Figure 14K:
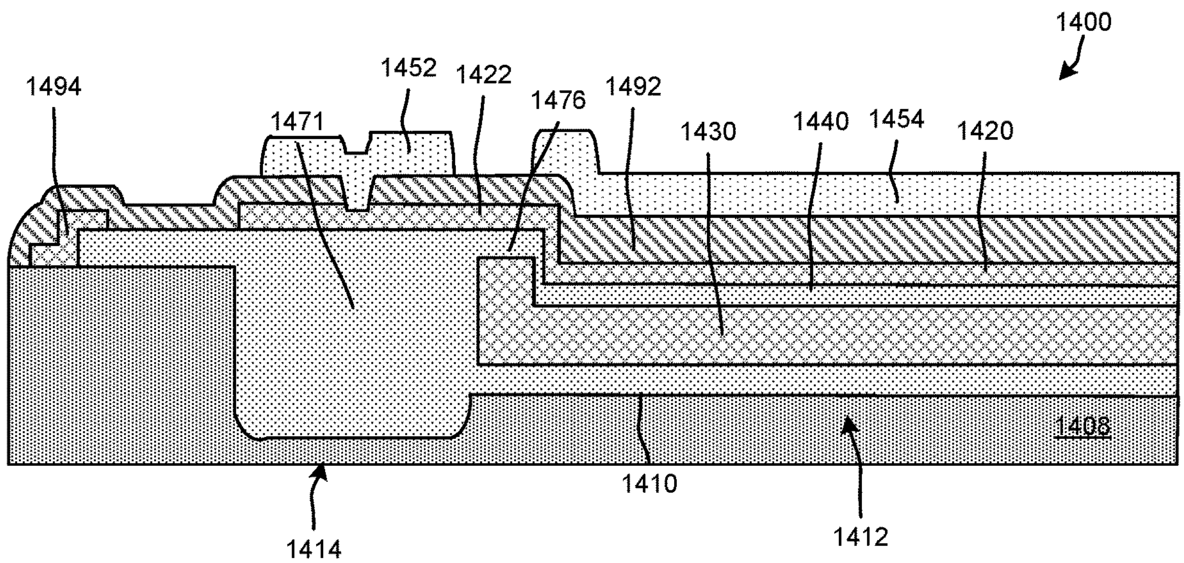

As shown in FIG. 14K, an interlayer dielectric 1492 is formed. A gate runner conductor 1452 and a source runner conductor 1454 are shown in FIG. 14K. Vias to the gate runner conductor 1452 and the source runner conductor 1454 can be formed.

Figure 15A:
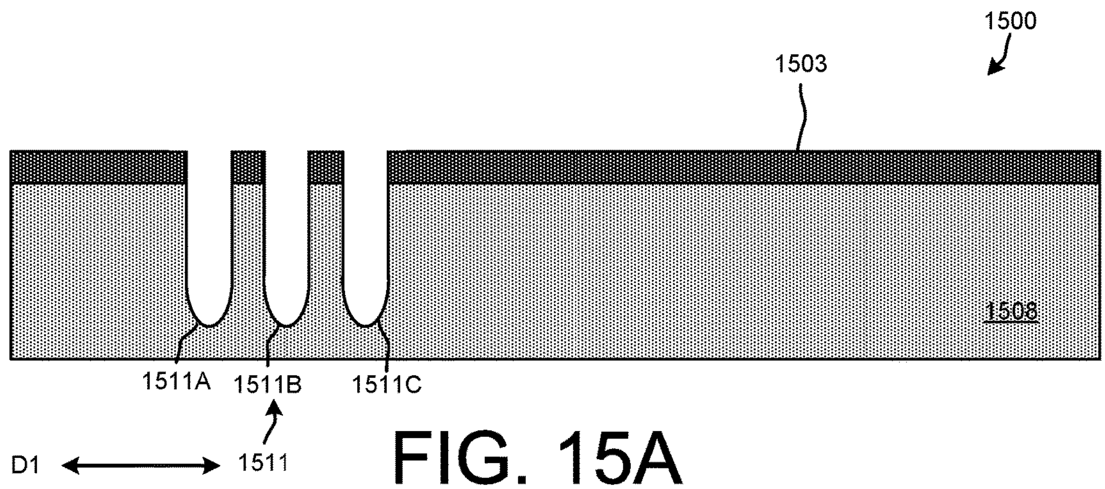
FIGS. 15A through 15O are side cross-sectional diagrams that illustrate another method for making one or more features of a semiconductor device.
Figure 15B:
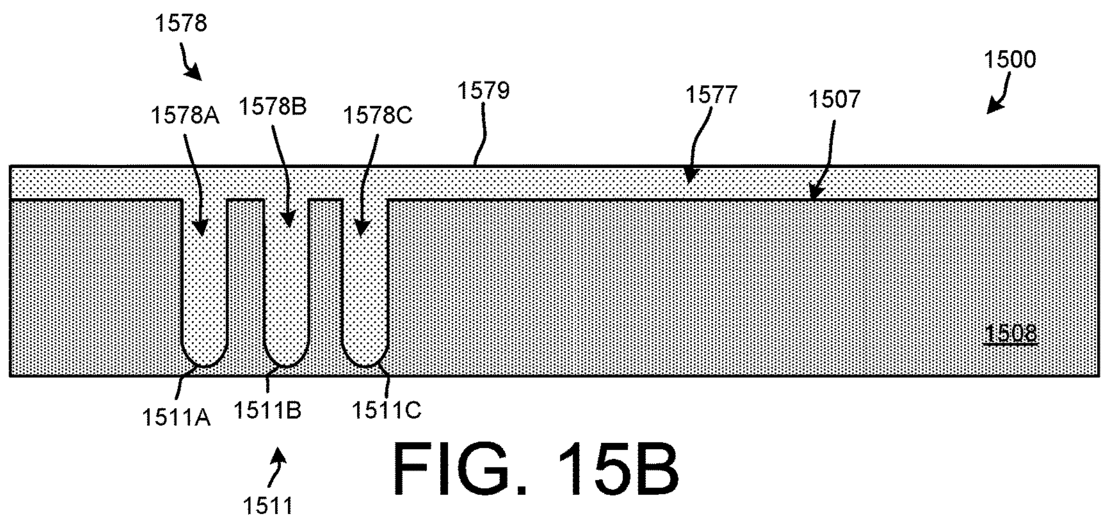
Figure 15C:
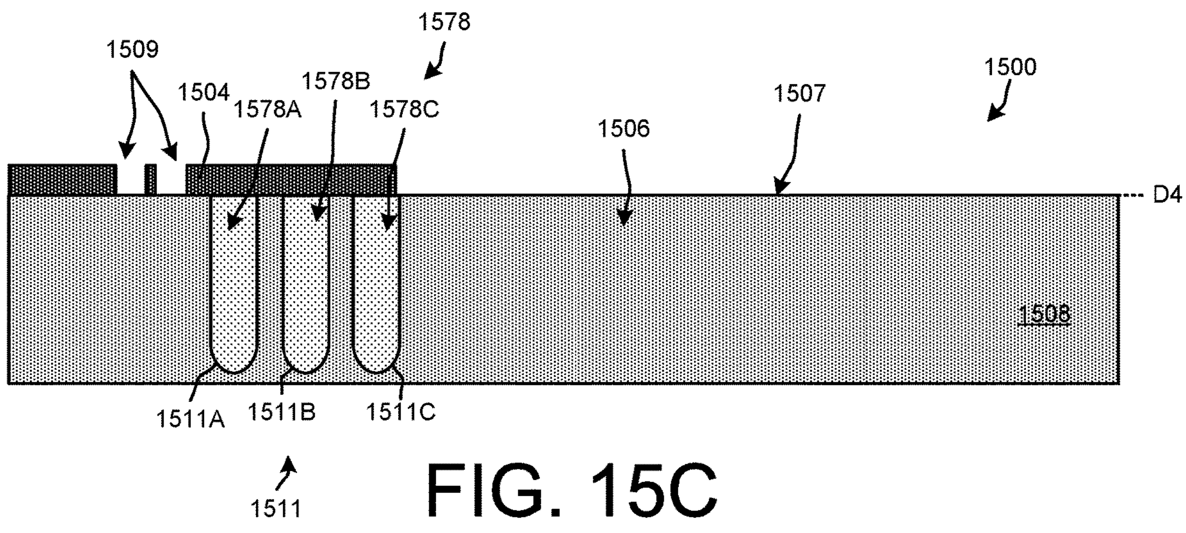
Figure 15D:
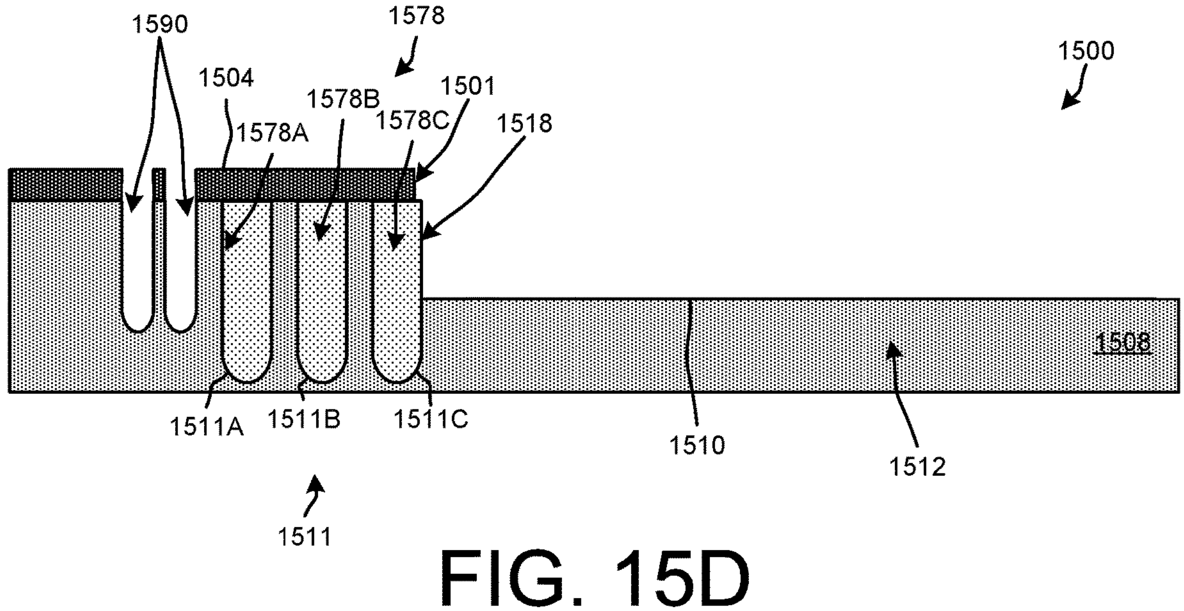
Figure 15E:
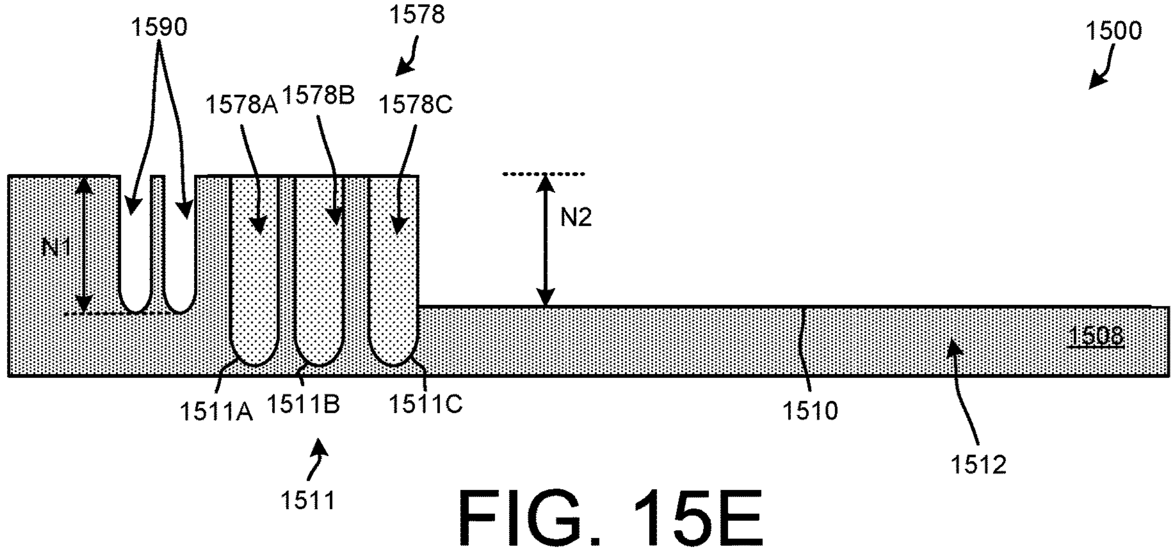
Figure 15F:
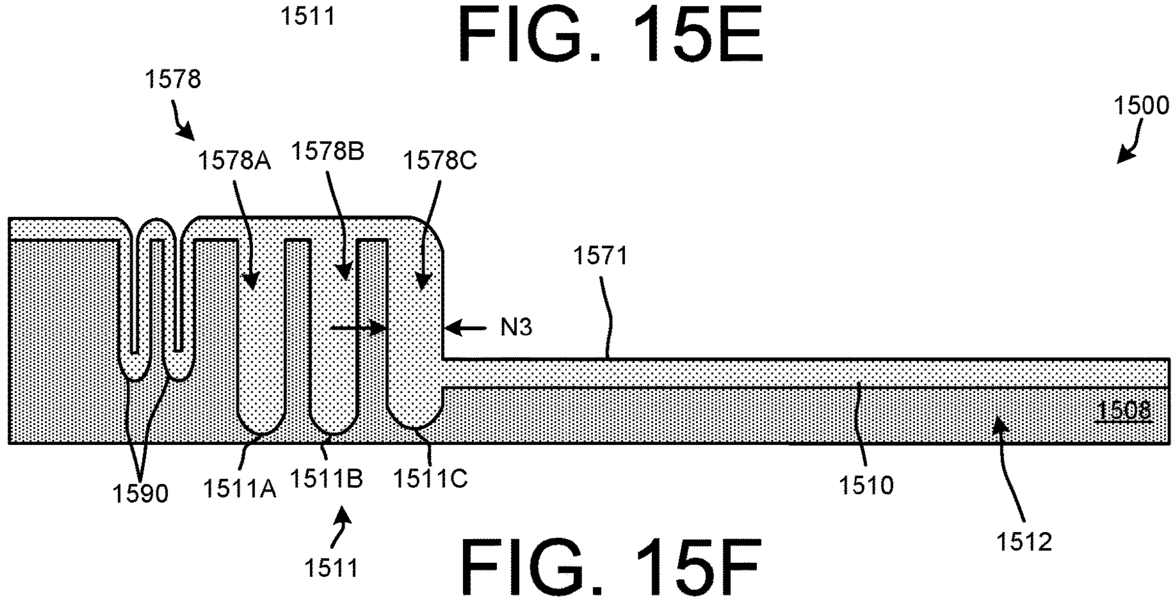
Figure 15G:
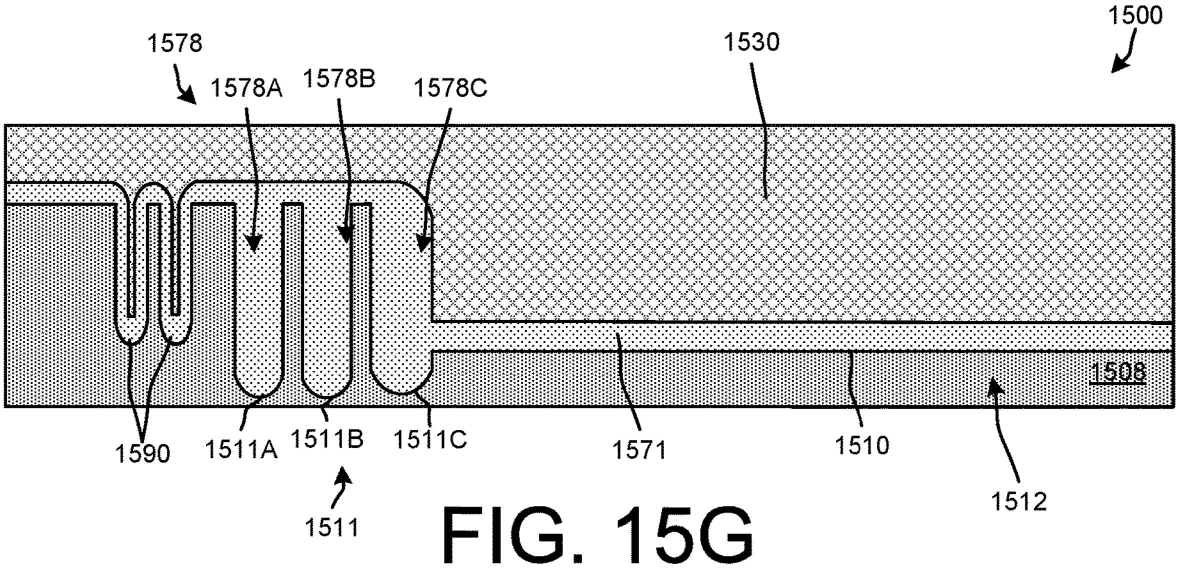
Figure 15H:
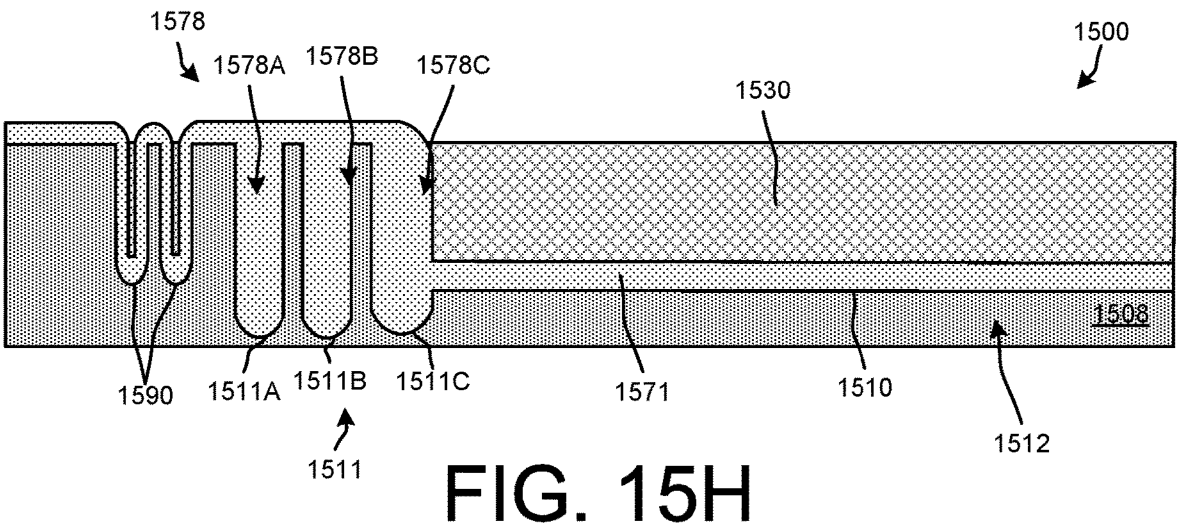
Figure 15I:
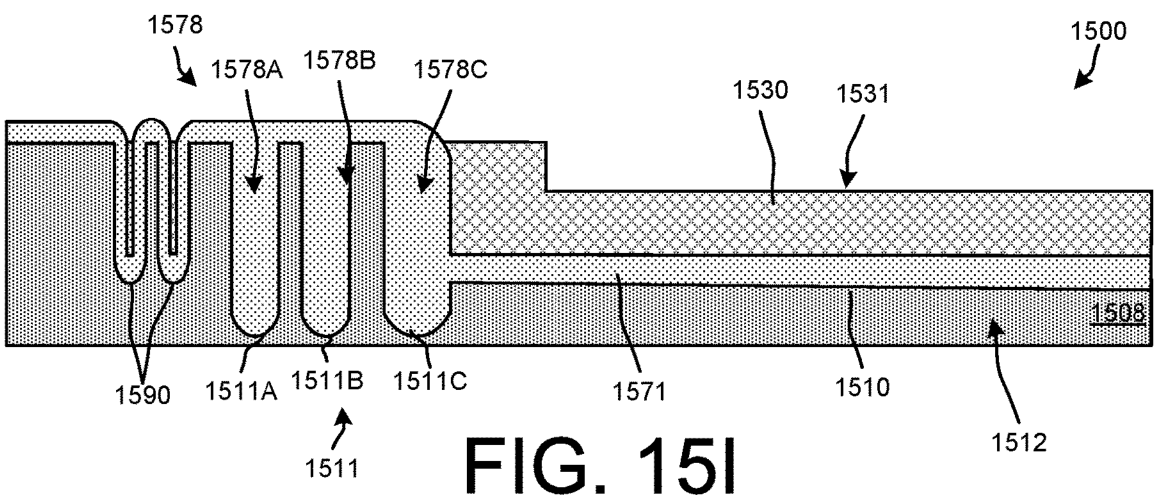
Figure 15J:
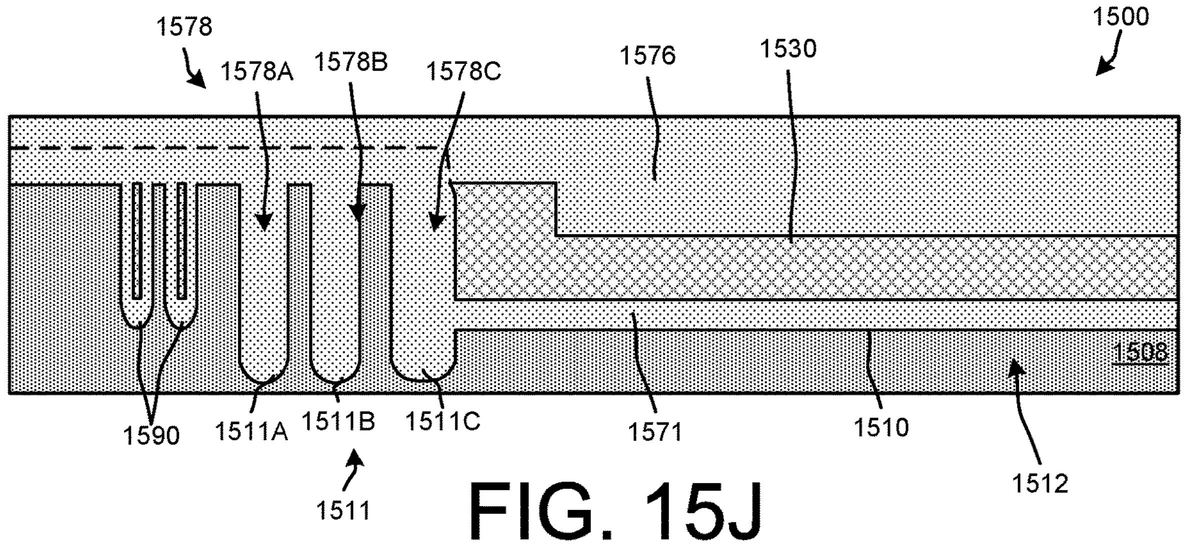
Figure 15K:
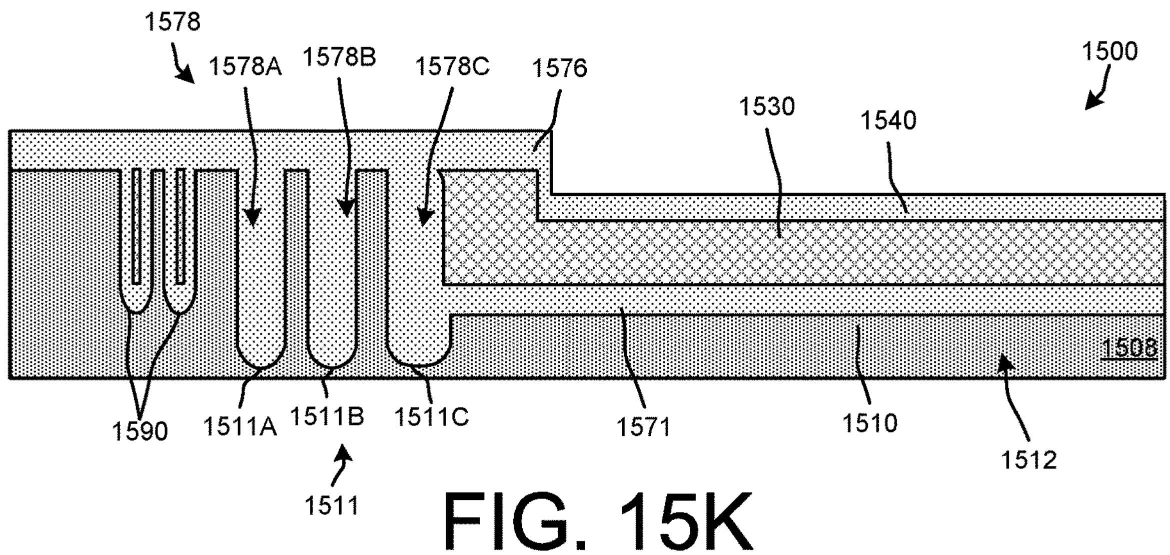
Figure 15L:
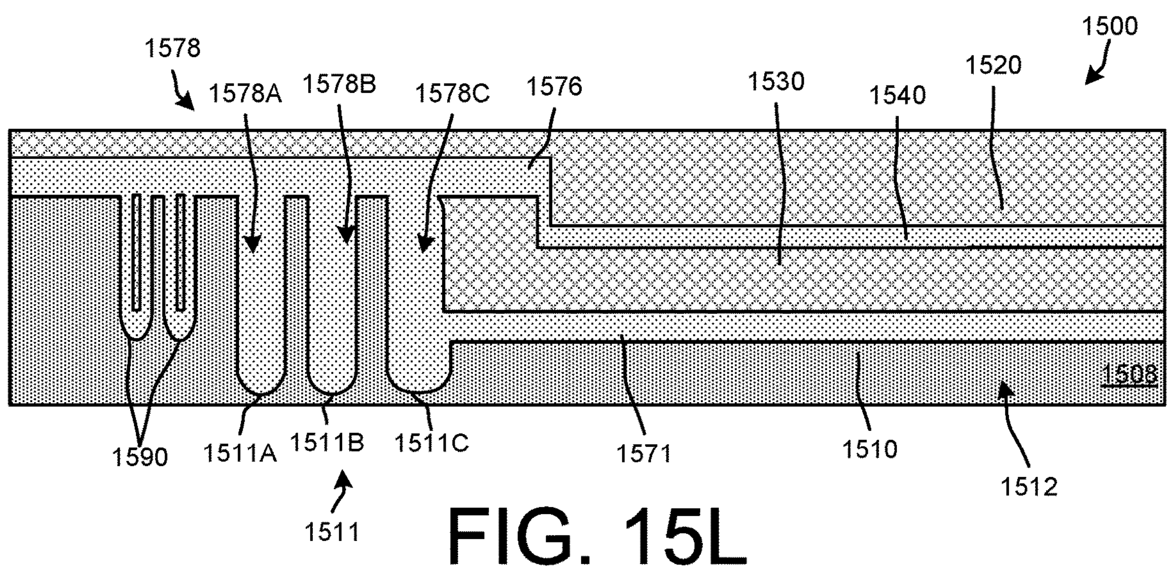
Figure 15M:
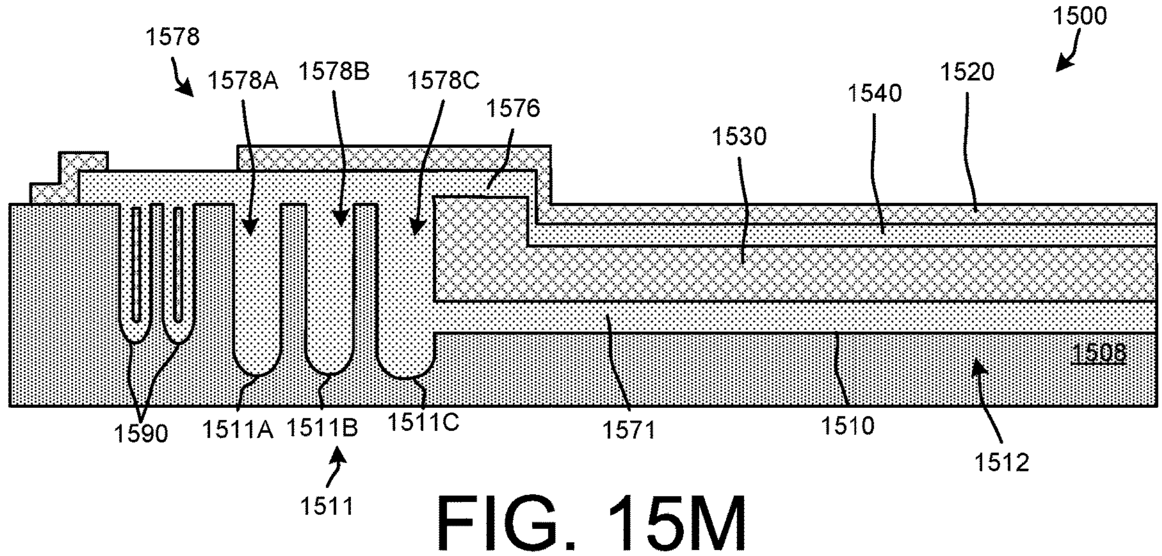
Figure 15N:
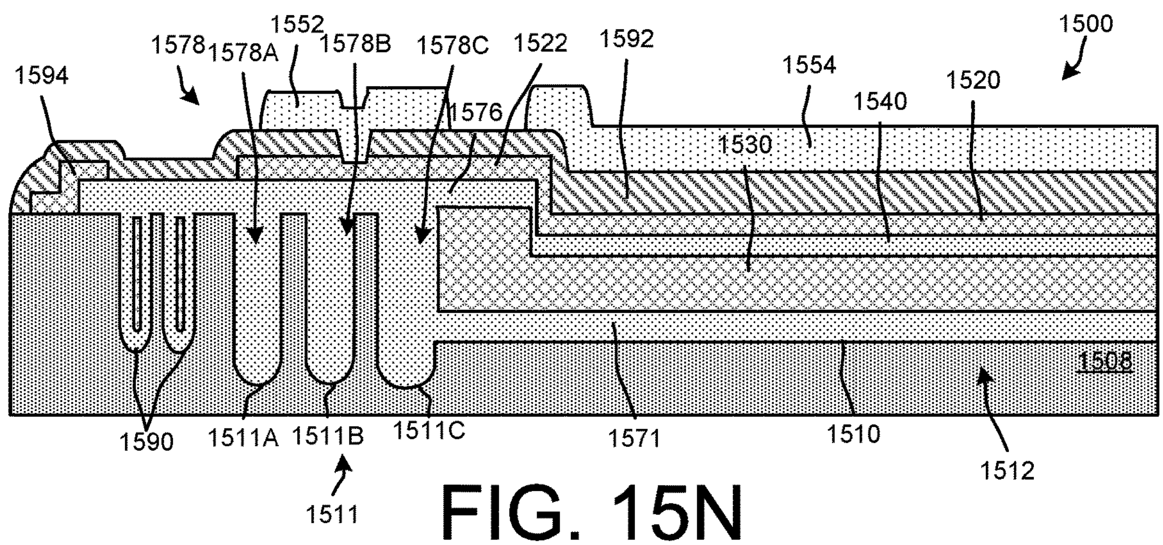
Figure 15O:
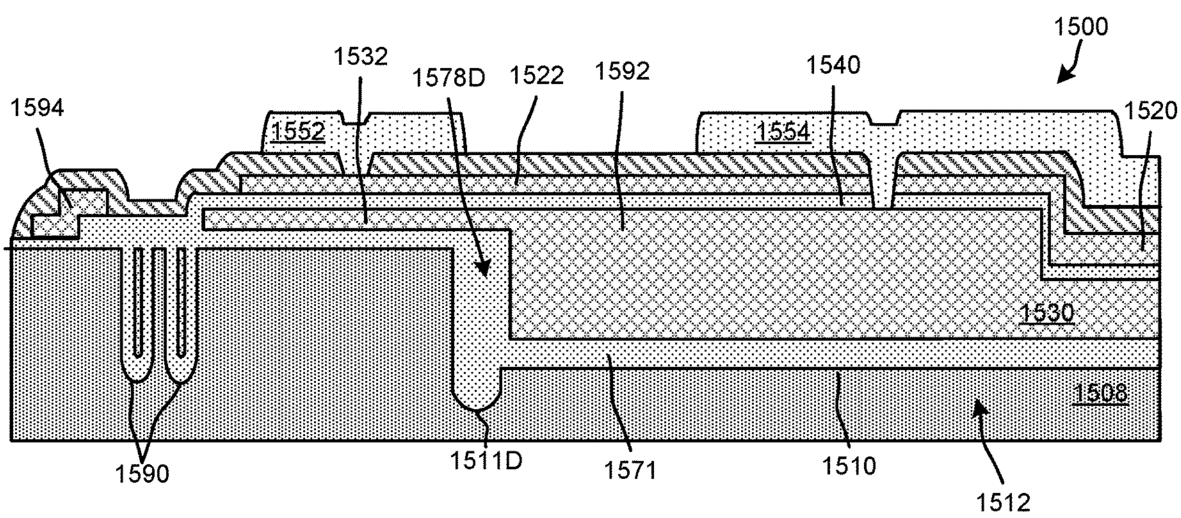

FIGS. 15A through 15O are side cross-sectional diagrams that illustrate another method for making one or more features of a semiconductor device 1500. The semiconductor device 1500 can be similar to the semiconductor devices described above. In some implementation, the method illustrated by FIGS. 15A through 15O can be referred to as double trench termination process because a first trench is formed, and a second trench that is self-aligned with the first trench is later form. The trenches illustrated in the side cross-sectional diagrams can be aligned along a longitudinal axis (e.g., longitudinal axis D1) and can be included in a set of parallel trenches (e.g., the plurality of trenches 310 shown in FIG. 3A).

As shown in FIG. 15A, a mask 1503 is formed on an epitaxial layer 1508 of a semiconductor substrate (not shown). The epitaxial layer 1508 can be formed within or on top of the semiconductor substrate. In some embodiments, the mask 1503 can be a hard mask. FIG. 15A illustrates termination trenches 1511 (which includes trenches 1511A through 1511C) formed in the epitaxial layer 1508 using an etching process through the mask 1503. In some embodiments, one or more of the termination trenches 1511 can be a transverse trench (e.g., transverse trench 380A shown in FIG. 3A, transverse trench 383A shown in FIG. 7A), a perimeter trench (e.g., perimeter trench 390A shown in FIG. 3A, perimeter trench 910L shown in FIG. 9A), a trench extension portion (e.g., trench extension portion 314A shown in FIG. 3A), and/or so forth.

In this implementation, the termination trenches 1511 include three separate termination trenches. In some implementations, less than three termination trenches (e.g., a single termination trench, a pair of termination trenches) or a series of termination trenches (such as those shown in FIG. 13) can be formed. In some embodiments, the termination trench 1511C can be referred to as a transverse trench.

After the termination trenches 1511 have been formed, the mask 1503 is removed, and a dielectric 1579 is formed within the termination trenches 1511 and on a surface 1507 of the epitaxial layer 1508 as shown in FIG. 15B. In this implementation, portions 1578 (including portions 1578A through 1578D) of the dielectric 1579 are formed within the termination trenches 1511 and a portion 1577 of the dielectric 1579 is formed on the surface 1507 of the epitaxial layer 1508. The portions 1578 of the dielectric 1579 can be referred to as dielectric portions.

In some embodiments, the dielectric 1579 can be formed using one or more different dielectric formation processes. For example, a first portion of the dielectric 1571, which can be an oxide, can be formed using a thermal growth process, and a second portion of the dielectric 1571 can be formed using a deposition process (e.g., a sub-atmospheric chemical vapor deposition (SACVD) process), or vice versa. The dielectric 1579 can include a borosilicate glass (BSG).

After the termination trenches 1511 have been filled with the dielectric portions 1578 of the dielectric 1579, the portion 1577 of the dielectric 1579 disposed on the surface 1507 (e.g., a top surface) of the epitaxial layer 1508, which is aligned along plane D4, is removed. Dielectric portions 1578 disposed within the termination trenches 1511 and substantially aligned along plane D4 remain within the termination trenches 1511 and top surfaces of the dielectric portions 1578 are exposed. For example, one of the dielectric portion 1578A disposed within the termination trench 1511A can have a top surface that is exposed when the portion 1577 is removed. In some implementations, portion 1577 can be removed using any combination of a wet etch, a dry etch, and/or a CMP process.

As shown in FIG. 15C, a mask 1504 (and portions thereof) is formed on at least a portion of a surface of the epitaxial layer 1508. Shown in FIG. 15C, the mask 1504 has at least a portion disposed over the exposed top surfaces of the dielectric portions 1578. Openings 1509 in the mask 1504 are formed (e.g., defined) so that perimeter trenches 1590 can be etched into the epitaxial layer 1508. Also, a region 1506 of the epitaxial layer 1508 is exposed so that etching of trench 1510 (or a main portion 1512 of the trench 1510) can be formed (e.g., etched).

As shown in FIG. 15D, perimeter trenches 1590 and the trench 1510 are formed in the epitaxial layer 1508 using the mask 1504. In some embodiments, the trench 1510 can be referred to as an active trench, or can have a least a portion that is disposed within an active area of the semiconductor device 1500. As shown in FIG. 15D, one or more of the perimeter trenches 1590 have a depth N1 that is approximately equal to a depth N2 of the trench 1510.

In this embodiment, the etching of the trench 1510 is performed so that the trench 1510 can abut and be self-aligned with the termination trench 1511C. As shown in FIG. 15D an edge 1501 of the mask 1504 is offset from an edge 1518 of dielectric portion 1578C disposed in termination trench 1511C so that over etching can guarantee that the trench 1510 abuts the termination trench 1511C even with some misalignment. In other words, less than all of a top surface of the dielectric portion 1578C disposed in the termination trench 1511C may be covered by the mask 1504 so that a portion of the top surface of the dielectric portion 1578C is exposed to etching. In some embodiments, the portion of the top surface of the dielectric 1578C that is exposed to etching can be aligned along (or contiguous with) the edge 1518 to be contacted with the trench 1510.

Although not shown, the processing steps described herein can be modified such that a transverse trench can be etched within and in a perpendicular direction to at least a portion of the trench 1510. The transverse trench can be formed using the same process used to form the termination trenches 1511.

The mask 1504 (shown in FIG. 15D) is removed, as shown in FIG. 15E, using any combination of a wet etch, a dry etch, and/or a CMP process. After the mask 1504 has been removed, a dielectric 1571 is formed within the trench 1510, over the termination trenches 1511, and within the perimeter trenches 1590. In some embodiments, the dielectric 1571 can be formed using one or more different dielectric formation processes. For example, a first portion of the dielectric 1571, which can be an oxide, can be formed using a thermal growth process, and a second portion of the dielectric 1571 can be formed using a deposition process (e.g., a sub-atmospheric chemical vapor deposition (SACVD) process).

As shown in FIG. 15F, a thickness of a portion of the dielectric 1571 disposed along a bottom surface of one or more of the perimeter trenches 1590 can be the same as, or approximately the same as, a thickness of a portion of the dielectric 1571 disposed along a bottom surface of the trench 1510.

After the formation of the dielectric 1571, a combined width N3 of dielectric portion 1578C included in termination trench 1511C and width of a portion of the dielectric 1571 can be greater than that shown in FIG. 15F and can be greater than a width of the dielectric portion 1578C alone.

FIG. 15G illustrates formation of a shield electrode 1530 in the trench 1510. In some embodiments, the shield electrode 1530 can be formed on (e.g., disposed on) the dielectric 1571 in the trench 1510 and in the perimeter trenches 1590 using a deposition process (e.g., a polysilicon deposition process, an in-situ doped (ISD) amorphous polysilicon deposition process). In some embodiments, if one or more of the termination trenches 1511 are not entirely filled with the dielectric portions 1578, at least a portion of the shield electrode 1530 can be included in one or more of the termination trenches 1511.

After the shield electrode 1530 has been formed within the trench 1510 and in the perimeter trenches 1590, one or more portions of the shield electrode 1530 can be removed as shown in FIG. 15H (to reduce a thickness of the shield electrode 1530). Specifically, a chemical mechanical polish (CMP) process can be applied to the shield electrode 1530 to remove portions of the shield electrode 1530. After the CMP process has been performed, portions of the shield electrode 1530 can be etched to recess the shield electrode 1530 within the trench 1510. Although not shown, in some implementations, at least a portion of a surface shield electrode can also be formed.

As shown in FIG. 15I, the shield electrode 1530 is further recessed within the trench 1510. The shield electrode 1530 within the perimeter trenches 1590 can also be further recessed. The shield electrode 1530 can be recessed using, for example, an etch process. The shield electrode 1530 can be recessed to have a profile similar to that shown in, for example, FIG. 9B or FIG. 10B. The shield electrode 1530 can be recessed to have a profile similar to that shown in, for example, FIG. 10O, FIG. 9L, FIG. 9M and/or FIG. 12H.

A dielectric 1576 is formed as shown in FIG. 15J after a profile of the shield electrode 1530 has been formed. The dielectric 1576 is formed at least on a portion of the dielectric 1571. In some embodiments, the dielectric 1576 can be used to form an inter-electrode dielectric 1540 shown in FIG. 15K. In some embodiments, the dielectric 1576 can be formed using a deposition process (e.g., an SACVD process), a thermal formation process, and/or so forth. In some embodiments, the dielectric 1576 can include a borosilicate glass (BSG). In some implementations, one or more of the dielectric 1571 and the dielectric 1576 can define a field dielectric (e.g., field dielectric 374 shown in FIG. 3B). Although not shown, a gate dielectric can also be formed after the inter-electrode dielectric 1540 has been formed.

As shown in FIG. 15K, the inter-electrode dielectric 1540 can be defined and recessed using any combination of a CMP process or an etch process. As shown in FIG. 15K, the inter-electrode dielectric 1540 is recessed within the second portion 1512 of the trench 1510.

After a profile of the inter-electrode dielectric 1540 has been formed as shown in FIG. 15K, a gate electrode 1520 can be formed as shown in FIG. 15L. In some embodiments, the gate electrode 1520 can be formed on (e.g., disposed on) the inter-electrode dielectric 1540 in the trench 1510 using a deposition process (e.g., a polysilicon deposition process, an in-situ doped (ISD) amorphous polysilicon deposition process).

The gate electrode 1520 is recessed to form the gate electrode 1520 profile shown in FIG. 15M. In this implementation, a surface gate electrode 1522 and a channel stopper 1594 are formed. The processing associated with the gate electrode 1520, the inter-electrode dielectric 1540, and/or the shield electrode 1530 can be modified to define a different set of profiles (e.g., the profiles shown in FIG. 12B, FIG. 10O, FIG. 10F, FIG. 10E).

As shown in FIG. 15N, an interlayer dielectric 1592 is formed. In some embodiments, the interlayer dielectric 1592 can be, for example, a borophosphosilicate glass (BPSG) layer. A gate runner conductor 1552 and a source runner conductor 1554 are shown in FIG. 15N. Vias to the gate runner conductor 1552 and the source runner conductor 1554 can also be formed.

FIG. 15O illustrates a variation of the semiconductor device 1500 that can be produced using the process illustrated in FIGS. 15A through 15N. In this variation, a single termination trench 1511D (which can function as a transverse trench) is formed within the epitaxial layer 1508. Also, as shown in FIG. 15O, a surface shield electrode 1532 is formed within the semiconductor device 1500.

FIGS. 16A through 16F are side cross-sectional diagrams that illustrate a variation of a method for making one or more features of the semiconductor device 1500. Accordingly, the reference numerals and features included in FIGS. 15A through 15O are generally maintained and some features are not described again in connection with FIGS. 16A through 16F. In this implementation, the process for producing the variation uses the same processing steps up through FIG. 15J. Accordingly, FIG. 16A in this implementation corresponds with FIG. 15J. The process variation described in connection with FIGS. 16A through 16F can correspond with at least some of the features for a semiconductor device that excludes a surface shield electrode and/or a surface gate electrode such as that shown in, for example, FIGS. 9B and 10B.

Figure 16A:
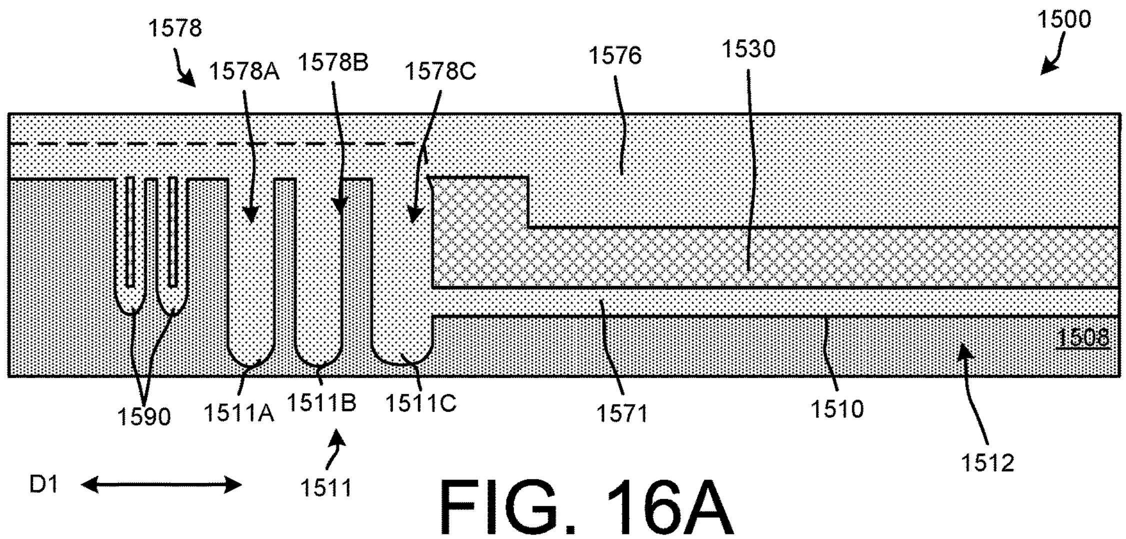
FIGS. 16A through 16F are side cross-sectional diagrams that illustrate a variation of a method for making one or more features of the semiconductor device.
Figure 16B:
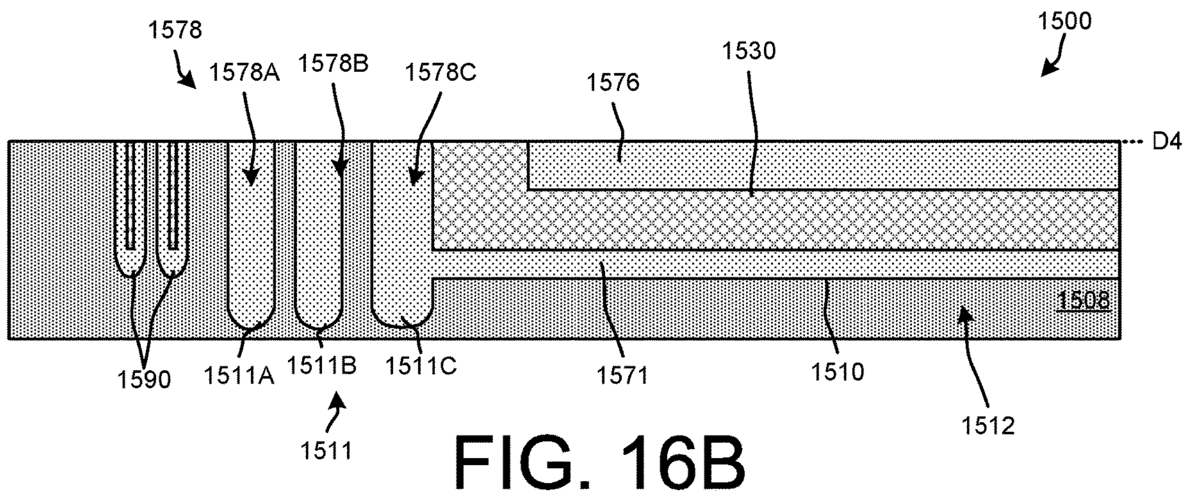

As shown in FIG. 16B, at least a portion of the dielectric 1571 and at least a portion of the dielectric 1576 are removed. The portion of the dielectric 1571 and portion of the dielectric 1576 are removed until a surface of the semiconductor device 1500 is substantially planar and within the plane D4 of the epitaxial layer 1508. The semiconductor device 1500 can be referred to as being planarized.

As shown in FIG. 16B, several of the elements that were previously covered by, for example, the dielectric 1571 can be exposed. For example, dielectric included in the perimeter trenches 1590 can be exposed, one or more of the dielectric portions 1578 can have top surfaces that are exposed, shield electrodes disposed within the perimeter trenches 1590 can be exposed, a top surface of the shield electrode 1530 can be exposed, and/or so forth.

Figure 16C:
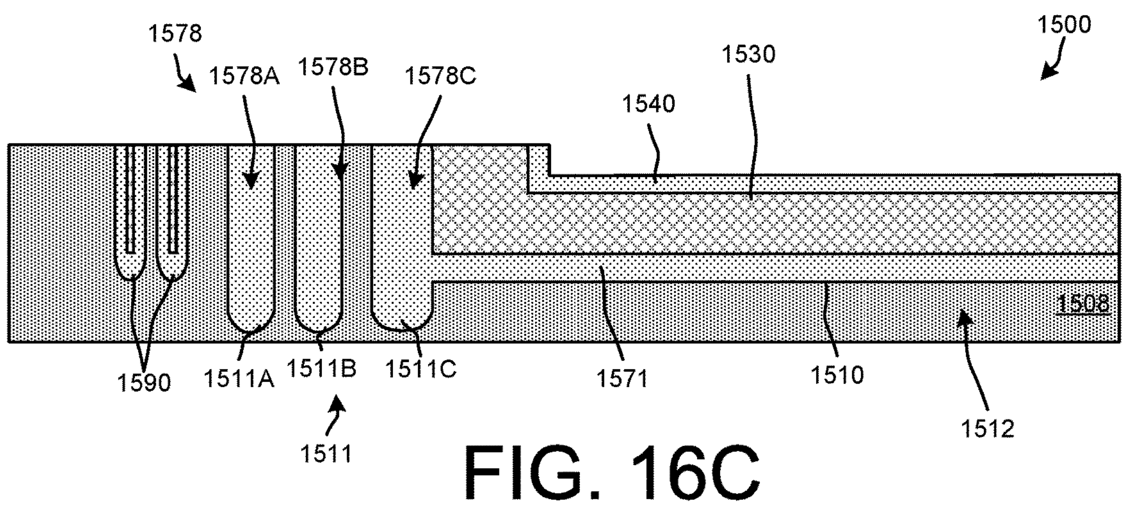

As shown in FIG. 16C, an inter-electrode dielectric 1540 is defined from the dielectric 1576. The inter-electrode dielectric 1540 can have a profile that is defined using any combination of a CMP process or an etch process. As shown in FIG. 16C, the inter-electrode dielectric 1540 is recessed within the second portion 1512 of the trench 1510.

Figure 16D:
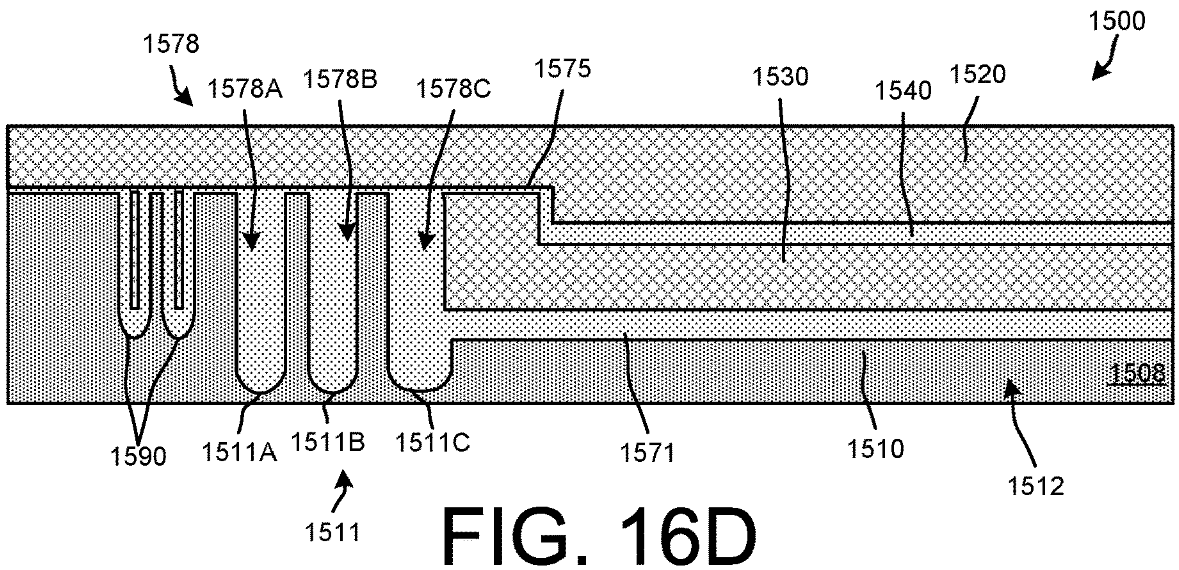

After a profile of the inter-electrode dielectric 1540 has been formed as shown in FIG. 16C, a gate dielectric 1575 can be formed and a gate electrode 1520 can be formed on the gate dielectric 1575 as shown in FIG. 16D. In some embodiments, the gate electrode 1520 can be formed on (e.g., disposed on) the inter-electrode dielectric 1540 in the trench 1510 and on the gate dielectric 1575 using a deposition process (e.g., a polysilicon deposition process, an in-situ doped (ISD) amorphous polysilicon deposition process).

Figure 16E:
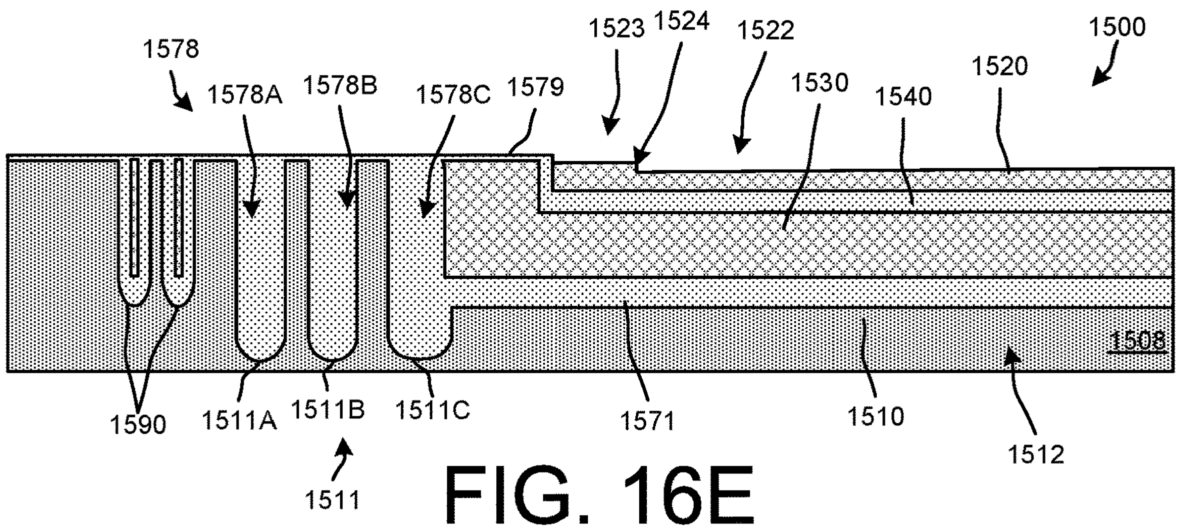

The gate electrode 1520 is recessed using one or more masking and/or recessing steps (e.g., etching steps) to form a profile of the gate electrode 1520 shown in FIG. 16E. As shown in FIG. 16E, the gate electrode 1520 has two different recessed portions—a recessed portion 1523 and a recessed portion 1522. Accordingly, the recessed portion 1523 of the gate electrode 1520 has a thickness that is less than the recessed portion 1522 of the gate electrode 1520. The profile can be similar to the profile of the gate electrode shown in, for example, FIGS. 10E and 10F. The gate electrode 1520 can be modified with a different profile such as that shown in FIG. 12B, FIG. 10B, and/or FIG. 10D. The gate electrode 1520 can be recessed so that the gate electrode 1520 has a substantially constant thickness across longitudinal length.

Figure 16F:
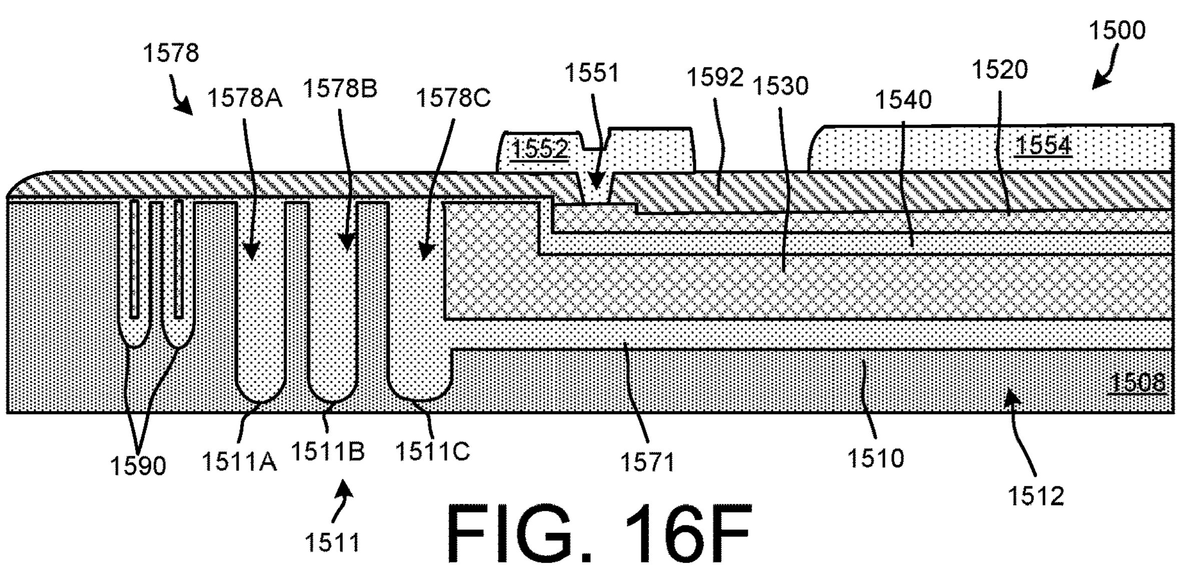
Figure 17A:
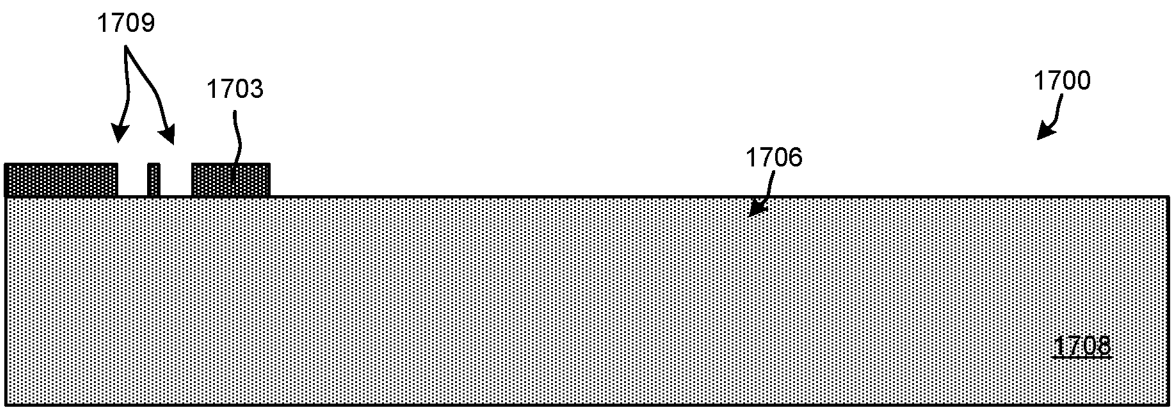
FIGS. 17A through 17L are side cross-sectional diagrams that illustrate yet another method for making one or more features of a semiconductor device.
Figure 17B:
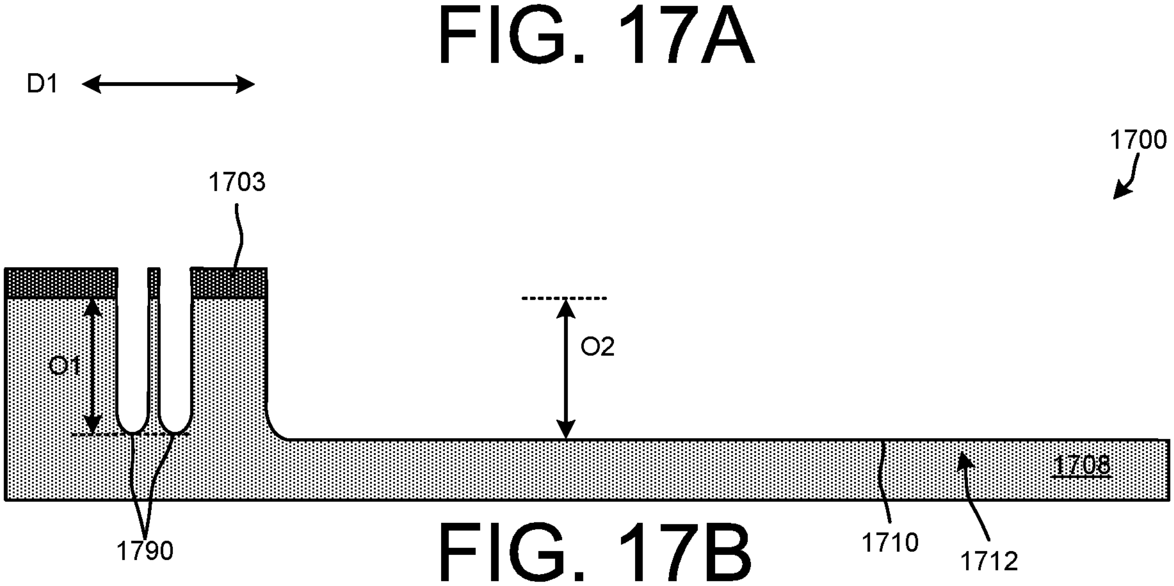
Figure 17C:
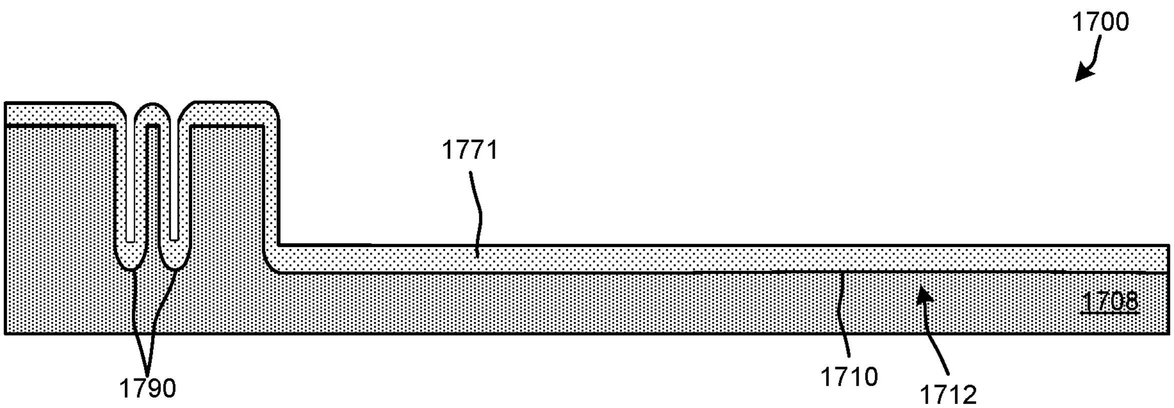
Figure 17D:
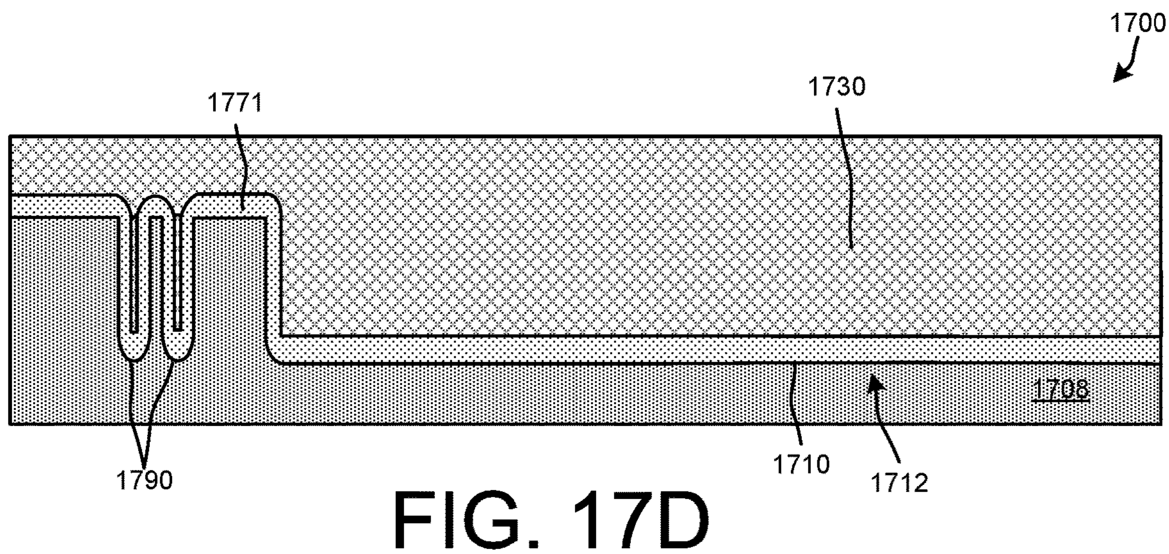
Figure 17E:
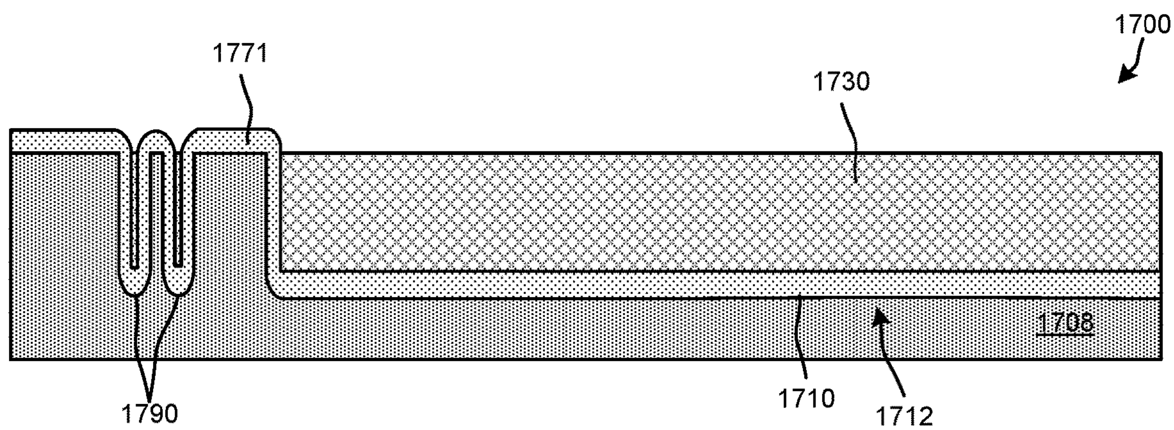
Figure 17F:
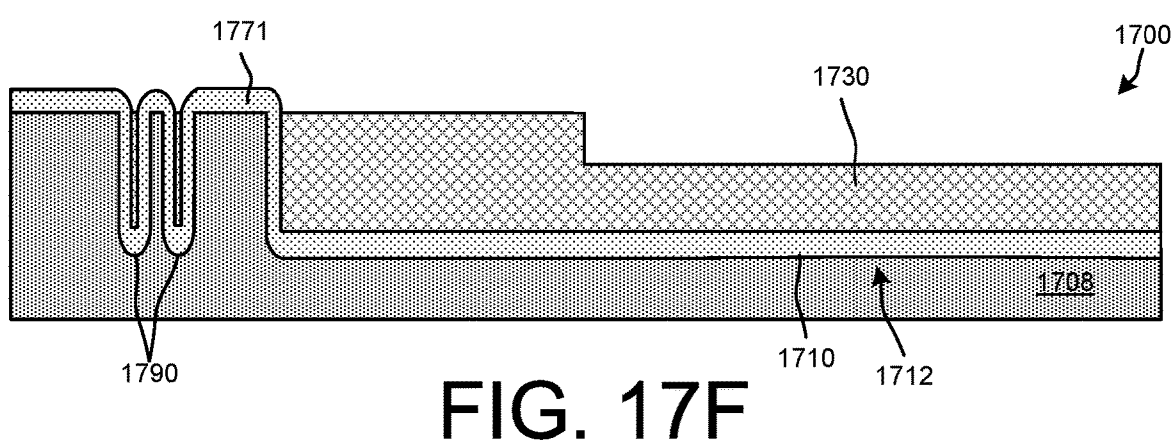
Figure 17G:
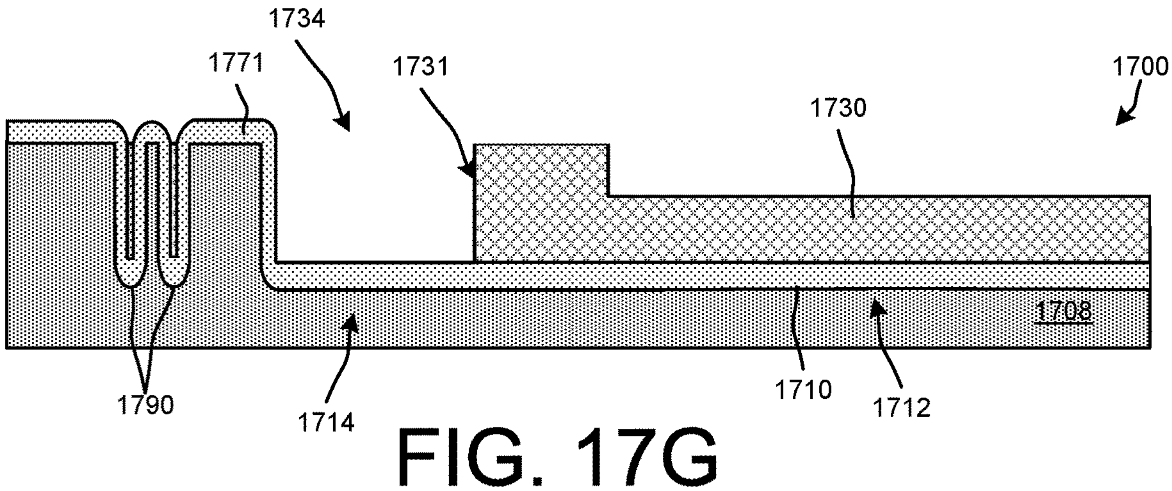
Figure 17H:
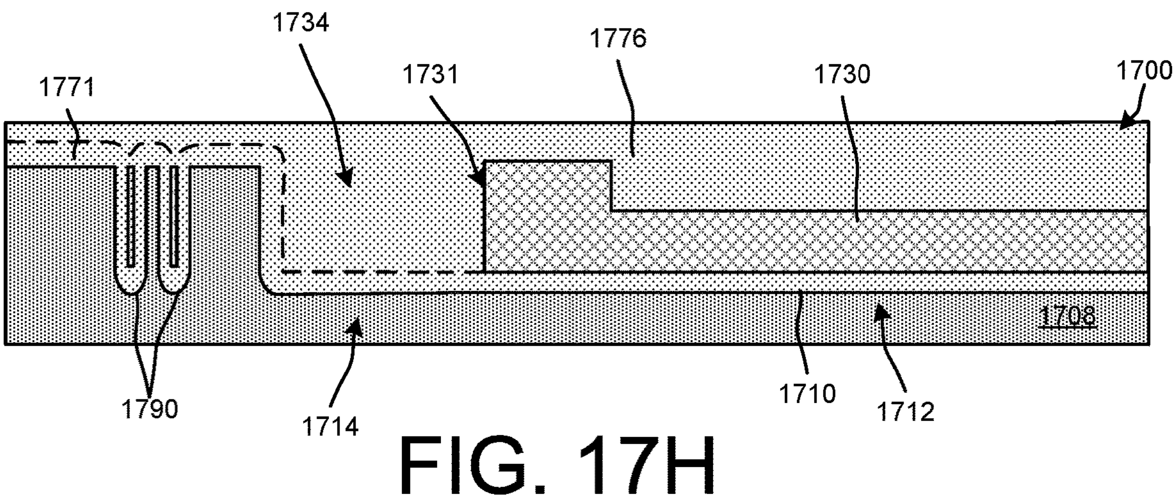
Figure 17I:
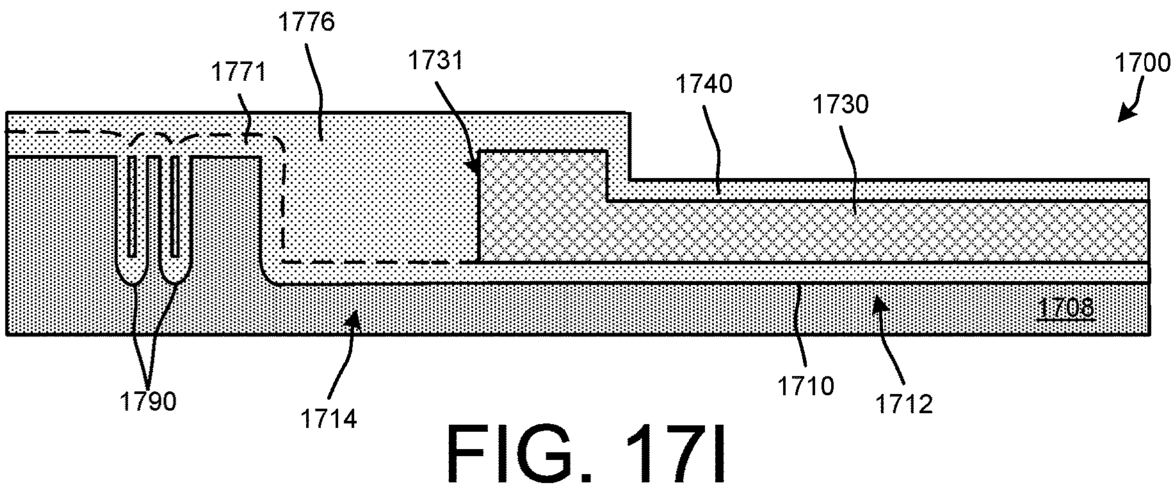
Figure 17J:
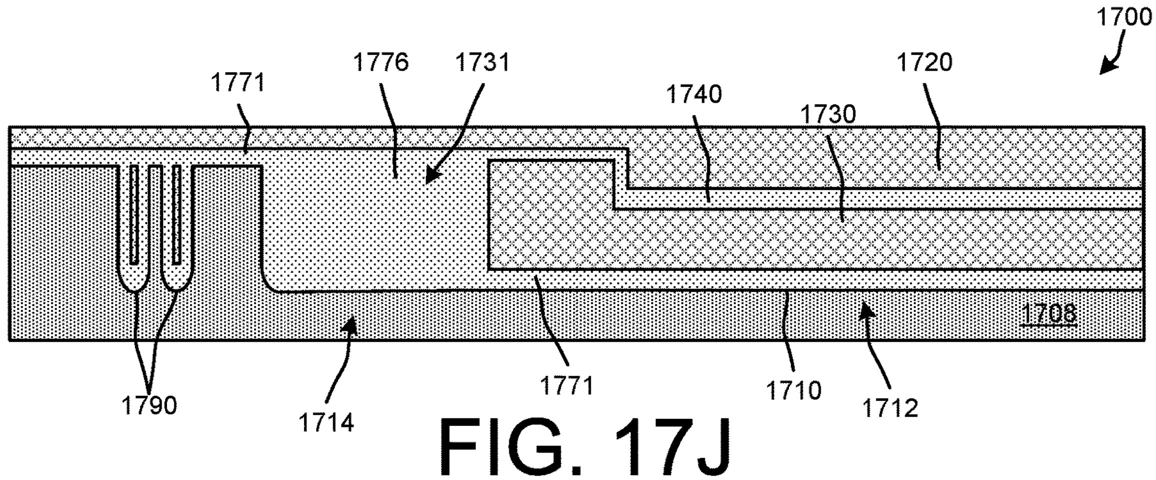
Figure 17K:
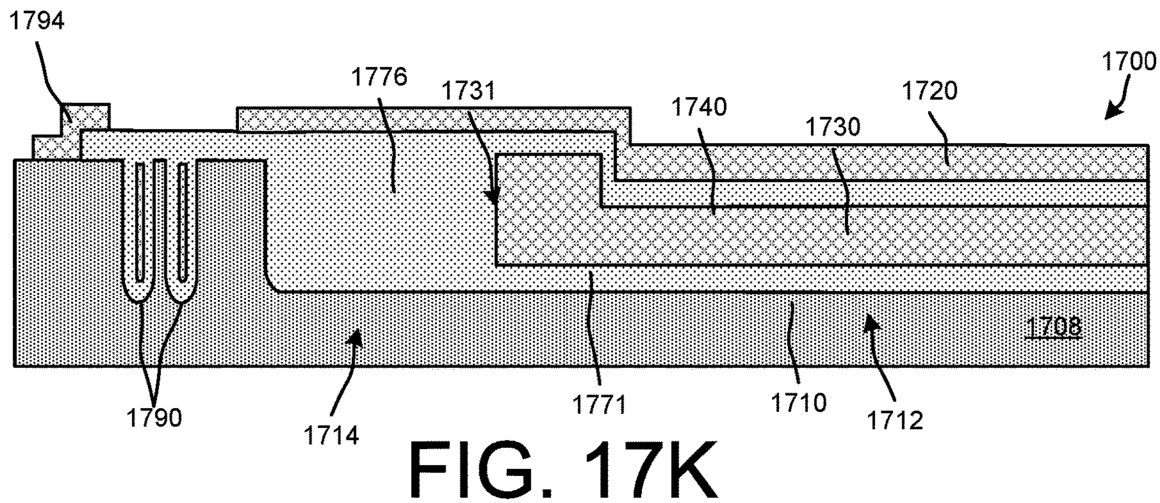
Figure 17L:
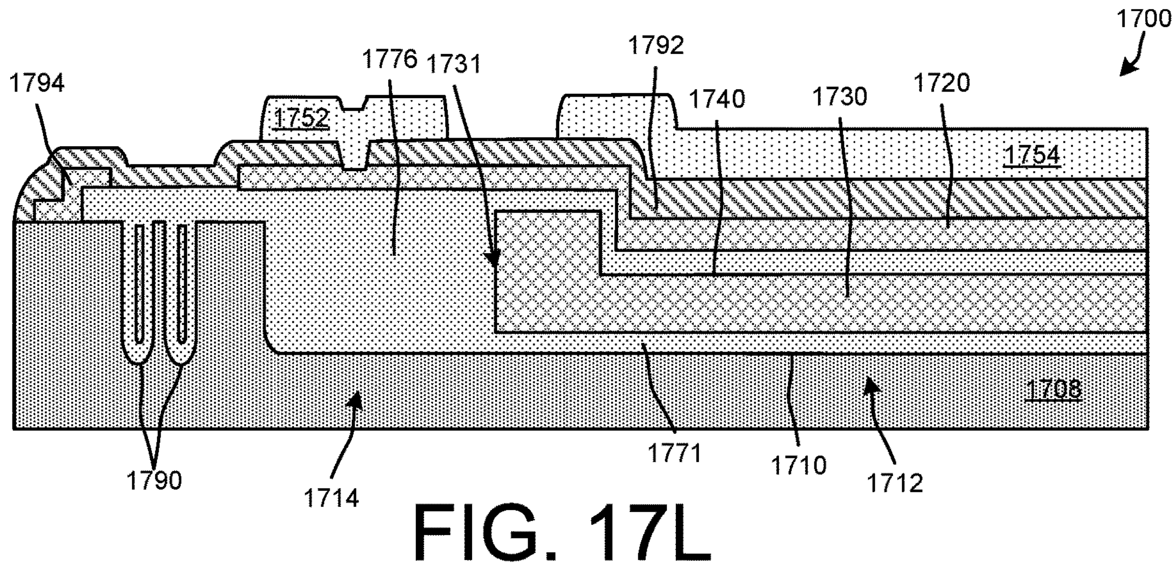

As shown in FIG. 16F, an interlayer dielectric 1592 is formed. In some embodiments, the interlayer dielectric 1592 can be, for example, a borophosphosilicate glass (BPSG) layer. A gate runner conductor 1552 and a source runner conductor 1554 are also formed and shown in FIG. 16F. A via 1551 through an ILD 592 to the gate runner conductor 1552 and a via (not shown) the source runner conductor 1554 can also be formed.

It will also be understood that when a layer is referred to as being on another layer or substrate, it can be directly on the other layer or substrate, or intervening layers may also be present. It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method comprising:

forming a trench defined in a semiconductor region, the trench having a depth aligned along a vertical axis and having a length aligned along a longitudinal axis orthogonal to the vertical axis, the trench having a first portion of the length included in a termination region of the semiconductor region and having a second portion of the length included in an active region of the semiconductor region;

forming a shield electrode in the trench; and forming a dielectric, the dielectric lining a bottom portion of the trench, the dielectric having a first portion disposed in the termination region of the semiconductor region and a second portion disposed in the active region of the semiconductor region, the first portion of the dielectric disposed in the termination region having a vertical thickness greater than a vertical thickness of the second portion of the dielectric disposed in the active region, the vertical thickness of the first portion of the dielectric extending between a bottom surface of the trench and a bottom surface of the shield electrode in the termination region, the vertical thickness of the second portion of the dielectric extending between the bottom surface of the trench and the bottom surface of the shield electrode in the active region.

2. The method of claim 1, wherein the trench has a first width in the termination region aligned orthogonal to the vertical axis and aligned orthogonal to the longitudinal axis, the trench has a second width in the active region aligned orthogonal to the vertical axis and aligned orthogonal to the longitudinal axis, the first width of the trench is less than the second width of the trench.

3. The method of claim 1, wherein the depth is a first depth in the active region, the trench has a second depth in the termination region that is shallower than the first depth.

4. The method of claim 1, wherein the depth is a first depth in the active region, the trench has a second depth in the termination region that is shallower than the first depth, the trench has a third depth different than the first depth and different than the second depth.

5. The method of claim 1, wherein the longitudinal axis is a first longitudinal axis, the trench is a first trench, the depth is a first depth in the active region, and the trench has a second depth in the termination region that is shallower than the first depth, the method further comprising:

forming a second trench aligned along a second longitudinal axis orthogonal to the first longitudinal axis, the second trench intersecting the first trench, the second trench having a third depth, the third depth being different than the first depth and different than the second depth.

6. The method of claim 1, wherein the trench is a first trench, the method further comprising:

forming a second trench aligned parallel to the first trench; and forming a third trench intersecting the first trench and intersecting the second trench such that the dielectric in the first trench is in contact with a dielectric disposed in the second trench and in contact with a dielectric disposed in the third trench.

7. The method of claim 1, wherein the trench is a first trench, the method further comprising:

forming a second trench aligned orthogonal to and intersecting the first trench, the first trench having a first width on a first side of the second trench that is greater than a second width on a second side of the second trench.

8. The method of claim 1, further comprising:

forming an electrode in the first portion of the trench, the second portion of the trench excluding an electrode.

9. The method of claim 1, wherein the first portion of the dielectric has a bottom surface at a depth that is deeper than a depth of a bottom surface of the second portion of the dielectric.

10. The method of claim 1, wherein the trench is a first trench and the dielectric is a first dielectric, the method further comprising:

forming a second trench aligned in a direction parallel to the first trench; and forming a second dielectric, the second dielectric lining a bottom portion of the second trench lateral, in a direction perpendicular to the parallel direction, to the active region of the semiconductor region, the second dielectric having a thickness substantially equal to the vertical thickness of the first portion of the first dielectric in the first trench.

11. A method, comprising:

forming a first trench in a semiconductor region, the first trench having a first portion included in a termination region of the semiconductor region and having a second portion included in an active region of the semiconductor region;

forming a dielectric, the dielectric lining a bottom portion of the first trench, the dielectric having a first portion disposed in the termination region of the semiconductor region and a second portion disposed in the active region of the semiconductor region, the first portion of the dielectric disposed in the termination region having a thickness different than a thickness of the second portion of the dielectric disposed in the active region; and forming a second trench aligned parallel to the first trench and having a profile intersecting a profile of the first trench, the first trench having a depth different than a depth of the second trench, the first trench and the second trench defining a single trench.

12. The method of claim 11, wherein the first trench is an active trench including a gate electrode and a shield electrode.

13. The method of claim 11, wherein the first trench includes a shield electrode and excludes a gate electrode.

14. The method of claim 11, wherein the second trench has a first portion aligned parallel to the first trench and the second trench has a second portion aligned perpendicular to the first trench, the method further comprising:

forming a dopant well region having an edge separated from the second portion of the second trench.

15. The method of claim 11, wherein the first trench includes a gate electrode and a shield electrode, the shield electrode having a recessed portion in the active region and a vertically extending portion in the termination region.

16. The method of claim 11, wherein the second trench has a first portion aligned parallel to the first trench and the second trench has a second portion aligned perpendicular to the first trench, the method further comprising:

forming a protrusion dielectric portion in contact with a dielectric disposed in the second portion of the second trench.

17. The method of claim 11, wherein the second trench has a first portion aligned parallel to the first trench and the second trench has a second portion aligned perpendicular to the first trench, the method further comprising:

forming a gate electrode having an edge intersecting a profile of the second portion of the second trench; and forming a source electrode having an edge intersecting a profile of the second portion of the second trench.

* * * * *